US009152049B2

(12) United States Patent
Kataoka et al.

(10) Patent No.: US 9,152,049 B2
(45) Date of Patent: Oct. 6, 2015

(54) ACTINIC-RAY- OR RADIATION-SENSITIVE RESIN COMPOSITION AND METHOD OF FORMING PATTERN USING THE COMPOSITION

(75) Inventors: Shohei Kataoka, Shizuoka (JP); Akinori Shibuya, Shizuoka (JP); Shuhei Yamaguchi, Shizuoka (JP); Hisamitsu Tomeba, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/392,836

(22) PCT Filed: Aug. 27, 2010

(86) PCT No.: PCT/JP2010/065088

§ 371 (c)(1), (2), (4) Date: Feb. 27, 2012

(87) PCT Pub. No.: WO2011/025065

PCT Pub. Date: Mar. 3, 2011

(65) Prior Publication Data

US 2012/0156617 A1 Jun. 21, 2012

(30) Foreign Application Priority Data

Aug. 28, 2009 (JP) ................................ 2009-198729
Oct. 6, 2009 (JP) ................................ 2009-232799

(51) Int. Cl.

| | |
|---|---|
| ***G03F 7/004*** | (2006.01) |
| ***G03F 7/039*** | (2006.01) |
| ***G03F 7/20*** | (2006.01) |
| ***G03F 7/075*** | (2006.01) |
| ***G03F 7/11*** | (2006.01) |

(52) U.S. Cl.

CPC ............ *G03F 7/0397* (2013.01); *G03F 7/0045* (2013.01); *G03F 7/0046* (2013.01); *G03F 7/0758* (2013.01); *G03F 7/11* (2013.01); *G03F 7/2041* (2013.01)

(58) Field of Classification Search

None

See application file for complete search history.

(56) References Cited

U.S. PATENT DOCUMENTS

| | | | | |
|---|---|---|---|---|
| 6,322,949 B2 | 11/2001 | Suwa et al. | | |
| 7,871,752 B2 | 1/2011 | Hasegawa et al. | | |
| 7,875,746 B2 | 1/2011 | Wada | | |
| 2006/0264528 A1* | 11/2006 | Wada | ............................ | 522/130 |
| 2007/0141512 A1* | 6/2007 | Wada et al. | ................ | 430/270.1 |
| 2009/0035692 A1* | 2/2009 | Tarutani et al. | ............ | 430/270.1 |

FOREIGN PATENT DOCUMENTS

| | | | |
|---|---|---|---|
| CN | 101276144 | A | 10/2008 |
| CN | 101405310 | A | 4/2009 |
| EP | 1 736 824 | A2 | 12/2006 |
| EP | 2 020 615 | A1 | 2/2009 |
| EP | 2 443 513 | A1 | 4/2012 |
| JP | 2003-215804 | A | 7/2003 |
| JP | 3577743 | B2 | 7/2004 |
| JP | 3632410 | B2 | 1/2005 |
| JP | 2005-266766 | A | 9/2005 |
| JP | 2006-330098 | A | 12/2006 |
| JP | 2007-206639 | A | 8/2007 |
| JP | 2007-326903 | A | 12/2007 |
| JP | 2008-031298 | A | 2/2008 |
| JP | 2008-116703 | A | 5/2008 |
| JP | 2009-53688 | A | 3/2009 |
| JP | 2009-093011 | A | 4/2009 |
| TW | 200910002 | A | 3/2009 |
| WO | WO 2010067898 | A2 * | 6/2010 |
| WO | 2010/147228 | A1 | 12/2010 |

OTHER PUBLICATIONS

McDaniel, et al. J. Org. Chem. vol. 23, pp. 23-27, 1958.*
Machine translation JP 2007-206639. Aug. 16, 2007.*
Machine translation JP 2008-116703. May 22, 2008.*
Chinese Office Action issued in Appln. No. 201080038279.2 dated Mar. 13, 2013.
European Search Report dated Feb. 20, 2014 issued in application No. 108121070.0-1564.
Japanese Office Action issued in application No. 2010-192545 dated Oct. 22, 2013.
Taiwanese Office Action issued a application No. 099128816 dated Aug. 6, 2014.
Israeli Office Action issued in corresponding application No. 218310 dated Jun. 11, 2015.

* cited by examiner

*Primary Examiner* — Cynthia H Kelly
*Assistant Examiner* — Alyssa L Cepluch
(74) *Attorney, Agent, or Firm* — Sughrue Mion, PLLC

(57) ABSTRACT

According to one embodiment, an actinic-ray- or radiation-sensitive resin composition includes any of the compounds of general formula (I) below, a compound that when exposed to actinic rays or radiation, generates an acid and a hydrophobic resin. (The characters used in general formula (I) have the meanings mentioned in the description.)

$$R_N\text{-}A^-X^+ \quad \text{(I)}$$

16 Claims, No Drawings

ACTINIC-RAY- OR RADIATION-SENSITIVE RESIN COMPOSITION AND METHOD OF FORMING PATTERN USING THE COMPOSITION

CROSS REFERENCE TO RELATED APPLICATIONS

This application is a National Stage of International Application No. PCT/JP2010/065088 filed Aug. 27, 2010, claiming priority based on Japanese Patent Application Nos. 2009-198729 filed Aug. 28, 2009, and 2009-232799 filed Oct. 6, 2009.

TECHNICAL FIELD

The present invention relates to an actinic-ray- or radiation-sensitive resin composition suitable for use in an ultra-microlithography process or other photofabrication process for production of very-large-scale integrated circuits or large-capacity microchips, etc. and further relates to a method of forming a pattern using the composition. More particularly, the present invention relates to an actinic-ray- or radiation-sensitive resin composition that is especially useful when an exposure source is an ArF excimer laser or a KrF excimer laser and further relates to a method of forming a pattern using the composition.

In the present invention, the terms “actinic rays” and “radiation” mean, for example, brightline spectra from a mercury lamp, far ultraviolet represented by excimer laser, extreme ultraviolet, X-rays, electron beams and the like. In the present invention, the term “light” means actinic rays or radiation.

BACKGROUND ART

In the production process for semiconductor devices, such as ICs and LSIs, it is conventional practice to perform microfabrication by lithography using a photoresist composition. In recent years, the formation of an ultrafine pattern in the sub-micron region or quarter-micron region is increasingly demanded in accordance with the realization of high integration for integrated circuits. Accordingly, the trend of exposure wavelength toward a short wavelength, for example, from g-rays to i-rays and further to KrF excimer laser light is seen.

Resist compositions for KrF comprising a resin whose fundamental skeleton consists of a poly(hydroxystyrene) have been developed. As such a resin, it is known to use, for example, a copolymer from hydroxystyrene and a monomer containing an adamantyl group (see, for example, patent reference 1).

In contrast, as resist compositions for which mainly an ArF light source is used, those comprising a resin containing no aromatic ring have been developed. For example, compositions comprising a resin with a specified lactone structure are known (see, for example, patent reference 2). Moreover, as a photoacid generator of high transmission, it was reported to use an alkyl aryl onium salt (see, for example, patent references 3 and 4).

Meanwhile, it was reported to use compounds having a basic moiety, each of which when exposed to radiation, generates an acid to thereby have its basicity lowered or become neutral, with the intent to attain an enhancement of pattern profile, line edge roughness or the like (see, for example, patent references 5 and 6).

As a result of the inventors’ study, it has become apparent that the use of a compound having a basic moiety that when exposed to radiation, generates an acid to thereby have its basicity lowered or become neutral is likely to cause the resist composition to be unstable.

PRIOR ART LITERATURE

Patent Reference

[Patent reference 1] U.S. Patent Application Publication No. 2007/0121390,

[Patent reference 2] Jpn. Pat. Appln. KOKAI Publication No. (hereinafter referred to as JP-A-) 2008-031298,

[Patent reference 3] Japanese Patent No. 3632410,

[Patent reference 4] JP-A-2003-215804,

[Patent reference 5] Japanese Patent No. 3577743, and

[Patent reference 6] JP-A-2006-330098.

DISCLOSURE OF INVENTION

It is an object of the present invention to solve the problems of performance-enhancing technology encountered in the microfabrication of semiconductor devices using actinic rays or radiation, especially an ArF excimer laser or a KrF excimer laser light. It is another object of the present invention to provide an actinic-ray- or radiation-sensitive resin composition that can realize not only an enhancement of pattern profile and line edge roughness but also a high storage stability and further provide a method of forming a pattern using the composition.

The inventors have succeeded in developing an actinic-ray- or radiation-sensitive resin composition that can realize not only an enhancement of pattern profile and line edge roughness but also a high stability by lowering the nucleophilicity of a compound having a basic moiety. Moreover, the inventors have found that this stability-enhancing effect is strikingly manifest when the compound is used in combination with a resin with a lactone structure and a compound being susceptible to the nucleophilic attack from an alkyl aryl onium salt or the like.

The present invention in its one aspect is as follows.

(1) An actinic-ray- or radiation-sensitive resin composition comprising any of the compounds of general formula (I) below, a compound that when exposed to actinic rays or radiation, generates an acid and a hydrophobic resin, $$R_N\text{-}A^-X^+ \quad (I)$$

in general formula (I), $R_N$ represents a monovalent basic compound residue containing at least one nitrogen atom, the conjugate acid of the basic compound residue, $R_NH^+$, having a pKa value of 8 or less, $A^-$ represents —$SO_3^-$, —$CO_2^-$ or —$X_1$—$N^-$—$X_2$—$R_1$ in which each of $X_1$ and $X_2$ independently represents —CO— or —$SO_2$— and $R_1$ represents a monovalent organic group, and $X^+$ represents a counter cation.

(2) The actinic-ray- or radiation-sensitive resin composition according to item (1), wherein in general formula (I), $R_N$ is any of the groups of general formula (II) below, (II)

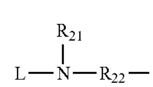

in general formula (II), $R_{21}$ represents a monovalent organic group, and $R_{22}$ represents a bivalent organic group, provided that $R_{21}$ and $R_{22}$ may be bonded to each other to thereby form a ring, L represents a functional group of −0.1 or greater in the $\sigma_p$ value of Hammett's rule, excluding a hydrogen atom, and

* represents a site of bonding to $A^-$.

(3) The actinic-ray- or radiation-sensitive resin composition according to item (1) or (2), wherein in general formula (I), $A^-$ represents $—X_1—N^-—X_2—R_1$ in which each of $X_1$ and $X_2$ independently represents —CO— or $—SO_2—$ and $R_1$ represents a monovalent organic group.

(4) The actinic-ray- or radiation-sensitive resin composition according to any of items (1) to (3), wherein the hydrophobic resin comprises a repeating unit containing a polarity conversion group and further comprises at least either a fluorine atom or a silicon atom.

(5) The actinic-ray- or radiation-sensitive resin composition according to any of items (1) to (4), wherein the hydrophobic resin comprises a repeating unit containing two or more polarity conversion groups.

(6) The actinic-ray- or radiation-sensitive resin composition according to any of items (1) to (5), wherein the content ratio of the hydrophobic resin is in the range of 0.01 to 20 mass % based on the total solids of the composition.

(7) The actinic-ray- or radiation-sensitive resin composition according to any of items (1) to (6), wherein the compound that when exposed to actinic rays or radiation, generates an acid is a sulfonium salt of fluoro-substituted alkanesulfonic acid, fluoro-substituted benzenesulfonic acid or fluoro-substituted imidic acid.

(8) The actinic-ray- or radiation-sensitive resin composition according to any of items (1) to (7) above, further comprising a resin that is decomposed by the action of an acid to thereby increase its solubility in an alkali developer.

(9) A method of forming a pattern, comprising the steps of forming the actinic-ray- or radiation-sensitive resin composition of any of items (1) to (8) into a film, exposing the film and developing the exposed film.

(10) The method of forming a pattern according to item (9), wherein the exposure is carried out by a liquid immersion exposure.

By virtue of the present invention, there can be provided an actinic-ray- or radiation-sensitive resin composition that can realize not only an enhancement of pattern profile and line edge roughness but also a high stability and further provided a method of forming a pattern using the composition.

BEST MODE FOR CARRYING OUT THE INVENTION

The present invention will be described in detail below.

With respect to the expression of a group (atomic group) used in this specification, the expression even when there is no mention of "substituted and unsubstituted" encompasses groups not only having no substituent but also having substituents. For example, the expression "alkyl groups" encompasses not only alkyls having no substituent (unsubstituted alkyls) but also alkyls having substituents (substituted alkyls).

[1] Compounds of General Formula (I)

The actinic-ray- or radiation-sensitive resin composition of the present invention contains any of the compounds of general formula (I) below (hereinafter also referred to as "compounds (A)").

$$R_N\text{-}A^-X^+ \qquad (I)$$

In general formula (I), $R_N$ represents a monovalent basic compound residue containing at least one nitrogen atom, the conjugate acid of the basic compound residue, $R_NH^+$, having a pKa value of 8 or less.

$A^-$ represents $—SO_3^-$, $—CO_2^-$ or $—X_1—N^-—X_2—R_1$ in which each of $X_1$ and $X_2$ independently represents —CO— or $—SO_2—$ and $R_1$ represents a monovalent organic group.

$X^+$ represents a counter cation.

In general formula (I), $A^-$ is preferably $—X_1—N^-—X_2—R_1$.

More preferably, at least one of $X_1$ and $X_2$ is $—SO_2—$.

The organic group represented by $R_1$ preferably has 1 to 40 carbon atoms. As such, there can be mentioned, for example, an alkyl group, a cycloalkyl group, an aryl group, an aralkyl group, an alkenyl group or the like.

A substituent may be introduced in the alkyl group represented by $R_1$. The alkyl group is preferably a linear or branched alkyl group having 1 to 30 carbon atoms. The alkyl group in its chain may contain an oxygen atom, a sulfur atom or a nitrogen atom. For example, there can be mentioned a linear alkyl group, such as a methyl group, an ethyl group, an n-propyl group, an n-butyl group, an n-pentyl group, an n-hexyl group, an n-octyl group, an n-dodecyl group, an n-tetradecyl group or an n-octadecyl group, or a branched alkyl group, such as an isopropyl group, an isobutyl group, a t-butyl group, a neopentyl group or a 2-ethylhexyl group.

A substituent may be introduced in the cycloalkyl group represented by $R_1$. A cycloalkyl group having 3 to 20 carbon atoms is preferred. The cycloalkyl group in its ring may have an oxygen atom or a nitrogen group. For example, there can be mentioned a cyclopropyl group, a cyclopentyl group, a cyclohexyl group, a norbornyl group, an adamantyl group or the like.

A substituent may be introduced in the aryl group represented by $R_1$. An aryl group having 6 to 14 carbon atoms is preferred. For example, there can be mentioned a phenyl group, a naphthyl group or the like.

A substituent may be introduced in the aralkyl group represented by $R_1$. An aralkyl group having 7 to 20 carbon atoms is preferred. For example, there can be mentioned a benzyl group, a phenethyl group, a naphthylmethyl group or a naphthylethyl group.

A substituent may be introduced in the alkenyl group represented by $R_1$. There can be mentioned groups resulting from the introduction of a double bond at an arbitrary position of any of the above alkyl groups.

As a substituent that can be introduced in each of the above groups represented by $R_1$, there can be mentioned, for example, a halogen atom, a hydroxyl group, a nitro group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably 2 to 10 carbon atoms) or the like. With respect to the ring structure of the aryl group, cycloalkyl group or the like, an alkyl group (preferably 1 to 10 carbon atoms) can be mentioned as a further substituent. With respect to the aminoacyl group, also, an alkyl group (preferably 1 to 10 carbon atoms) can be mentioned as a further substituent. As substituted alkyl groups, there can be mentioned, for example, perfluoroalkyl groups, such as a perfluoromethyl group, a perfluoroethyl group, a perfluoropropyl group and a perfluorobutyl group.

In general formula (I), $R_N$ is a monovalent basic compound residue containing at least one nitrogen atom, which is also hereinafter referred to as "basic moiety $R_N$" or the like. The conjugate acid of the basic moiety $R_N$, $R_NH^+$, has a value of pKa, as an acid dissociation constant, of 8 or less, preferably −2 to 8 and more preferably −1.5 to 7.8. In the present invention, the given pKa values are those calculated by ACD/ChemSketch (ACD/Labs 8.00 Release Product Version: 8.08).

The basic moiety $R_N$ is preferably represented by general formula (II) below.

(II)

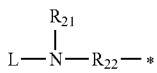

In general formula (II), $R_{21}$ represents a monovalent organic group, and $R_{22}$ represents a bivalent organic group, provided that $R_{21}$ and $R_{22}$ may be bonded to each other to thereby form a ring.

L represents a functional group of −0.1 or greater in the $Y_p$ value of Hammett's rule, excluding a hydrogen atom, and

* represents a site of bonding to $A^-$.

General formula (II) will be described in detail below.

L represents a functional group of −0.1 or greater in the $\sigma_p$ value of Hammett's rule (reference: Hansch et al., Chemical Reviews, 1991, Vol. 91, No. 2, pp. 165-195). L is preferably a functional group of −0.05 or greater in the $\sigma_p$ value, more preferably a functional group of −0.03 to 0.5 in the $\sigma_p$ value. With respect to the functional groups not listed in the reference, separately, the $\sigma_p$ value thereof can be calculated from the difference from the pKa value of benzoic acid by ACD/ChemSketch (ACD/Labs 8.00 Release Product Version: 8.08). As the functional group of −0.1 or greater in the $\sigma_p$ value, there can be mentioned, for example, an aryl group (for example, a phenyl group), an acyl group (for example, an acetyl group), an alkoxycarbonyl group (for example, a methoxycarbonyl group or a t-butoxycarbonyl group), an alkylcarbonyloxy group (for example, a methylcarbonyloxy group), a carboxyl group, an alkoxy group (for example, a methoxy group), a cyano group, a nitro group, a halogen atom, an alkyl group substituted with any of these functional groups, a group containing a lactone structure, or the like.

As the substituted alkyl group, it is especially preferred to use an alkyl group substituted with an acyl group, an alkoxycarbonyl group, an alkoxy group or a cyano group.

Among the above functional groups, those containing the following lactone structures are preferred.

KA-1-1

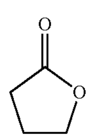

KA-1-2

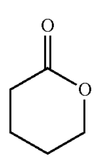

KA-1-3

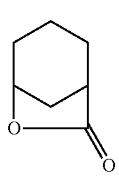

-continued

KA-1-4

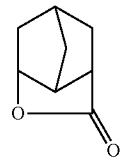

KA-1-5

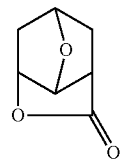

KA-1-6

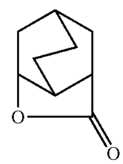

KA-1-7

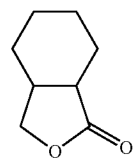

KA-1-8

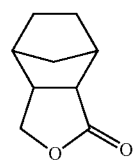

KA-1-9

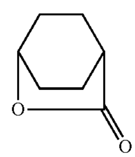

KA-1-10

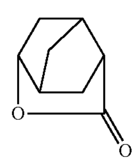

KA-1-11

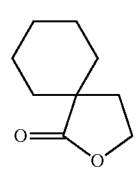

KA-1-12

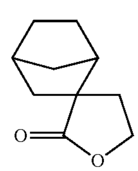

-continued

KA-1-13

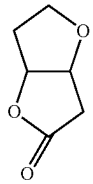

KA-1-14

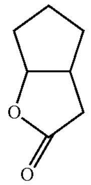

KA-1-15

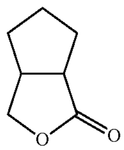

KA-1-16

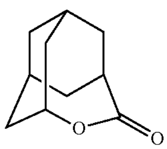

KA-1-17

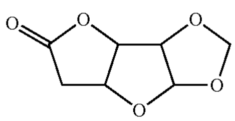

L may have a structure that can be decomposed by the acid generated by the compound that when exposed to actinic rays or radiation, generates an acid (acid generator) to be described hereinafter. For example, when L has a structure containing an alkoxycarbonyl group, if the alkyl group of the alkoxycarbonyl group has any of the structures of the formula —C($R_{36}$)($R_{37}$)($R_{38}$), the decomposition can be induced by the acid generated by the acid generator. In the formula, each of $R_{36}$ to $R_{38}$ independently represents an alkyl group, a cycloalkyl group, an aryl group, an aralkyl group or an alkenyl group. $R_{36}$ and $R_{37}$ may be bonded to each other to thereby form a ring.

The number of atoms as constituents of L (excluding hydrogen atoms) is not particularly limited. Generally, the number is in the range of 1 to 20. The number is preferably in the range of 1 to 15, more preferably 1 to 10.

As the organic group represented by $R_{21}$, there can be mentioned those set forth with respect to $R_1$ of general formula (I).

The bivalent organic group represented by $R_{22}$ is preferably any of those of general formula (III) below. In that instance, the basic moiety $R_N$ is expressed by general formula (IV) below.

$$—R_{42}—B—X_3—R_{41}—* \qquad \text{(III)}$$

$$L—N(R_{21})—R_{42}—B—X_3—R_{41}—* \qquad \text{(IV)}$$

In general formulae (III) and (IV), each of $R_{41}$ and $R_{42}$ independently represents a bivalent connecting group.

B represents a single bond, an oxygen atom or —N(Rx)—.

Rx represents a hydrogen atom or a monovalent organic group.

When B is —N(Rx)—, $R_{21}$ and Rx may be bonded to each other to thereby form a ring. $X_3$ represents —CO— or —$SO_2$—.

* represents a site of bonding to $A^-$.

$R_{21}$ and L have the same meaning as in general formula (II).

In general formulae (III) and (IV), the bivalent connecting group represented by $R_{41}$ is preferably a bivalent connecting group having 1 to 8 carbon atoms in which a fluorine atom is contained. As such, there can be mentioned, for example, an alkylene group having 1 to 8 carbon atoms in which a fluorine atom is contained, a phenylene group containing a fluorine atom, or the like. The alkylene group containing a fluorine atom is more preferred, which preferably has 2 to 6 carbon atoms, more preferably 2 to 4 carbon atoms. The alkylene group in its chain may contain a connecting group, such as an oxygen atom or a sulfur atom. It is preferred for the alkylene group to be one having hydrogen atoms, 30 to 100% of which are substituted with a fluorine atom. Perfluoroalkylene groups are more preferred. A perfluoroethylene group, a perfluoropropylene group and a perfluorobutylene group are most preferred.

The bivalent connecting group represented by $R_{42}$ is preferably an alkylene group, a phenylene group or the like. An alkylene group is especially preferred.

B is preferably —N(Rx)—. The monovalent organic group represented by Rx preferably has 1 to 8 carbon atoms. As such, there can be mentioned, for example, an alkyl group, a cycloalkyl group, an aryl group, an aralkyl group, an alkenyl group or the like. As the alkyl group, cycloalkyl group, aryl group, aralkyl group or alkenyl group, there can be mentioned those set forth above.

$X_3$ is preferably —$SO_2$—.

The basic moiety $R_N$ in its one form is expressed by general formula (V) below.

(V)

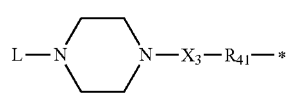

In general formula (V), $R_{41}$, $X_3$, L and * are as defined above in connection with general formula (IV).

In general formula (I), the counter cation represented by $X^+$ is preferably an onium, more preferably a sulfonium or an iodonium.

The sulfonium and iodonium are the same as those contained in the compounds of general formulae (ZI) and (ZII) given in connection with the compound that when exposed to actinic rays or radiation, generates an acid (acid generator) to be described hereinafter. Particular examples thereof are also the same as those of the sulfonium and iodonium contained in the compounds (z1) to (z70) to be described hereinafter.

Particular examples of the compounds (A) of general formula (I) will be shown below, which should not be construed as limiting the scope of the present invention. The pKa values appearing below are those calculated with respect to the conjugate acid of the basic moiety $R_N$ by the method to be described hereinafter.

(A-1)
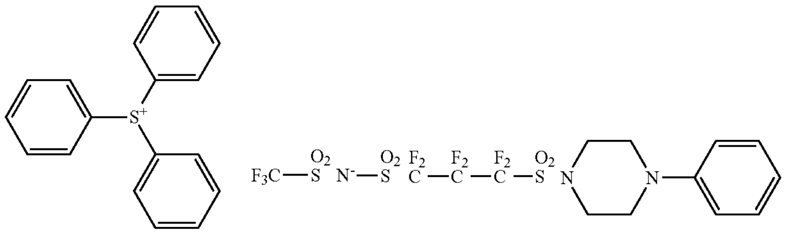
pKa 5.68
(A-2)
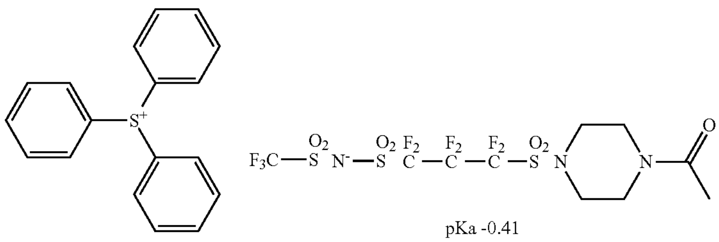
pKa -0.41
(A-3)
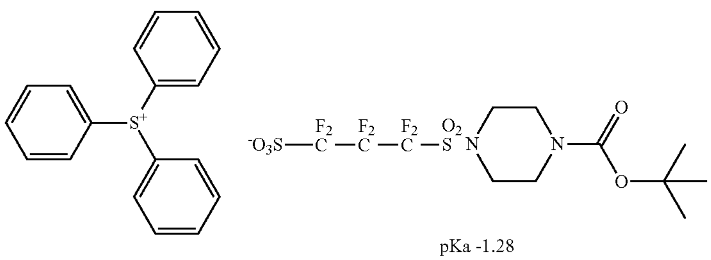
pKa -1.28
(A-4)
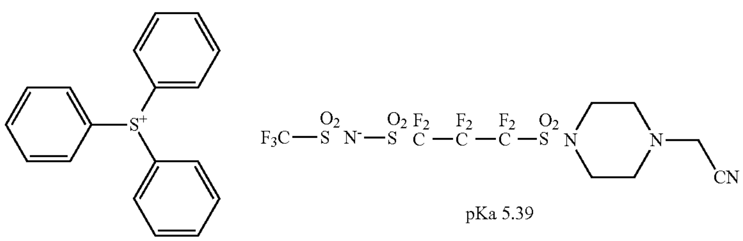
pKa 5.39
(A-5)
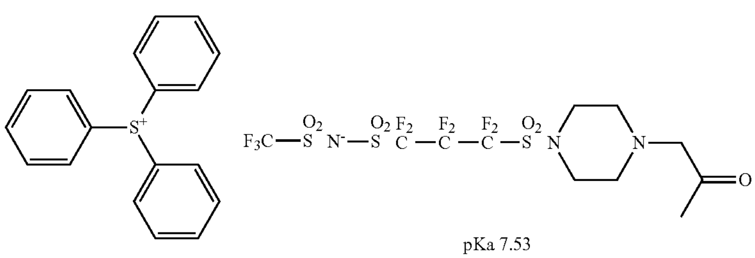
pKa 7.53
(A-6)
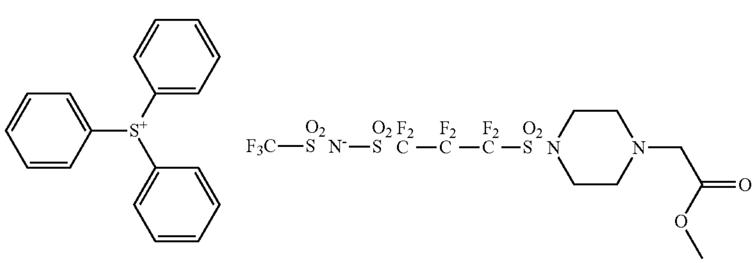
pKa 7.37

-continued
(A-7)
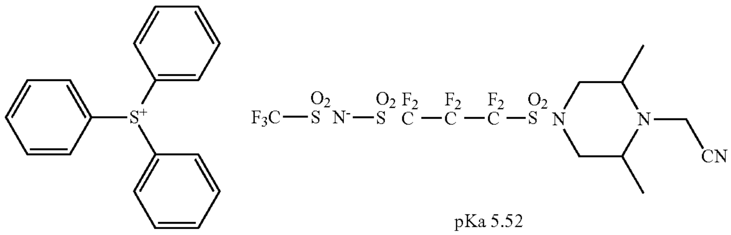
pKa 5.52
(A-8)
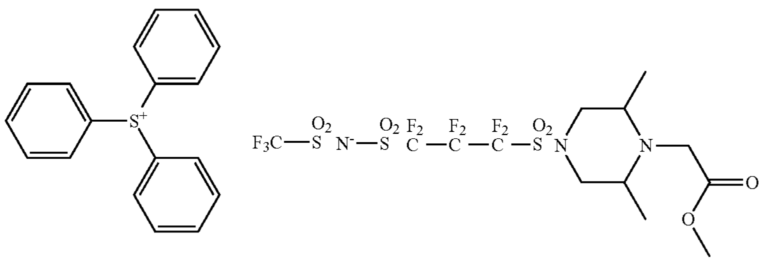
pKa 7.5
(A-9)
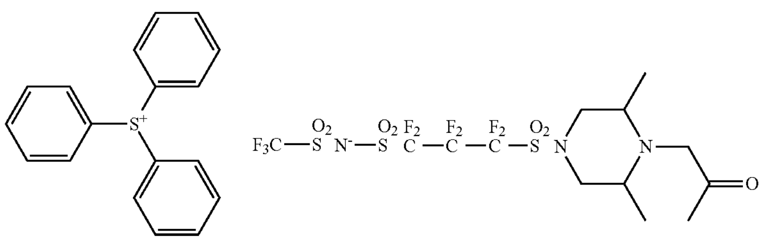
pKa 7.66
(A-10)
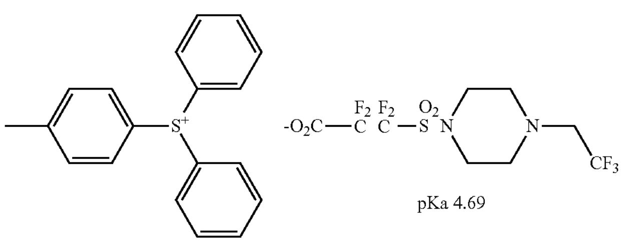
pKa 4.69
(A-11)
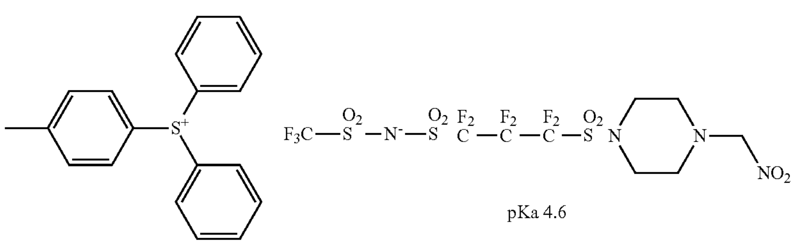
pKa 4.6
(A-12)
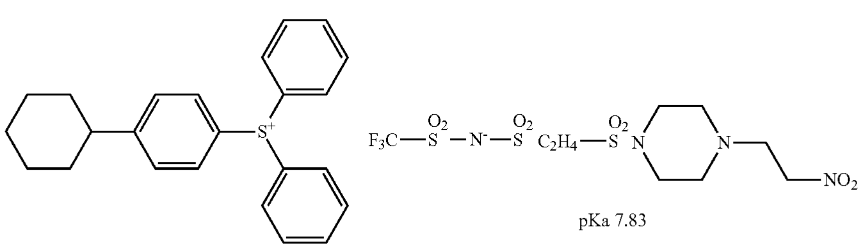
pKa 7.83

-continued
(A-13)
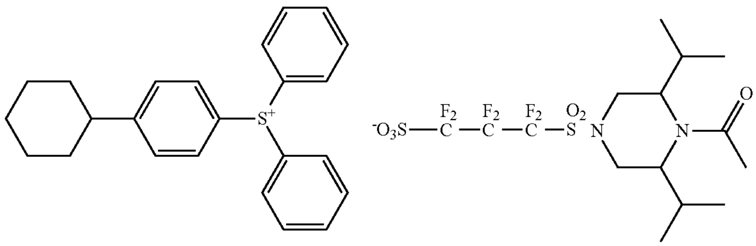
pKa -0.41
(A-14)
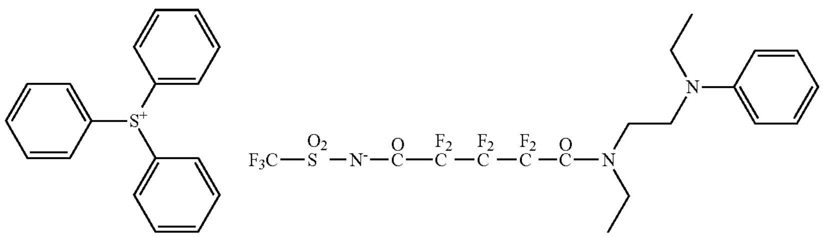
pKa 6.69
(A-15)
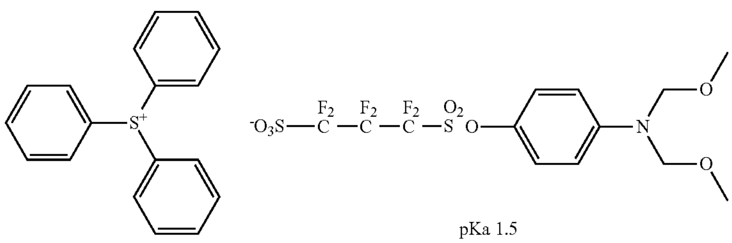
pKa 1.5
(A-16)
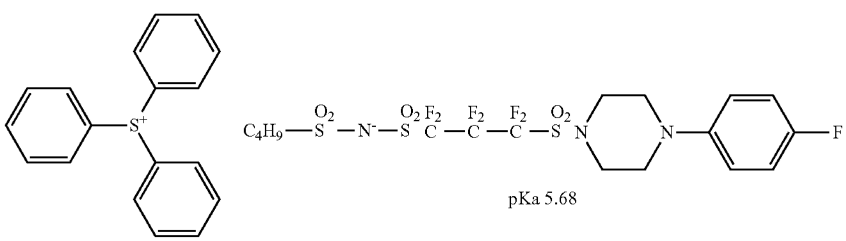
pKa 5.68
(A-17)
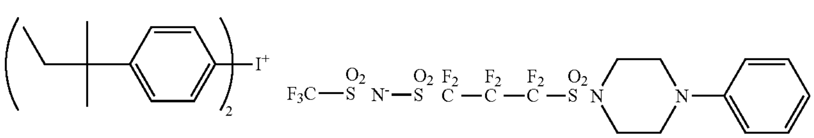
pKa 5.68
(A-18)
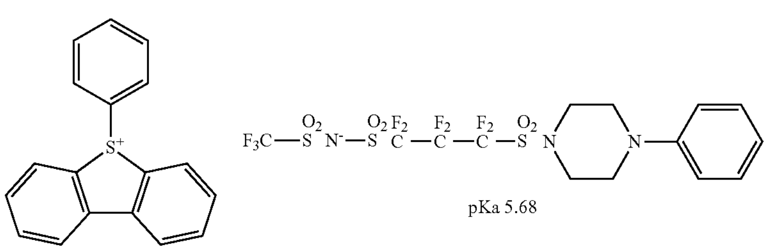
pKa 5.68

-continued (A-19)

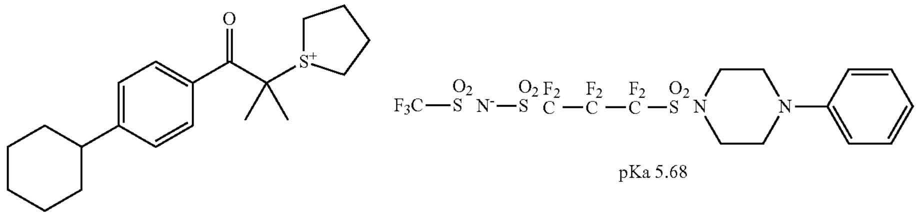

pKa 5.68

(A-20)

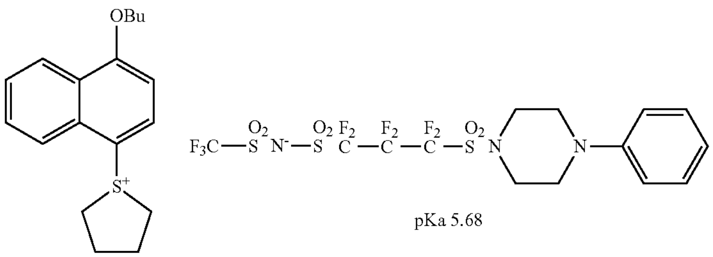

pKa 5.68

(A-21)

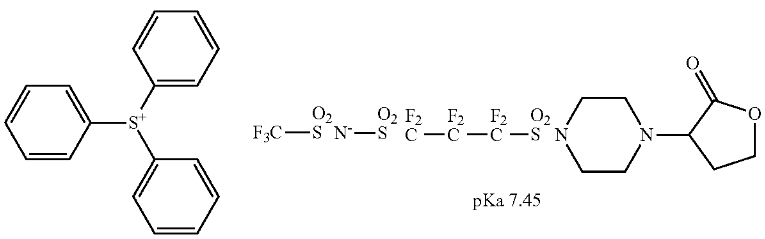

pKa 7.45

(A-22)

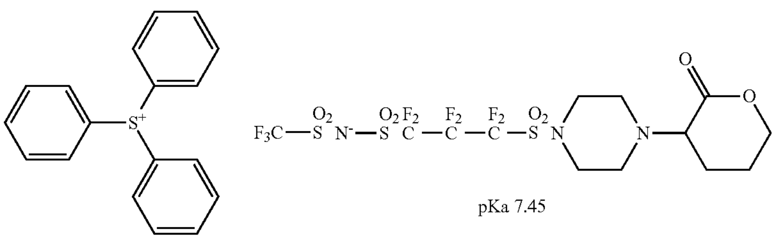

pKa 7.45

(A-23)

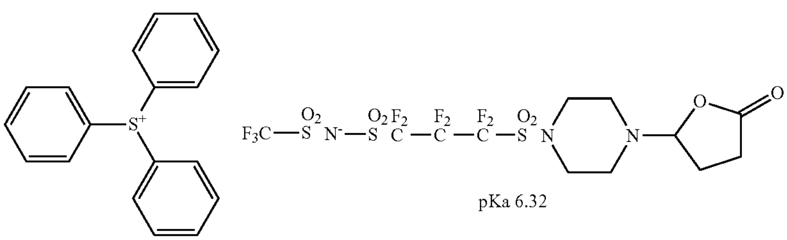

pKa 6.32

The content of the compound (A) in the actinic-ray- or radiation-sensitive resin composition of the present invention is preferably in the range of 0.1 to 20 mass %, more preferably 0.1 to 15 mass % and further more preferably 2 to 10 mass %, based on the total solids of the composition.

The compounds (A) can be synthesized in the same manner as described in JP-A-2006-330098.

[2] Hydrophobic Resin

The actinic-ray- or radiation-sensitive resin composition of the present invention contains a hydrophobic resin (HR).

When a hydrophobic resin is contained, the hydrophobic resin is unevenly localized in the surface layer of the film of the actinic-ray- or radiation-sensitive resin. Thus, when water is used as a liquid immersion medium, there can be increased the receding contact angle of the film with reference to the immersion liquid. Accordingly, the immersion liquid tracking property of the film can be enhanced.

The receding contact angle of the film after bake but before exposure is preferably in the range of 60° to 90°, more preferably 65° or greater, further more preferably 70° or greater and most preferably 75° or greater at 23±3° C. in a humidity of 45±5%.

Although the hydrophobic resin is unevenly localized on the interface as aforementioned, differing from the surfactant, the hydrophobic resin does not necessarily have to have a hydrophilic group in its molecule and does not need to contribute toward uniform mixing of polar/nonpolar substances.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the film in dynamic condition is important, and it is required for the actinic-ray- or radiation-sensitive resin composition to be capable of tracking the high-speed scanning of the exposure head without leaving any droplets.

It is preferred for the hydrophobic resin (HR) to be a resin containing at least either a fluorine atom or a silicon atom. In the hydrophobic resin (HR), the fluorine atom or silicon atom may be introduced in the principal chain of the resin or in the side chain thereof as a substituent. When the hydrophobic resin contains at least either a fluorine atom or a silicon atom, the hydrophobicity (water tracking property) of the film surface is increased, thereby attaining a reduction of development residue (scum).

The hydrophobic resin (HR) is preferably a resin having an alkyl group containing a fluorine atom, a cycloalkyl group containing a fluorine atom or an aryl group containing a fluorine atom as a partial structure containing a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a cycloalkyl group of a single ring or multiple rings having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing a fluorine atom, cycloalkyl groups containing a fluorine atom and aryl groups containing a fluorine atom, there can be mentioned groups of the following general formulae (F2) to (F4), which however in no way limit the scope of the present invention.

(F2)

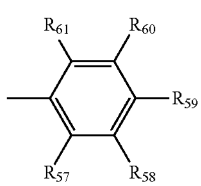

(F3)

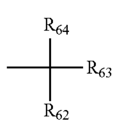

(F4)

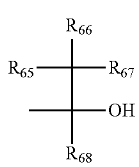

In the general formulae (F2) to (F4), each of $R_{57}$ to $R_{68}$ independently represents a hydrogen atom, a fluorine atom or an alkyl group, provided that at least one of each of $R_{57}$-$R_{61}$, $R_{62}$-$R_{64}$ and $R_{65}$-$R_{68}$ represents a fluorine atom or an alkyl group (preferably having 1 to 4 carbon atoms) having at least one hydrogen atom thereof substituted with a fluorine atom. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group (especially having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded with each other to thereby form a ring.

Specific examples of the groups of the general formula (F2) include a p-fluorophenyl group, a pentafluorophenyl group, a 3,5-di(trifluoromethyl)phenyl group and the like.

Specific examples of the groups of the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of the general formula (F4) include —$C(CF_3)_2OH$, —$C(C_2F_5)_2OH$, —$C(CF_3)(CF_3)OH$, —$CH(CF_3)OH$ and the like. —$C(CF_3)_2OH$ is preferred.

As preferred repeating units having a fluorine atom, there can be mentioned the repeating units represented by the general formulae below.

(C-Ia)

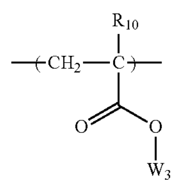

(C-Ib)

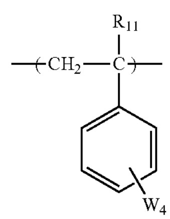

(C-Ic)

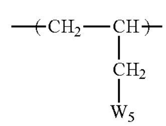

(C-Id)

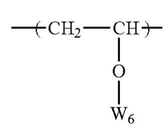

In the formulae, each of $R_{10}$ and $R_{11}$ independently represents a hydrogen atom, a fluorine atom or an alkyl group (preferably a linear or branched alkyl group having 1 to 4 carbon atoms; as a substituted alkyl group, there can be mentioned, in particular, a fluorinated alkyl group).

Each of $W_3$ to $W_6$ independently represents an organic group containing at least one fluorine atom. As such, for example, there can be mentioned the groups of general formulae (F2) to (F4) above.

Further, besides these, the following units may be introduced as the repeating unit containing a fluorine atom.

(C-II)

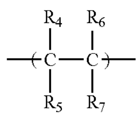

(C-III)

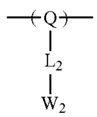

In the formulae, each of $R_4$ to $R_7$ independently represents a hydrogen atom, a fluorine atom or an alkyl group (preferably a linear or branched alkyl group having 1 to 4 carbon atoms; as a substituted alkyl group, there can be mentioned, in particular, a fluorinated alkyl group), provided that at least one of $R_4$ to $R_7$ represents a fluorine atom. $R_4$ and $R_5$, or $R_6$ and $R_7$ may cooperate with each other to thereby form a ring.

$W_2$ represents an organic group containing at least one fluorine atom. As such, for example, there can be mentioned the atomic groups of general formulae (F2) to (F4) above.

Q represents an alicyclic structure. The alicyclic structure may have a substituent, and may be monocyclic or polycyclic. The alicyclic structure when being polycyclic may be a bridged one. The alicyclic structure when being monocyclic is preferably a cycloalkyl group having 3 to 8 carbon atoms. As such, there can be mentioned, for example, a cyclopentyl group, a cyclohexyl group, a cyclobutyl group, a cyclooctyl group or the like. As the polycyclic one, there can be mentioned a group with, for example, a bicyclo, tricyclo or tetracyclo structure having 5 or more carbon atoms. A cycloalkyl group having 6 to 20 carbon atoms is preferred. As such, there can be mentioned, for example, an adamantyl group, a norbornyl group, a dicyclopentyl group, a tricyclodecanyl group, a tetracyclododecyl group or the like. The carbon atoms of the cycloalkyl group may be partially replaced with a heteroatom, such as an oxygen atom.

$L_2$ represents a single bond or a bivalent connecting group. As the bivalent connecting group, there can be mentioned a substituted or unsubstituted arylene group, a substituted or unsubstituted alkylene group, a substituted or unsubstituted cycloalkylene group, —O—, —$SO_2$—, —CO—, —N(R)— (in the formula, R is a hydrogen atom or an alkyl group), —$NHSO_2$— or a bivalent connecting group consisting of a combination of two or more of these.

The hydrophobic resin (HR) may contain a silicon atom. It is preferred for the resin to have an alkylsilyl structure (preferably a trialkylsilyl group) or a cyclosiloxane structure as a partial structure having a silicon atom.

As the alkylsilyl structure or cyclosiloxane structure, there can be mentioned, for example, any of the groups of the following general formulae (CS-1) to (CS-3) or the like.

(CS-1)

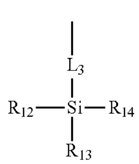

-continued (CS-2)

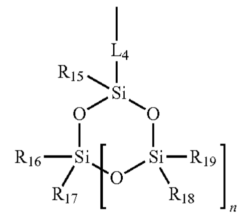

(CS-3)

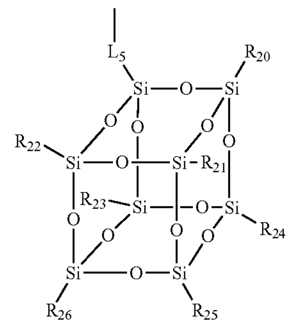

In general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group.

In the formulae, n is an integer of 1 to 5. n is preferably an integer of 2 to 4.

Particular examples of the repeating units containing a fluorine atom or silicon atom will be shown below. In particular examples, $X_1$ represents a hydrogen atom, —$CH_3$, —F or —$CF_3$, and $X_2$ represents —F or —$CF_3$.

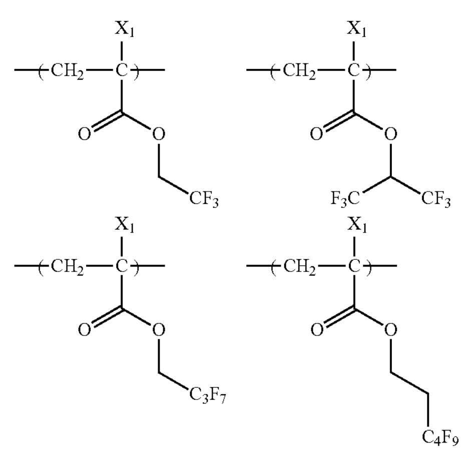

-continued
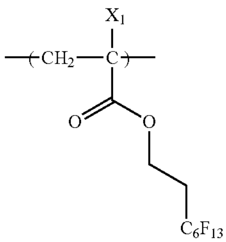
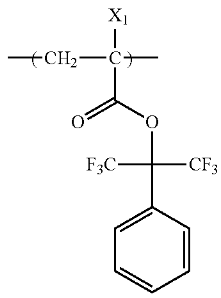
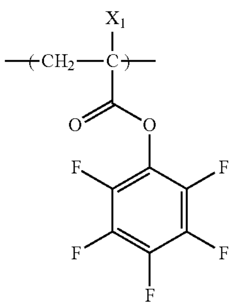
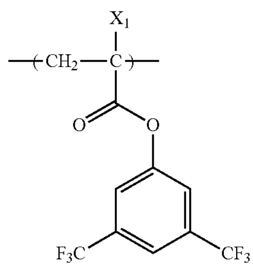
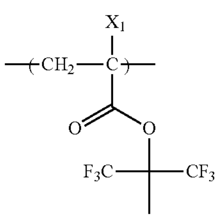
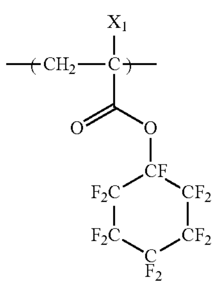
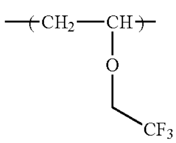
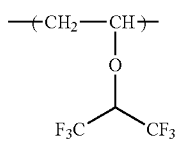
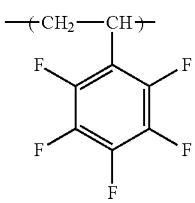
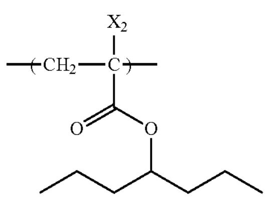
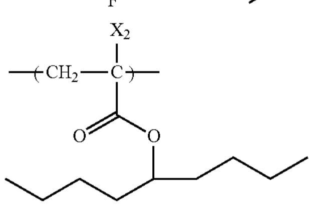
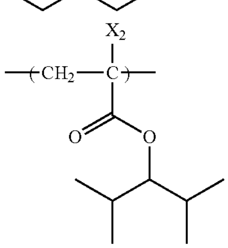
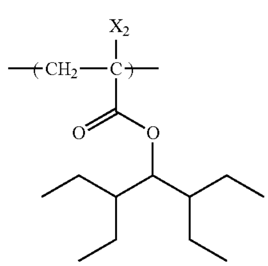
-continued
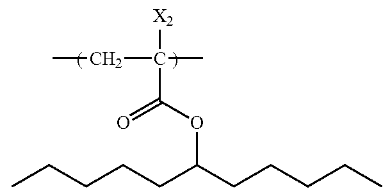
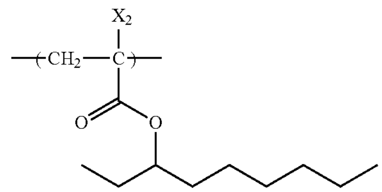
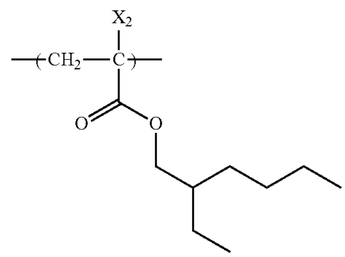
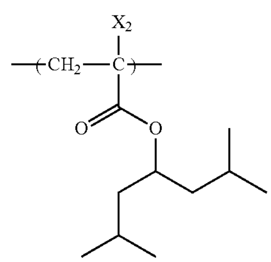
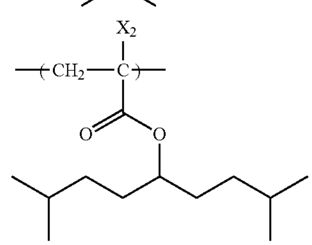
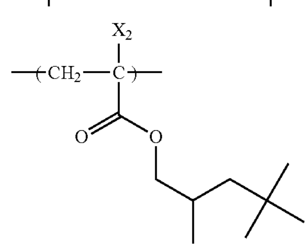
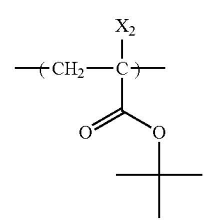
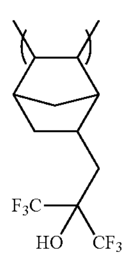
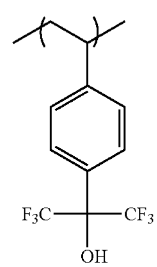

-continued
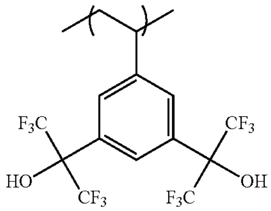
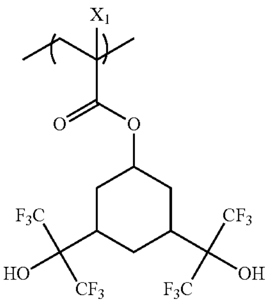
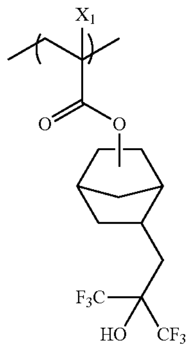
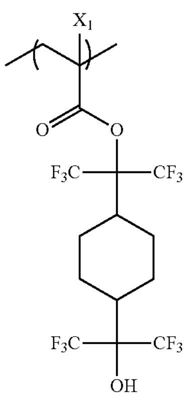
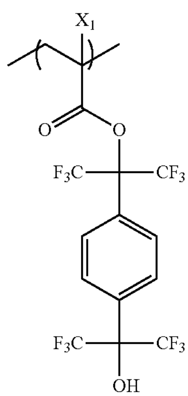
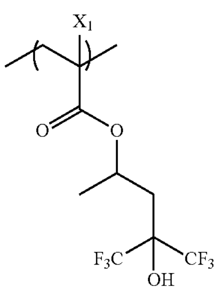
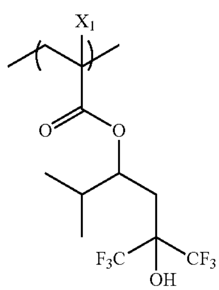
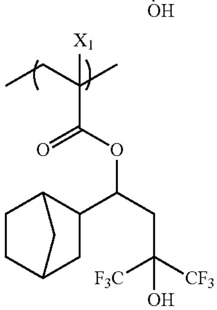
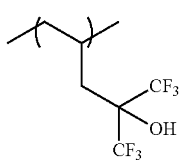
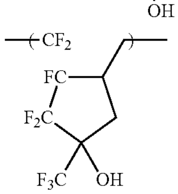
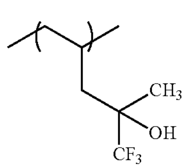
-continued
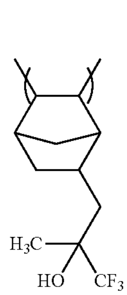
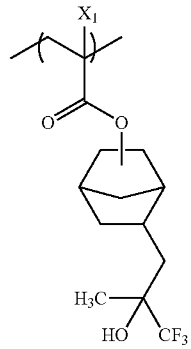
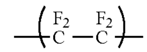
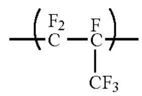
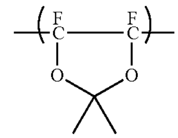
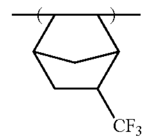
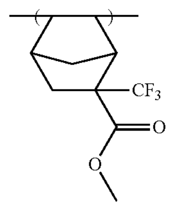
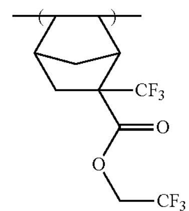
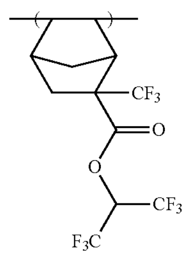
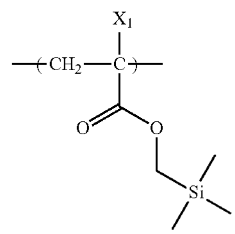
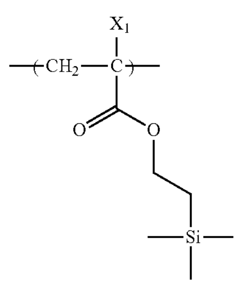
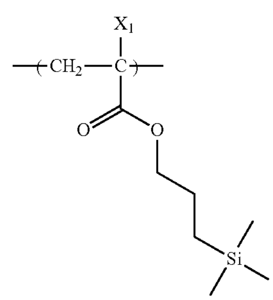
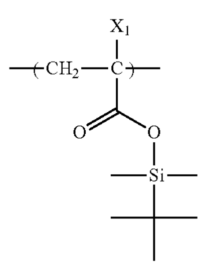
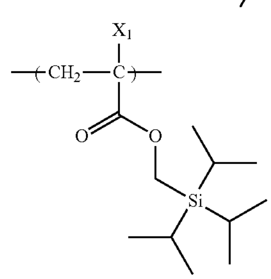
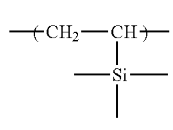
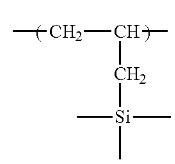

-continued

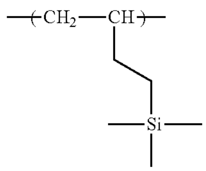

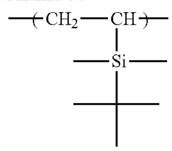

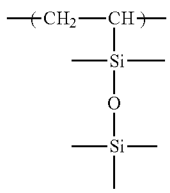

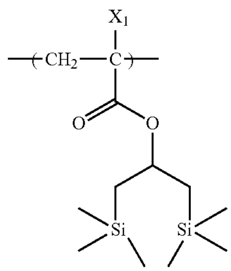

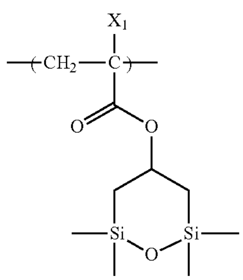

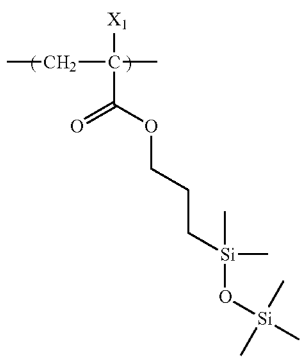

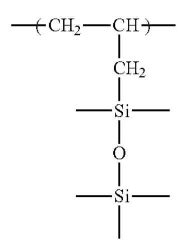

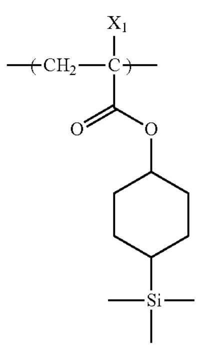

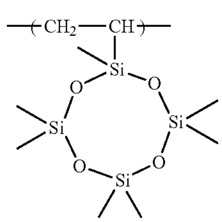

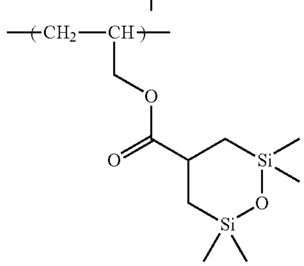

-continued

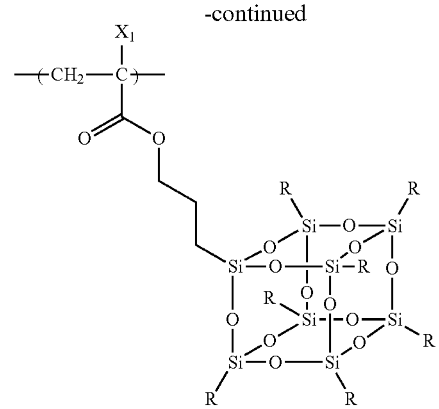

R = $CH_3$, $C_2H_5$, $C_3H_7$, $C_4H_9$

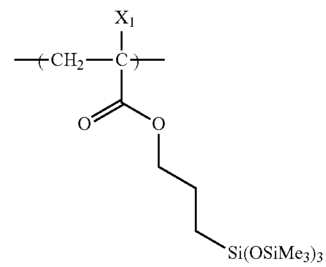

Moreover, the hydrophobic resin (HR) may have at least one group selected from among the following groups (x) to (z):

(x) an alkali soluble group, (y) a group that is decomposed by the action of an alkali developer, resulting in an increase of solubility in the alkali developer, and (z) a group that is decomposed by the action of an acid.

As the alkali soluble group (x), there can be mentioned a phenolic hydroxyl group, a carboxylate group, a fluoroalcohol group, a sulfonate group, a sulfonamido group, a sulfonylimido group, an (alkylsulfonyl) (alkylcarbonyl)methylene group, an (alkylsulfonyl) (alkylcarbonyl)imido group, a bis (alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris (alkylsulfonyl)methylene group or the like.

As preferred alkali soluble groups, there can be mentioned a fluoroalcohol group (preferably hexafluoroisopropanol), a sulfonimido group and a bis(carbonyl)methylene group.

As the repeating unit having an alkali soluble group (x), preferred use is made of any of a repeating unit resulting from direct bonding of an alkali soluble group to the principal chain of a resin like a repeating unit of acrylic acid or methacrylic acid, a repeating unit resulting from bonding, via a connecting group, of an alkali soluble group to the principal chain of a resin and a repeating unit resulting from polymerization with the use of a chain transfer agent or polymerization initiator having an alkali soluble group to thereby introduce the same in a polymer chain terminal.

The content ratio of repeating units having an alkali soluble group (x) is preferably in the range of 1 to 50 mol %, more preferably 3 to 35 mol % and still more preferably 5 to 20 mol % based on all the repeating units of the hydrophobic resin.

Specific examples of the repeating units having an alkali soluble group (x) will be shown below.

In the formulae, Rx represents H, $CH_3$, $CF_3$ or $CH_2OH$.

-continued
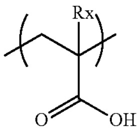
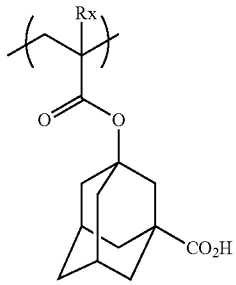
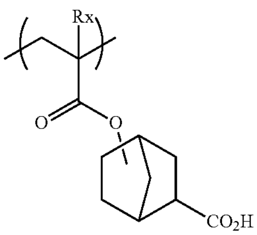
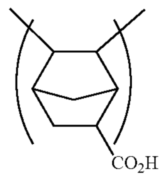
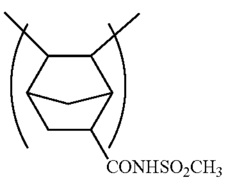
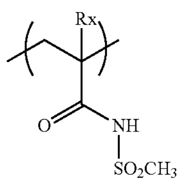
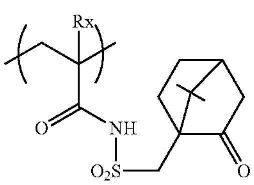
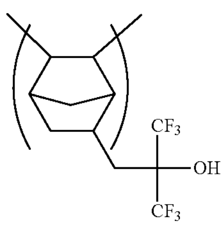
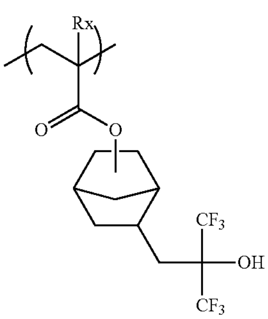
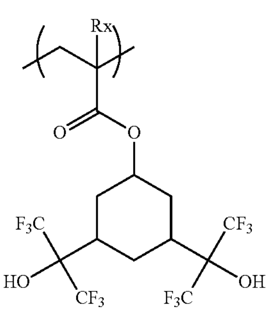
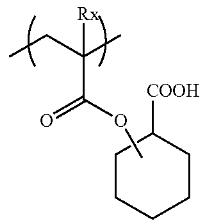
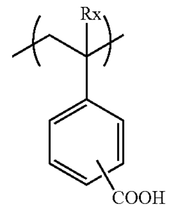
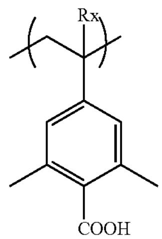
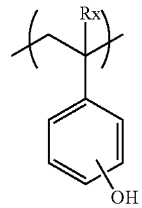
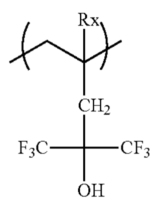
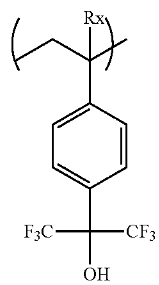
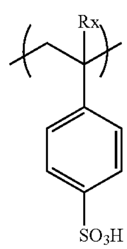
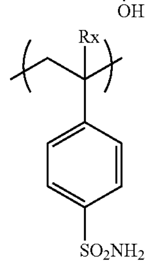
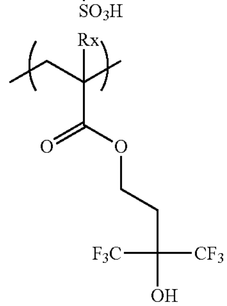
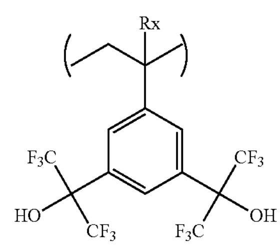
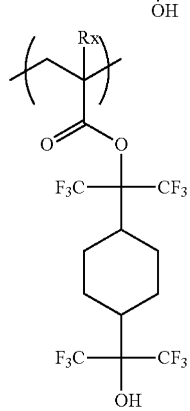
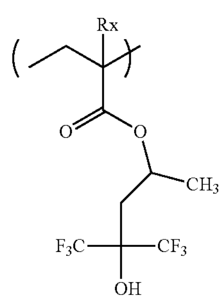

-continued

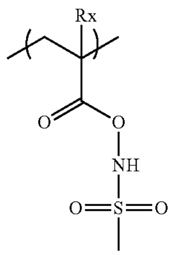

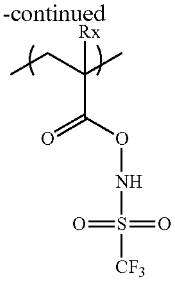

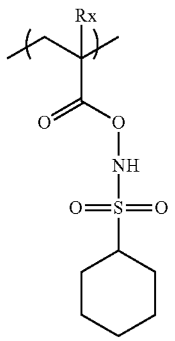

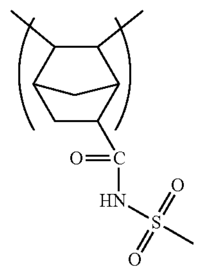

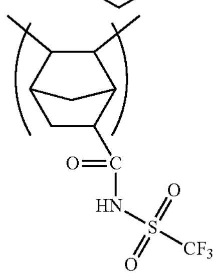

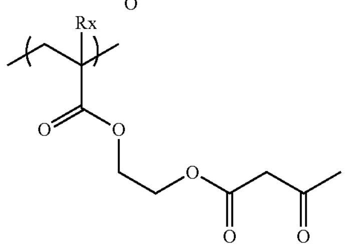

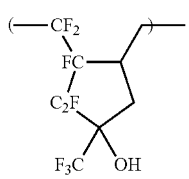

As the group (y) that is decomposed by the action of an alkali developer, resulting in an increase of solubility in the alkali developer, there can be mentioned, for example, a group having a lactone structure, an acid anhydride group, an acid imide group or the like. A group having a lactone structure is preferred.

As the repeating unit having a group (y) that is decomposed by the action of an alkali developer, resulting in an increase of solubility in the alkali developer, preferred use is made of both of a repeating unit resulting from bonding of a group (y) that is decomposed by the action of an alkali developer, resulting in an increase of solubility in the alkali developer, to the principal chain of a resin such as a repeating unit of acrylic ester or methacrylic ester, and a repeating unit resulting from polymerization with the use of a chain transfer agent or polymerization initiator having a group (y) resulting in an increase of solubility in an alkali developer to thereby introduce the same in a polymer chain terminal.

The content ratio of repeating units having a group (y) resulting in an increase of solubility in an alkali developer is preferably in the range of 1 to 40 mol %, more preferably 3 to 30 mol % and still more preferably 5 to 15 mol % based on all the repeating units of the hydrophobic resin.

As specific examples of the repeating units having a group (y) resulting in an increase of solubility in an alkali developer, there can be mentioned those similar to the repeating units having a lactone structure set forth with respect to after-mentioned resin (B).

As the repeating unit having a group (z) that is decomposed by the action of an acid in the hydrophobic resin (HR), there can be mentioned those similar to the repeating units having an acid decomposable group set forth with respect to after-mentioned resin (B).

The content ratio of repeating units having a group (z) that is decomposed by the action of an acid in the hydrophobic resin (HR) is preferably in the range of 1 to 80 mol %, more preferably 10 to 80 mol % and still more preferably 20 to 60 mol % based on all the repeating units of the hydrophobic resin.

The hydrophobic resin (HR) may further have any of the repeating units of general formula (VI), below.

(VI)

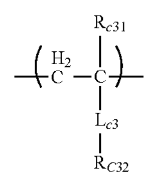

In general formula (VI), $R_{c31}$ represents a hydrogen atom, an alkyl group, an alkyl group substituted with a fluorine atom, a cyano group or —$CH_2$—O-$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, especially preferably a hydrogen atom or a methyl group.

$R_{c32}$ represents a group having any of an alkyl group, a cycloalkyl group, an alkenyl group, a cycloalkenyl group and an aryl group. These groups may optionally be substituted with a fluorine atom or a silicon atom.

$L_{c3}$ represents a single bond or a bivalent connecting group.

In general formula (VI), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms. As such, there can be mentioned a phenyl group or a naphthyl group. The aryl group may have a substituent.

Preferably, $R_{c32}$ represents an unsubstituted alkyl group or an alkyl group substituted with a fluorine atom.

The bivalent connecting group represented by $L_{c3}$ is preferably an alkylene group (preferably having 1 to 5 carbon atoms), an oxy group, a phenylene group or an ester bond (group of the formula —COO—).

The repeating units of general formula (VI) may be those of general formula (VII) or (VIII) below.

(VII)

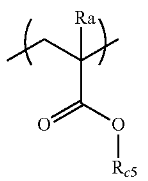

(VIII)

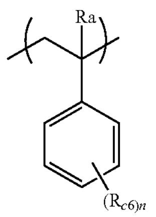

In general formula (VII), $R_{c5}$ represents a hydrocarbon group having at least one cyclic structure in which neither a hydroxyl group nor a cyano group is contained.

Ra represents a hydrogen atom, an alkyl group that may be substituted with a fluorine atom, a cyano group or a group of the formula —$CH_2$—O-$Rac_2$ in which $Rac_2$ represents a hydrogen atom, an alkyl group or an acyl group. Ra is preferably a hydrogen atom, a methyl group, a hydroxymethyl group and a trifluoromethyl group, especially preferably a hydrogen atom and a methyl group.

The cyclic structures contained in $R_{c5}$ include a monocyclic hydrocarbon group and a polycyclic hydrocarbon group. As the monocyclic hydrocarbon group, there can be mentioned, for example, a cycloalkyl group having 3 to 12 carbon atoms or a cycloalkenyl group having 3 to 12 carbon atoms. Preferably, the monocyclic hydrocarbon group is a monocyclic hydrocarbon group having 3 to 7 carbon atoms.

The polycyclic hydrocarbon groups include ring-assembly hydrocarbon groups and crosslinked-ring hydrocarbon groups. As the crosslinked-ring hydrocarbon rings, there can be mentioned, for example, bicyclic hydrocarbon rings, tricyclic hydrocarbon rings and tetracyclic hydrocarbon rings. Further, the crosslinked-ring hydrocarbon rings include condensed-ring hydrocarbon rings, for example, condensed rings resulting from condensation of multiple 5- to 8-membered cycloalkane rings. As preferred crosslinked-ring hydrocarbon rings, there can be mentioned, for example, a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

In general formula (VIII), Ra has the same meaning as in general formula (VII).

$R_{c6}$ represents an alkyl group, a cycloalkyl group, an alkenyl group, a cycloalkenyl group, an alkoxycarbonyl group or an alkylcarbonyloxy group. These groups may be substituted with a fluorine atom or a silicon atom.

The alkyl group represented by $R_{c6}$ is preferably a linear or branched alkyl group having 1 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The alkoxycarbonyl group is preferably an alkoxycarbonyl group having 2 to 20 carbon atoms.

The alkylcarbonyloxy group is preferably an alkylcarbonyloxy group having 2 to 20 carbon atoms.

In the formula, n is an integer of 0 to 5. When n is 2 or greater, the plurality of $R_{c6}$s may be identical to or different from each other.

It is preferred for $R_{c6}$ to represent an unsubstituted alkyl group or an alkyl group substituted with a fluorine atom. A trifluoromethyl group and a t-butyl group are especially preferred.

Further, the hydrophobic resin (HR) may preferably have any of the repeating units of general formula (CII-AB) below.

(CII-AB)

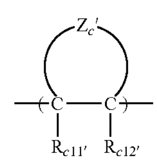

In general formula (CII-AB), each of $R_{c11'}$ and $R_{c12'}$ independently represents a hydrogen atom, a cyano group, a halogen atom or an alkyl group.

Zc' represents an atomic group for forming an alicyclic structure which contains two bonded carbon atoms (C—C).

Further preferably, general formula (CII-AB) is either general formula (CII-AB1) or general formula (CII-AB2) below.

CII-AB1

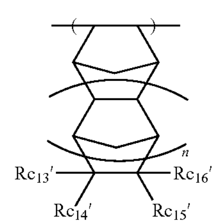

-continued

CII-AB2

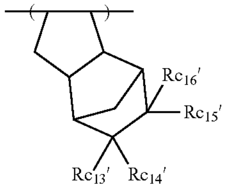

In general formulae (CII-AB1) and (CII-AB2), each of $Rc_{13'}$ to $Rc_{16'}$ independently represents a hydrogen atom, a halogen atom, an alkyl group or a cycloalkyl group. At least two of $Rc_{13'}$ to $Rc_{16'}$ may be bonded to each other to thereby form a ring.

n is 0 or 1.

Specific examples of repeating units of general formulae (VI) and (CII-AB) will be shown below, which however in no way limit the scope of the present invention. In the formulae, Ra represents H, $CH_3$, $CH_2OH$, $CF_3$ or CN.

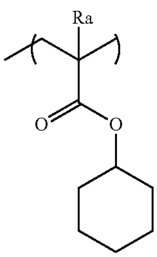
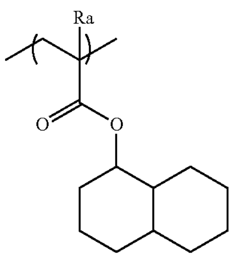
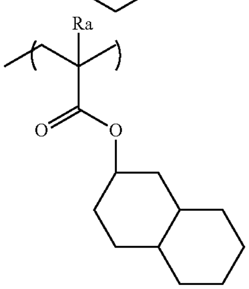
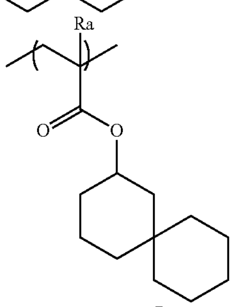
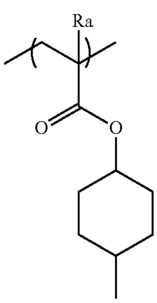
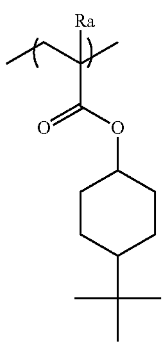
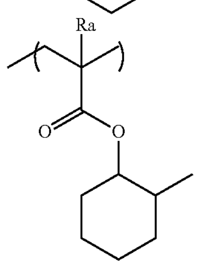
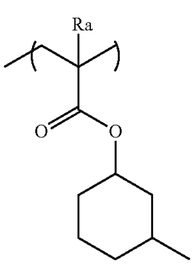
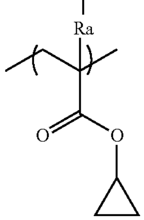
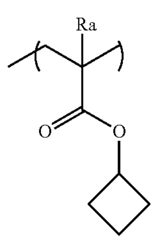

-continued

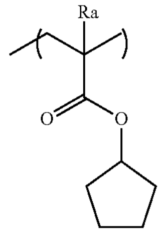
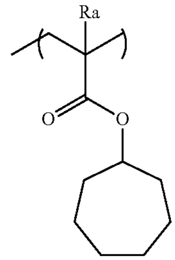
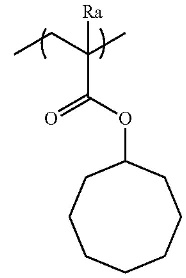
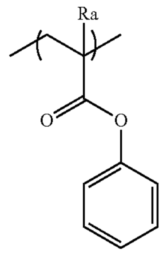
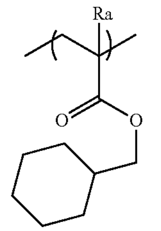
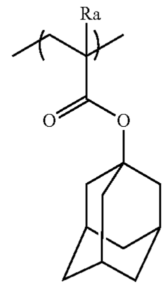
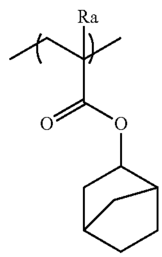
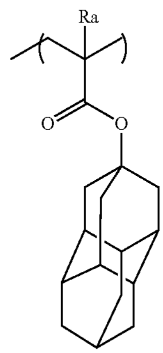
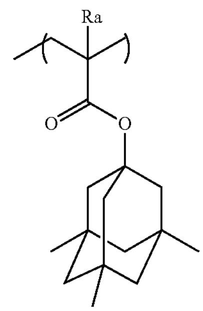
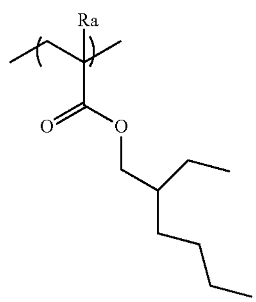
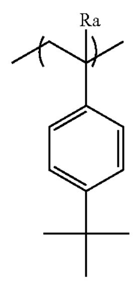
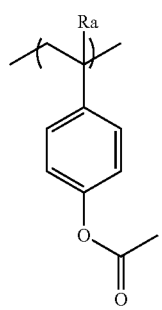
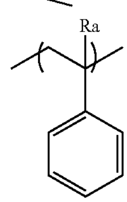
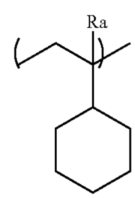
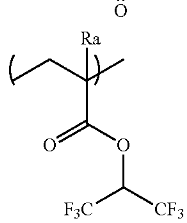
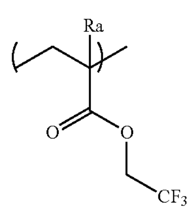

-continued
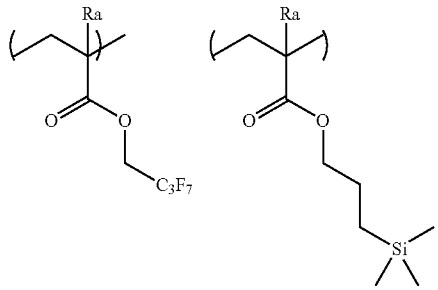
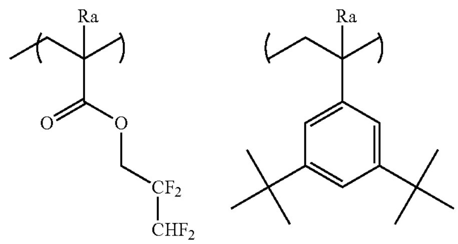
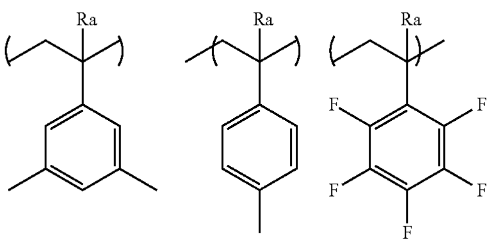
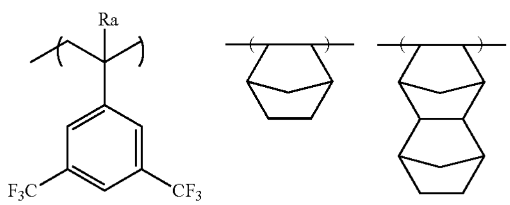
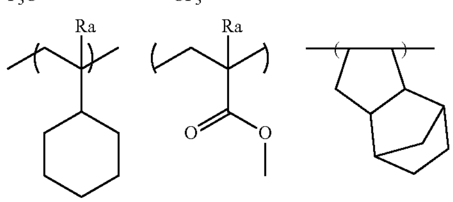
Specific examples of the hydrophobic resins (HR) will be shown below. The following Table 1 shows the molar ratio of individual repeating units (corresponding to individual repeating units in order from the left), weight average molecular weight and degree of dispersal with respect to each of the resins.
(HR-1)
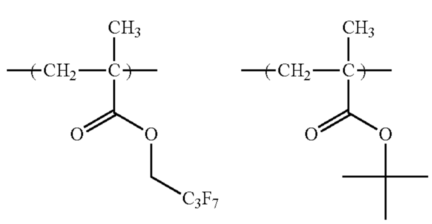
-continued
(HR-2)
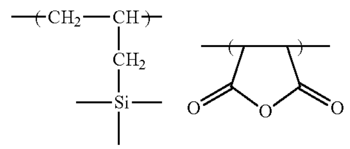
(HR-3)
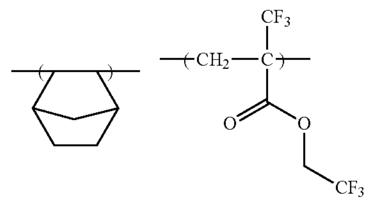
(HR-4)
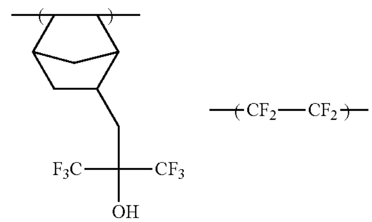
(HR-5)
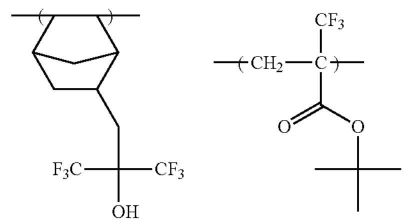
(HR-6)
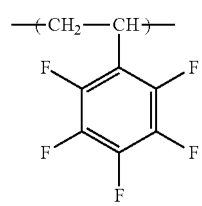
(HR-7)
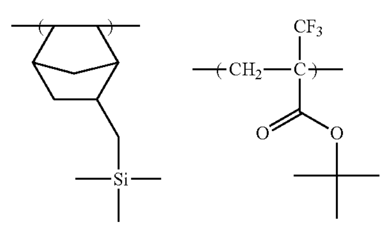
(HR-8)
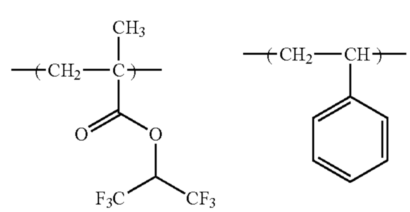

-continued
(HR-9)
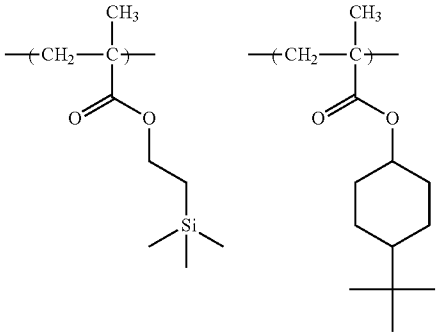
(HR-10)
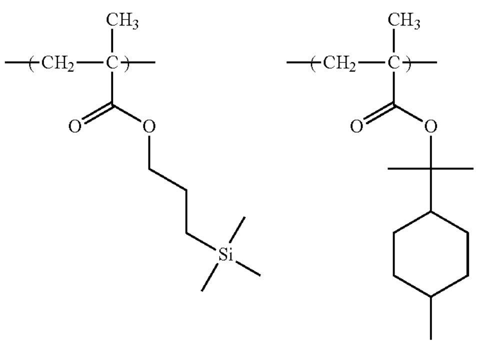
(HR-11)
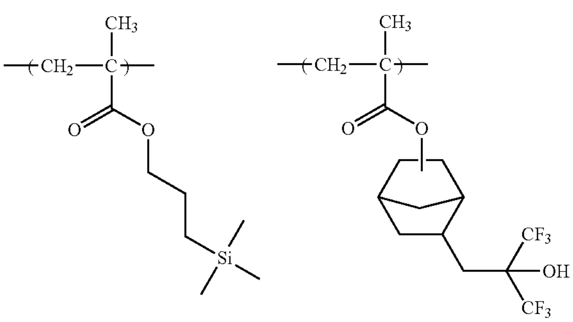
(HR-12)
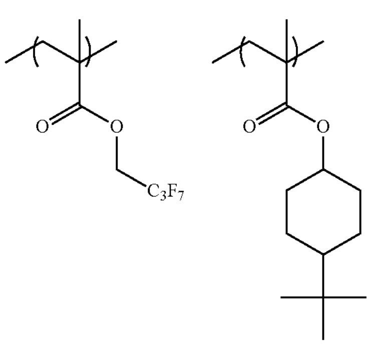
-continued
(HR-13)
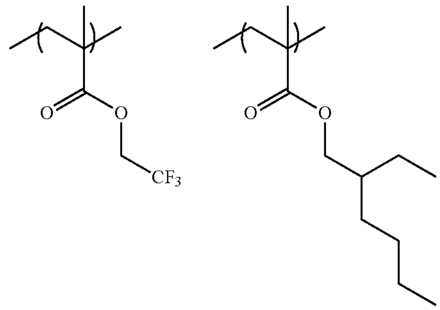
(HR-14)
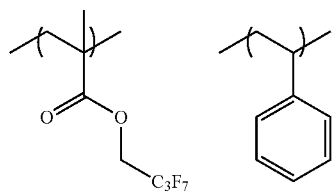
(HR-15)
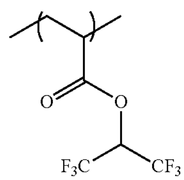
(HR-16)
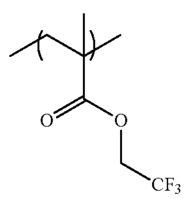
(HR-17)
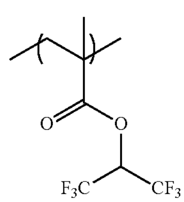
(HR-18)
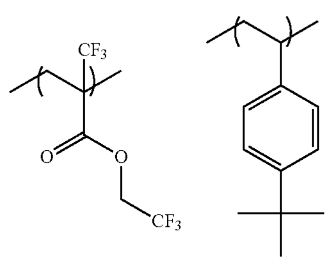

-continued
(HR-19)
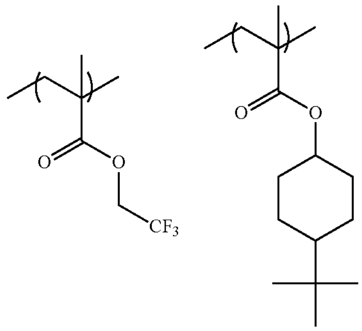
(HR-20)
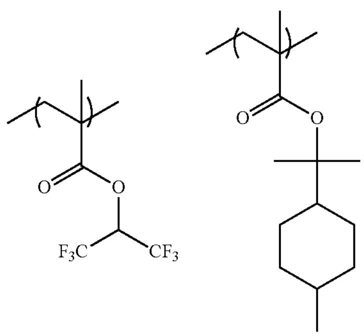
(HR-21)
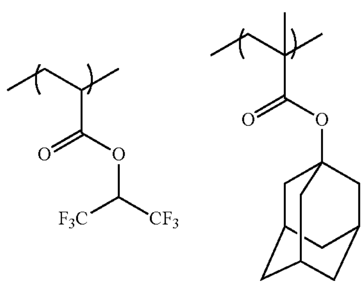
(HR-22)
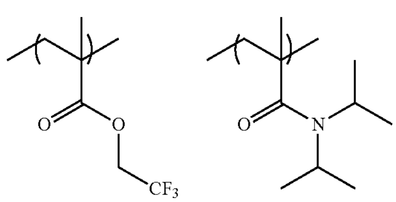
(HR-23)
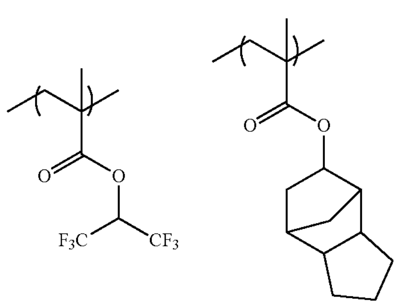
-continued
(HR-24)
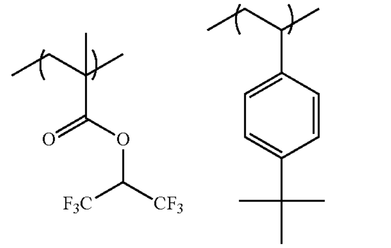
(HR-25)
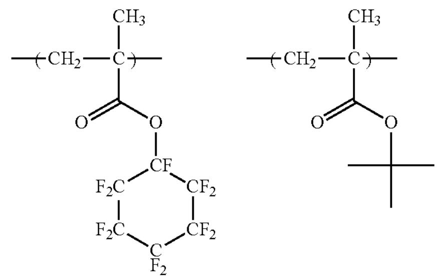
(HR-26)
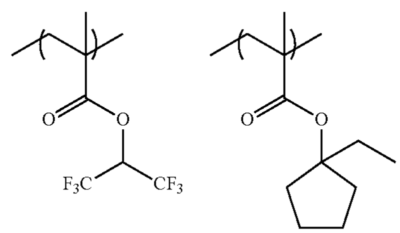
(HR-27)
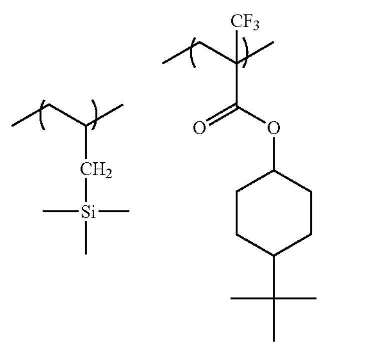
(HR-28)
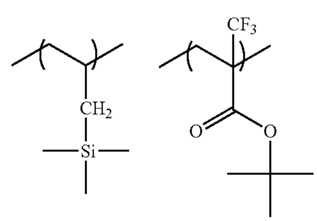
(HR-29)
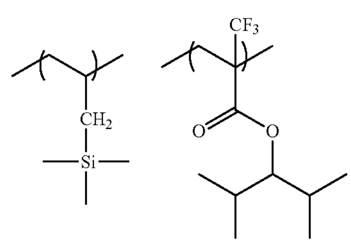

-continued
(HR-30)
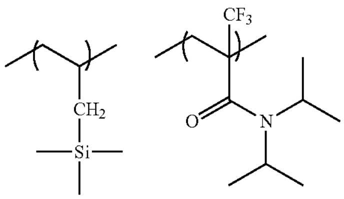
(HR-31)
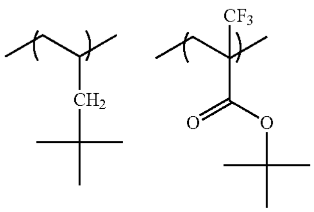
(HR-32)
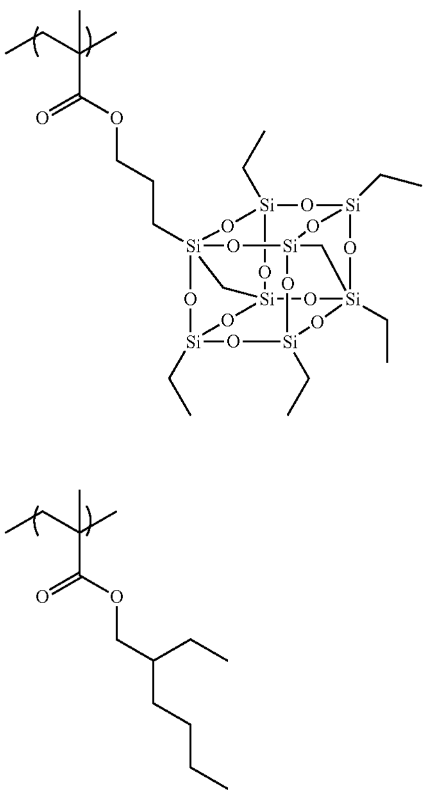
(HR-33)
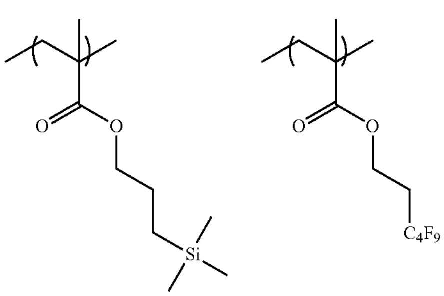
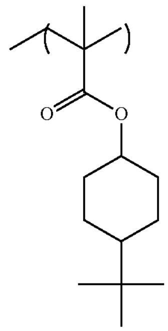
(HR-34)
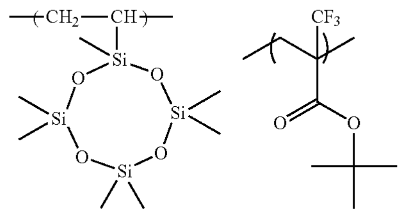
(HR-35)
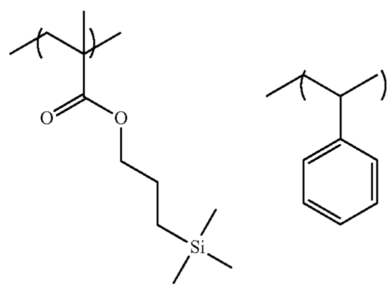
(HR-36)
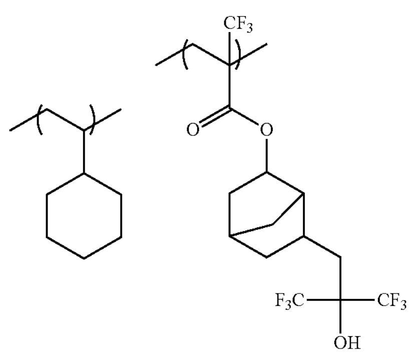
(HR-37)
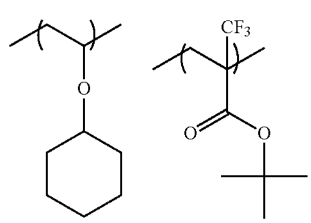

(HR-38)
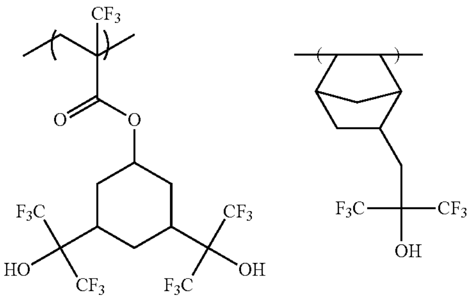
(HR-39)
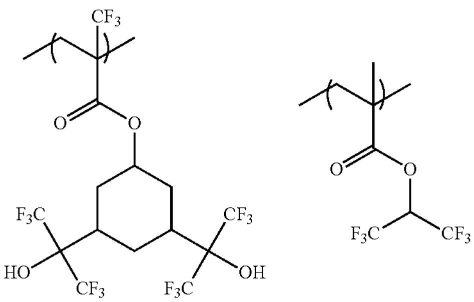
(HR-40)
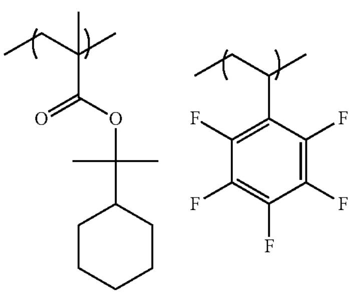
(HR-41)
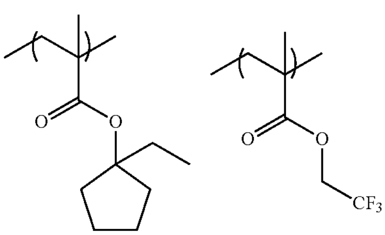
(HR-42)
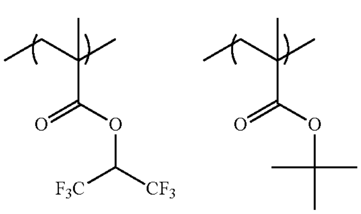
(HR-43)
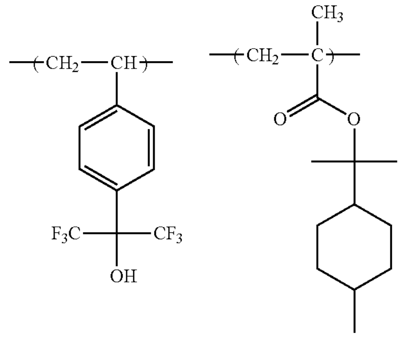
(HR-44)
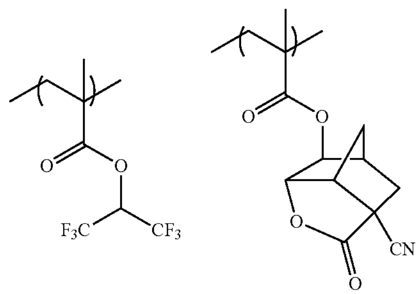
(HR-45)
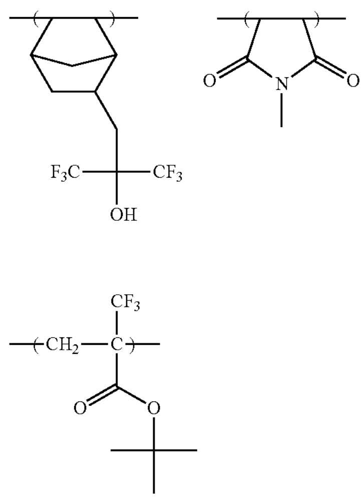
(HR-46)
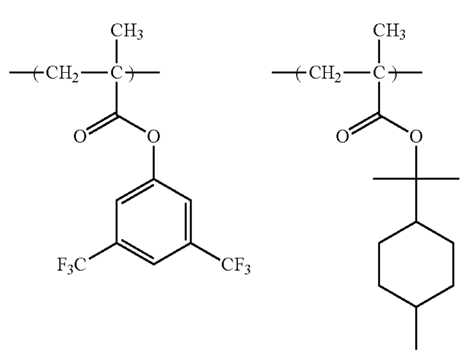

-continued
(HR-47)
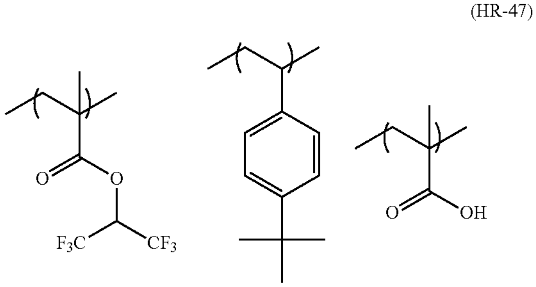
(HR-48)
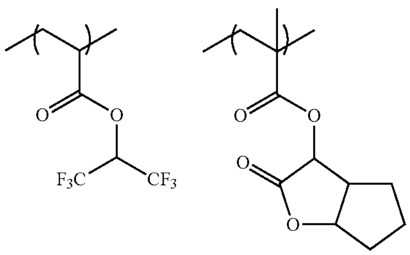
(HR-49)
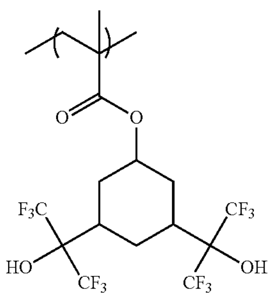
(HR-50)
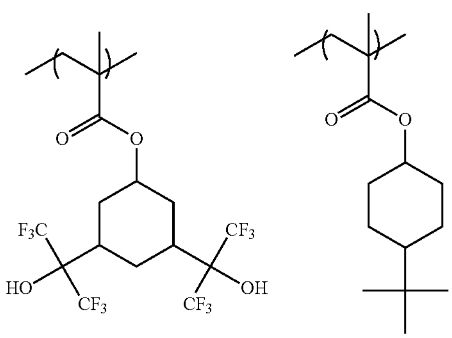
(HR-51)
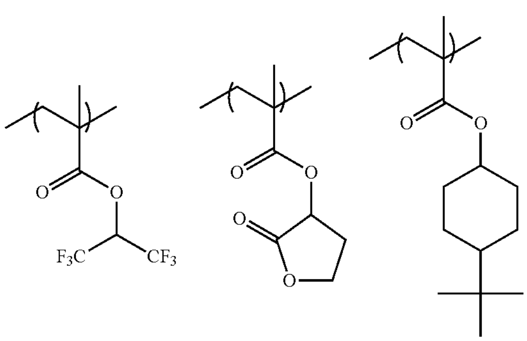
-continued
(HR-52)
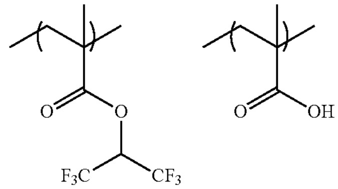
(HR-53)
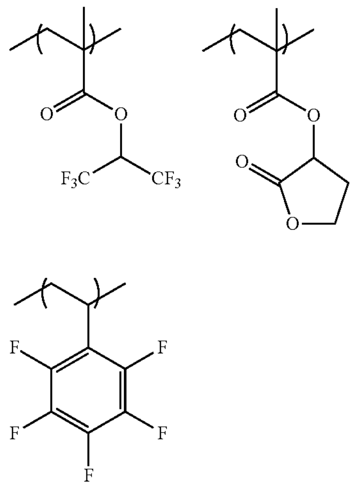
(HR-54)
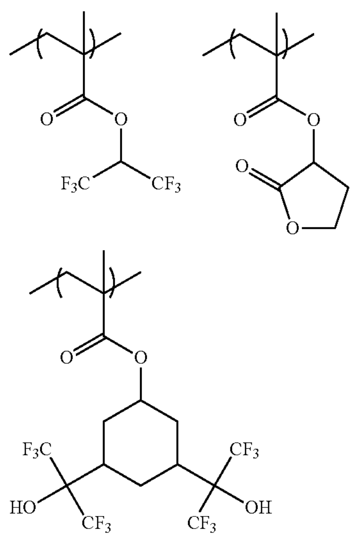
(HR-55)
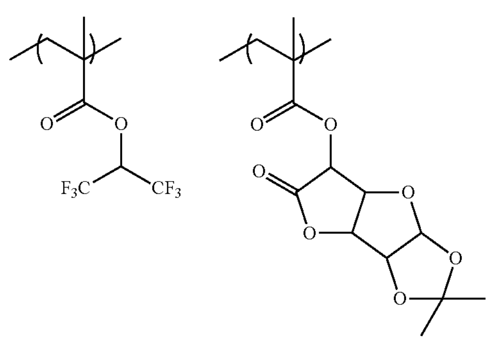

-continued
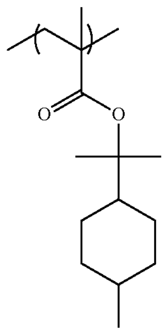
(HR-56)
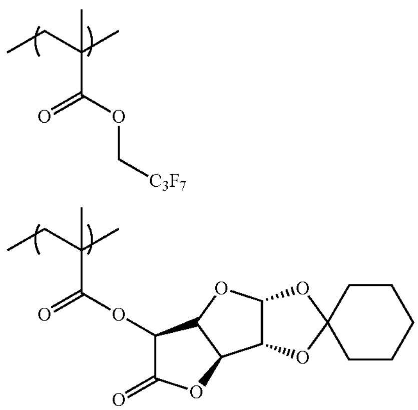
(HR-57)
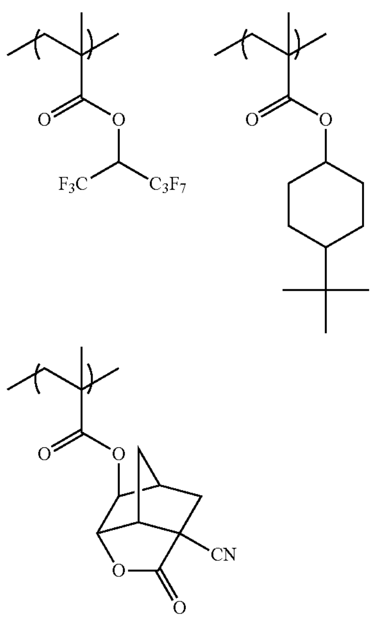
(HR-58)
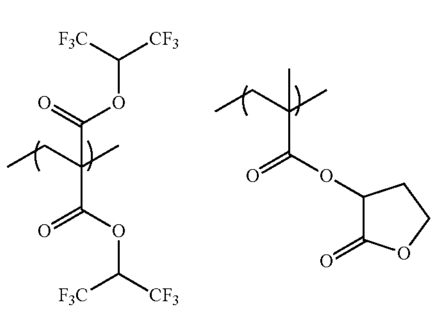
-continued
(HR-59)
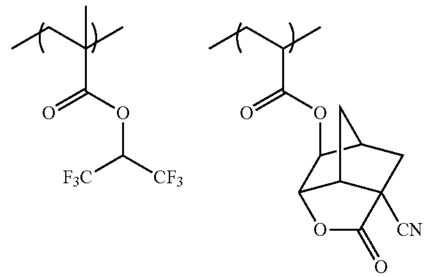
(HR-60)
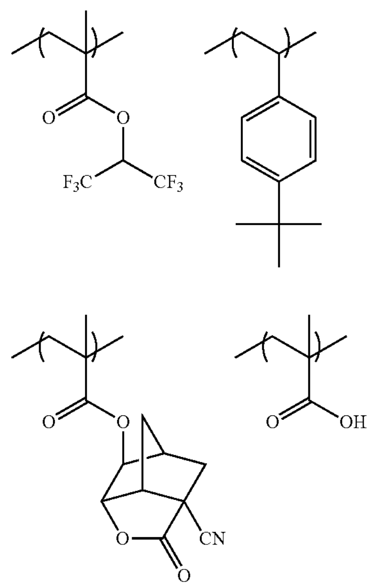
(HR-61)
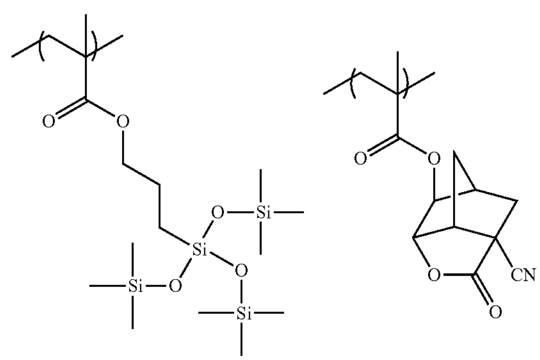
(HR-62)
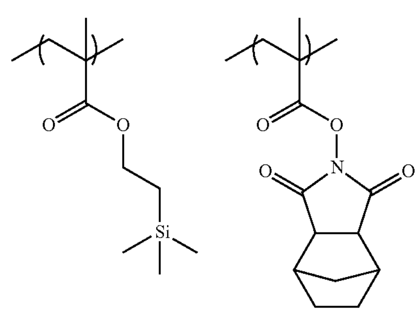

-continued (HR-63)

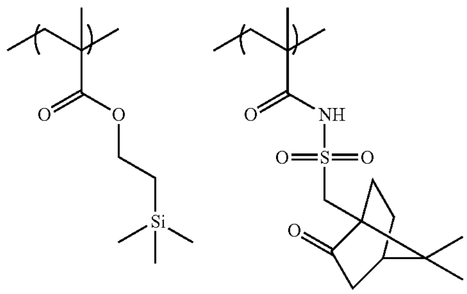

(HR-64)

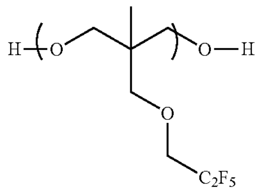

(HR-65)

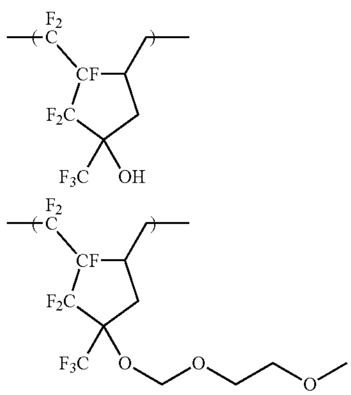

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |

TABLE 1-continued

| Resin | Composition | Mw | Mw/Mn |
|---|---|---|---|
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

It is preferred for the above hydrophobic resin (HR) to comprise a repeating unit (c) containing at least one polarity conversion group and further comprise at least either a fluorine atom or a silicon atom. The addition of a hydrophobic resin containing a polarity conversion group is especially preferred from the viewpoint of the suppression of development defect. The above fluorine atom may be one as an electron withdrawing group contained in the polarity conversion group, or may be another fluorine atom.

Herein, the polarity conversion group refers to a group that is decomposed by the action of an alkali developer to thereby increase its solubility in the alkali developer. As such, there can be mentioned, for example, a lactone group, a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—$OSO_2O$—), a sulfonic ester group (—$SO_2O$—) or the like.

In this connection, the ester group directly bonded to the principal chain of a repeating unit, such as that of an acrylate, is poor in the capability of being decomposed by the action of an alkali developer to thereby increase its solubility in the alkali developer, so that the ester group is not included in the polarity conversion groups used in the present invention.

The polarity conversion group is decomposed by the action of an alkali developer to thereby change its polarity. Thus, the receding contact angle between the film after alkali development and water as an immersion liquid can be decreased.

The receding contact angle between the film after alkali development and water is preferably 50° or less, more preferably 40° or less, further more preferably 35° or less and most preferably 30° or less at 23±3° C. in a humidity of 45±5%.

The receding contact angle refers to a contact angle determined when the contact line at a droplet-substrate interface draws back. It is generally known that the receding contact angle is useful in the simulation of droplet mobility in a dynamic condition. In brief, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

When the hydrophobic resin is a resin comprising not only a repeating unit containing at least one polarity conversion group but also at least either a fluorine atom or a silicon atom, it is preferred for this resin to contain a repeating unit (c') simultaneously containing on its one side chain at least one polarity conversion group and at least either a fluorine atom or a silicon atom. Namely, preferably, this hydrophobic resin comprises a repeating unit containing at least either a fluorine atom or a silicon atom on its side chain having at least one polarity conversion group.

Alternatively, in such an instance, the hydrophobic resin may contain both a repeating unit (c*) containing at least one polarity conversion group but containing neither a fluorine atom nor a silicon atom and a repeating unit containing at least either a fluorine atom or a silicon atom.

Further alternatively, in such an instance, the hydrophobic resin may contain a repeating unit (c") in which at least one polarity conversion group is introduced in its one side chain while at least either a fluorine atom or a silicon atom is introduced in its another side chain within the same repeating unit. In this hydrophobic resin, it is preferred for the side chain having a polarity conversion group introduced therein and the side chain having at least either a fluorine atom or a silicon atom introduced therein to have a positional relationship such that the one lies on the α-position to the other via a carbon atom of the principal chain. That is, it is preferred for these side chains to have a positional relationship shown in formula (4) below. In the formula, B1 represents a side chain containing a polarity conversion group, and B2 represents a side chain containing at least either a fluorine atom or a silicon atom.

(4)

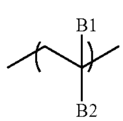

It is preferred for the polarity conversion group to be a group represented by X in the partial structure of general formula (KA-1) or (KB-1) below.

(KA-1)

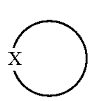

(KB-1)

$Y^1$—X—$Y^2$

In general formula (KA-1) or (KB-1), X represents a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—$OSO_2O$—) or a sulfonic ester group (—$SO_2O$—).

$Y^1$ and $Y^2$ may be identical to or different from each other, and each thereof represents an electron withdrawing group.

The repeating unit (c) can have a preferred polarity conversion group through the introduction therein of any of groups with the partial structures of general formula (KA-1) or (KB-1). When the partial structures have no bonding hand as in the case of the partial structures of general formula (KA-1) or the partial structures of general formula (KB-1) in which $Y^1$ and $Y^2$ are monovalent, the groups with the above partial structures refer to those containing a monovalent or higher-valent group resulting from the deletion of at least one arbitrary hydrogen atom from the partial structures. The partial structures of general formula (KA-1) or (KB-1) are linked at an arbitrary position to the principal chain of the hydrophobic resin via a substituent.

First, the partial structures of general formula (KA-1) will be described in detail below.

The partial structures of general formula (KA-1) are each arranged so as to form a ring structure in cooperation with a group represented by X.

In general formula (KA-1), X is preferably a carboxylic ester group (namely, in the case of the formation of a lactone ring structure as KA-1), an acid anhydride group or a carbonic ester group. More preferably, X is a carboxylic ester group.

A substituent may be introduced in any of the ring structures of general formula (KA-1). For example, nka substituents, the substituent referred to as $Z_{ka1}$, may be introduced in any of the ring structures.

$Z_{ka1}$, or each of a plurality of $Z_{ka1}$s independently, represents an alkyl group, a cycloalkyl group, an ether group, a hydroxyl group, an amido group, an aryl group, a lactone ring group, a halogen atom or an electron withdrawing group.

$Z_{ka1}$s may be linked to each other to thereby form a ring. As the ring formed by the mutual linkage of $Z_{ka1}$s, there can be mentioned, for example, a cycloalkyl ring or a heterocycle (for example, a cycloether ring or a lactone ring).

The above nka is an integer of 0 to 10, preferably 0 to 8, more preferably 0 to 5, further more preferably 1 to 4 and most preferably 1 to 3.

$Z_{ka1}$ is preferably an alkyl group, a cycloalkyl group, an ether group, a hydroxyl group or an electron withdrawing group. $Z_{ka1}$ is more preferably an alkyl group, a cycloalkyl group or an electron withdrawing group. It is preferred for the ether group to be one substituted with, for example, an alkyl group or a cycloalkyl group, namely, to be an alkyl ether group or the like.

The electron withdrawing groups represented by $Z_{ka1}$ are the same as those represented by $Y^1$ and $Y^2$ to be described hereinafter. These electron withdrawing groups may be substituted with other electron withdrawing groups.

As the aryl group represented by $Z_{ka1}$, there can be mentioned, for example, a phenyl group or a naphthyl group. A substituent may be introduced therein.

As the halogen atom represented by $Z_{ka1}$, there can be mentioned a fluorine atom, a chlorine atom, a bromine atom, an iodine atom or the like. Among these, a fluorine atom is preferred.

The alkyl group represented by $Z_{ka1}$ may contain a substituent, and may be linear or branched. The linear alkyl group preferably has 1 to 30 carbon atoms, more preferably 1 to 20 carbon atoms. As the linear alkyl group, there can be mentioned, for example, a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, an n-decanyl group or the like. The branched alkyl group preferably has 3 to 30 carbon atoms, more preferably 3 to 20 carbon atoms. As the branched alkyl group, there can be mentioned, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, a t-decanyl group or the like. It is preferred for the alkyl group represented by $Z_{ka1}$ to be one having 1 to 4 carbon atoms, such as a methyl group, an ethyl group, an n-propyl group, an i-propyl group, an n-butyl group, an i-butyl group or a t-butyl group.

The cycloalkyl group represented by $Z_{ka1}$ may contain a substituent and may be monocyclic or polycyclic. When polycyclic, the cycloalkyl group may be a bridged one. Namely, in that case, the cycloalkyl group may have a bridged structure. The monocycloalkyl group is preferably one having 3 to 8 carbon atoms. As such a cycloalkyl group, there can be mentioned, for example, a cyclopropyl group, a cyclopentyl group, a cyclohexyl group, a cyclobutyl group, a cyclooctyl group or the like. As the polycycloalkyl group, there can be mentioned a group with, for example, a bicyclo, tricyclo or tetracyclo structure having 5 or more carbon atoms. This polycycloalkyl group is preferably one having 6 to 20 carbon atoms. As such, there can be mentioned, for example, an adamantyl group, a norbornyl group, an isobornyl group, a camphonyl group, a bicyclopentyl group, an α-pinel group, a tricyclodecanyl group, a tetracyclododecyl group, an androstanyl group or the like. The carbon atoms of each of the cycloalkyl groups may be partially replaced with a heteroatom, such as an oxygen atom.

As these cycloalkyl groups, there can be mentioned, for example, those of the following formulae.

(1)

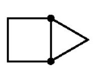

(2)

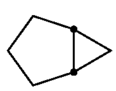

(3)

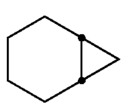

(4)

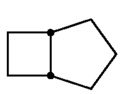

(5)

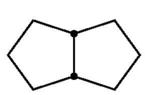

(6)

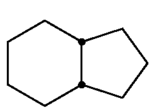

(7)

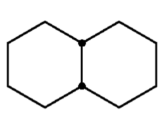

-continued (8)

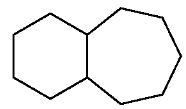

(9)

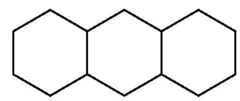

(10)

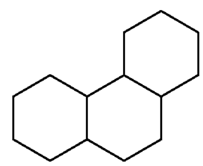

(11)

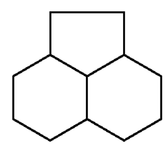

(12)

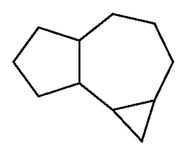

(13)

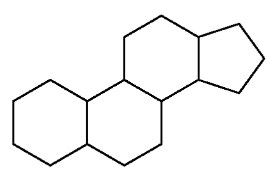

(14)

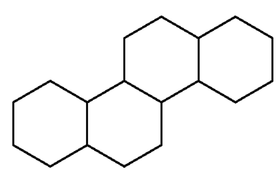

(15)

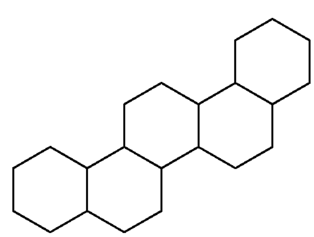

(16)

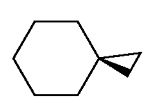

(17)

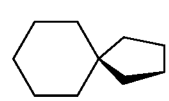

(18)

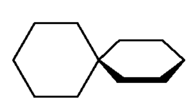

-continued
(19)
(20)
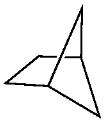
(21)
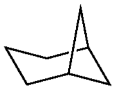
(22)
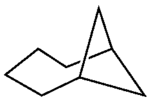
(23)
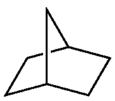
(24)
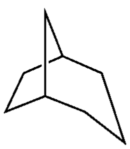
(25)
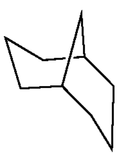
(26)
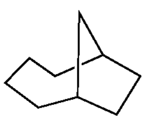
(27)
(28)
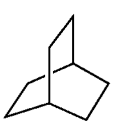
(29)
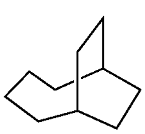
(30)
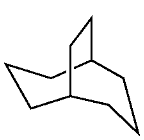
-continued
(31)
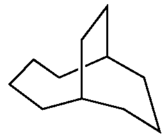
(32)
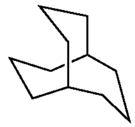
(33)
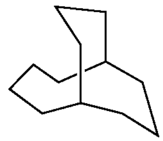
(34)
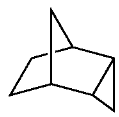
(35)
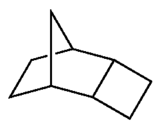
(36)
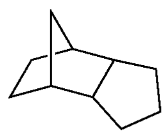
(37)
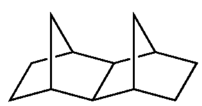
(38)
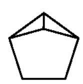
(39)
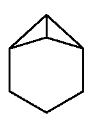
(40)
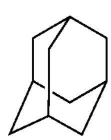
(41)
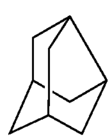
(42)
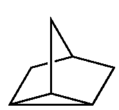

-continued (43)

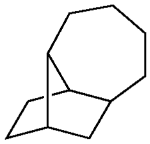

(44)

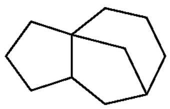

(45)

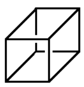

(46)

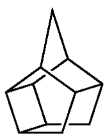

(47)

(48)

(49)

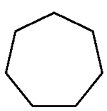

(50)

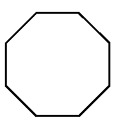

As preferred alicyclic moieties among the above, there can be mentioned an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. As more preferred alicyclic moieties, there can be mentioned an adamantyl group, a decalin group, a norbornyl group, a cedrol group, a cyclohexyl group, a cycloheptyl group, a cyclooctyl group, a cyclodecanyl group, a cyclododecanyl group and a tricyclodecanyl group.

As a substituent that can be introduced in these alicyclic structures, there can be mentioned an alkyl group, a halogen atom, a hydroxyl group, an alkoxy group, a carboxyl group or an alkoxycarbonyl group. The alkyl group is preferably a lower alkyl group, such as a methyl group, an ethyl group, a propyl group, an isopropyl group or a butyl group. More preferably, the alkyl group is a methyl group, an ethyl group, a propyl group or an isopropyl group. As preferred alkoxy groups, there can be mentioned those each having 1 to 4 carbon atoms, such as a methoxy group, an ethoxy group, a propoxy group and a butoxy group. As a substituent that may be introduced in these alkyl and alkoxy groups, there can be mentioned a hydroxyl group, a halogen atom, an alkoxy group (preferably having 1 to 4 carbon atoms) or the like.

As further substituents that may be introduced in the above groups, there can be mentioned a hydroxyl group; a halogen atom (fluorine, chlorine, bromine or iodine); a nitro group; a cyano group; the above alkyl groups; an alkoxy group, such as a methoxy group, an ethoxy group, a hydroxyethoxy group, a propoxy group, a hydroxypropoxy group, an n-butoxy group, an isobutoxy group, a sec-butoxy group or a t-butoxy group; an alkoxycarbonyl group, such as a methoxycarbonyl group or an ethoxycarbonyl group; an aralkyl group, such as a benzyl group, a phenethyl group or a cumyl group; an aralkyloxy group; an acyl group, such as a formyl group, an acetyl group, a butyryl group, a benzoyl group, a cyanamyl group or a valeryl group; an acyloxy group, such as a butyryloxy group; the above alkenyl groups; an alkenyloxy group, such as a vinyloxy group, a propenyloxy group, an allyloxy group or a butenyloxy group; the above aryl groups; an aryloxy group, such as a phenoxy group; an aryloxycarbonyl group, such as a benzoyloxy group; and the like.

Preferably, X of general formula (KA-1) represents a carboxylic ester group and the partial structures of general formula (KA-1) are lactone rings. A 5- to 7-membered lactone ring is preferred.

Further, as shown in formulae (KA-1-1) to (KA-1-17) below, each of 5- to 7-membered lactone rings as the partial structures of general formula (KA-1) is preferably condensed with another ring structure in such a fashion that a bicyclo structure or a spiro structure is formed.

The adjacent ring structures to which the ring structures of general formula (KA-1) may be bonded can be, for example, those shown in formulae (KA-1-1) to (KA-1-17) below, or those similar to the same.

It is preferred for the structures containing a lactone ring structure of general formula (KA-1) to be those of any of formulae (KA-1-1) to (KA-1-17) below. The lactone structures may be directly bonded to the principal chain. As preferred structures, there can be mentioned those of formulae (KA-1-1), (KA-1-4), (KA-1-5), (KA-1-6), (KA-1-13), (KA-1-14) and (KA-1-17).

KA-1-1

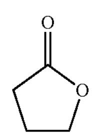

KA-1-2

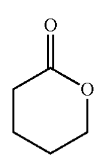

KA-1-3

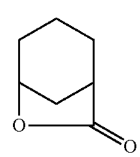

KA-1-4

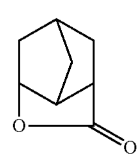

-continued

KA-1-5

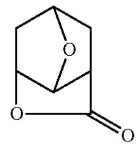

KA-1-6

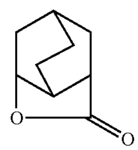

KA-1-7

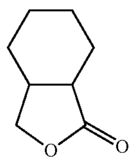

KA-1-8

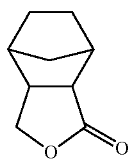

KA-1-9

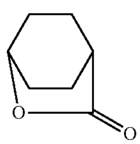

KA-1-10

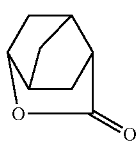

KA-1-11

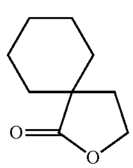

KA-1-12

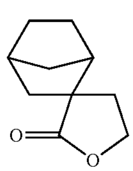

KA-1-13

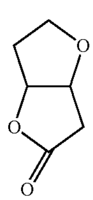

-continued

KA-1-14

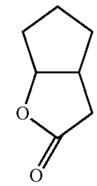

KA-1-15

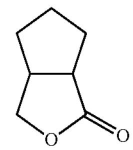

KA-1-16

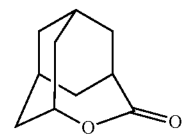

KA-1-17

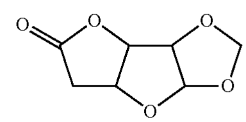

It is optional for the above structures containing a lactone ring structure to contain or not to contain a substituent. Preferred substituents are the same as those that may be introduced in the ring structures of general formula (KA-1) above.

For each of the lactone structures, there may be optically active substances. Any of the optically active substances may be used. It is both appropriate to use a single type of optically active substance alone and to use a plurality of optically active substances in the form of a mixture. When a single type of optically active substance is mainly used, the optical purity (ee) thereof is preferably 90 or higher, more preferably 95 or higher and most preferably 98 or higher.

Now, the partial structure of general formula (KB-1) will be described in detail.

In general formula (KB-1), X is preferably a carboxylic ester group (—COO—).

Each of the electron withdrawing groups represented by $Y^1$ and $Y^2$ has any of the partial structures of formula (EW) below. In formula (EW), represents either a bonding hand directly bonded to the structures of general formula (KA-1) or a bonding hand directly bonded to X of general formula (KB-1).

$$* - \left( C(R_{ew1})(R_{ew2}) \right)_{n_{ew}} - Y_{ew1} \qquad \text{(EW)}$$

In formula (EW), $n_{ew}$ is the number of repetitions of each of the connecting groups of the formula —$C(R_{ew1})(R_{ew2})$—, being an integer of 0 or 1. When $n_{ew}$ is 0, a single bond is represented, indicating the direct bonding of $Y_{ew1}$.

$Y_{ew1}$ can be any of a halogen atom, a cyano group, a nitrile group, a nitro group, any of the halo(cyclo)alkyl groups or haloaryl groups of the formula —$C(R_{f1})(R_{f2})$—$R_{f3}$, an oxy group, a carbonyl group, a sulfonyl group, a sulfinyl group and a combination thereof. The electron withdrawing groups may have, for example, the following structures. Herein, the "halo(cyclo)alkyl group" refers to an at least partially halogenated alkyl group or cycloalkyl group. Each of $R_{ew3}$ and $R_{ew4}$ independently represents an arbitrary structure. Regardless of the types of the structures of $R_{ew3}$ and $R_{ew4}$, the partial structures of formula (EW) exhibit electron withdrawing properties, and may be linked to, for example, the principal chain of the resin. Preferably, each of $R_{ew3}$ and $R_{ew4}$ is an alkyl group, a cycloalkyl group or a fluoroalkyl group.

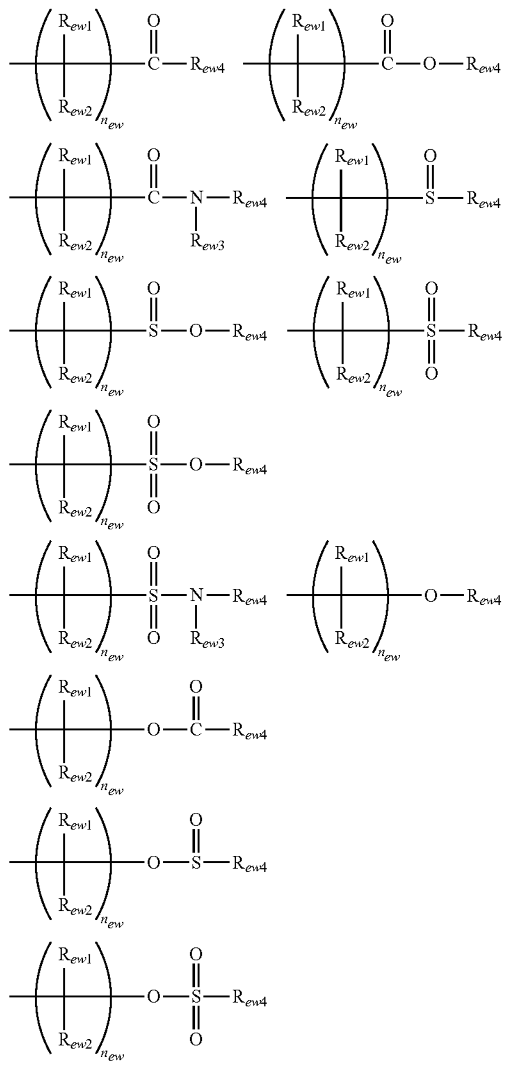

When $Y_{ew1}$ is a bivalent or higher-valent group, the remaining bonding hand or hands form a bond with an arbitrary atom or substituent. At least any of the groups represented by $Y_{ew1}$, $R_{ew1}$ and $R_{ew2}$ may be linked via a further substituent to the principal chain of the hydrophobic resin.

$Y_{ew1}$ is preferably a halogen atom or any of the halo(cyclo) alkyl groups or haloaryl groups of the formula —C($R_{f1}$)($R_{f2}$)—$R_{f3}$.

Each of $R_{ew1}$ and $R_{ew2}$ independently represents an arbitrary substituent, for example, a hydrogen atom, an alkyl group, a cycloalkyl group or an aryl group.

At least two of $R_{ew1}$, $R_{ew2}$ and $Y_{ew1}$ may be linked to each other to thereby form a ring.

In the above formula, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

Each of $R_{f2}$ and $R_{f3}$ independently represents a hydrogen atom, a halogen atom or an organic group. $R_{f2}$ and $R_{f3}$ may be linked to each other to thereby form a ring. As the organic group, there can be mentioned, for example, an alkyl group, a cycloalkyl group, an alkoxy group or the like. It is preferred for $R_{f2}$ to represent the same groups as by $R_{f1}$ or to be linked to $R_{f3}$ to thereby form a ring.

$R_{f1}$ to $R_{f3}$ may be linked to each other to thereby form a ring. As the formed ring, there can be mentioned a (halo) cycloalkyl ring, a (halo)aryl ring or the like.

As the (halo)alkyl groups represented by $R_{f1}$ to $R_{f3}$, there can be mentioned, for example, the alkyl groups mentioned above as being represented by $Z_{ka1}$ and structures resulting from halogenation thereof.

As the (per)halocycloalkyl groups and (per)haloaryl groups represented by $R_{f1}$ to $R_{f3}$ or contained in the ring formed by the mutual linkage of $R_{f2}$ and $R_{f3}$, there can be mentioned, for example, structures resulting from halogenation of the cycloalkyl groups as mentioned above with respect to $Z_{ka1}$, preferably fluorocycloalkyl groups of the formula $—C_{(n)}F_{(2n-2)}H$ and perfluoroaryl groups of the formula $—C_{(n)}F_{(n-1)}$. The number of carbon atoms, n, is not particularly limited. Preferably, it is in the range of 5 to 13, more preferably 6.

As preferred rings that may be formed by the mutual linkage of at least two of $R_{ew1}$, $R_{ew2}$ and $Y_{ew1}$, there can be mentioned cycloalkyl groups and heterocyclic groups. Preferred heterocyclic groups are lactone ring groups. As the lactone rings, there can be mentioned, for example, the structures of formulae (KA-1-1) to (KA-1-17) above.

The repeating unit (c) may contain two or more of the partial structures of general formula (KA-1), or two or more of the partial structures of general formula (KB-1), or both any one of the partial structures of general formula (KA-1) and any one of the partial structures of general formula (KB-1).

A part or the whole of any of the partial structures of general formula (KA-1) may double as the electron withdrawing group represented by $Y^1$ or $Y^2$ of general formula (KB-1). For example, when X of general formula (KA-1) is a carboxylic ester, the carboxylic ester can function as the electron withdrawing group represented by $Y^1$ or $Y^2$ of general formula (KB-1).

When the repeating unit (c) is the repeating unit (c*) containing at least one polarity conversion group but containing neither a fluorine atom nor a silicon atom, or the repeating unit (c") in which at least one polarity conversion group is introduced in its one side chain while at least either a fluorine atom or a silicon atom is introduced in its another side chain within the same repeating unit, it is preferred for the polarity conversion group to be the partial structure of —COO— contained in the structures of general formula (KA-1).

Preferably, the hydrophobic resin for use in the present invention contains the repeating unit (c) containing at least two polarity conversion groups and also contains at least either a fluorine atom or a silicon atom.

When the repeating unit (c) contains at least two polarity conversion groups, it is preferred for the repeating unit to contain a group with any of the partial structures having two polarity conversion groups of general formula (KY-1) below. When any of the structures of general formula (KY-1) has no bonding hand, it is a group with a mono- or higher-valent group resulting from the removal of at least any one of the hydrogen atoms contained in the structure.

(KY-1)

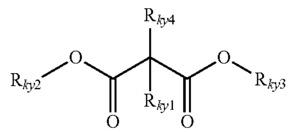

In general formula (KY-1), each of $R_{ky1}$ and $R_{ky4}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group. Alternatively, both $R_{ky1}$ and $R_{ky4}$ may be bonded to the same atom to thereby form a double bond. For example, both $R_{ky1}$ and $R_{ky4}$ may be bonded to the same oxygen atom to thereby form a part (=O) of a carbonyl group.

Each of $R_{ky2}$ and $R_{ky3}$ independently represents an electron withdrawing group. Alternatively, $R_{ky1}$ and $R_{ky2}$ are linked to each other to thereby form a lactone structure, while $R_{ky3}$ is an electron withdrawing group. The formed lactone structure is preferably any of the above-mentioned structures (KA-1-1) to (KA-1-17). As the electron withdrawing group, there can be mentioned any of the same groups as mentioned above with respect to $Y^1$ and $Y^2$ of general formula (KB-1). This electron withdrawing group is preferably a halogen atom, or any of the halo(cyclo)alkyl groups or haloaryl groups of the formula —$C(R_{f1})(R_{f2})$—$R_{f3}$. Preferably, $R_{ky3}$ is a halogen atom, or any of the halo(cyclo)alkyl groups or haloaryl groups of the formula —$C(R_{f1})(R_{f2})$—$R_{f3}$, while $R_{ky2}$ is either linked to $R_{ky1}$ to thereby form a lactone ring, or an electron withdrawing group containing no halogen atom.

$R_{ky1}$, $R_{ky2}$ and $R_{ky4}$ may be linked to each other to thereby form a monocyclic or polycyclic structure.

As $R_{ky1}$ and $R_{ky4}$, there can be mentioned, for example, the same groups as set forth above with respect to $Z_{ka1}$ of general formula (KA-1).

The lactone rings formed by the mutual linkage of $R_{ky1}$ and $R_{ky2}$ preferably have the structures of formulae (KA-1-1) to (KA-1-17) above. As the electron withdrawing groups, there can be mentioned those mentioned above as being represented by $Y^1$ and $Y^2$ of general formula (KB-1).

It is more preferred for the structures of general formula (KY-1) to be the structures of general formula (KY-2) below. Each of the structures of general formula (KY-2) is a group with a mono- or higher-valent group resulting from the removal of at least any one of the hydrogen atoms contained in the structure.

(KY-2)

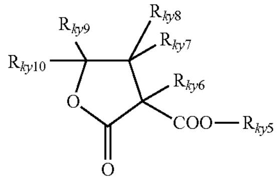

In formula (KY-2), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group.

At least two of $R_{ky6}$ to $R_{ky10}$ may be linked to each other to thereby form a monocyclic or polycyclic ring.

$R_{ky5}$ represents an electron withdrawing group. As the electron withdrawing group, there can be mentioned any of the same groups as set forth above with respect to $Y^1$ and $Y^2$. This electron withdrawing group is preferably a halogen atom, or any of the halo(cyclo)alkyl groups or haloaryl groups of the formula —$C(R_{f1})(R_{f2})$—$R_{f3}$.

As $R_{ky5}$ to $R_{ky10}$, there can be mentioned, for example, the same groups as set forth above with respect to $Z_{ka1}$ of general formula (KA-1).

It is more preferred for the structures of general formula (KY-2) to be the partial structures of general formula (KY-3) below.

(KY-3)

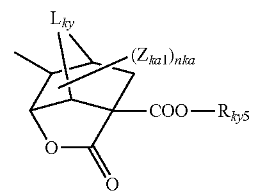

In general formula (KY-3), $Z_{ka1}$ and nka are as defined above in connection with general formula (KA-1). $R_{ky5}$ is as defined above in connection with general formula (KY-2).

$L_{ky}$ represents an alkylene group, an oxygen atom or a sulfur atom. As the alkylene group represented by $L_{ky}$, there can be mentioned a methylene group, an ethylene group or the like. $L_{ky}$ is preferably an oxygen atom or a methylene group, more preferably a methylene group.

The repeating units (c) are not limited as long as they are derived by polymerization, such as addition polymerization, condensation polymerization or addition condensation. Preferred repeating units are those obtained by the addition polymerization of a carbon to carbon double bond. As such repeating units, there can be mentioned, for example, acrylate repeating units (including the family having a substituent at the α- and/or β-position), styrene repeating units (including the family having a substituent at the α- and/or β-position), vinyl ether repeating units, norbornene repeating units, repeating units of maleic acid derivatives (maleic anhydride, its derivatives, maleimide, etc.) and the like. Of these, acrylate repeating units, styrene repeating units, vinyl ether repeating units and norbornene repeating units are preferred. Acrylate repeating units, vinyl ether repeating units and norbornene repeating units are more preferred. Acrylate repeating units are most preferred.

The repeating unit (c) can be any of the repeating units with the following partial structures.

(cc)

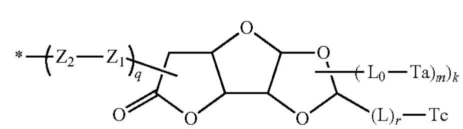

In general formula (cc), $Z_1$, or each of $Z_1$s independently, represents a single bond, an ether bond, an ester bond, an amido bond, a urethane bond or a urea bond. An ester bond is preferred.

$Z_2$, or each of $Z_2$s independently, represents a chain- or cycloalkylene group. An alkylene group having 1 or 2 carbon atoms and a cycloalkylene group having 5 to 10 carbon atoms are preferred.

Ta, or each of Tas independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1)). An alkyl group, a cycloalkyl group and an electron withdrawing group are preferred. An electron withdrawing group is more preferred. Two or more Tas may be bonded to each other to thereby form a ring.

$L_0$ represents a single bond or a hydrocarbon group with a valence of m+1 (preferably having 20 or less carbon atoms). A single bond is preferred. $L_0$ is a single bond when m is 1. The hydrocarbon group with a valence of m+1 represented by $L_0$ is, for example, one resulting from the removal of any m-1 hydrogen atoms from an alkylene group, a cycloalkylene group, a phenylene group or a combination thereof. When k is 2, two $L_0$s may be bonded to each other to thereby form a ring.

L, or each of Ls independently, represents a carbonyl group, a carbonyloxy group or an ether group.

Tc represents a hydrogen atom, an alkyl group, a cycloalkyl group, a nitrile group, a hydroxyl group, an amido group, an aryl group or an electron withdrawing group (having the same meaning as that of the electron withdrawing group represented by $Y^1$ or $Y^2$ of general formula (KB-1)).

In the formula, * represents the bonding hand to the principal chain or a side chain of the resin. Specifically, any of the partial structures of formula (cc) may be directly bonded to the principal chain, or may be bonded to a side chain of the resin. The bonding hand to the principal chain is one to an atom contained in the bonds as constituents of the principal chain. The bonding hand to a side chain is one to an atom being present outside the bonds as constituents of the principal chain.

In the general formula, m is an integer of 0 to 28, preferably an integer of 1 to 3, more preferably 1;

k is an integer of 0 to 2, preferably 1;

q is an integer of 0 to 5, preferably 0 to 2; and r is an integer of 0 to 5.

The moiety -(L)r-Tc may be replaced with -$L_0$-(Ta)m.

It is also preferred to contain a fluorine atom at an end of a sugar lactone and further contain a fluorine atom on a side chain different from the side chain on the side of the sugar lactone within the same repeating unit (repeating unit (c")).

As particular structures of the repeating units (c), the repeating units with the following partial structures are preferred.

(ca-2)

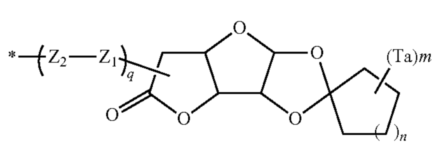

-continued (cb-2)

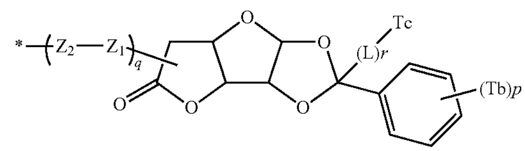

In general formulae (ca-2) and (cb-2), $Z_1$, $Z_2$, Tc, Ta, L, q and r are as defined above in connection with general formula (cc).

Tb, or each of Tbs independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1)).

In the formulae, * represents the bonding hand to the principal chain or a side chain of the resin. Specifically, any of the partial structures of general formulae (ca-2) and (cb-2) may be directly bonded to the principal chain, or may be bonded to a side chain of the resin.

In the general formulae, m is an integer of 0 to 28, preferably an integer of 1 to 3, more preferably 1;

n is an integer of 0 to 11, preferably an integer of 0 to 5, more preferably 1 or 2; and p is an integer of 0 to 5, preferably an integer of 0 to 3, more preferably 1 or 2.

The repeating unit (c) can have any of the partial structures of general formula (2) below.

(2)

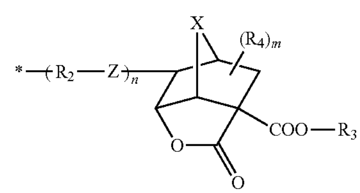

In general formula (2), $R_2$ represents a chain- or cycloalkylene group, provided that two or more $R_{2s}$ may be identical to or different from each other.

$R_3$ represents a linear, branched or cyclic hydrocarbon group whose hydrogen atoms on constituent carbons are partially or entirely substituted with fluorine atoms.

$R_4$ represents a halogen atom, a cyano group, a hydroxyl group, an amido group, an alkyl group, a cycloalkyl group, an alkoxy group, a phenyl group, an acyl group, an alkoxycarbonyl group or any of the groups of formula R—C(═O)— or R—C(═O)O— in which R is an alkyl group or a cycloalkyl group. Two or more $R_4$s may be identical to or different from each other, and may be bonded to each other to thereby form a ring.

X represents an alkylene group, an oxygen atom or a sulfur atom.

Z represents a single bond, an ether bond, an ester bond, an amido bond, a urethane bond or a urea bond. When there are a plurality of Zs, they may be identical to or different from each other.

In the formula, * represents the bonding hand to the principal chain of the resin;

n is the number of repetitions, being an integer of 0 to 5; and m is the number of substituents, being an integer of 0 to 7.

The structure —$R_2$—Z is preferably any of the structures of formula —$(CH_2)$l-COO— in which l is an integer of 1 to 5.

It is preferred for the hydrophobic resin to contain, as the repeating unit (c), any of the repeating units of general formula (K0) below.

(K0)

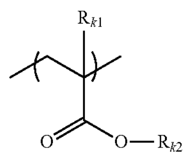

In the formula, $R_{k1}$ represents a hydrogen atom, a halogen atom, a hydroxyl group, an alkyl group, a cycloalkyl group, an aryl group or a group containing a polarity conversion group; and $R_{k2}$ represents an alkyl group, a cycloalkyl group, an aryl group or a group containing a polarity conversion group;

provided that at least one of $R_{k1}$ and $R_{k2}$ is a group containing a polarity conversion group. It is more preferred for the sum of polarity conversion groups to be 2 or greater.

As generally mentioned above, the ester group directly bonded to the principal chain of the repeating units of general formula (K0) is not included in the category of polarity conversion groups according to the present invention.

Specific examples of the repeating units (c) containing polarity conversion groups will be shown below, which in no way limit the scope of the appropriate repeating units. In the following specific examples, Ra represents a hydrogen atom, a fluorine atom, a methyl group or a trifluoromethyl group.

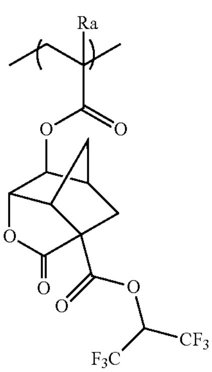

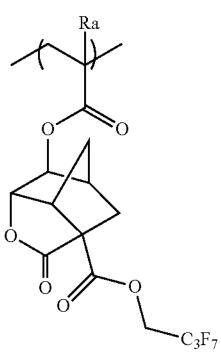

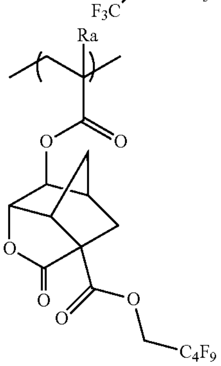

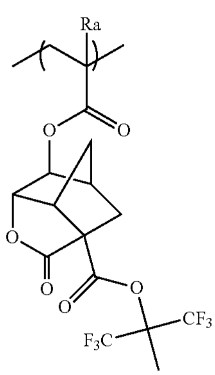

-continued

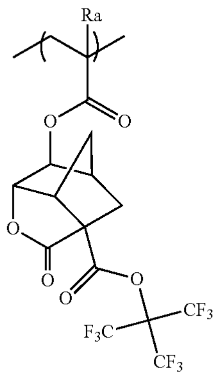

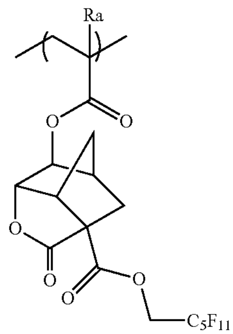

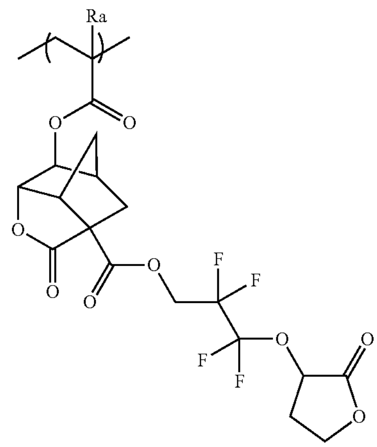

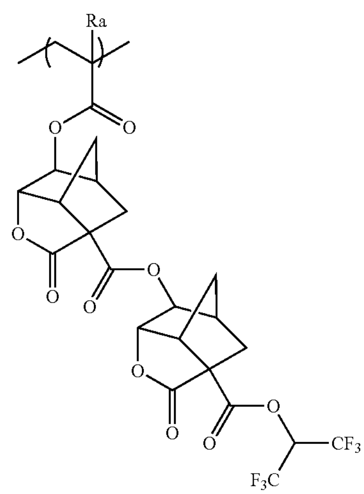

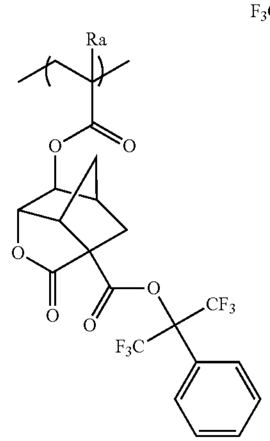

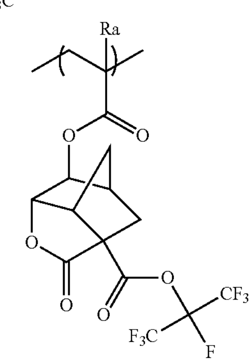

-continued
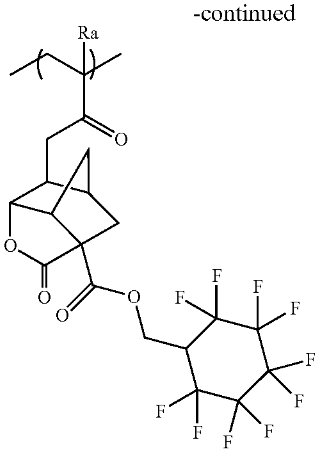
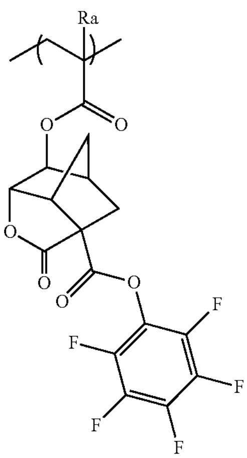
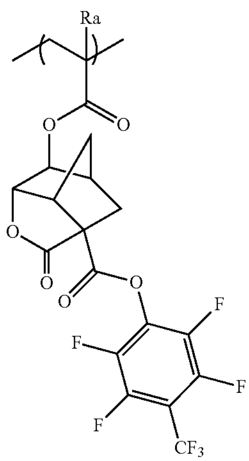
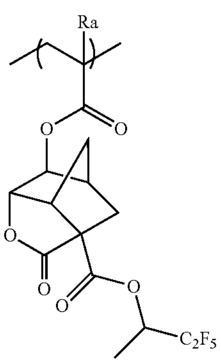
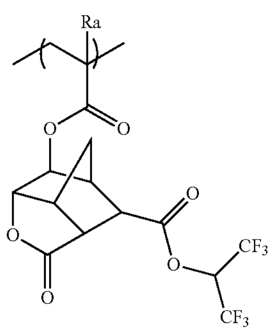
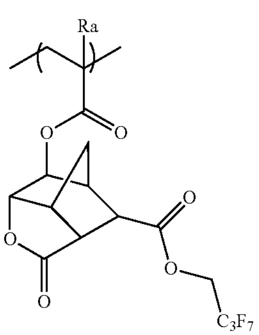
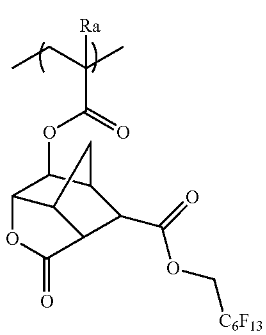
-continued
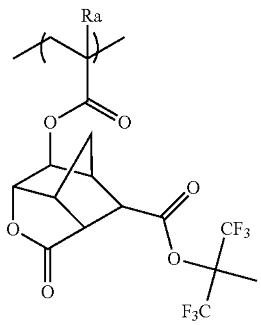
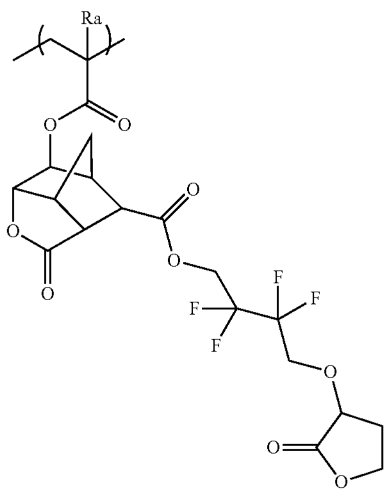
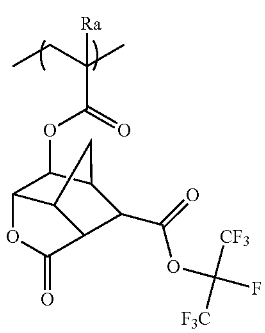
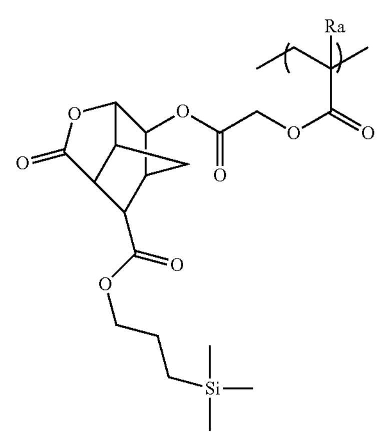

-continued
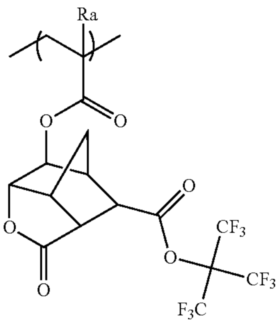
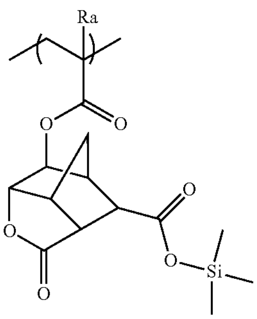
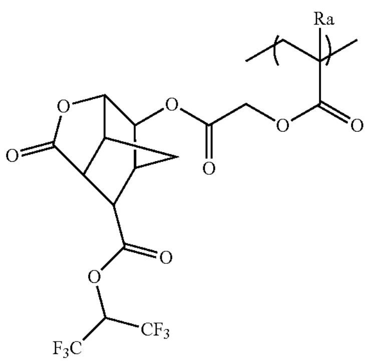
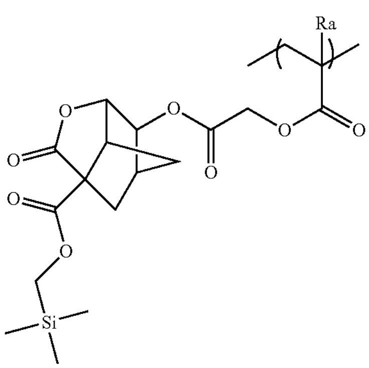
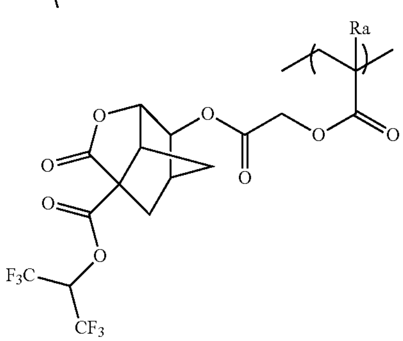
-continued
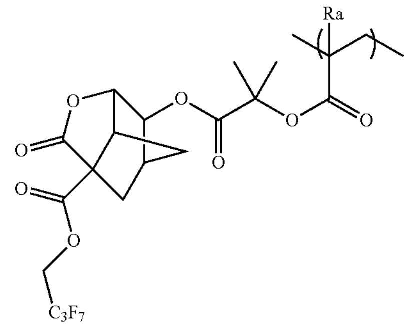
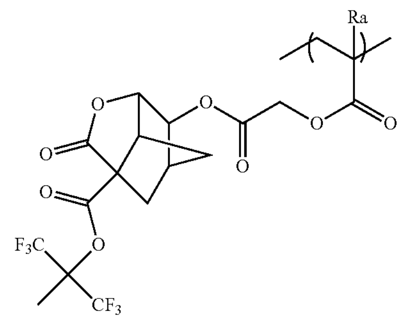
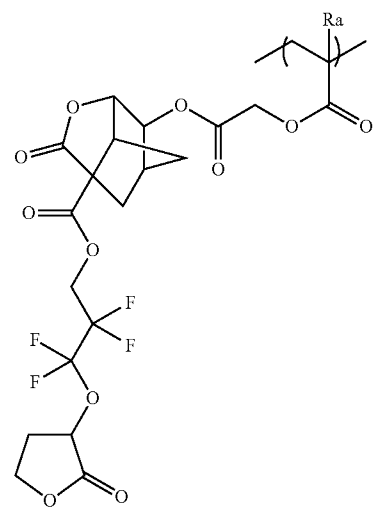
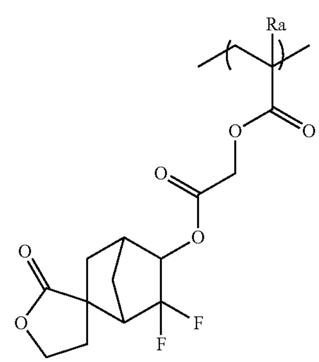

-continued
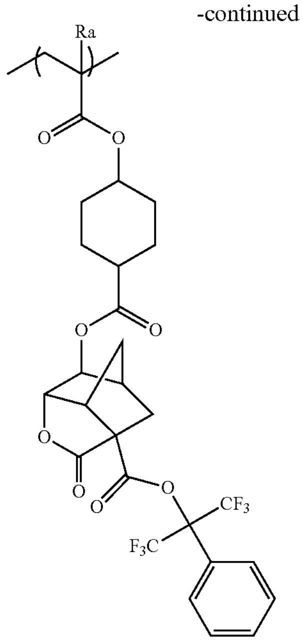
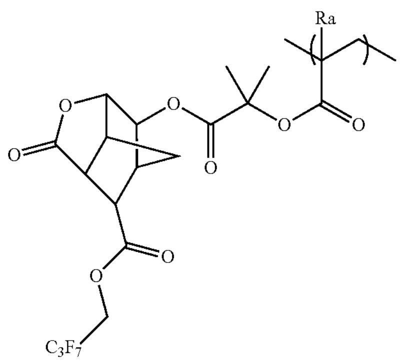
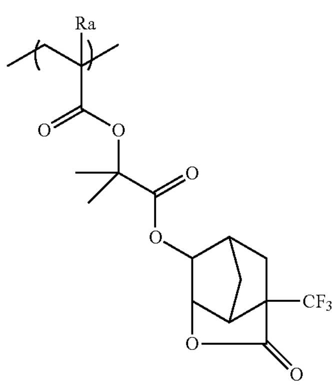
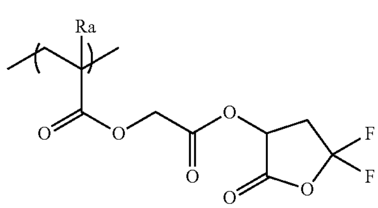
-continued
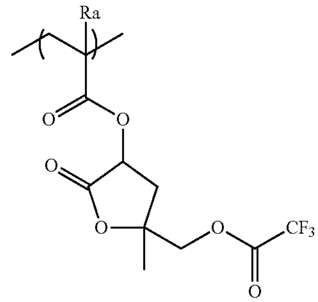
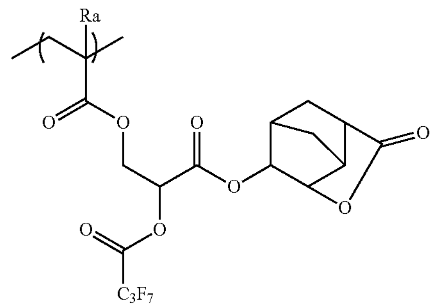
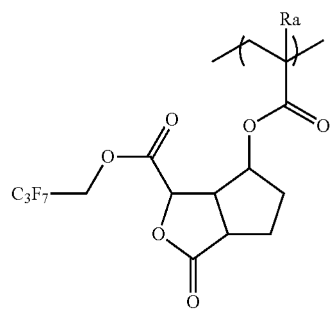
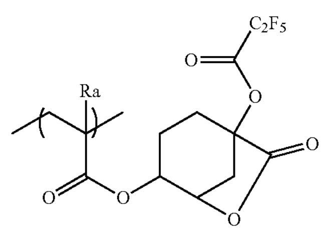
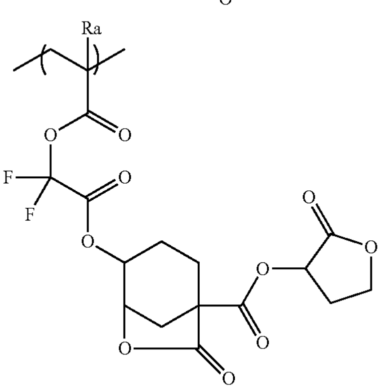

-continued
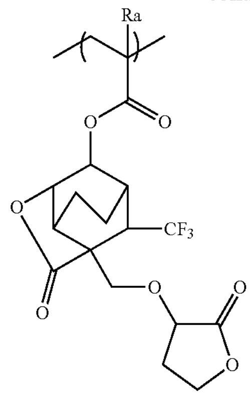
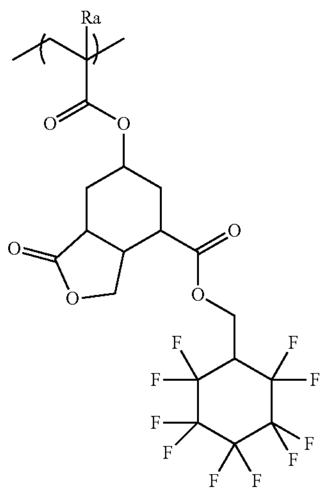
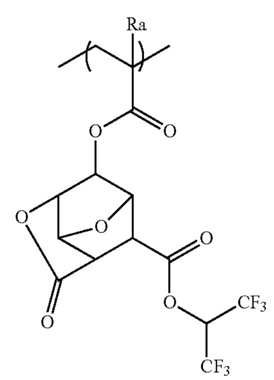
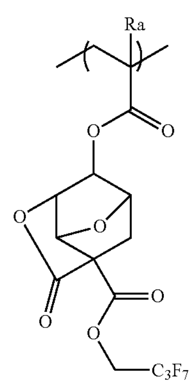
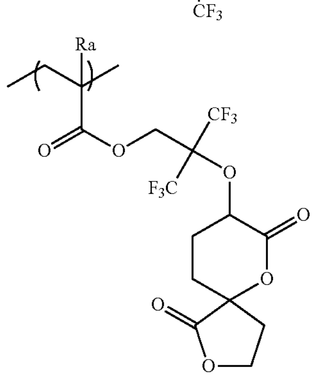
-continued
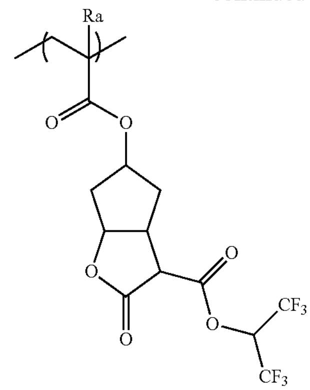
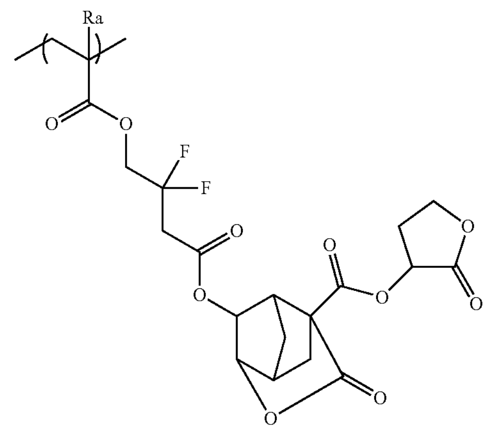
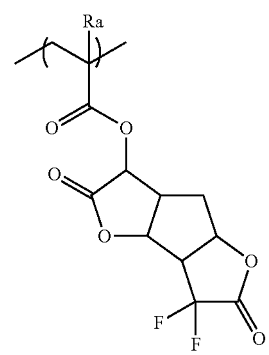
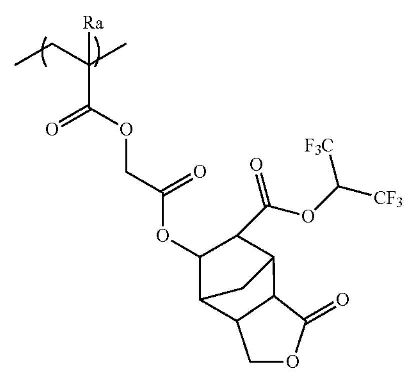

-continued
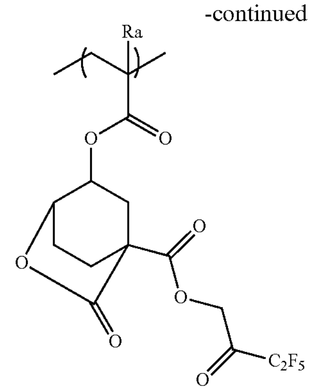
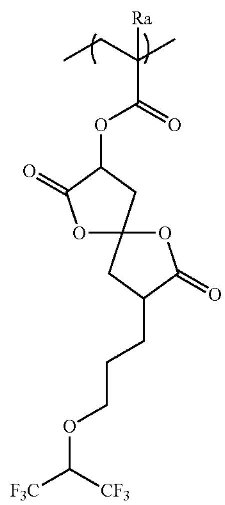
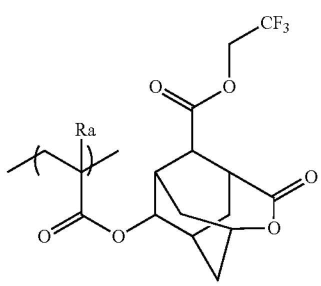
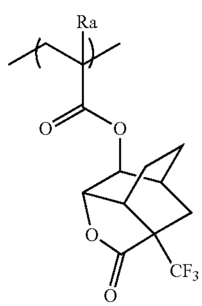
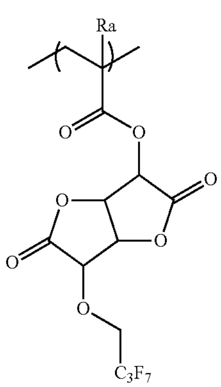
-continued
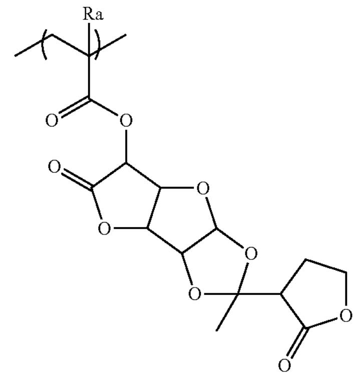
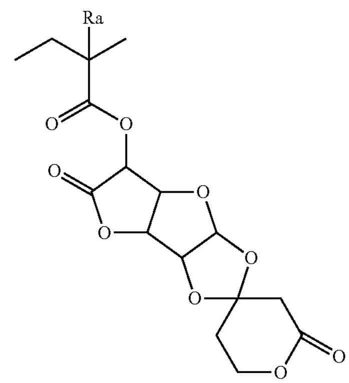
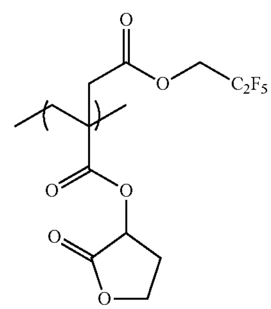
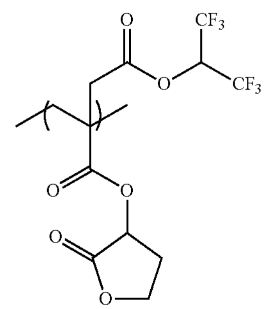
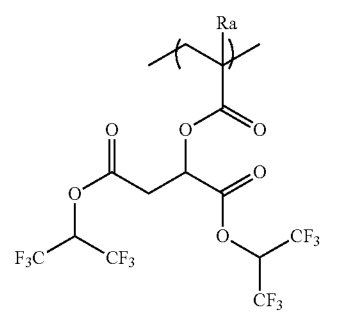
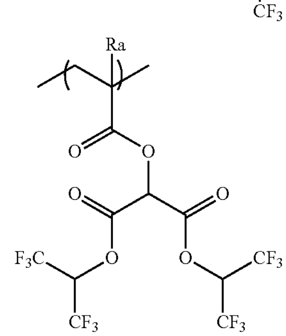

-continued
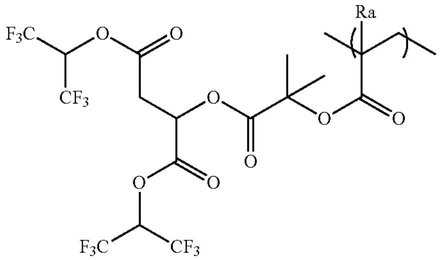
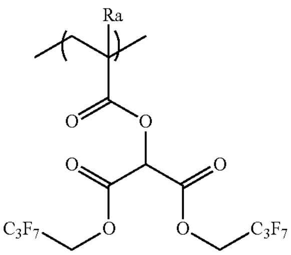
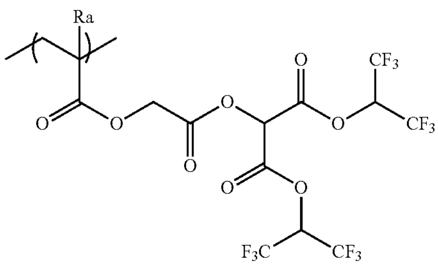
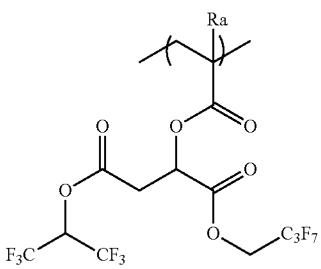
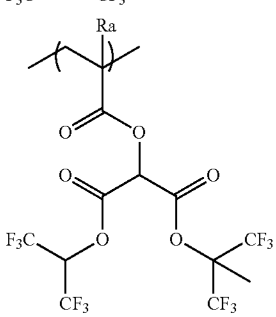
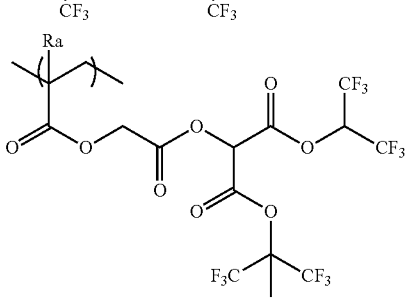
-continued
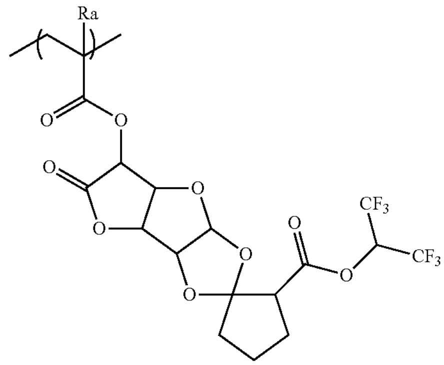
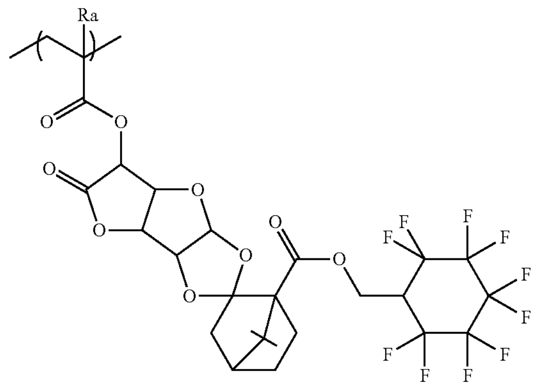
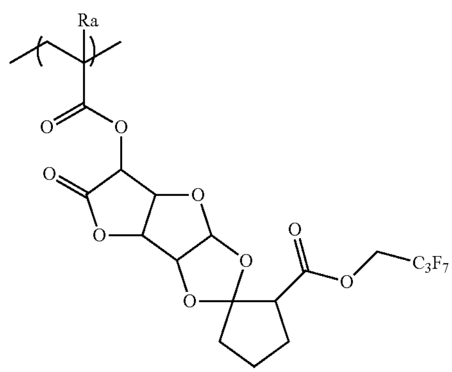
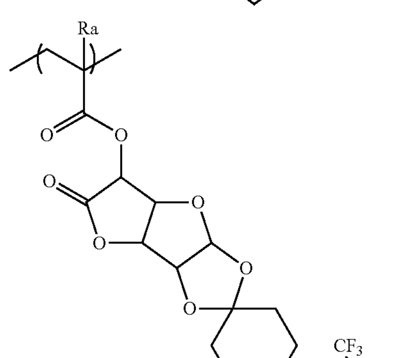

-continued
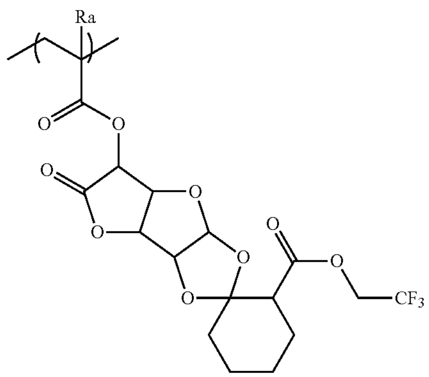
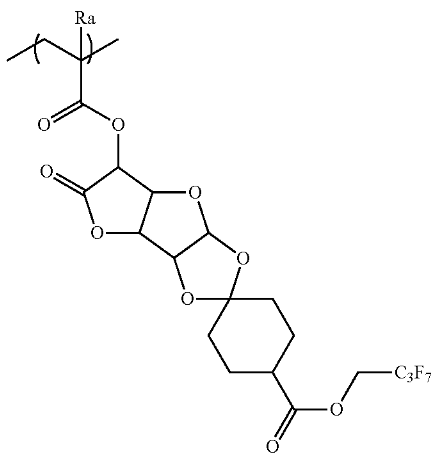
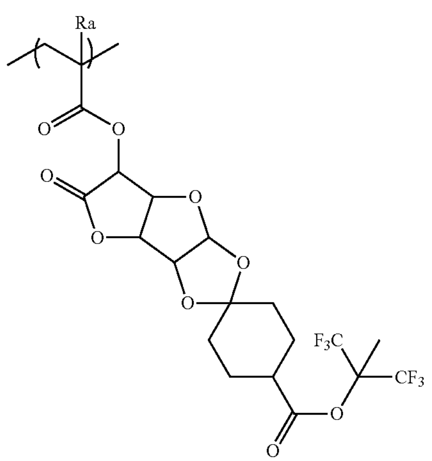
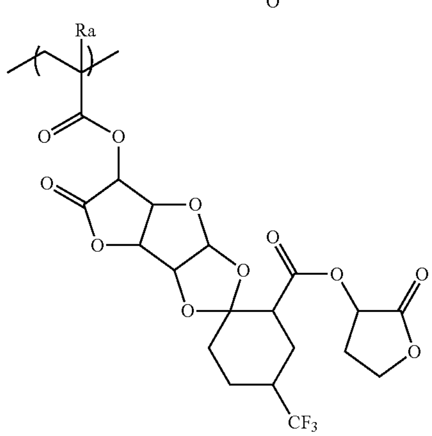
-continued
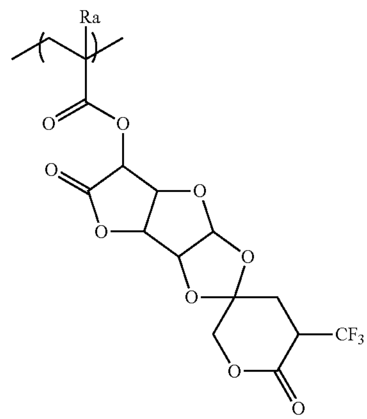
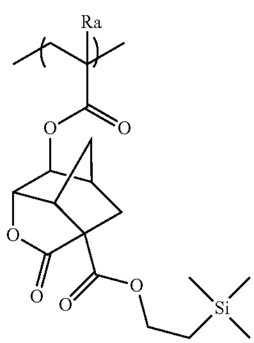
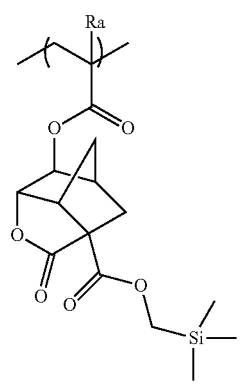
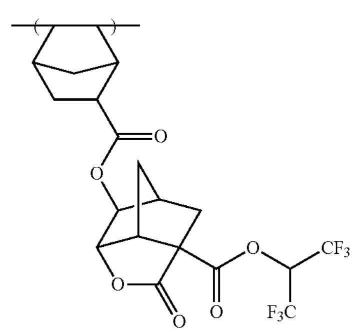
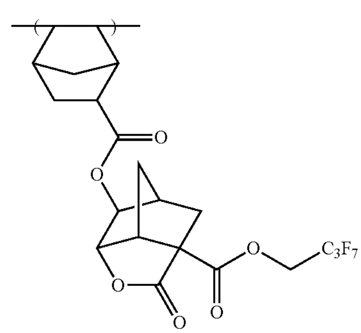

-continued
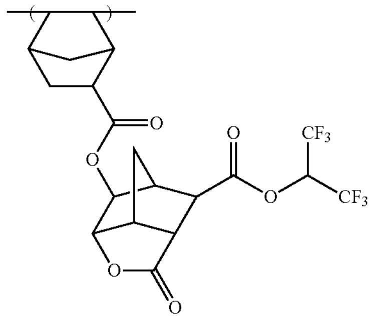
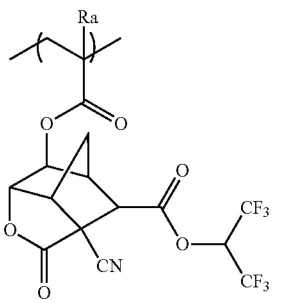
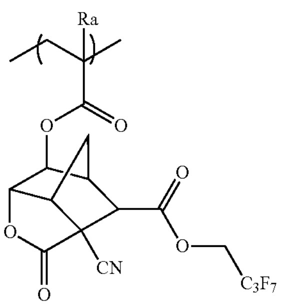
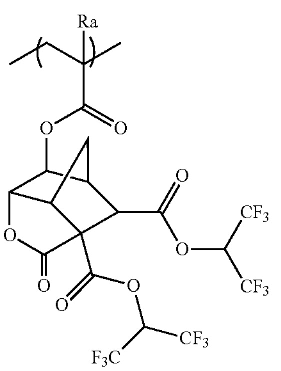
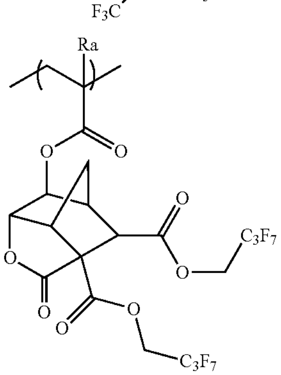
-continued
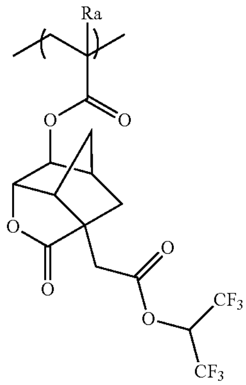
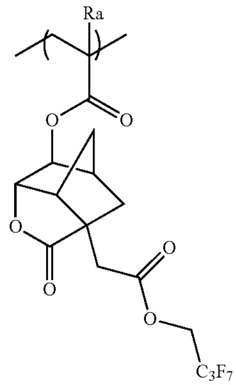
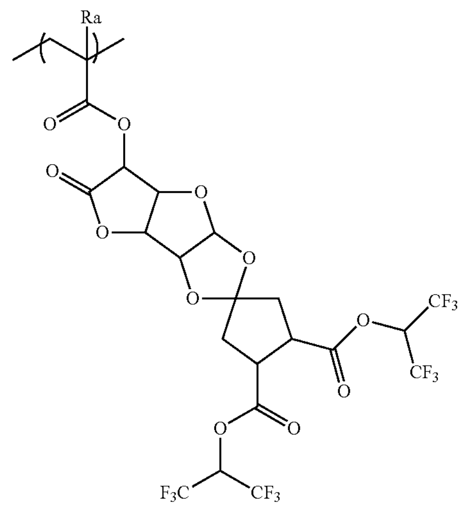
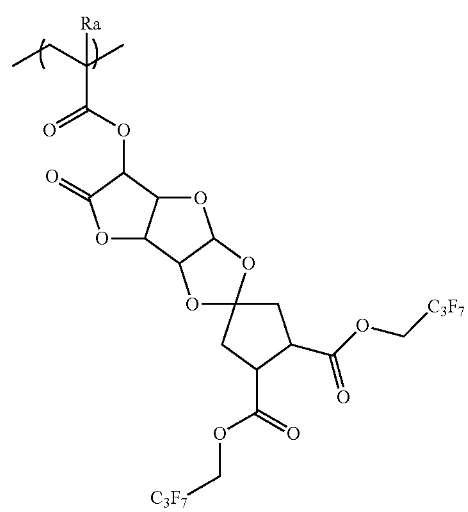

-continued

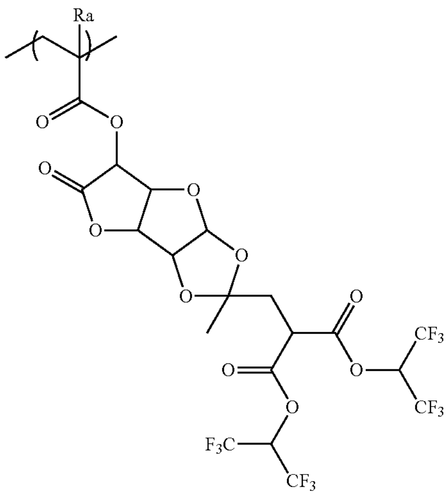

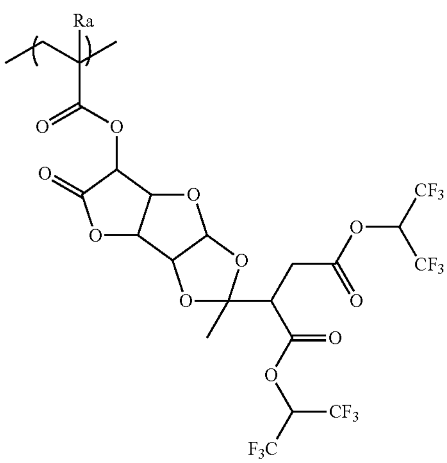

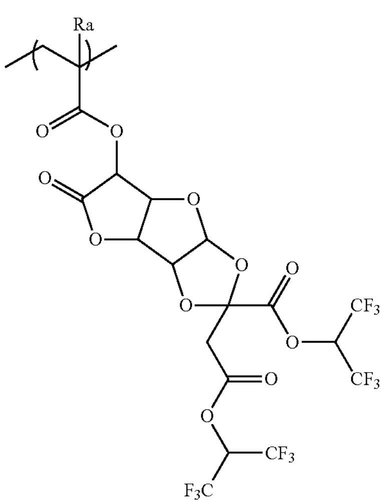

-continued

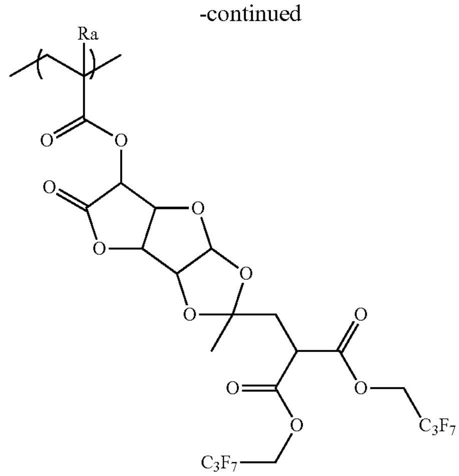

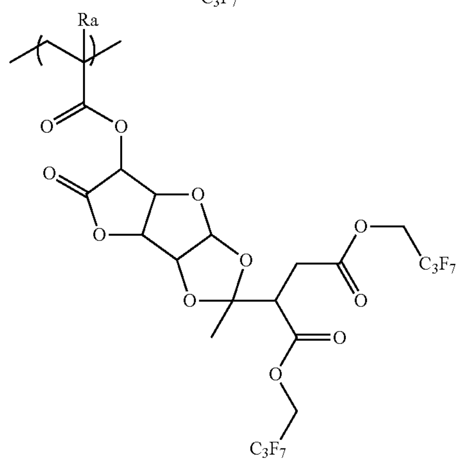

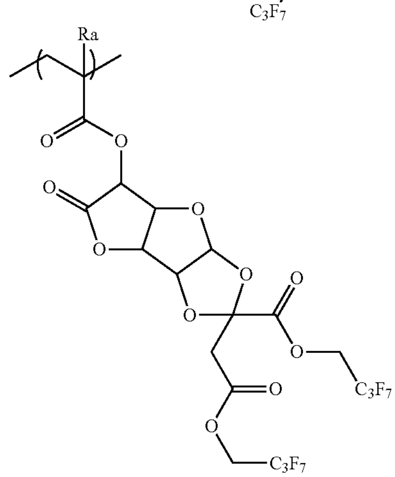

The content of the repeating unit (c) containing at least one polarity conversion group, based on all the repeating units of the hydrophobic resin, is preferably in the range of 10 to 100 mol %, more preferably 20 to 100 mol %, further more preferably 30 to 100 mol % and most preferably 40 to 100 mol %.

When the hydrophobic resin comprises a repeating unit simultaneously containing on its one side chain at least two polarity conversion groups and at least either a fluorine atom or a silicon atom, the content of this repeating unit, based on all the repeating units of the hydrophobic resin, is preferably in the range of 10 to 100 mol %, more preferably 20 to 100 mol %, further more preferably 30 to 100 mol % and most preferably 40 to 100 mol %.

When the hydrophobic resin comprises both a repeating unit containing at least two polarity conversion groups but containing neither a fluorine atom nor a silicon atom and a repeating unit containing at least either a fluorine atom or a silicon atom, the preferred contents of these repeating units are as follows. Namely, the content of the former repeating unit, based on all the repeating units of the hydrophobic resin, is preferably in the range of 10 to 90 mol %, more preferably 15 to 85 mol %, further more preferably 20 to 80 mol % and most preferably 25 to 75 mol %. The content of the latter repeating unit, based on all the repeating units of the hydrophobic resin, is preferably in the range of 10 to 90 mol %, more preferably 15 to 85 mol %, further more preferably 20 to 80 mol % and most preferably 25 to 75 mol %.

When the hydrophobic resin comprises a repeating unit in which at least two polarity conversion groups are introduced in its one side chain while at least either a fluorine atom or a silicon atom is introduced in its another side chain within the same repeating unit, the content of this repeating unit is preferably in the range of 10 to 100 mol %, more preferably 20 to 100 mol %, further more preferably 30 to 100 mol % and most preferably 40 to 100 mol %.

The hydrophobic resin comprising the repeating unit (c) containing at least one polarity conversion group may further comprise another repeating unit. As this other repeating unit, there can be mentioned, for example, those set forth above as the repeating units that can be contained in the hydrophobic resin.

Preferred forms of other repeating units that may be introduced in the hydrophobic resin containing a polarity conversion group are as follows.

(cy1) repeating unit that contains a fluorine atom and/or a silicon atom, being stable in an acid and poorly soluble or insoluble in an alkali developer, (cy2) repeating unit that contains neither a fluorine atom nor a silicon atom, being stable in an acid and poorly soluble or insoluble in an alkali developer, (cy3) repeating unit that contains a fluorine atom and/or a silicon atom, having a polar group other than the aforementioned groups (x) and (z), and (cy4) repeating unit that contains neither a fluorine atom nor a silicon atom, having a polar group other than the aforementioned groups (x) and (z).

The expression "poor soluble or insoluble in an alkali developer" with respect to the repeating units (cy1) and (cy2) means that the repeating units (cy1) and (cy2) contain neither an alkali-soluble group nor a group that produces an alkali-soluble group by the action of an acid or an alkali developer (for example, an acid-decomposable group or a polarity conversion group).

It is preferred for the repeating units (cy1) and (cy2) to have an alicyclic hydrocarbon structure having no polar group.

As the repeating units (cy1) and (cy2), there can be mentioned the repeating units of general formulae (VI) to (VIII) set forth above as the repeating units that can be introduced in the hydrophobic resin. Specific examples thereof are also the same.

Further, as the repeating units (cy1) and (cy2), there can be mentioned the repeating units of general formula (CII-AB) set forth above as the repeating units that can be introduced in the hydrophobic resin. Specific examples thereof are also the same.

It is preferred for the repeating units (cy3) and (cy4) to be repeating units each having a hydroxyl group or a cyano group as a polar group. This increases the affinity to developers. The repeating units each having a hydroxyl group or a cyano group are preferably repeating units with an alicyclic hydrocarbon structure substituted with a hydroxyl group or a cyano group. The alicyclic hydrocarbon structure of the alicyclic hydrocarbon structure substituted with a hydroxyl group or a cyano group is preferably an adamantyl group, a diadamantyl group or a norbornyl group. As preferred alicyclic hydrocarbon structures substituted with a hydroxyl group or a cyano group, there can be mentioned a monohydroxyadamantyl group, a dihydroxyadamantyl group, a monohydroxydiadamantyl group, a dihydroxydiadamantyl group, a cyanated norbornyl group and the like.

As the repeating units with the above atomic groups, there can be mentioned those of general formulae (CAIIa) to (CAIId) below.

(CAIIa)

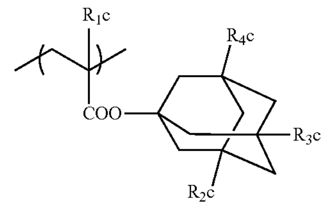

(CAIIb)

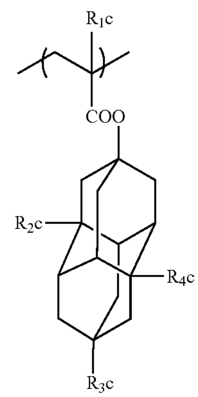

(CAIIc)

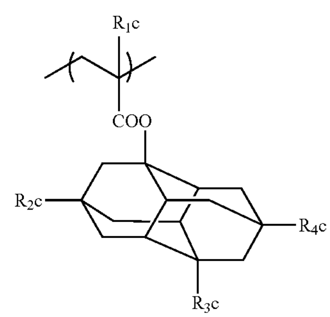

(CAIId)

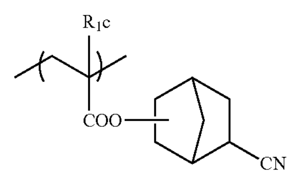

In general formulae (CAIIa) to (CAIId), $R_1c$ represents a hydrogen atom, a methyl group, a trifluoromethyl group or a hydroxymethyl group.

Each of $R_2c$ to $R_4c$ independently represents a hydrogen atom, a hydroxyl group or a cyano group, providing that at least one of the $R_2c$ to $R_4c$ represents a hydroxyl group or a cyano group. Preferably, one or two of the $R_2c$ to $R_4c$ are hydroxyl groups and the remainder is a hydrogen atom. In general formula (CAIIa), more preferably, two of the $R_2c$ to $R_4c$ are hydroxyl groups and the remainder is a hydrogen atom.

Specific examples of the repeating units (cy3) and (cy4) will be shown below, which however in no way limit the scope of the present invention.

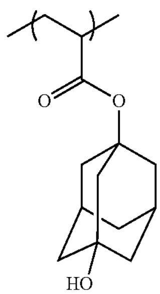

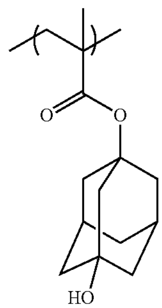

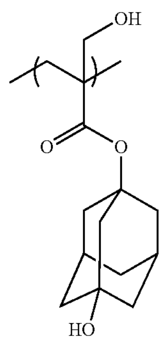

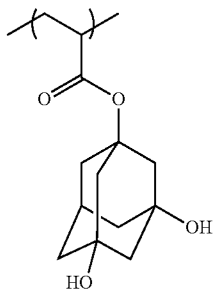

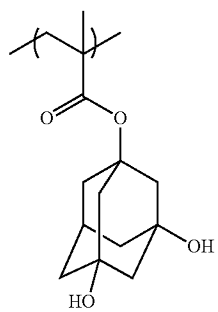

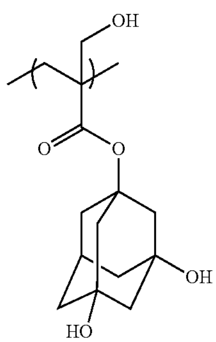

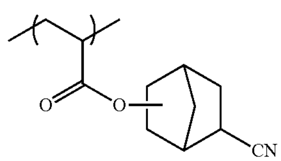

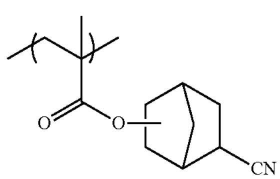

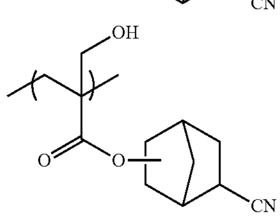

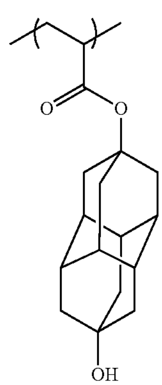

-continued

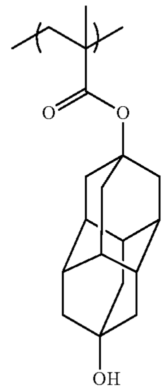

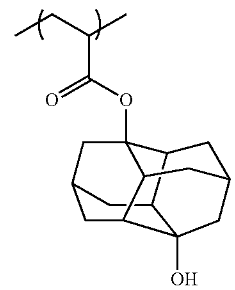

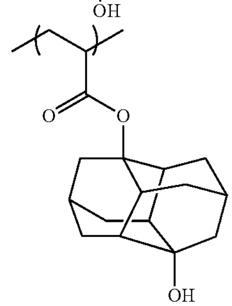

The content of the repeating units (cy1) to (cy4), based on all the repeating units of the resin comprising a repeating unit containing a polarity conversion group, is preferably in the range of 5 to 40 mol %, more preferably 5 to 30 mol % and further more preferably 10 to 25 mol %.

A plurality of repeating units (cy1) to (cy4) may be introduced in the hydrophobic resin.

When the hydrophobic resin (HR) has a fluorine atom, the content ratio of fluorine atom(s) is preferably in the range of 5 to 80 mass %, more preferably 10 to 80 mass %, based on the molecular weight of the hydrophobic resin (HR). The repeating unit containing a fluorine atom preferably exists in the hydrophobic resin (HR) in an amount of 10 to 100 mass %, more preferably 30 to 100 mass %, based on all the repeating units of the resin (HR).

When the hydrophobic resin (HR) has a silicon atom, the content ratio of silicon atom(s) is preferably in the range of 2 to 50 mass %, more preferably 2 to 30 mass %, based on the molecular weight of the hydrophobic resin (HR). The repeating unit containing a silicon atom preferably exists in the hydrophobic resin (HR) in an amount of 10 to 90 mass %, more preferably 20 to 80 mass %, based on all the repeating units of the resin (HR).

The weight average molecular weight of the hydrophobic resin (HR) in terms of standard polystyrene molecular weight is preferably in the range of 1000 to 100,000, more preferably 1000 to 50,000 and still more preferably 2000 to 15,000.

The rate of hydrolysis of the hydrophobic resin in an alkali developer is preferably 0.001 nm/sec or greater, more preferably 0.01 nm/sec or greater, further more preferably 0.1 nm/sec or greater and most preferably 1 nm/sec or greater.

Herein, the rate of hydrolysis of the hydrophobic resin in an alkali developer refers to the rate of decrease of the thickness of a film formed from the hydrophobic resin only in 23° C. TMAH (a 2.38 mass % aqueous tetramethylammonium hydroxide solution).

The content of the hydrophobic resin (HR) in the actinic-ray- or radiation-sensitive resin composition can be appropriately regulated so that the receding contact angle of the film of the actinic-ray- or radiation-sensitive resin falls within the above-mentioned range. Based on the total solids of the actinic-ray- or radiation-sensitive resin composition, the content ratio is preferably in the range of 0.01-20 mass %, more preferably 0.01 to 10 mass %, further more preferably 0.1 to 9 mass % and most preferably 0.5 to 8 mass %.

Impurities, such as metals, should naturally be of low quantity in the hydrophobic resin (HR), as for the resin (B) to be described. The content ratio of residual monomers and oligomer components is preferably 0 to 10 mass %, more preferably 0 to 5 mass % and still more preferably 0 to 1 mass %. Accordingly, there can be obtained a resist being free from a change of in-liquid foreign matter, sensitivity, etc. over time. From the viewpoint of resolving power, resist profile, side wall of resist pattern, roughness, etc., the molecular weight distribution (Mw/Mn, also referred to as the degree of dispersal) thereof is preferably in the range of 1 to 3, more preferably 1 to 2, still more preferably 1 to 1.8 and most preferably 1 to 1.5.

A variety of commercially available products can be used as the hydrophobic resin (HR), and also the resin can be synthesized in accordance with conventional methods (for example, radical polymerization). As general synthesizing methods, there can be mentioned, for example, a batch polymerization method in which a monomer species and an initiator are dissolved in a solvent and heated to thereby carry out polymerization, a dropping polymerization method in which a solution of monomer species and initiator is dropped into a hot solvent over a period of 1 to 10 hours, and the like. The dropping polymerization method is preferred. As a reaction solvent, there can be mentioned, for example, an ether such as tetrahydrofuran, 1,4-dioxane or diisopropyl ether, a ketone such as methyl ethyl ketone or methyl isobutyl ketone, an ester solvent such as ethyl acetate, an amide solvent such as dimethylformamide or dimethylacetamide, or the after-mentioned solvent capable of dissolving the composition of the present invention, such as propylene glycol monomethyl ether acetate (PGMEA), propylene glycol monomethyl ether (PGME) or cyclohexanone. Preferably, the polymerization is carried out with the use of the same solvent as that used in the photosensitive composition of the present invention. This would inhibit any particle generation during storage.

The polymerization reaction is preferably carried out in an atmosphere consisting of an inert gas, such as nitrogen or argon. In the initiation of polymerization, a commercially available radical initiator (azo initiator, peroxide, etc.) is used as the polymerization initiator. Among the radical initiators, an azo initiator is preferred, and azo initiators having an ester group, a cyano group and a carboxyl group are more preferred. As specific preferred initiators, there can be mentioned azobisisobutyronitrile, azobisdimethylvaleronitrile, dimethyl 2,2'-azobis(2-methylpropionate) and the like. The reaction concentration is in the range of 5 to 50 mass %, preferably 30 to 50 mass %. The reaction temperature is generally in the range of 10° to 150° C., preferably 30° to 120° C. and more preferably 60° to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc. and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to thereby precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents and the like. Of these, it is preferred to employ a solvent containing at least an alcohol (especially methanol or the like) or water as the precipitation or re-precipitation solvent.

The amount of precipitation or re-precipitation solvent used is generally in the range of 100 to 10,000 parts by mass, preferably 200 to 2000 parts by mass and more preferably 300 to 1000 parts by mass per 100 parts by mass of the polymer solution, according to intended efficiency, yield, etc.

The temperature at which the precipitation or re-precipitation is carried out is generally in the range of about 0° to 50° C., preferably about room temperature (for example, about 20° to 35° C.), according to efficiency and operation easiness. The operation of precipitation or re-precipitation can be carried out by a publicly known method, such as a batch or continuous method, with the use of a common mixing vessel, such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° to 100° C., preferably about 30° to 50° C. at ordinary pressure or reduced pressure (preferably reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing the resin solution (A) into contact with a solvent wherein the resin is poorly soluble or insoluble amounting to less than 10 times (preferably 5 times or less) the volume of the resin solution (A) to thereby precipitate a resin solid (step d) and separating the precipitated resin (step e).

Specific examples of the hydrophobic resins (HR) will be shown below. The following Table 2 shows the molar ratio of individual repeating units (corresponding to individual repeating units in order from the left), weight average molecular weight (Mw) and degree of dispersal (Mw/Mn) with respect to each of the resins.

-continued
(C-1)
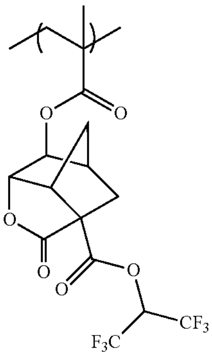
(C-2)
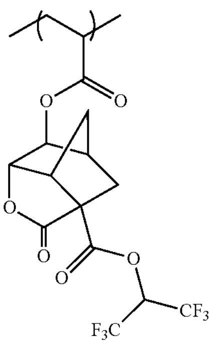
(C-3)
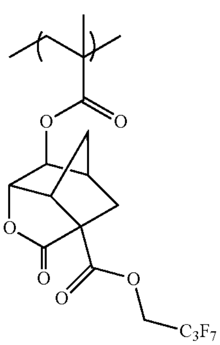
(C-4)
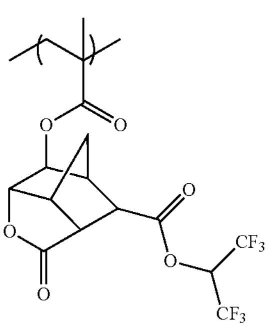
(C-5)
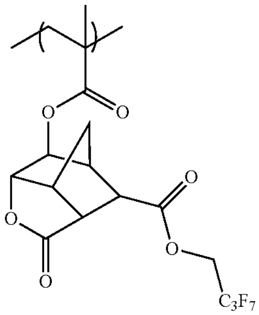
(C-6)
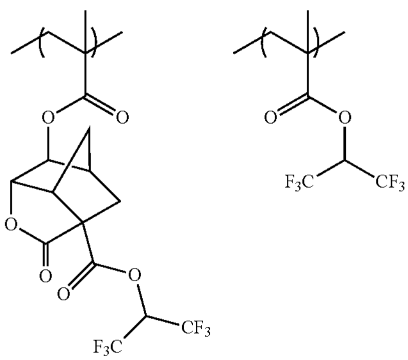
(C-7)
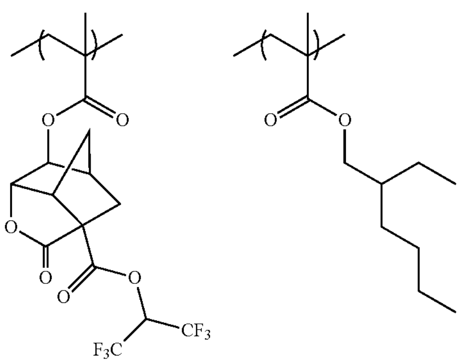
(C-8)
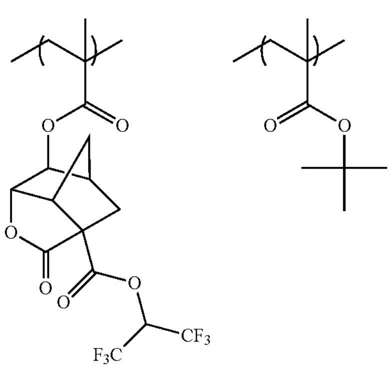

-continued
(C-9)
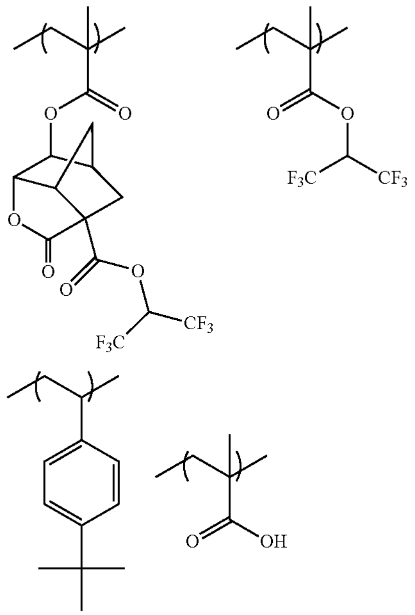
(C-10)
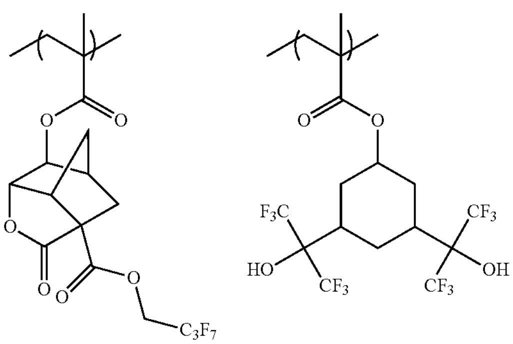
(C-11)
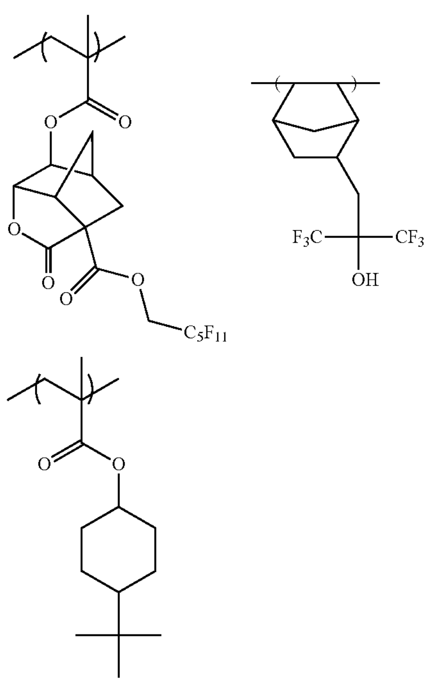
-continued
(C-12)
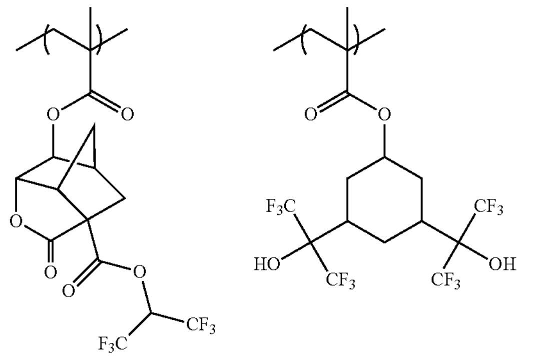
(C-13)
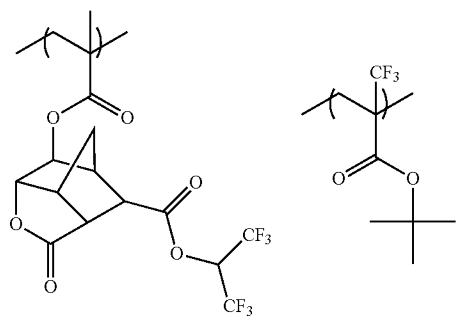
(C-14)
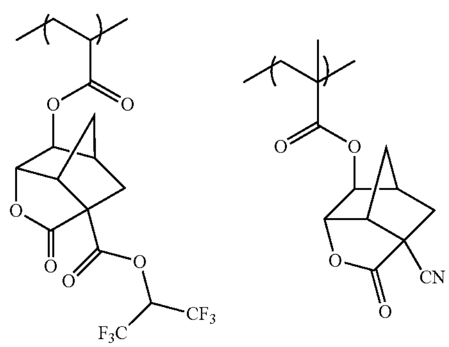
(C-15)
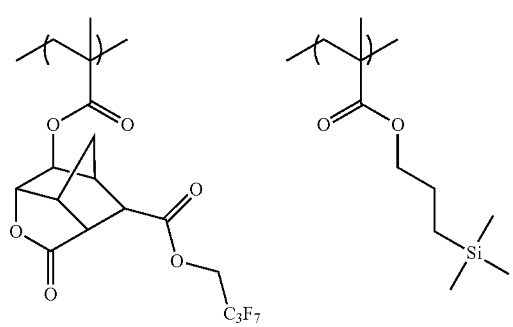

-continued
(C-16)
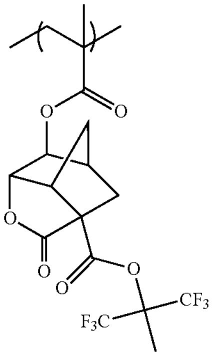
(C-17)
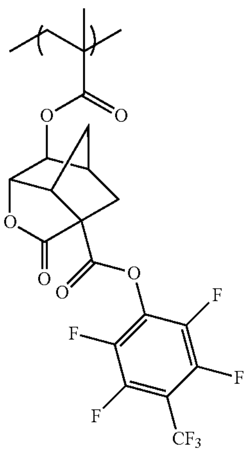
(C-18)
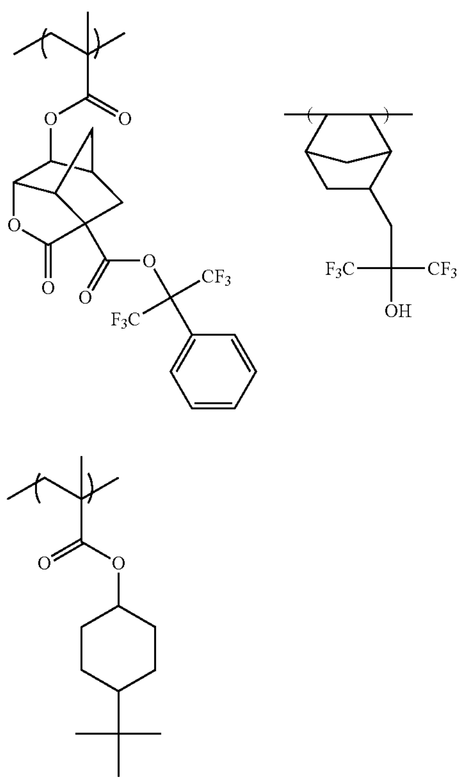
-continued
(C-19)
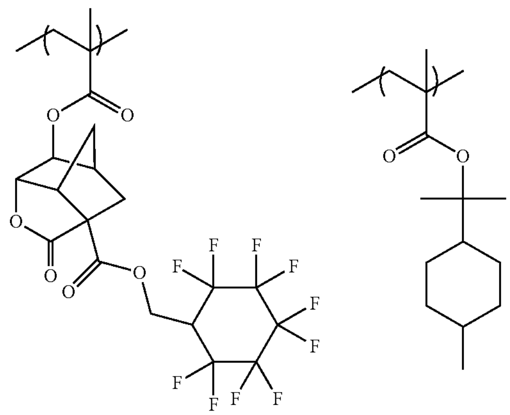
(C-20)
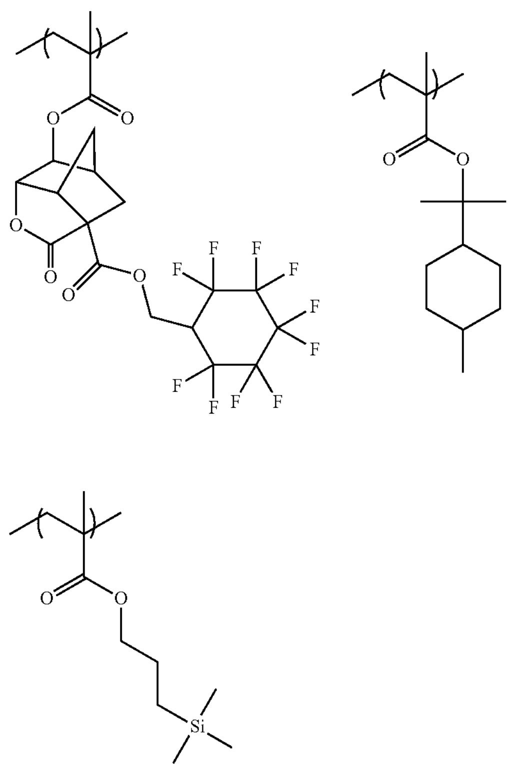
(C-21)
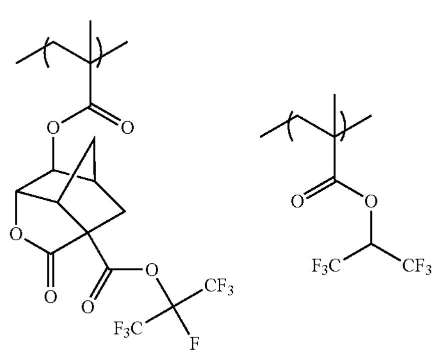

-continued
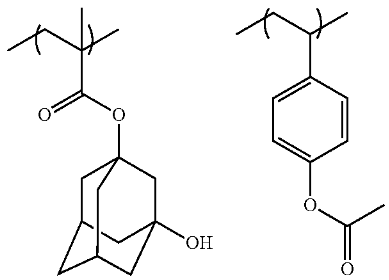
(C-22)
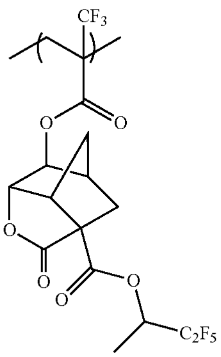
(C-23)
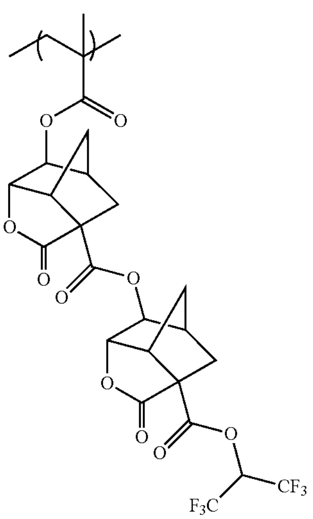
(C-24)
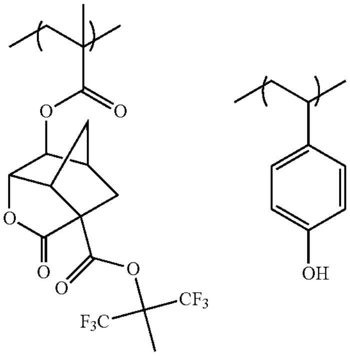
-continued
(C-25)
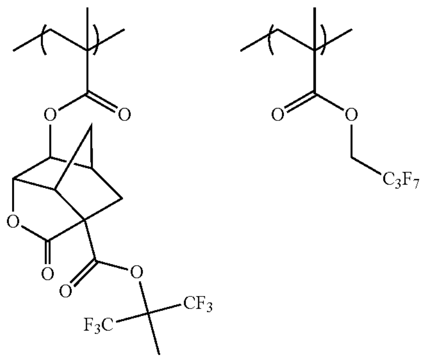
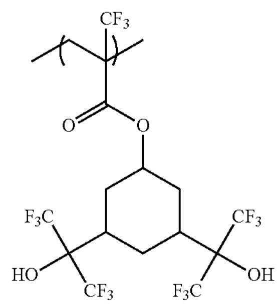
(C-26)
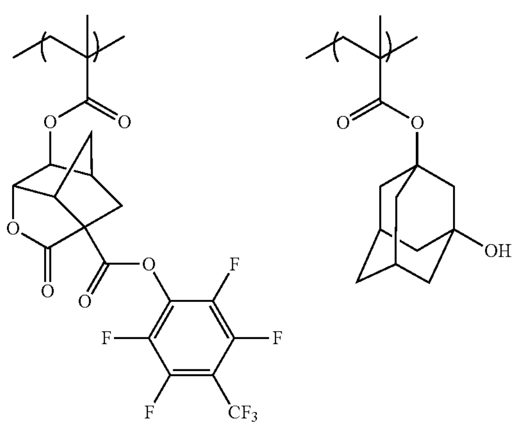
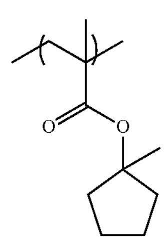

-continued
(C-27)
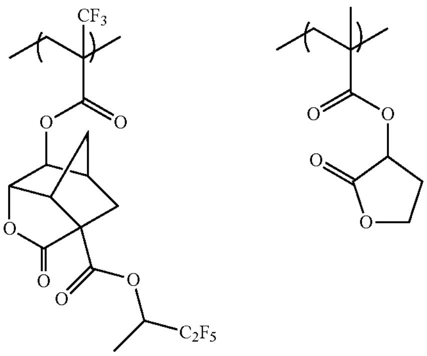
(C-28)
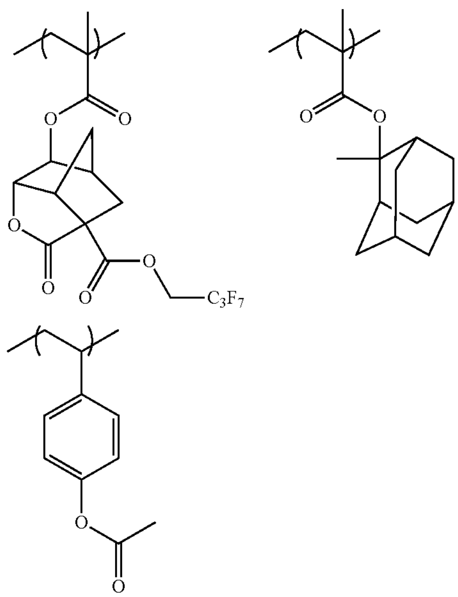
(C-29)
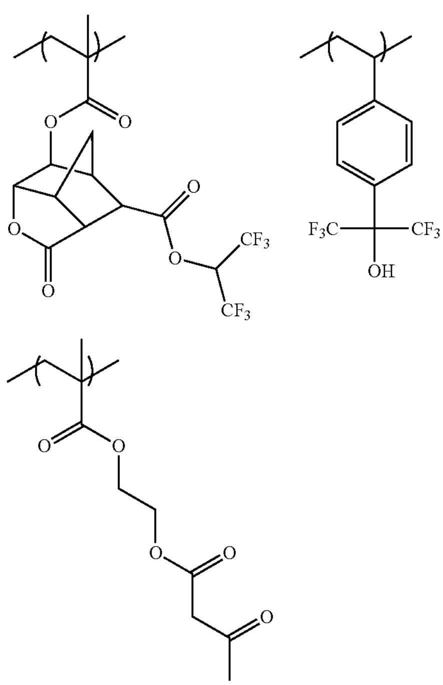
-continued
(C-30)
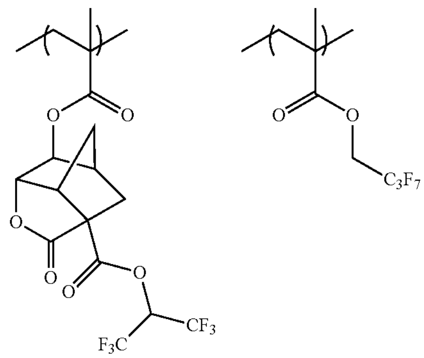
(C-31)
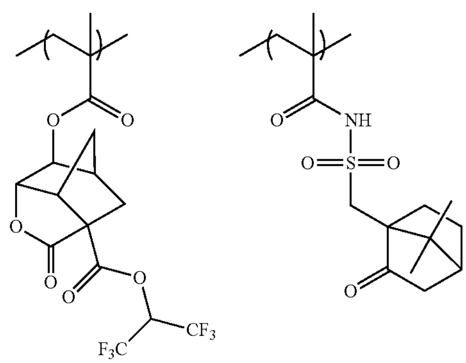
(C-32)
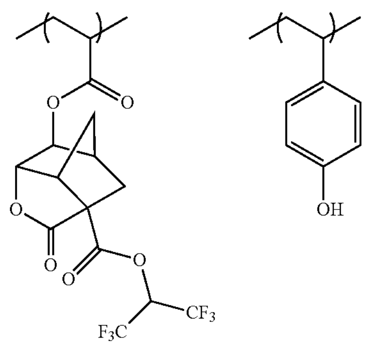
(C-33)
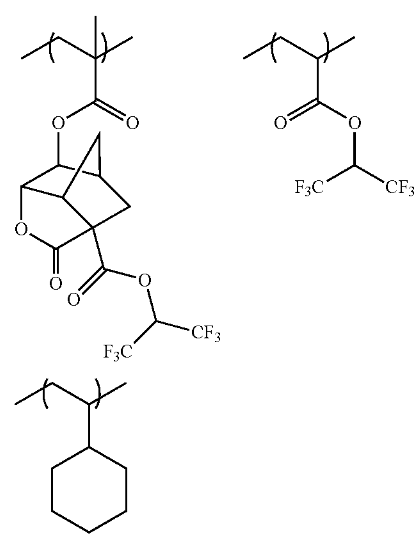

-continued
(C-34)
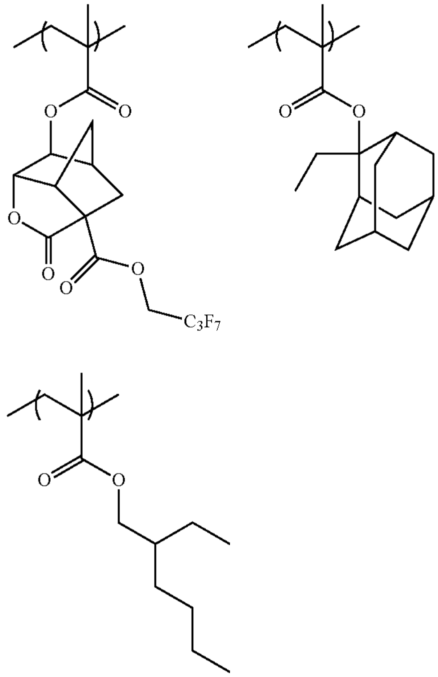
(C-35)
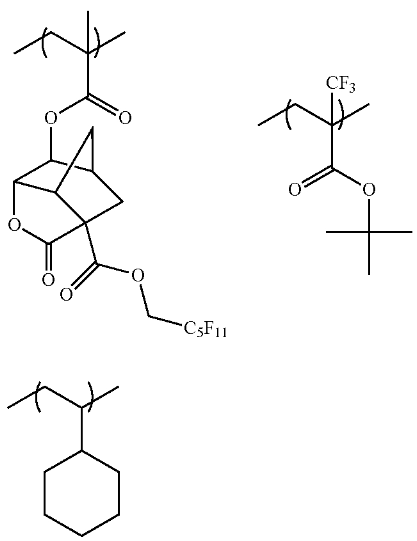
(C-36)
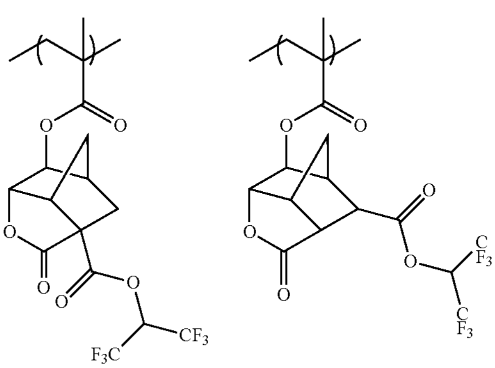
-continued
(C-37)
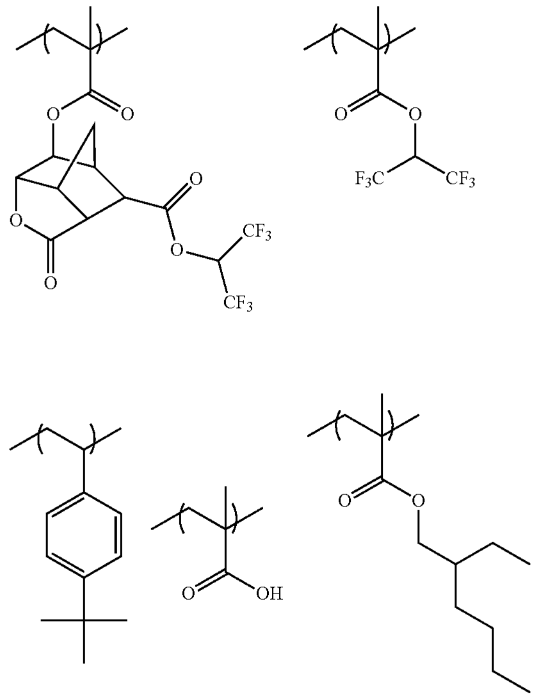
(C-38)
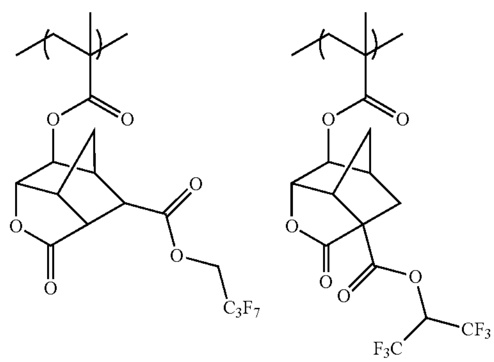
(C-39)
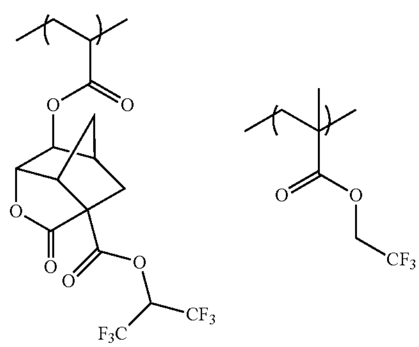

-continued
(C-40)
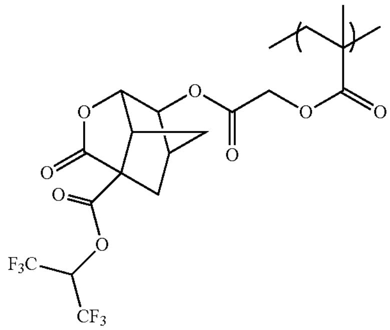
(C-41)
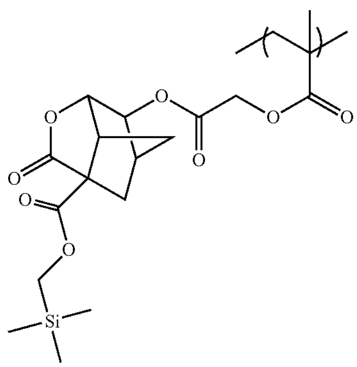
(C-42)
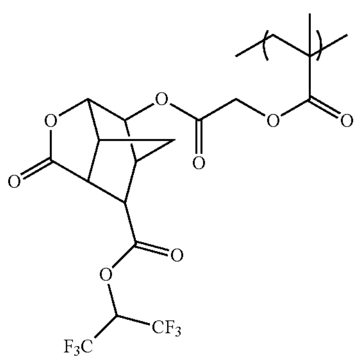
(C-43)
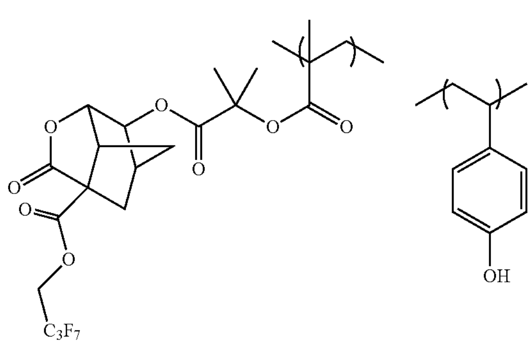
-continued
(C-44)
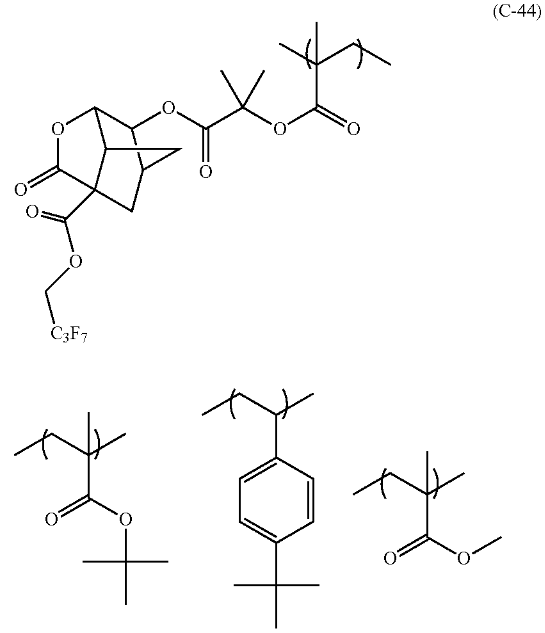
(C-45)
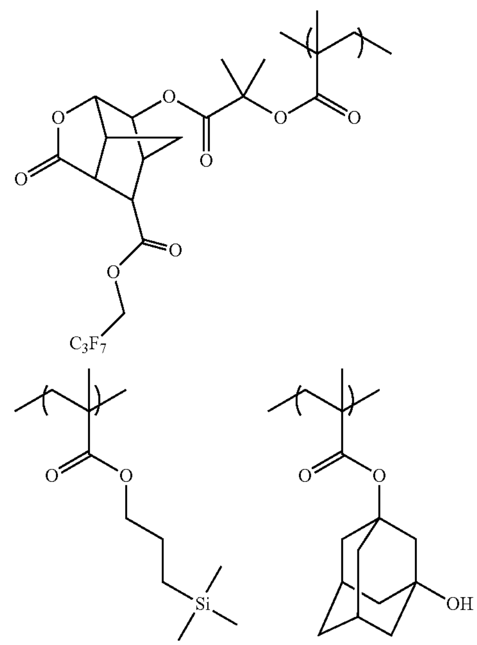
(C-46)
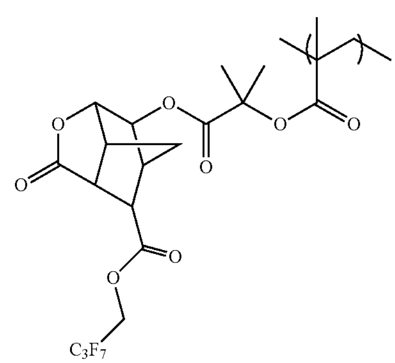

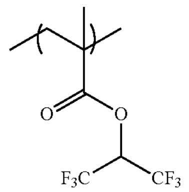
(C-47)
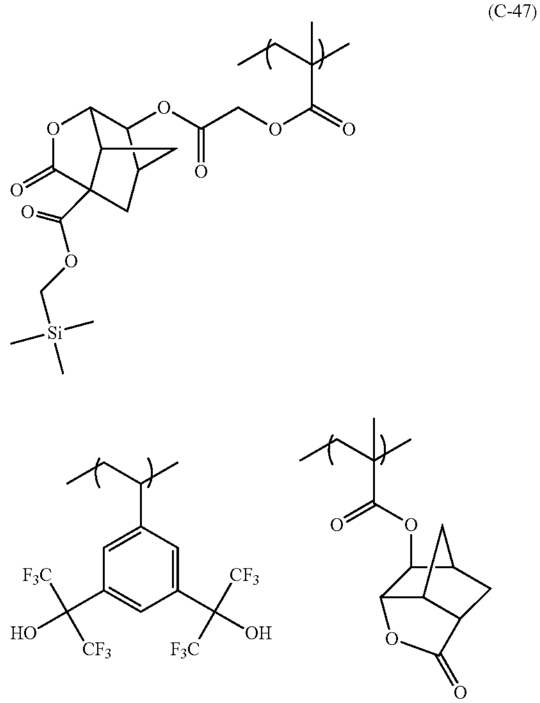
(C-48)
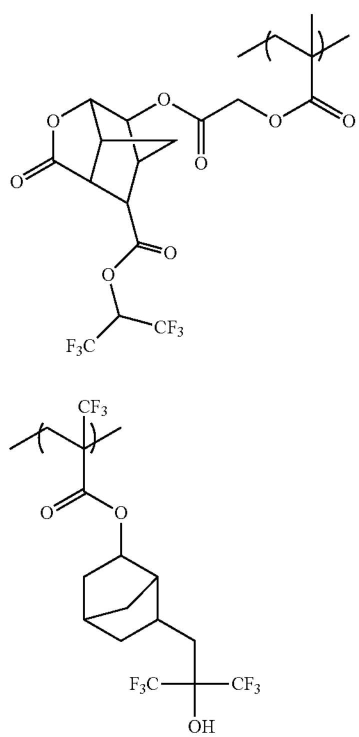
(C-49)
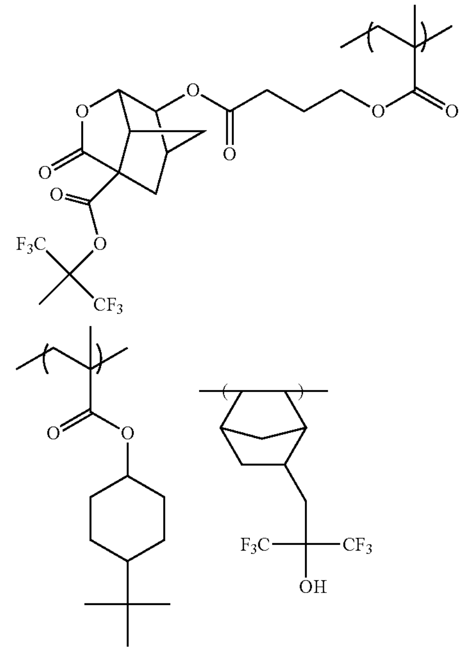
(C-50)
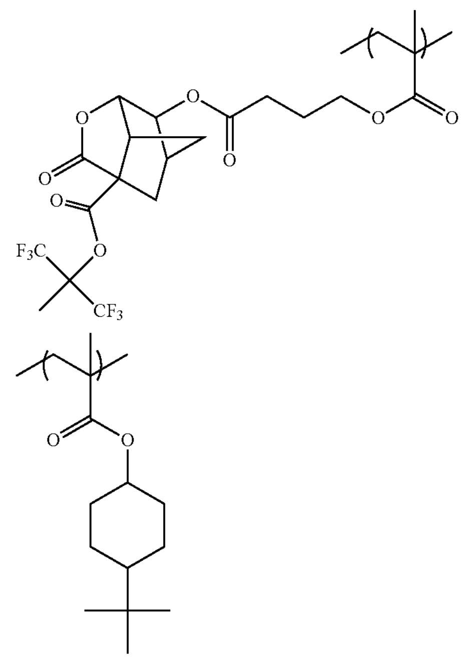
(C-51)
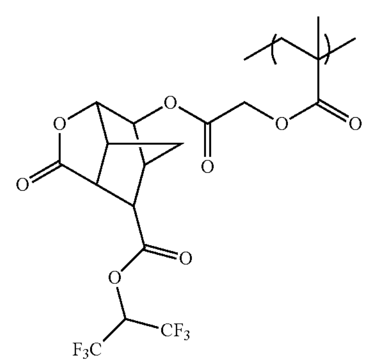

-continued
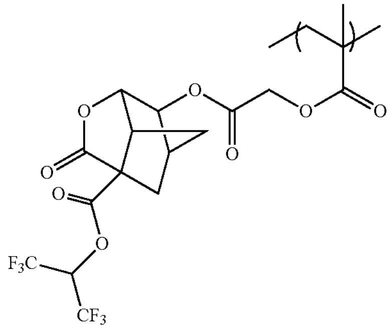
(C-52)
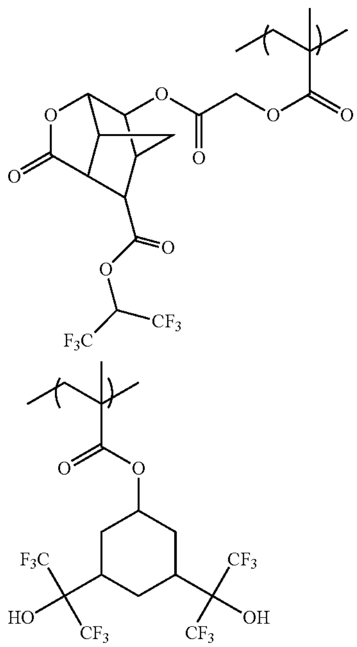
(C-53)
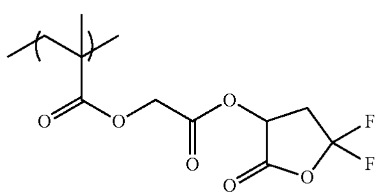
(C-54)
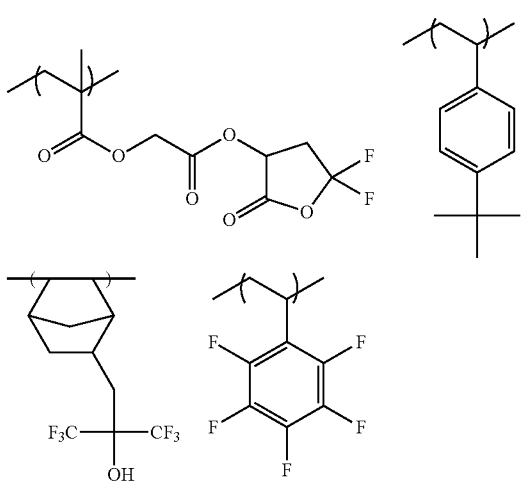
-continued
(C-55)
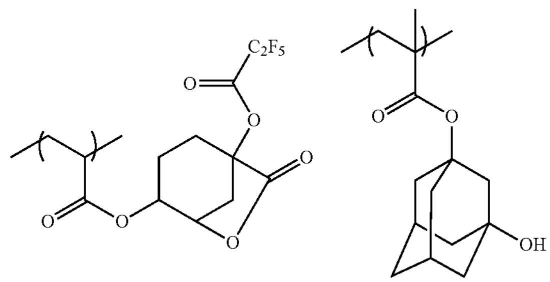
(C-56)
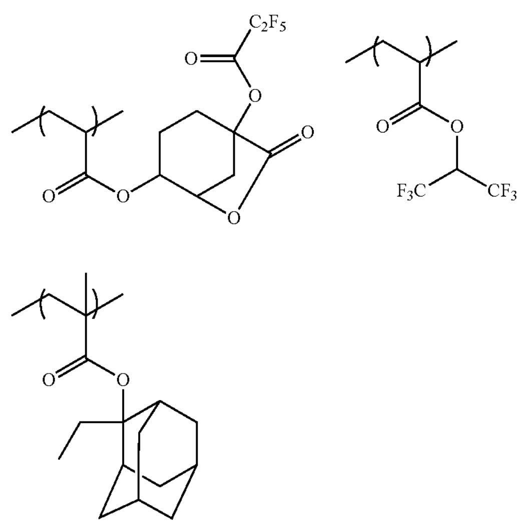
(C-57)
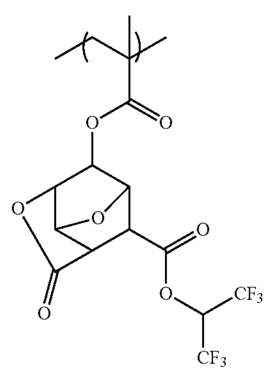
(C-58)
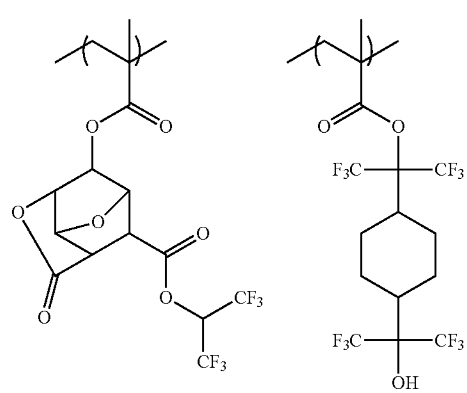

-continued
(C-59)
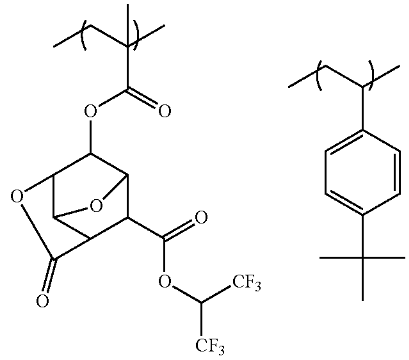
(C-60)
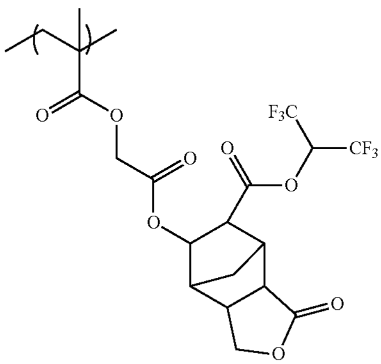
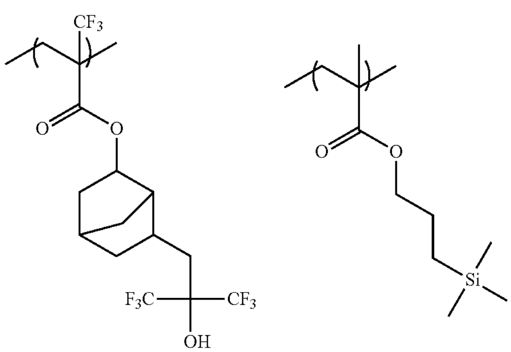
(C-61)
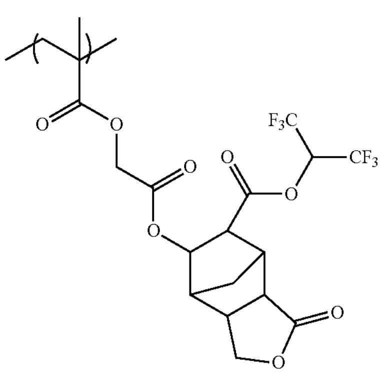
-continued
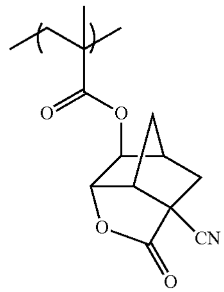
(C-62)
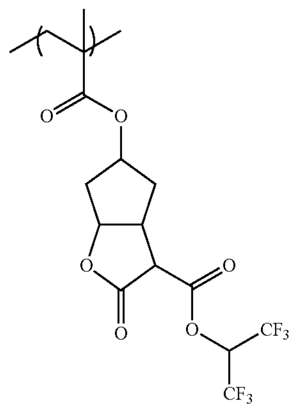
(C-63)
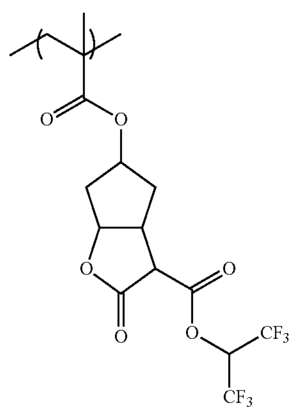
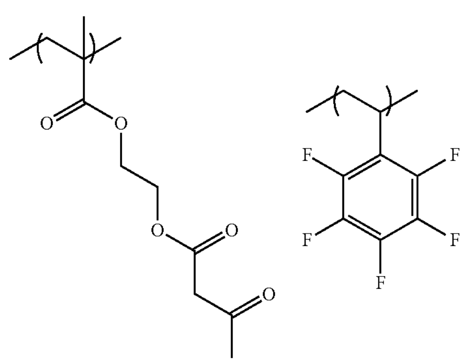

-continued
(C-64)
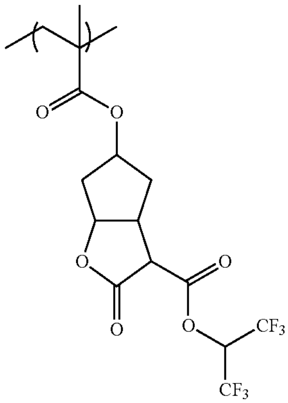
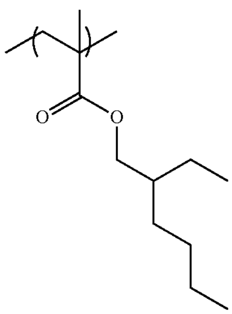
(C-65)
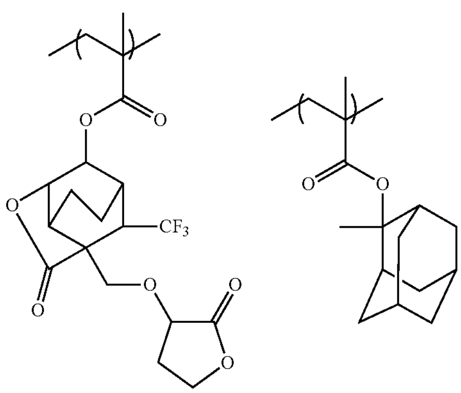
(C-66)
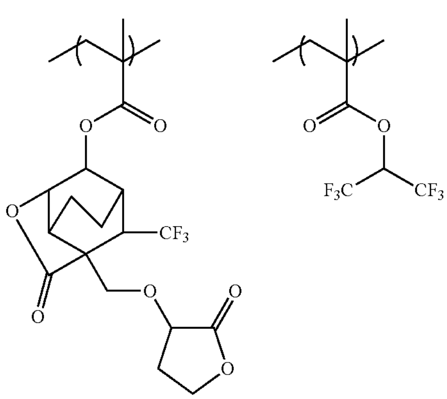
-continued
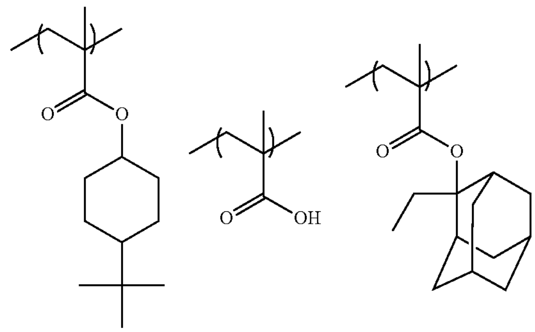
(C-67)
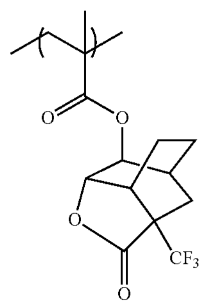
(C-68)
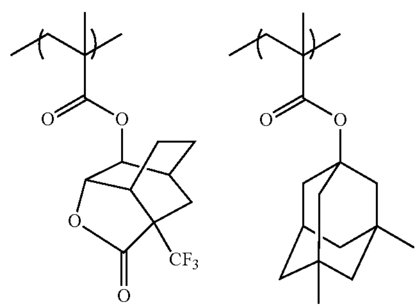
(C-69)
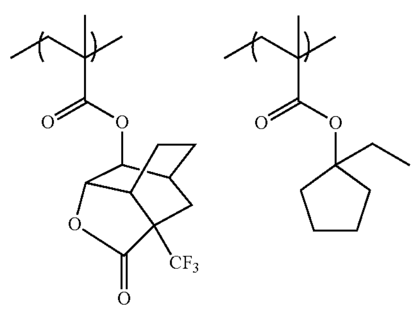
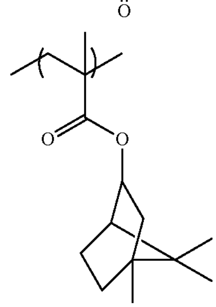

-continued
(C-70)
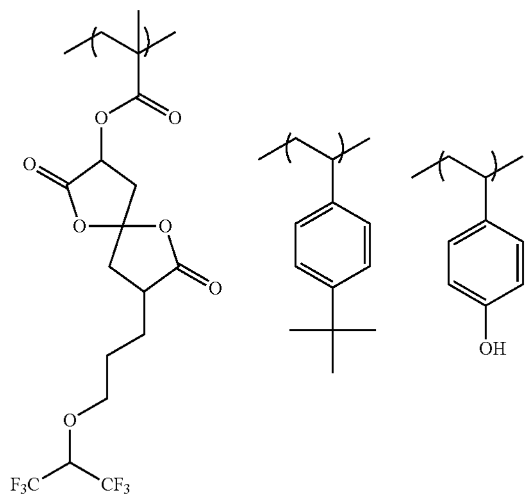
(C-71)
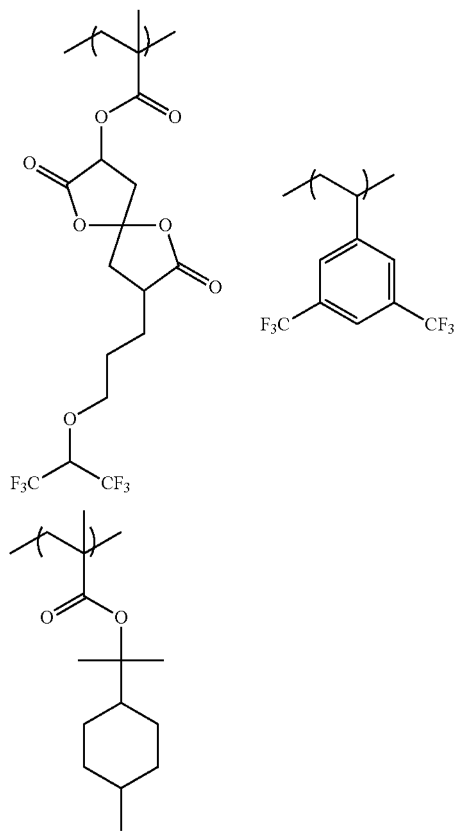
(C-72)
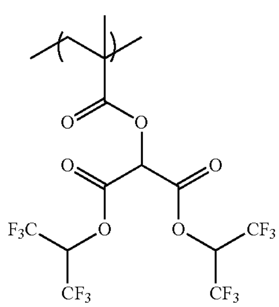
-continued
(C-73)
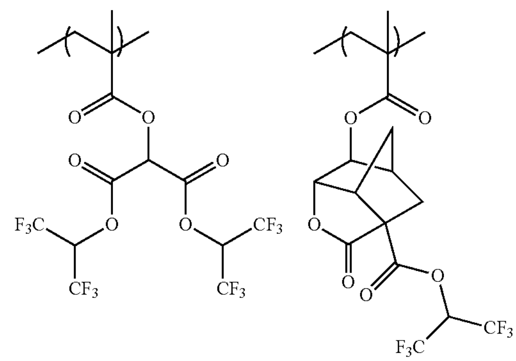
(C-74)
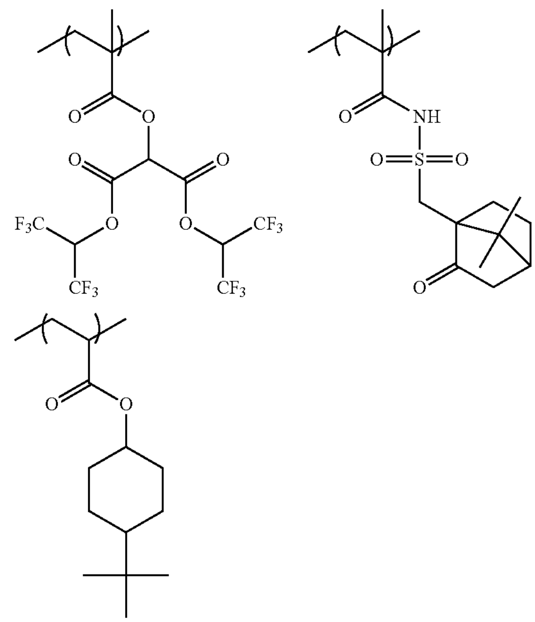
(C-75)
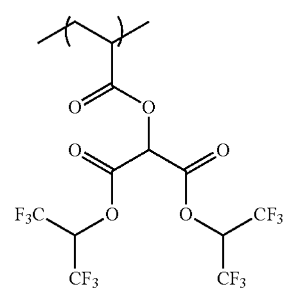
(C-76)
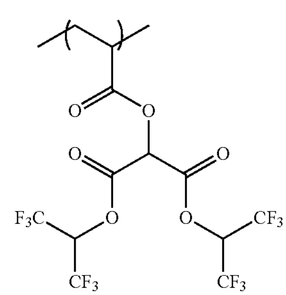

-continued
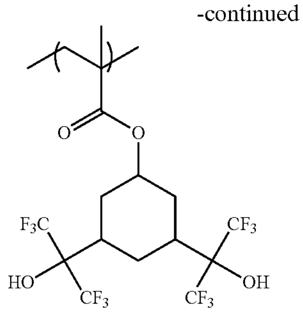
(C-77)
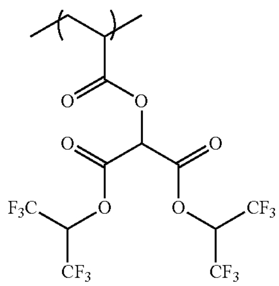
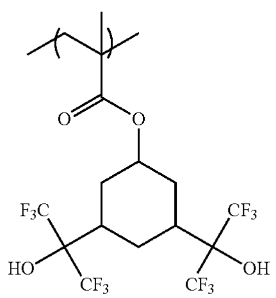
(C-78)
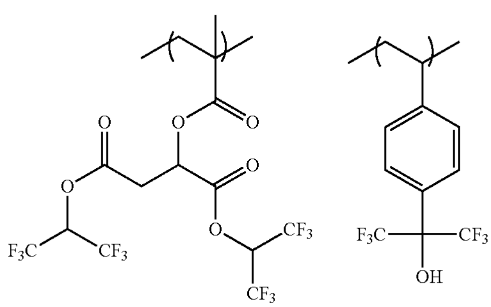
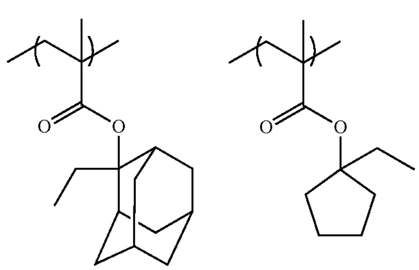
-continued
(C-79)
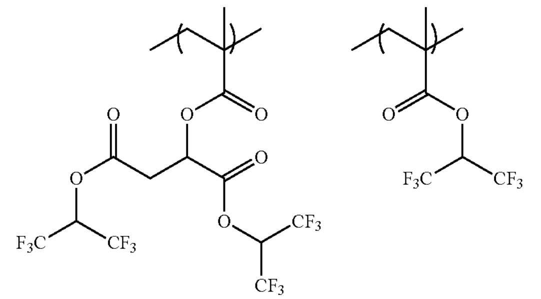
(C-80)
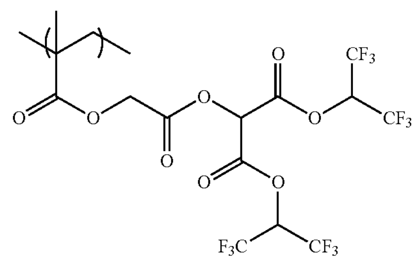
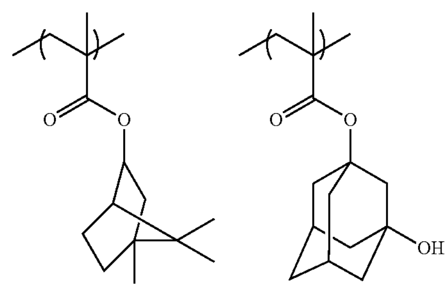
(C-81)
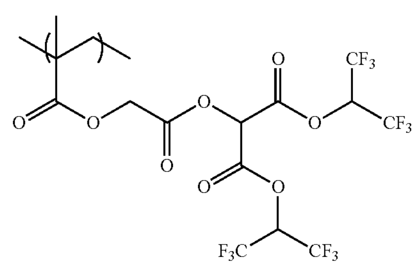
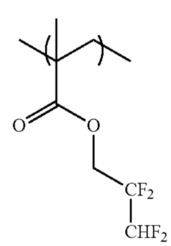

-continued
(C-82)
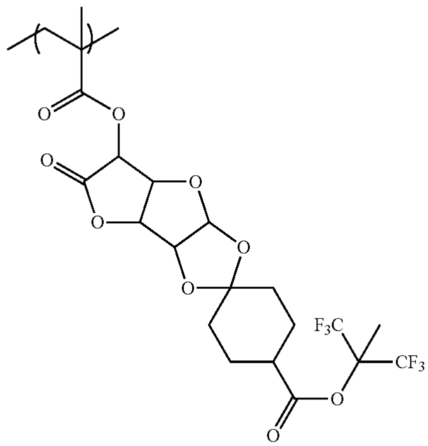
(C-83)
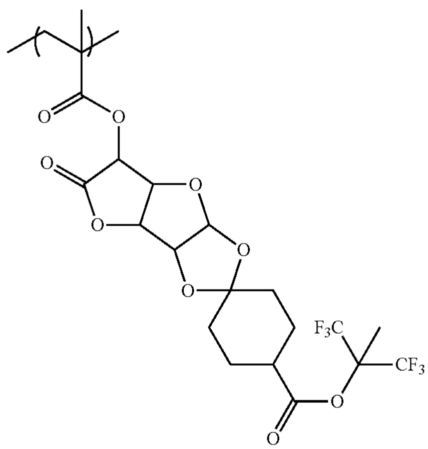
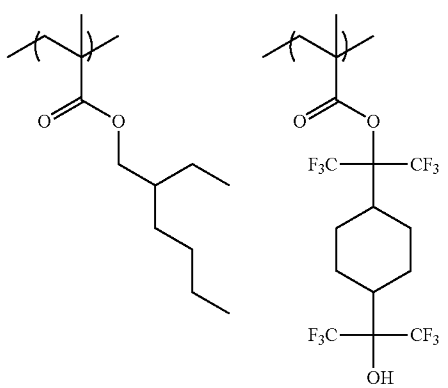
(C-84)
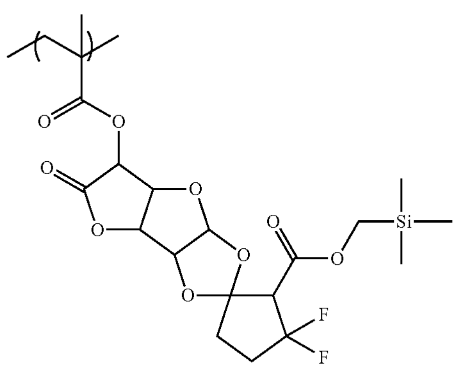
-continued
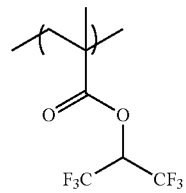
(C-85)
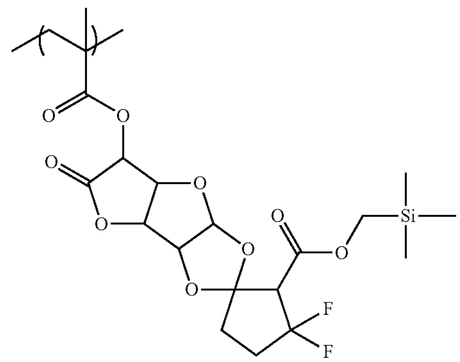
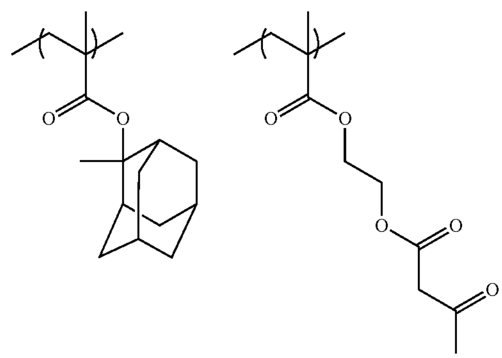
(C-86)
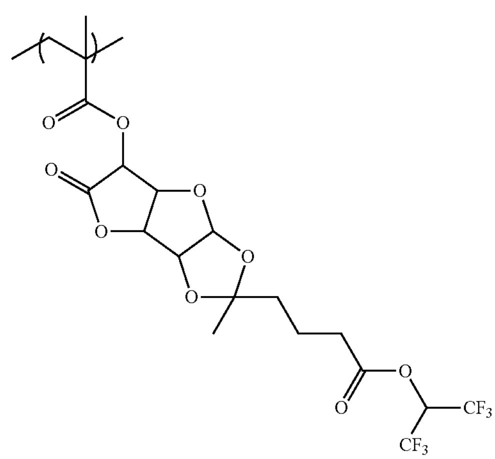

-continued
(C-87)
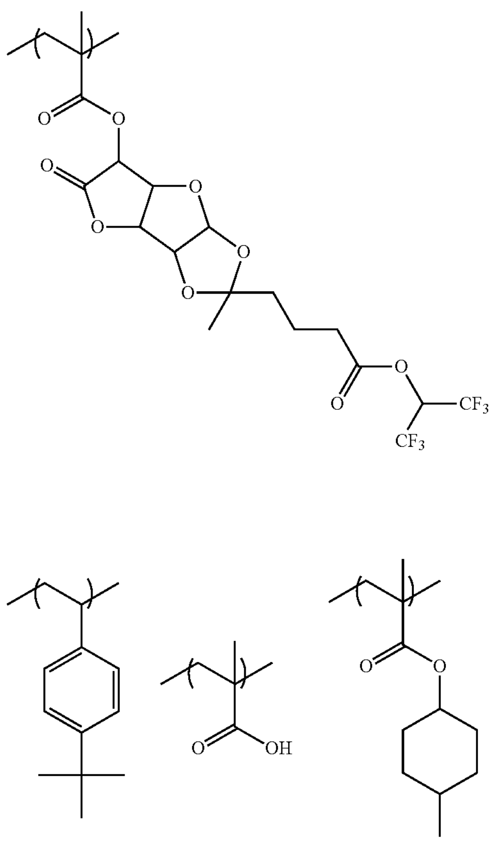
(C-88)
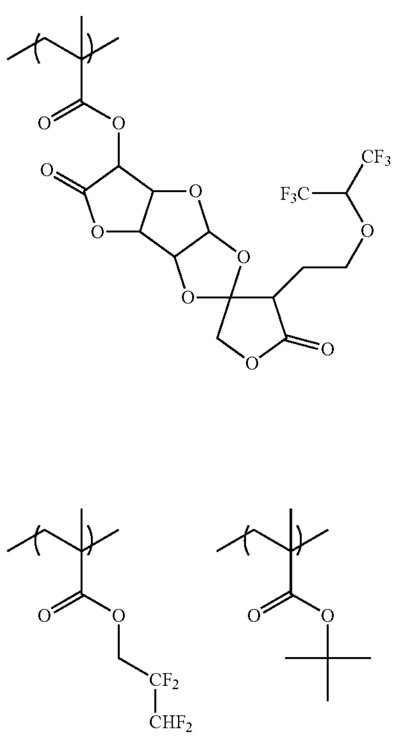
-continued
(C-89)
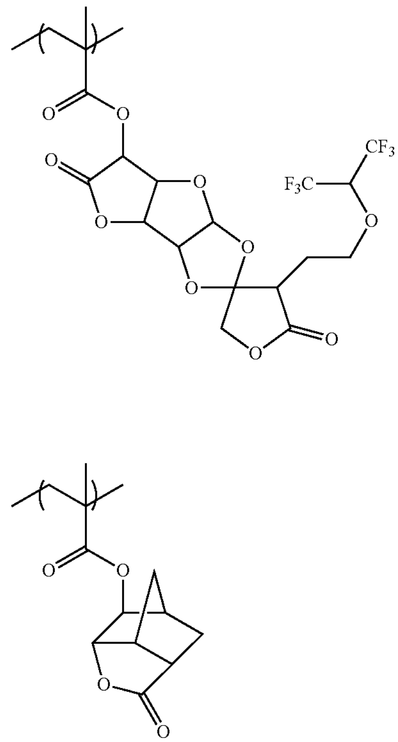
(C-90)
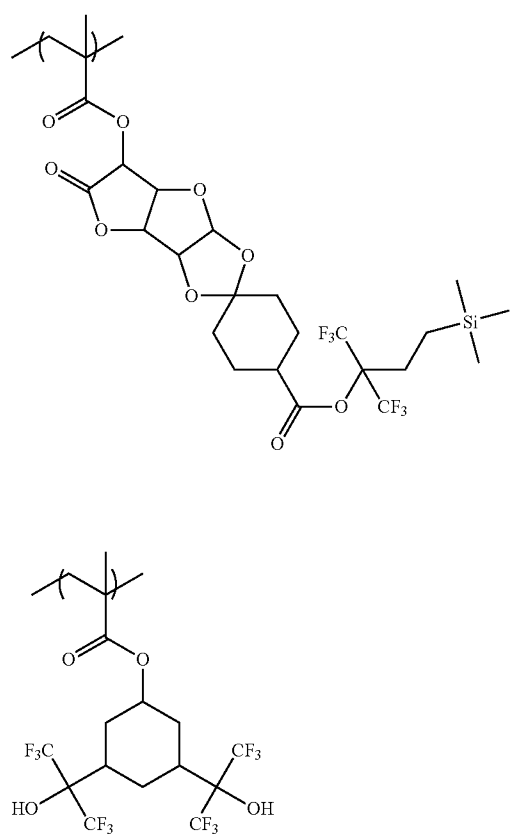

-continued
(C-91)
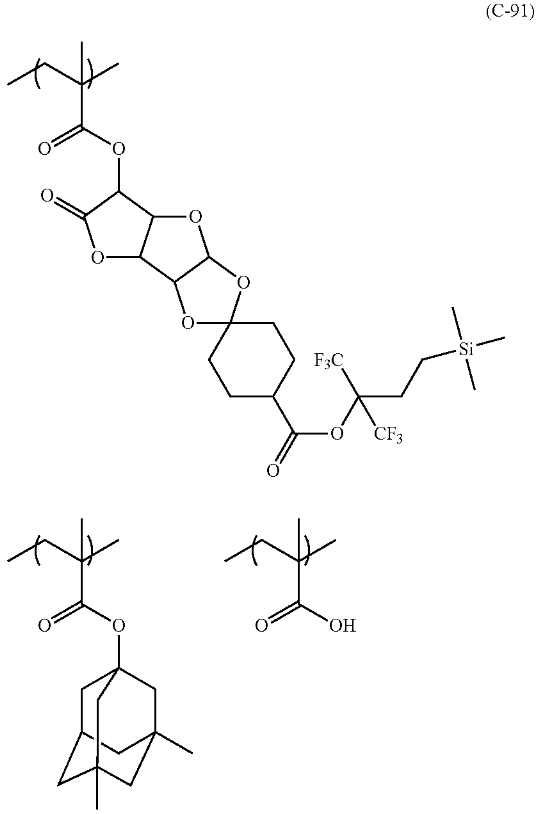
(C-92)
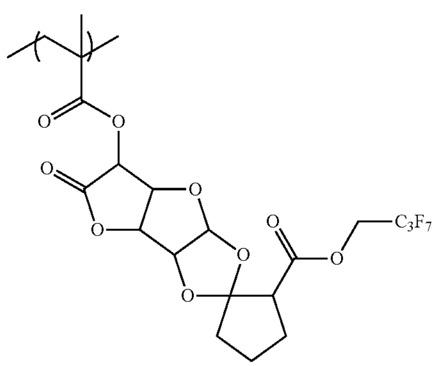
(C-93)
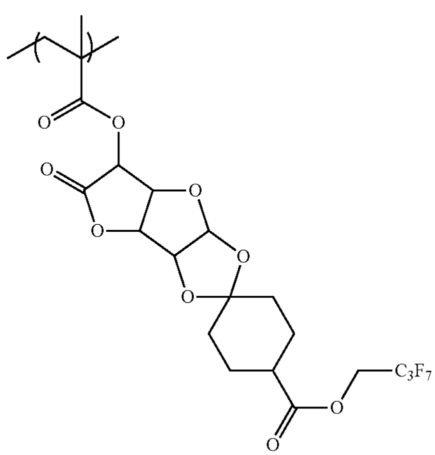
-continued
(C-94)
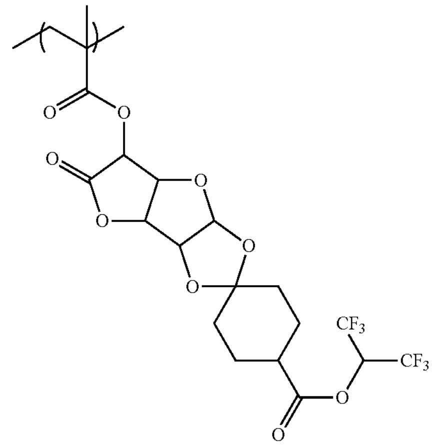
(C-95)
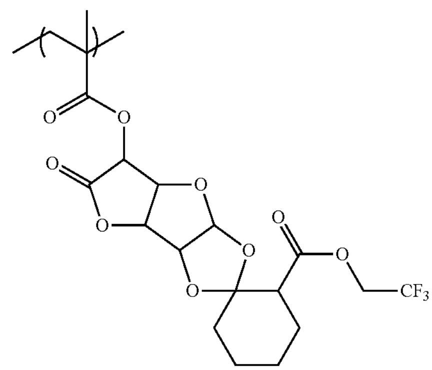
(C-96)
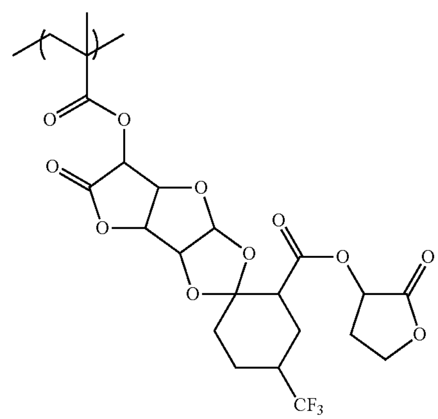
(C-97)
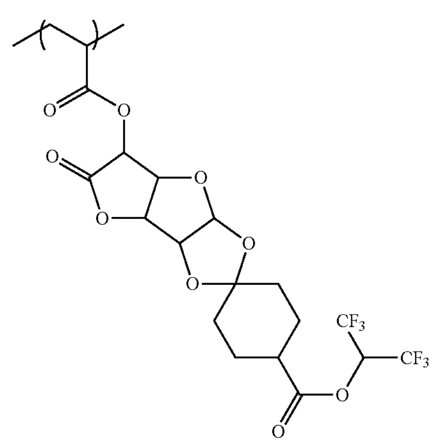

-continued
(C-98)
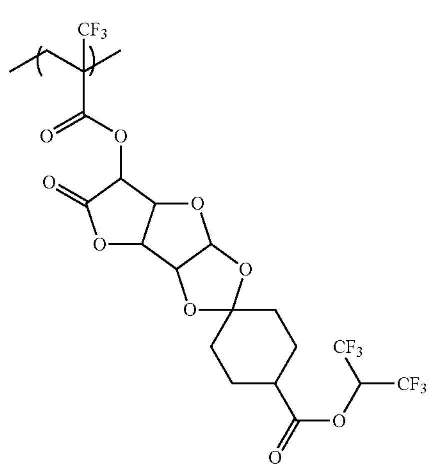
(C-99)
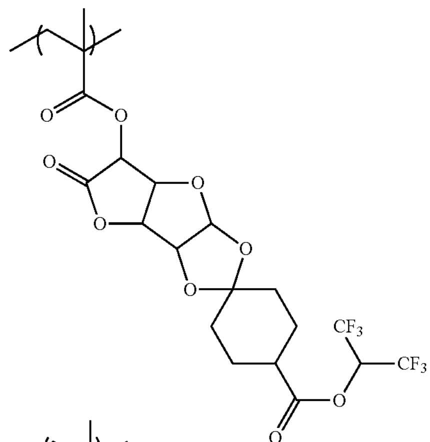
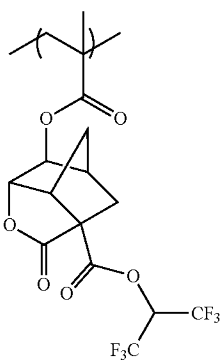
(C-100)
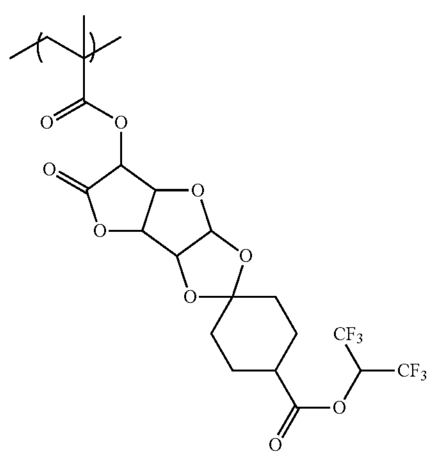
-continued
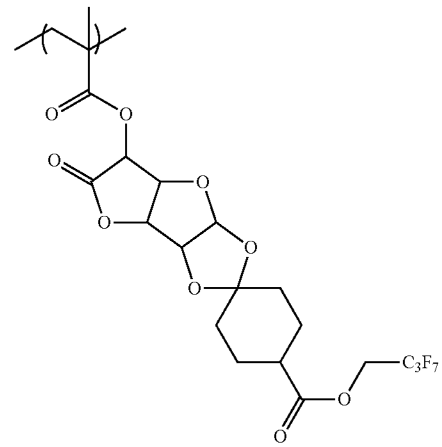
(C-101)
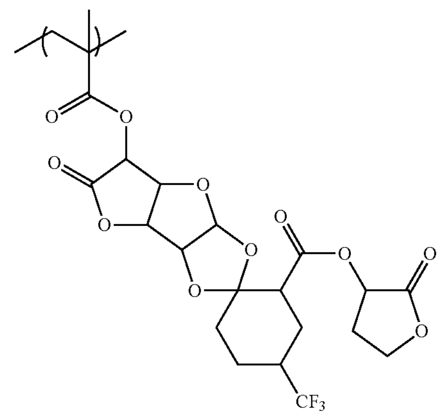
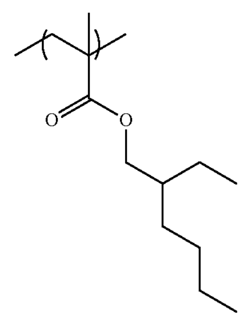
(C-102)
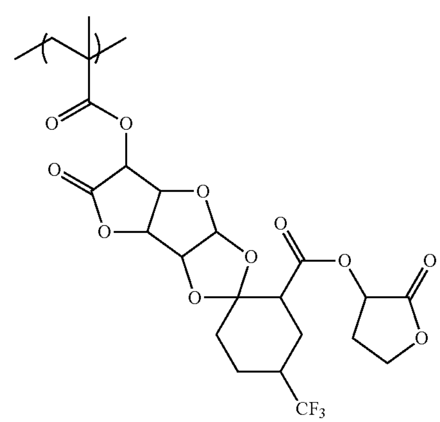

-continued
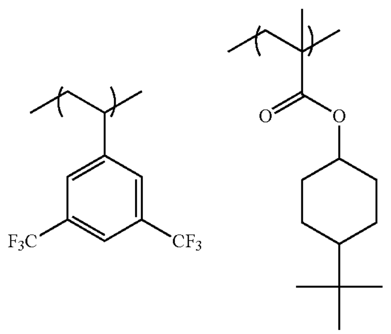
(C-103)
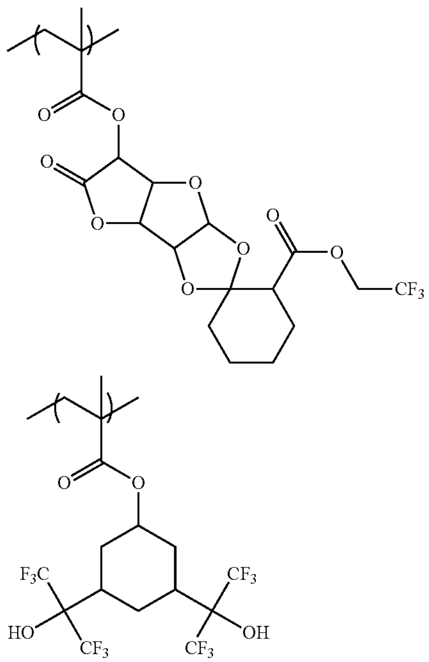
(C-104)
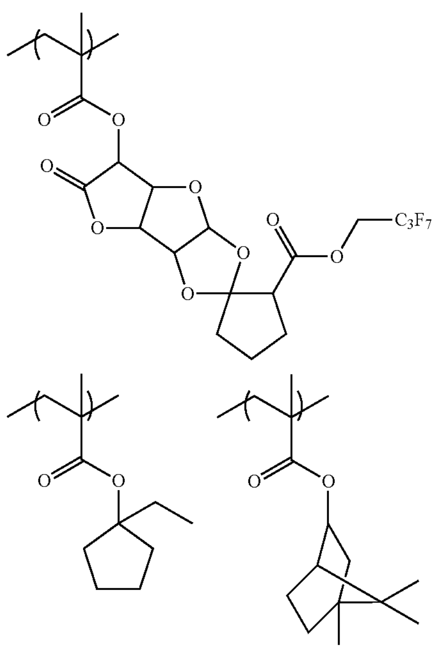
-continued
(C-105)
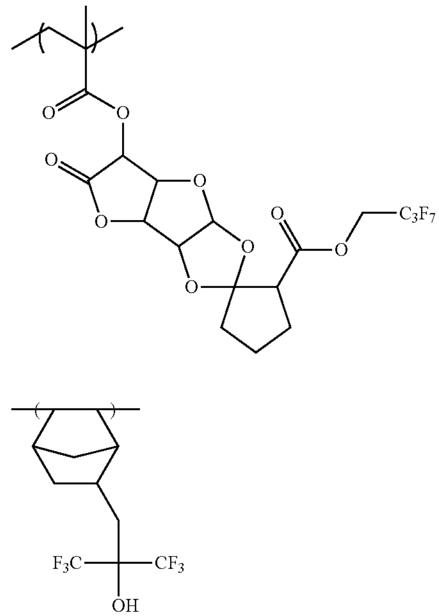
(C-106)
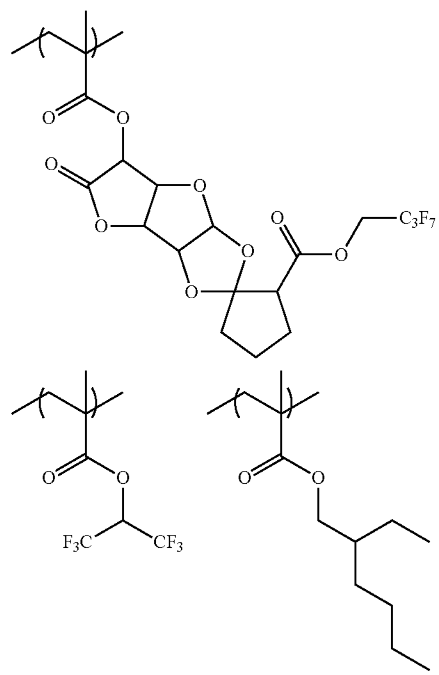
(C-107)
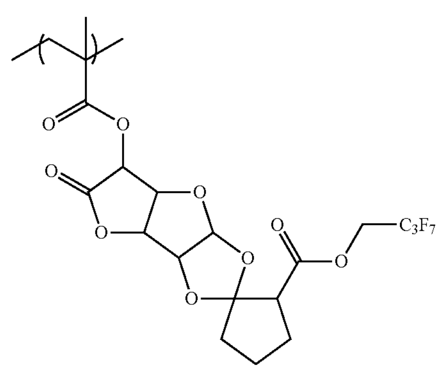

-continued
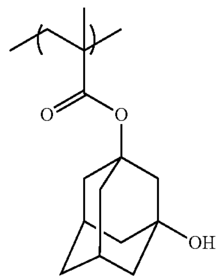
(C-108)
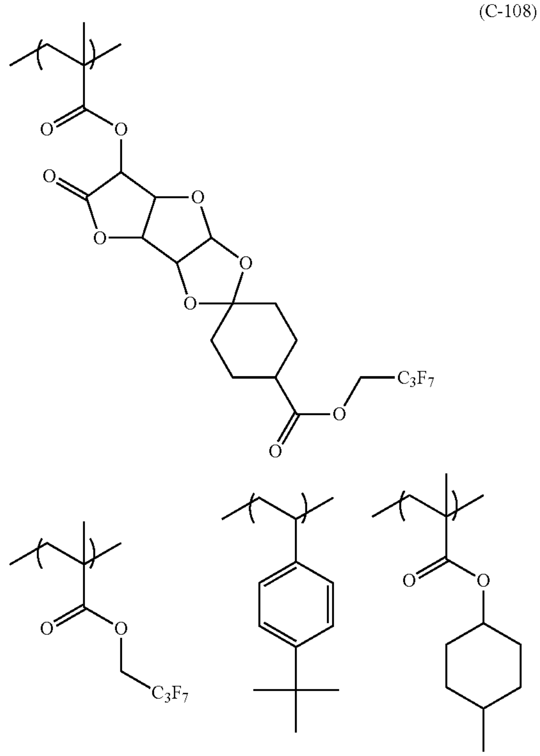
(C-109)
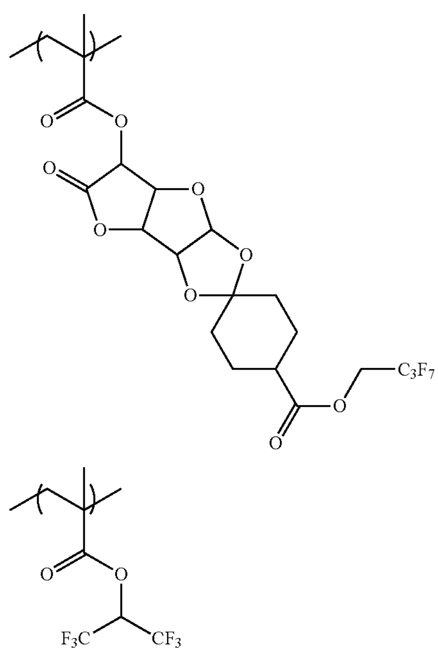
-continued
(C-110)
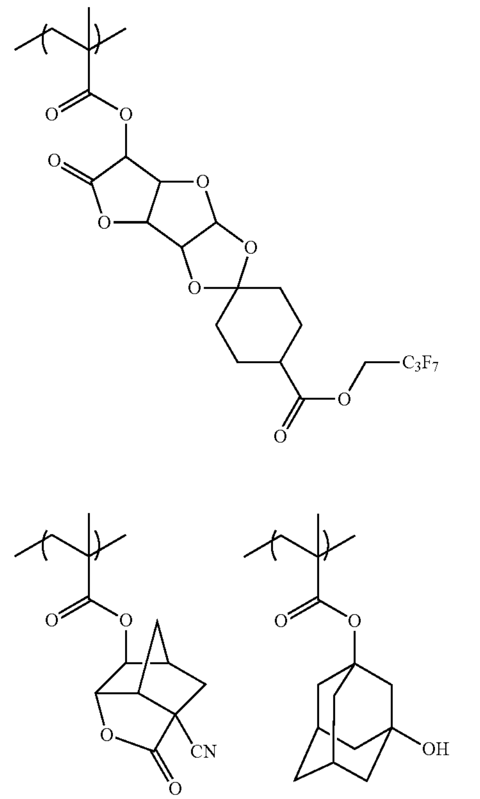
(C-111)
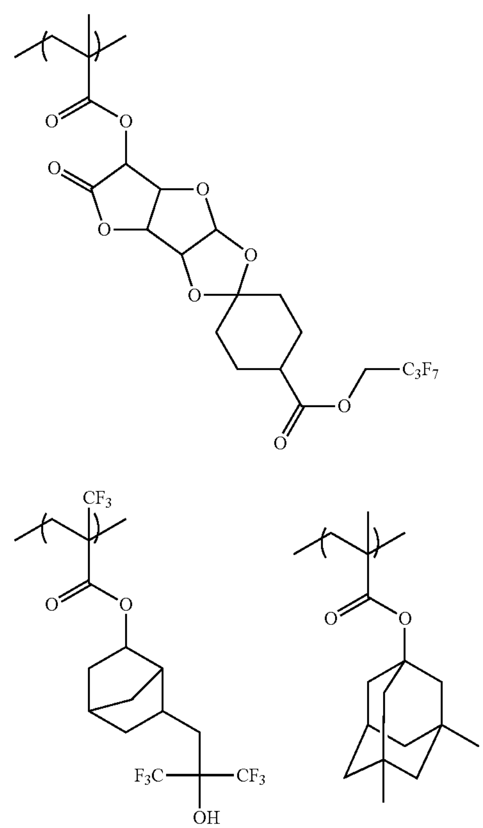

-continued
(C-112)
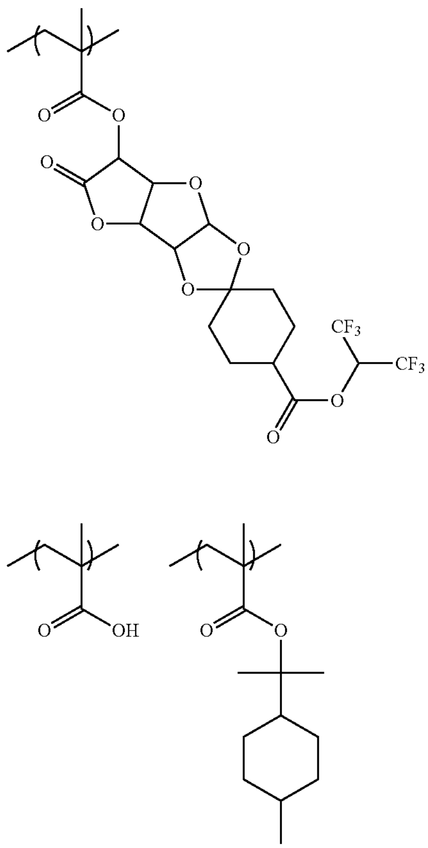
(C-113)
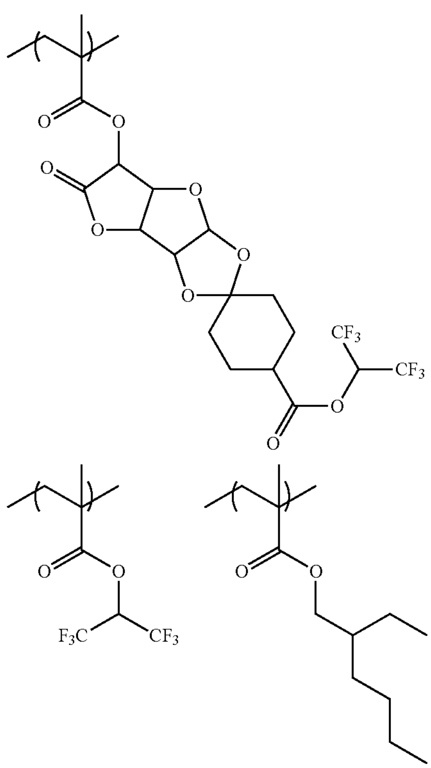
-continued
(C-114)
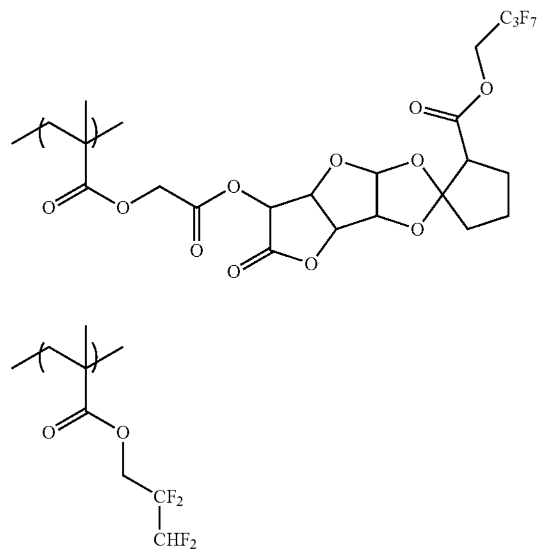
(C-115)
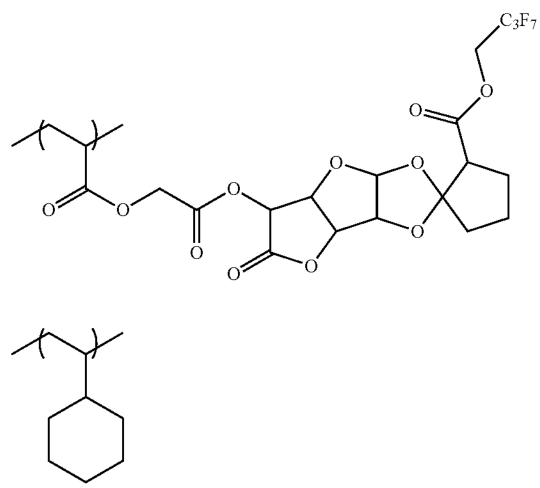
(C-116)
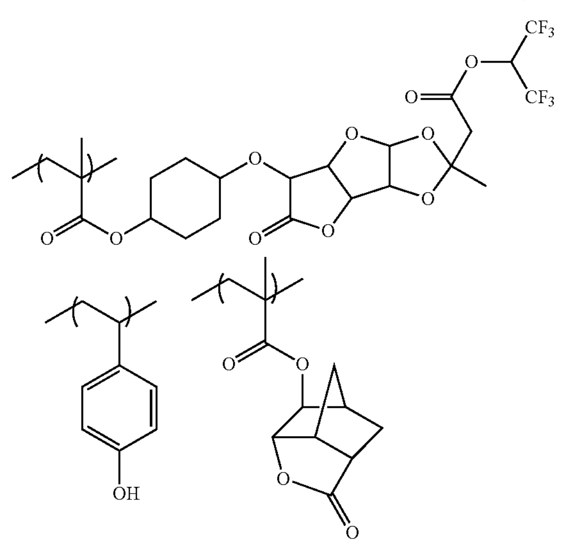

-continued
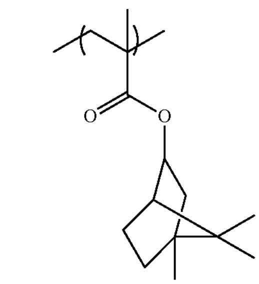
(C-117)
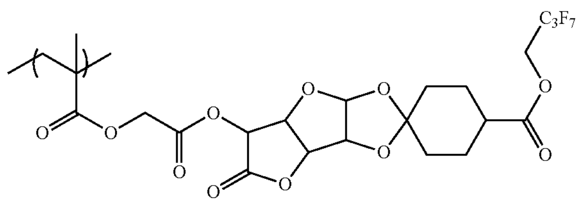
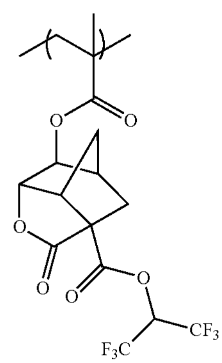
(C-118)
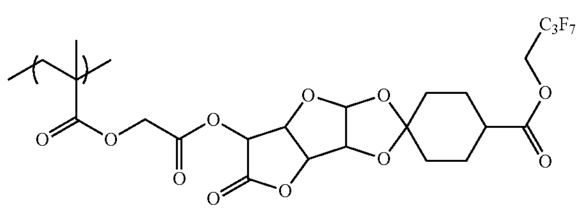
(C-119)
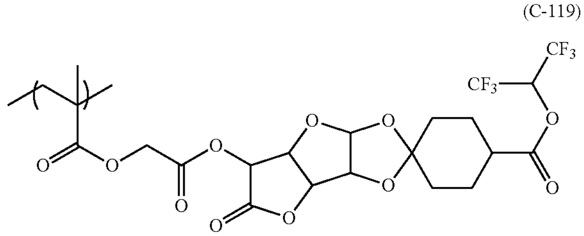
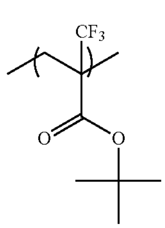
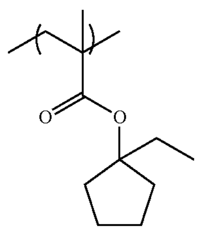
-continued
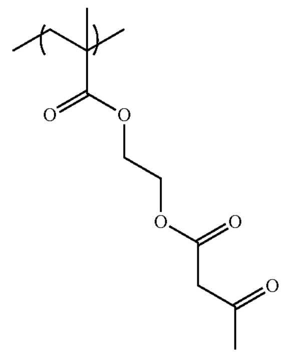
(C-120)
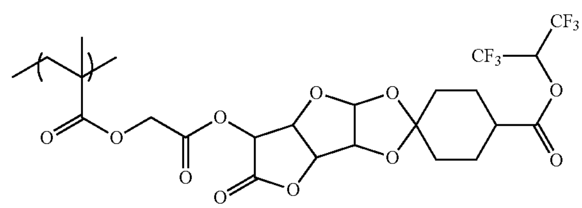
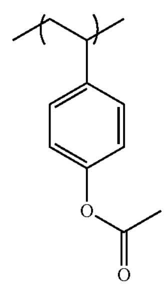
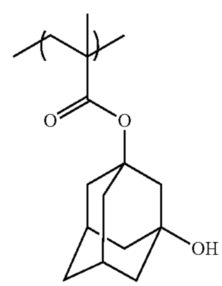
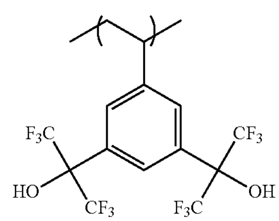
(C-121)
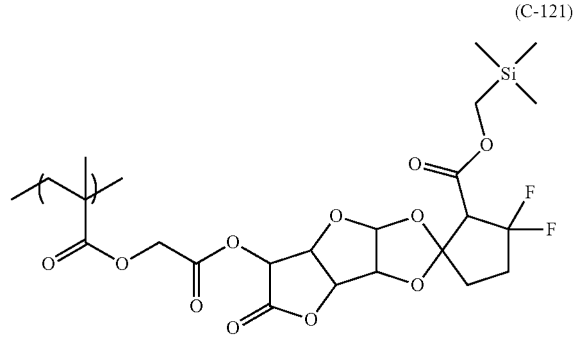

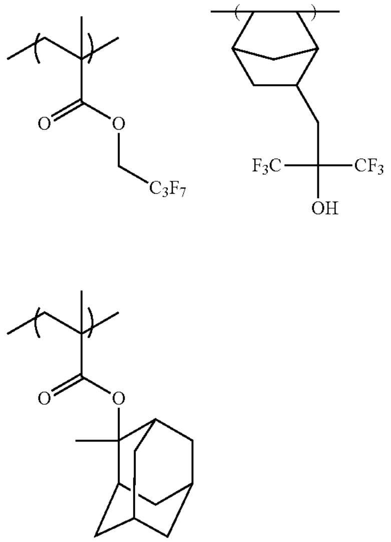
(C-122)
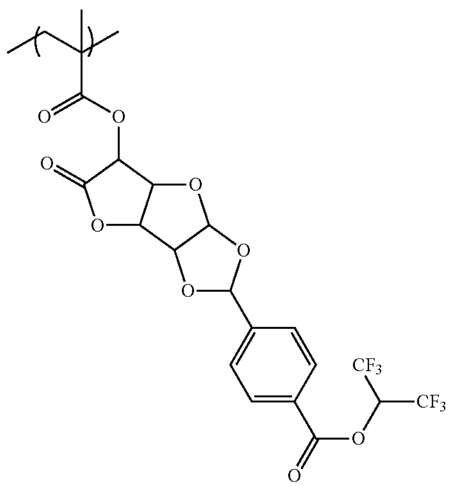
(C-123)
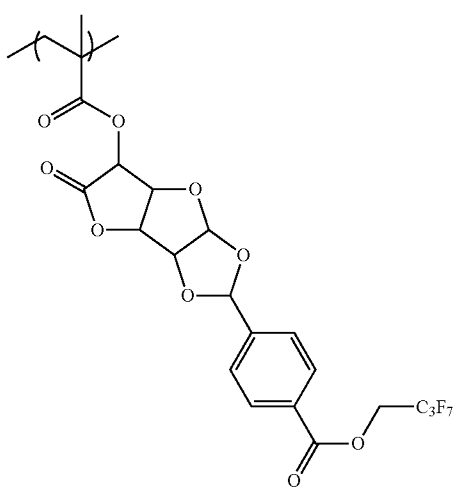
(C-124)
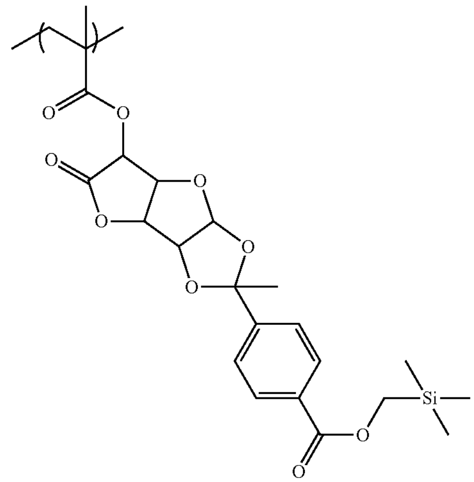
(C-125)
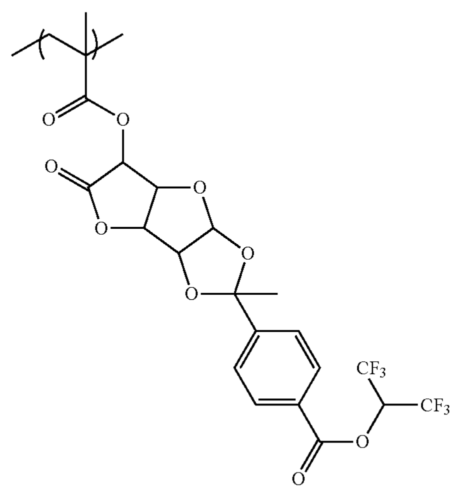
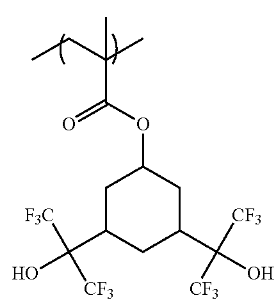

-continued
(C-126)
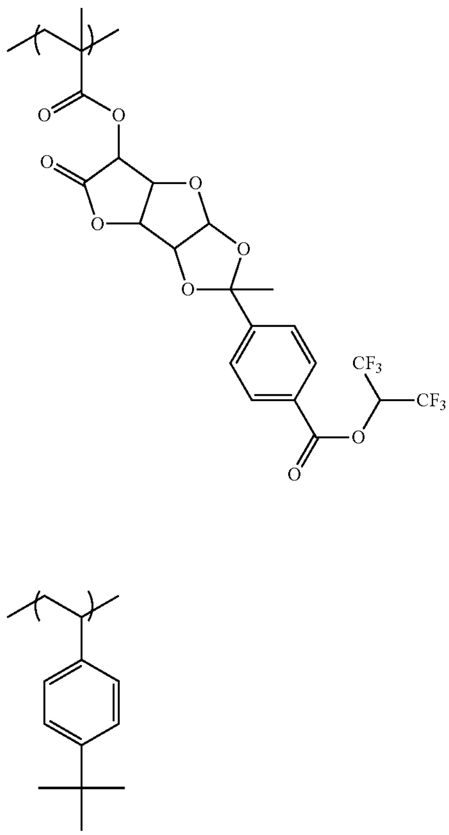
(C-127)
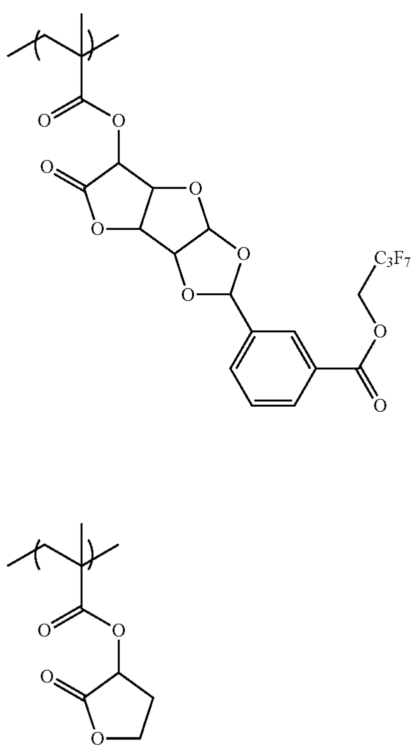
-continued
(C-128)
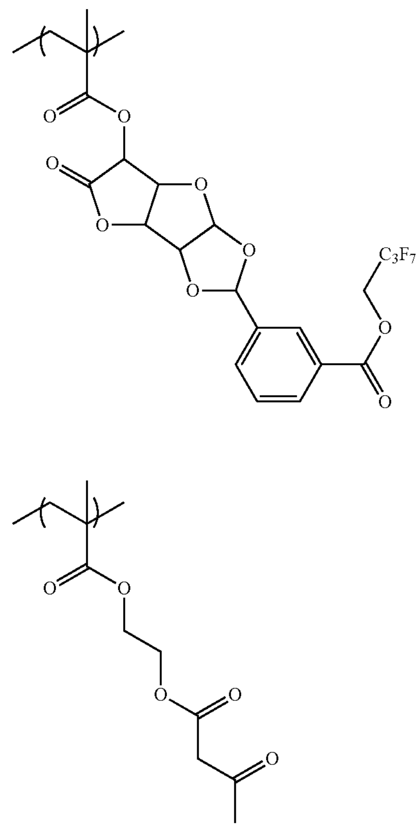
(C-129)
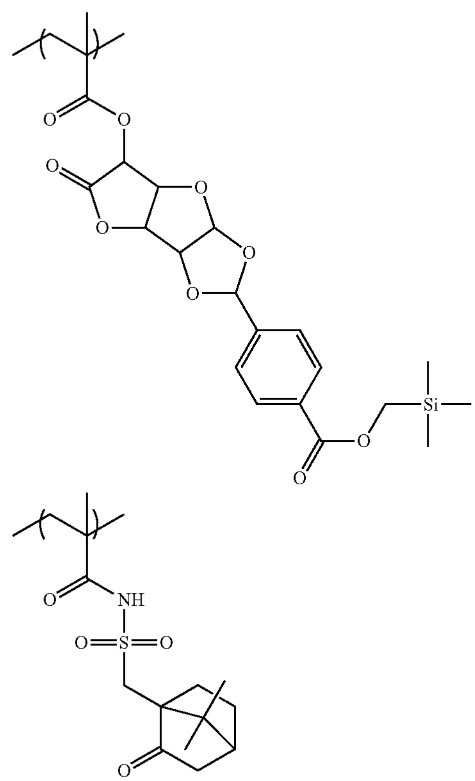

-continued
(C-130)
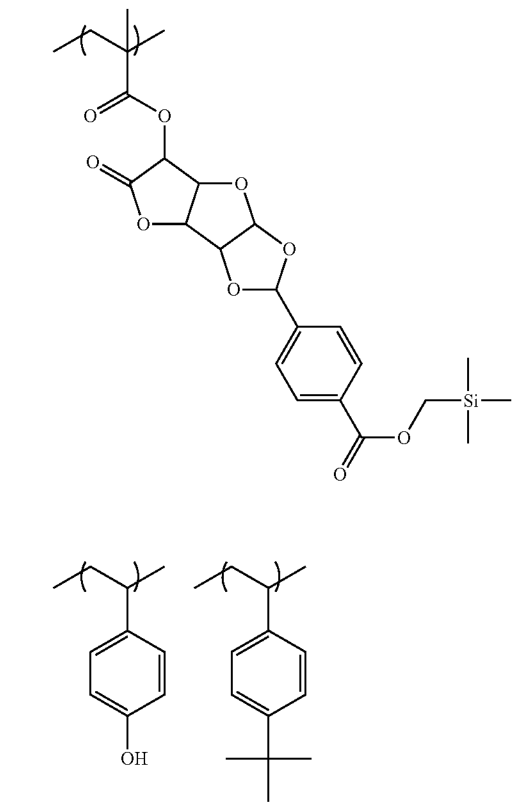
(C-131)
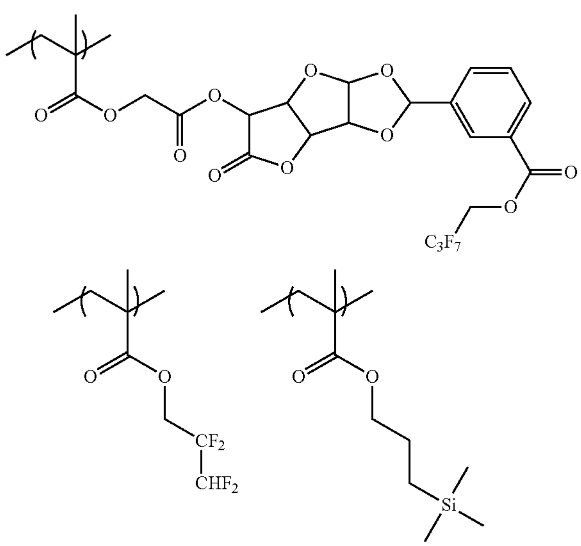
(C-132)
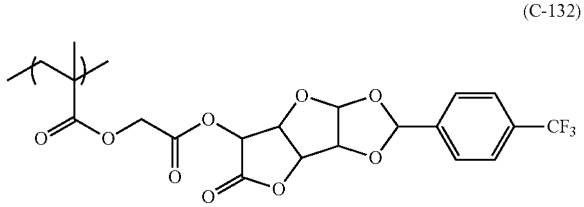
-continued
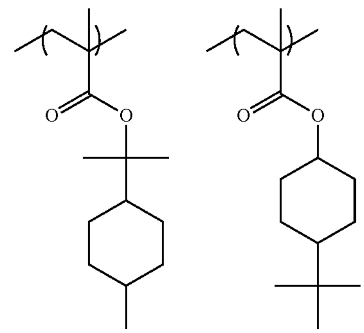
(C-133)
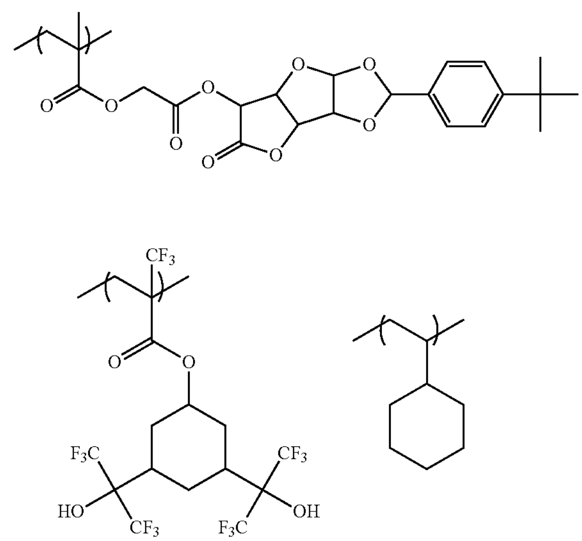
(C-134)
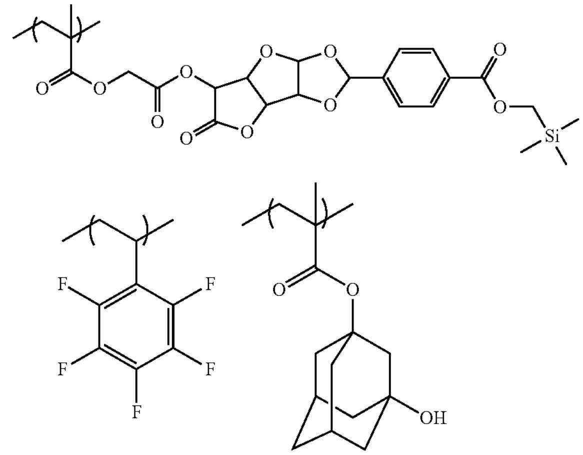
(C-135)
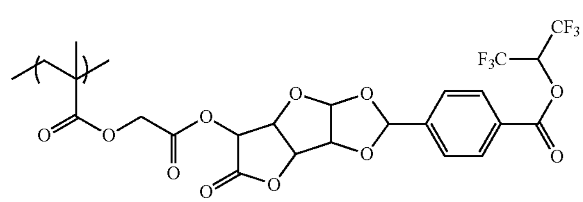

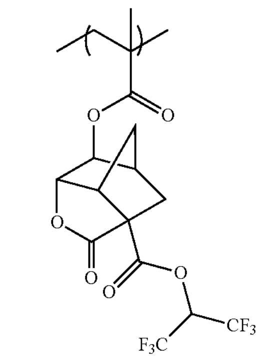
(C-136)
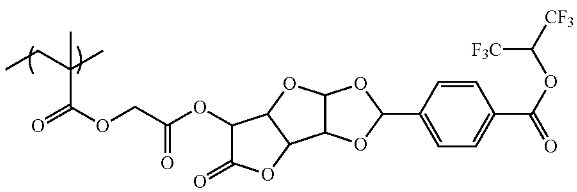
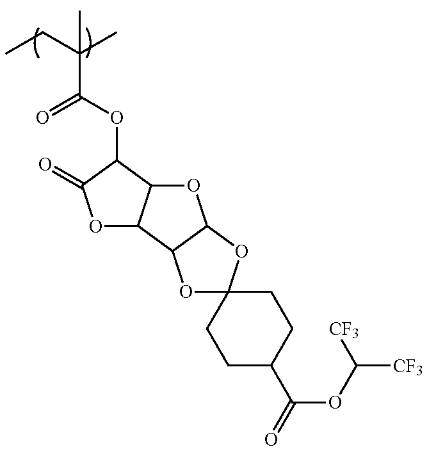
(C-137)
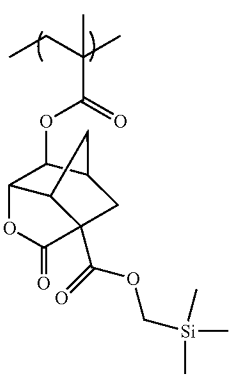
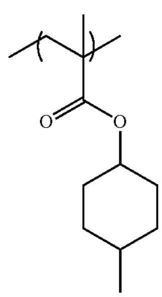
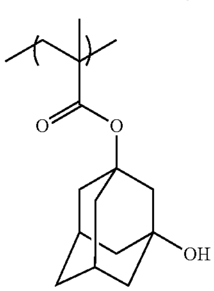
(C-138)
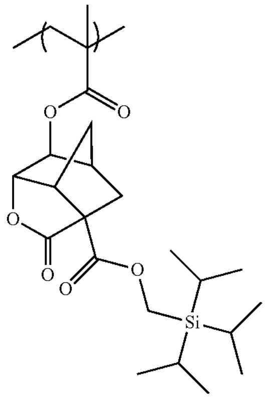
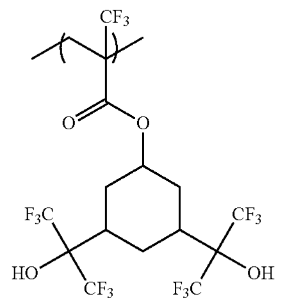
(C-139)
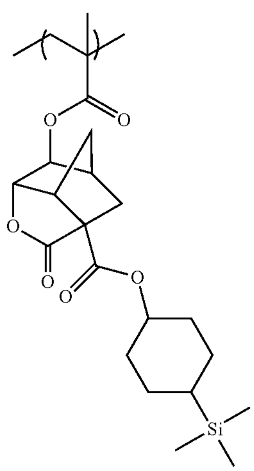
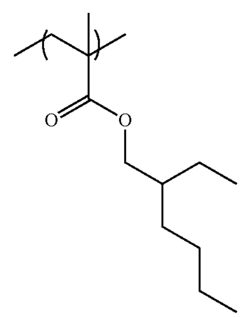
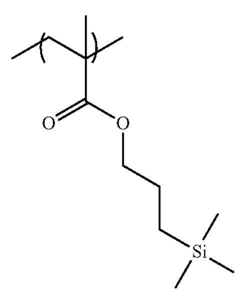
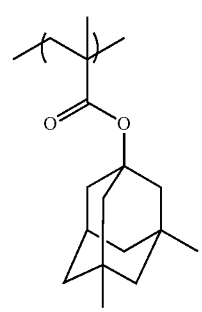

-continued
(C-140)
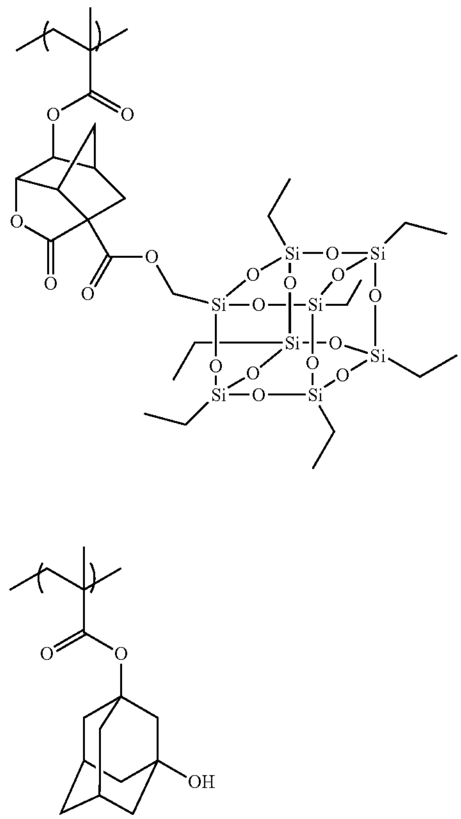
(C-141)
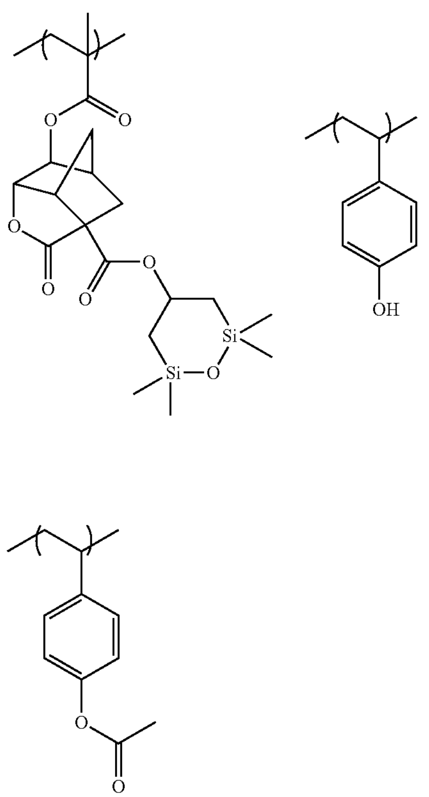
-continued
(C-142)
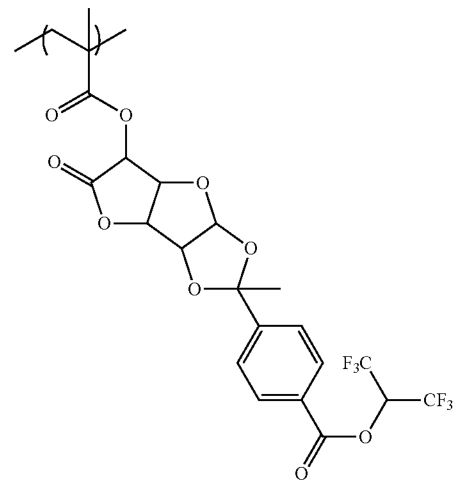
(C-143)
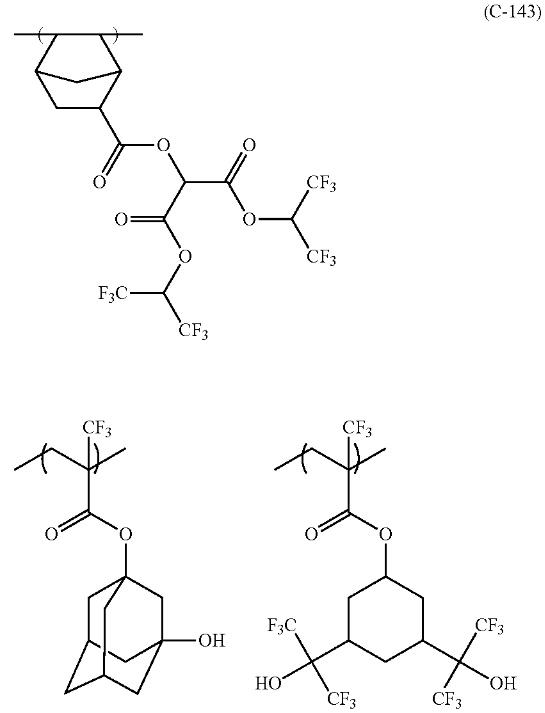
(C-144)
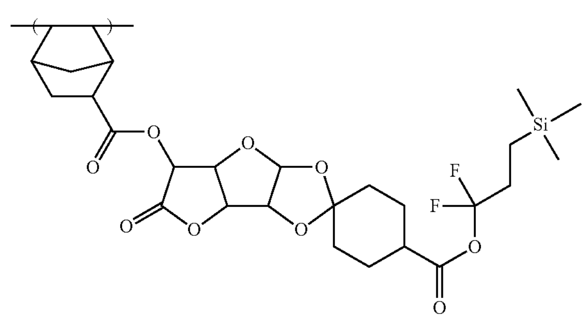

-continued
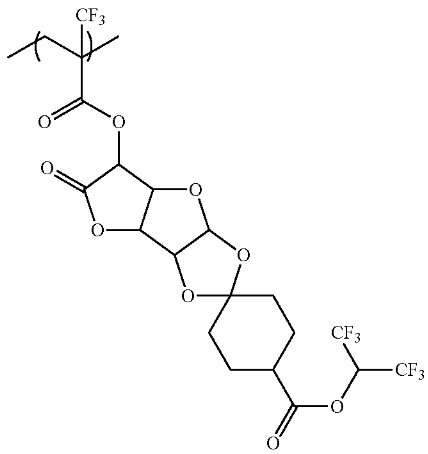
(C-145)
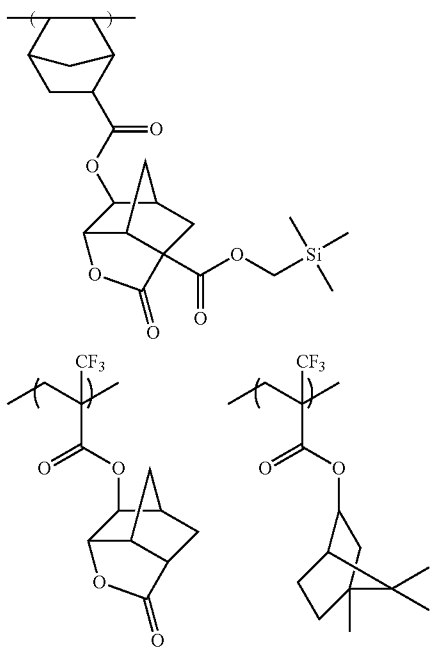
(C-146)
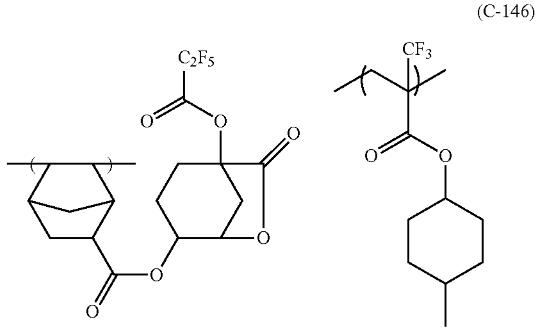
(C-147)
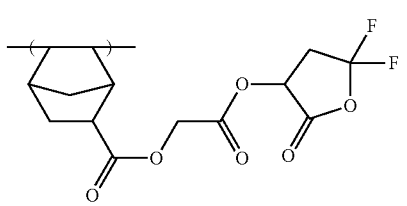
-continued
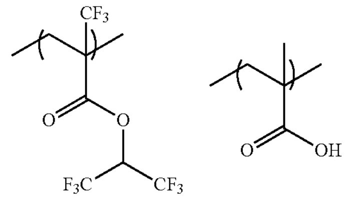
(C-148)
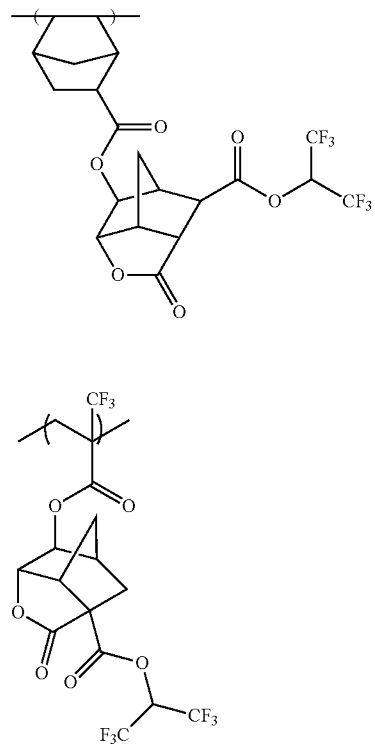
(C-149)
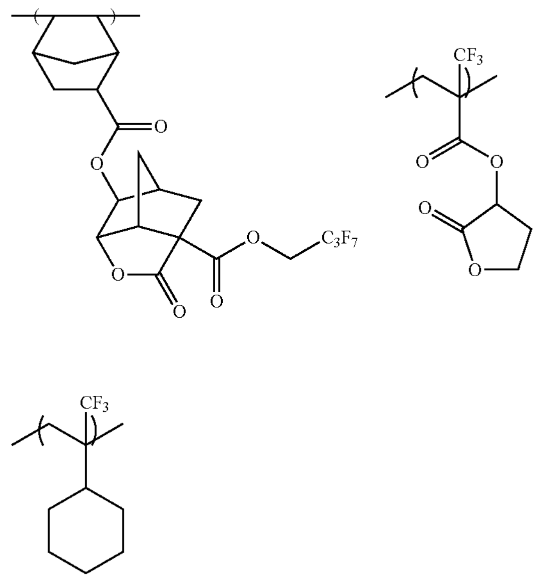

-continued
(C-150)
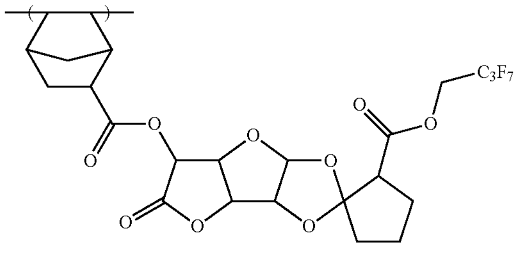
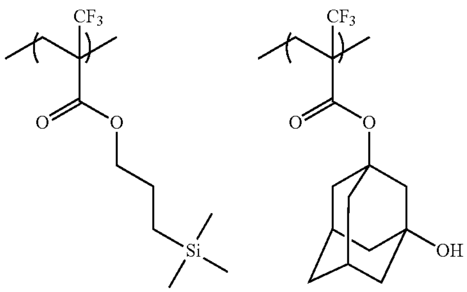
(C-151)
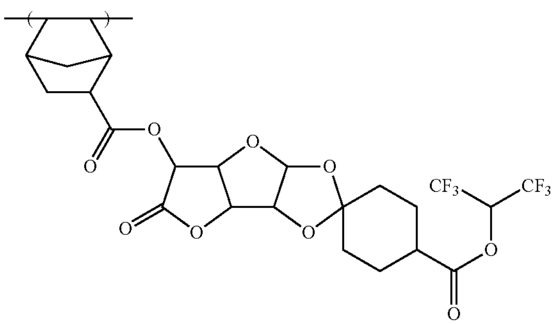
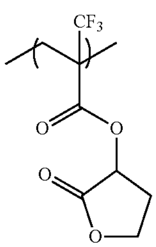
(C-152)
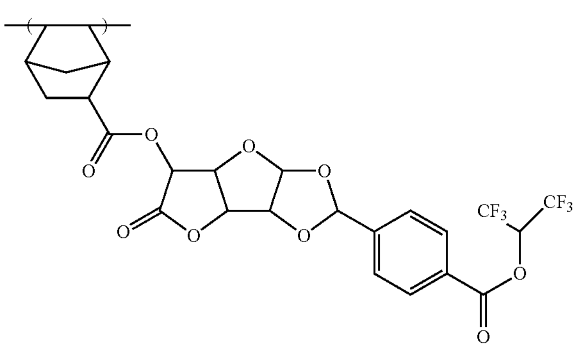
-continued
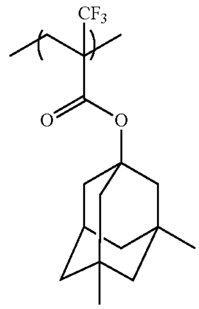
(C-153)
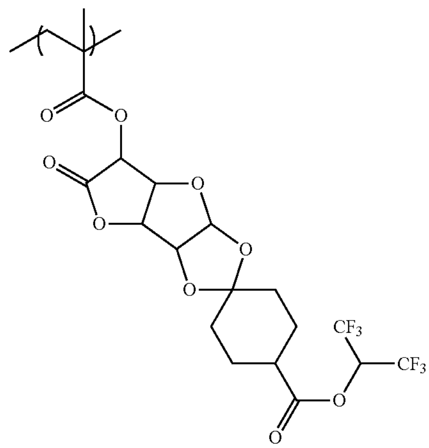
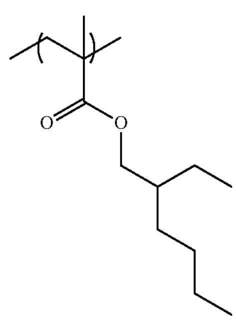
(C-154)
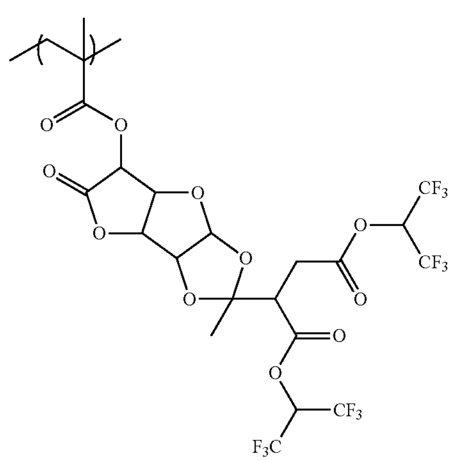

-continued
(C-155)
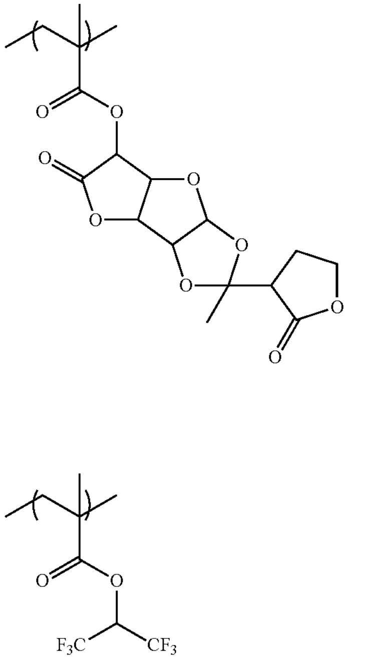
(C-156)
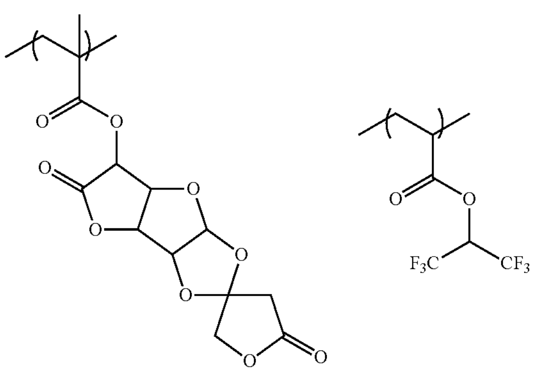
(C-157)
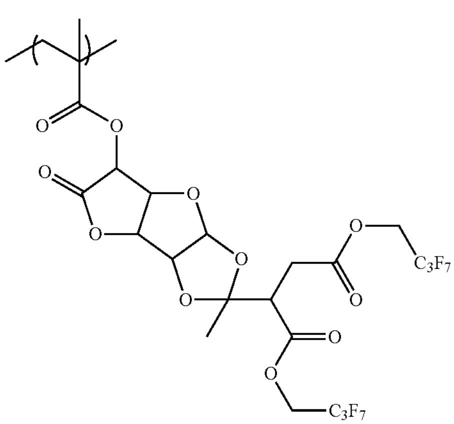
-continued
(C-158)
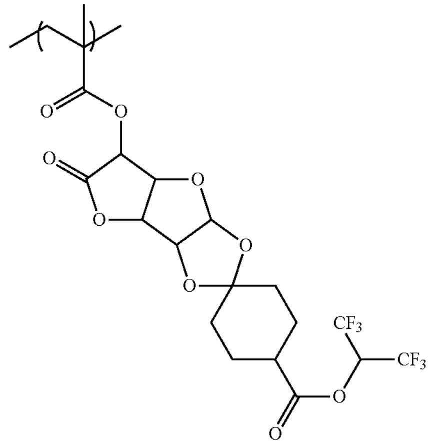
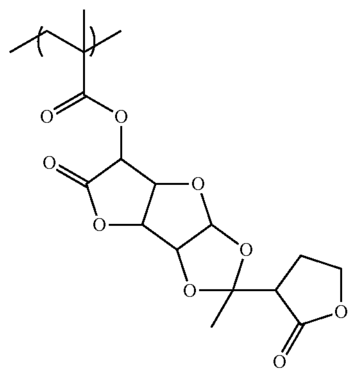
(C-159)
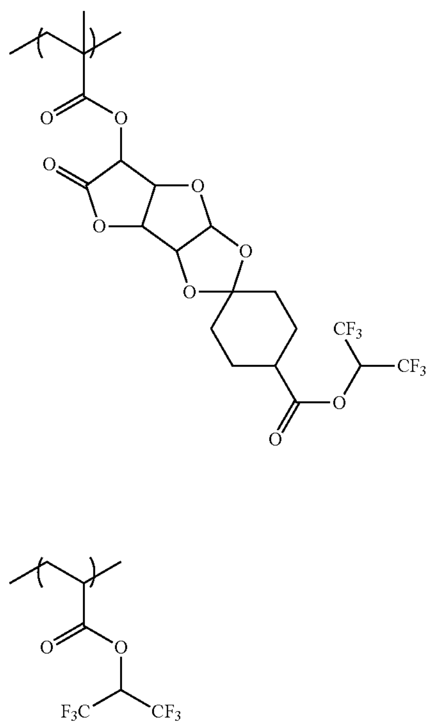

(C-160)
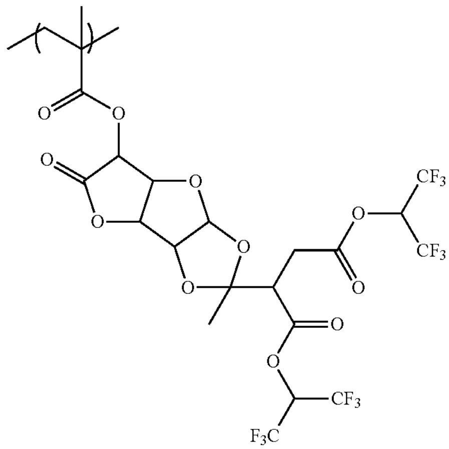
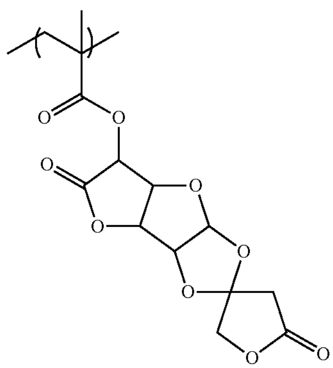
(C-161)
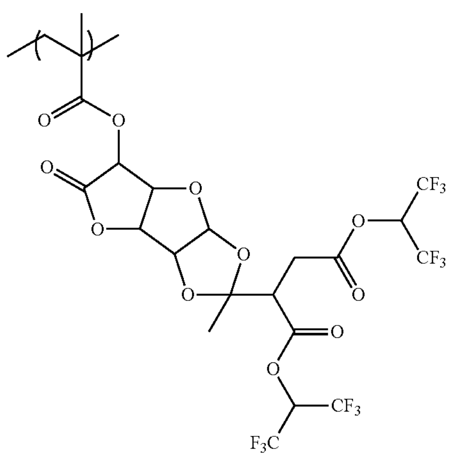
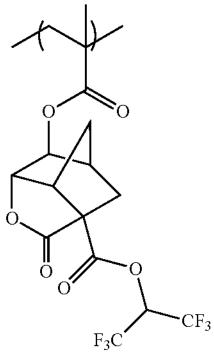
(C-162)
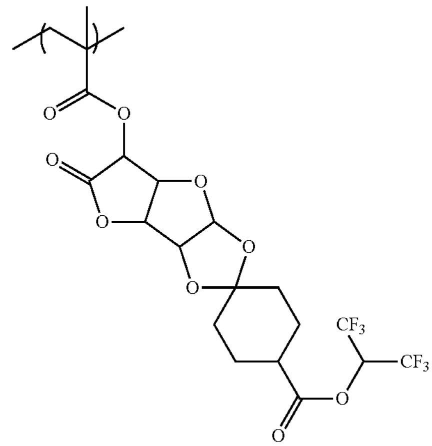
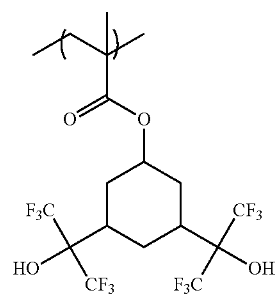
(C-163)
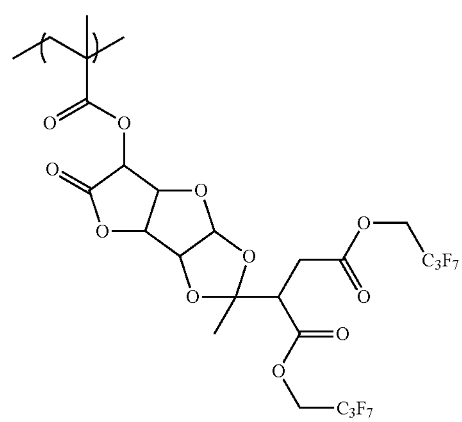
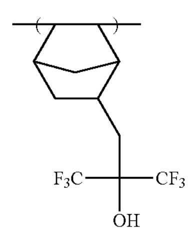

-continued
(C-164)
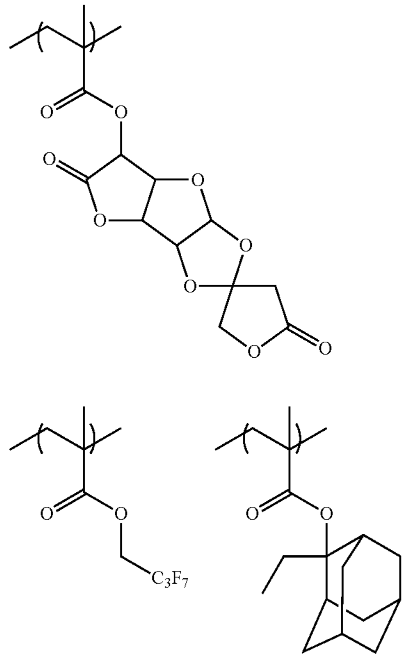
(C-165)
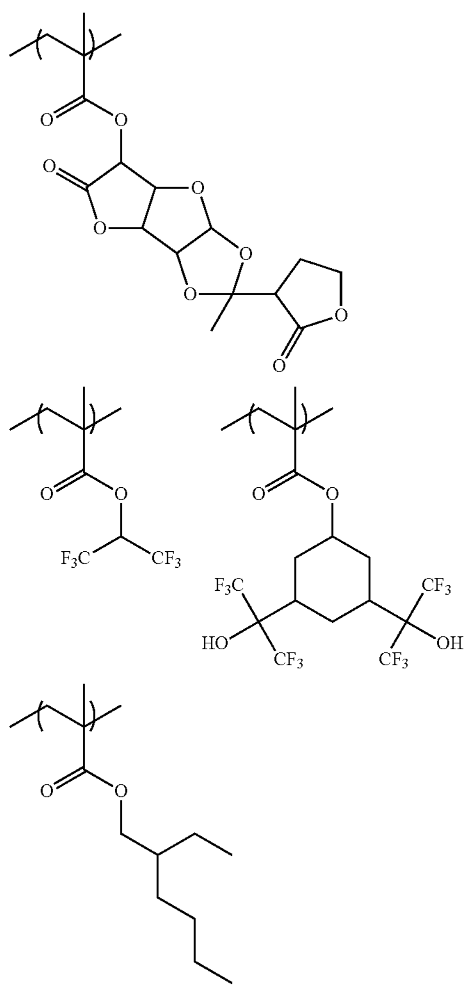
-continued
(C-166)
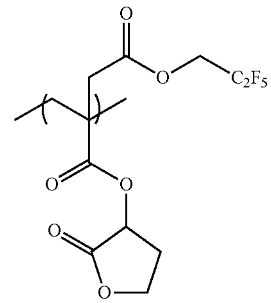
(C-167)
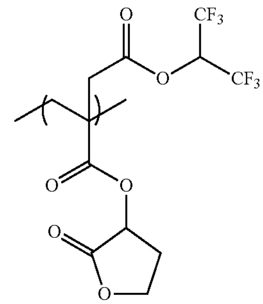
(C-168)
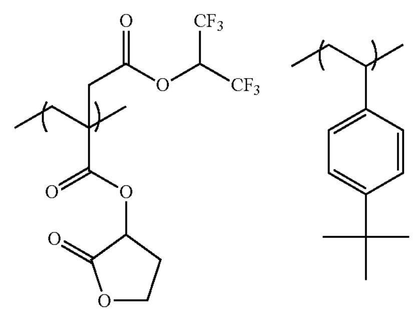
(C-169)
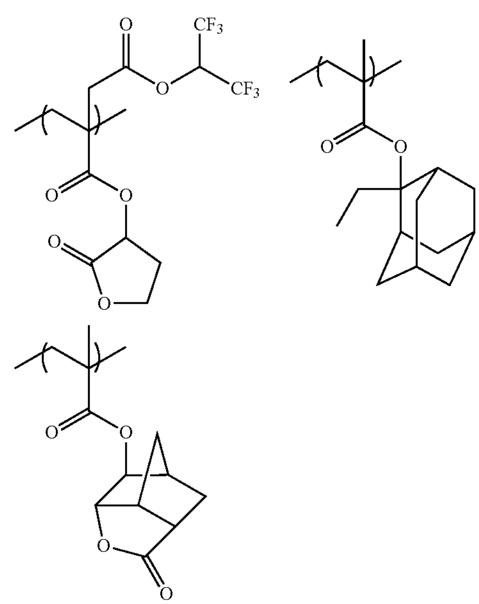

-continued
(C-170)
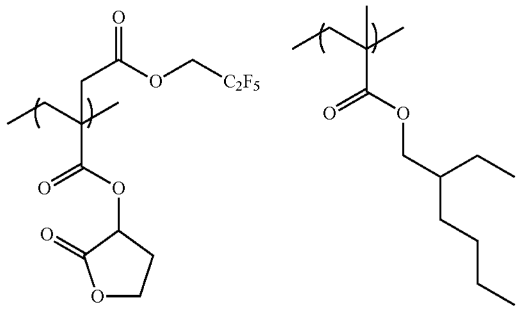
(C-171)
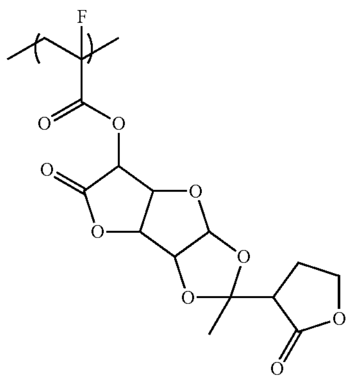
(C-172)
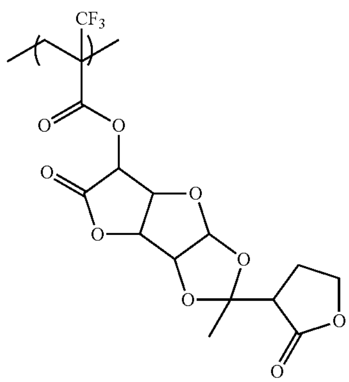
(C-173)
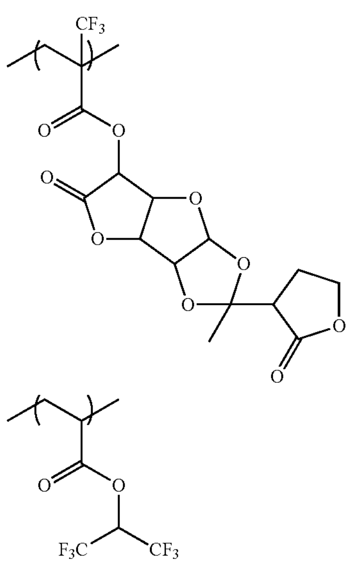
-continued
(C-174)
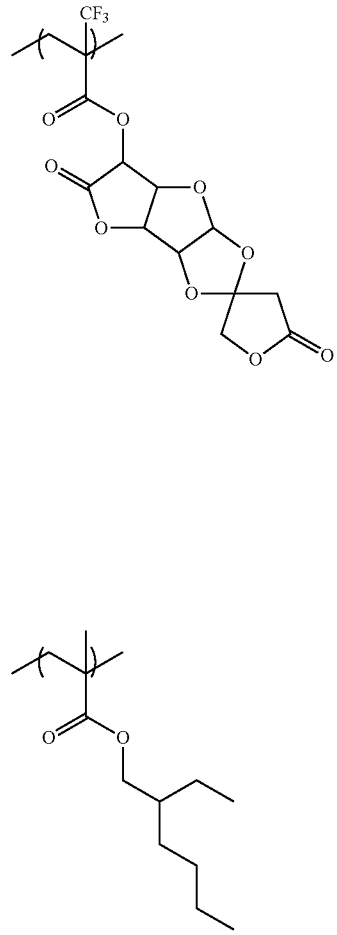
(C-175)
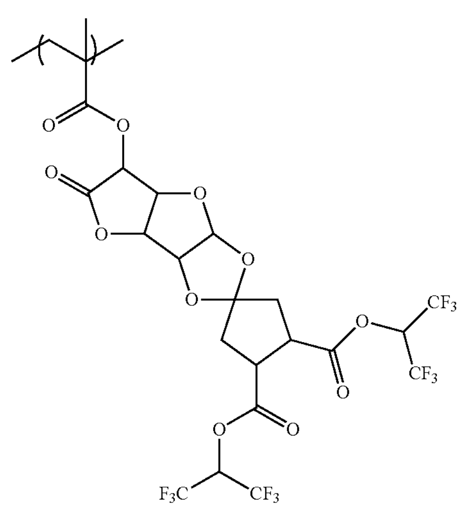

-continued
(C-176)
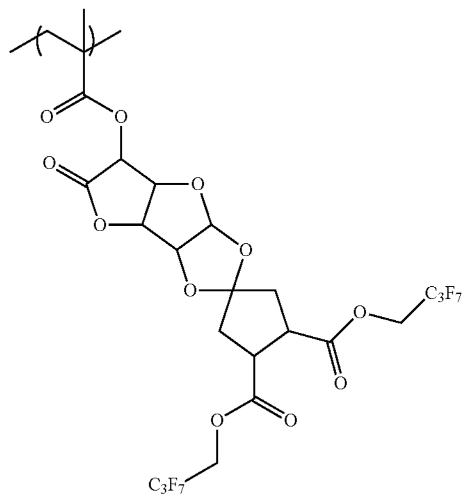
(C-177)
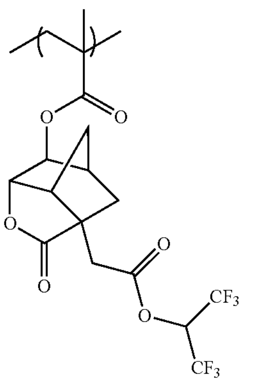
(C-178)
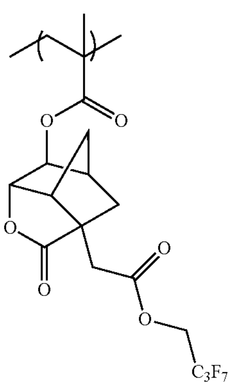
(C-179)
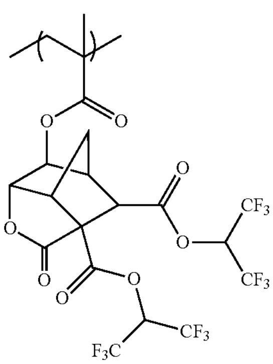
-continued
(C-180)
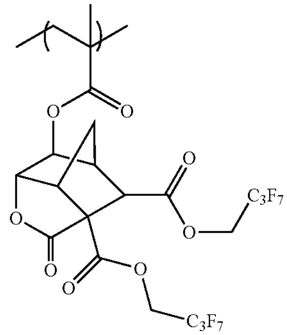
(C-181)
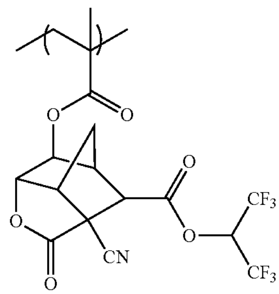
(C-182)
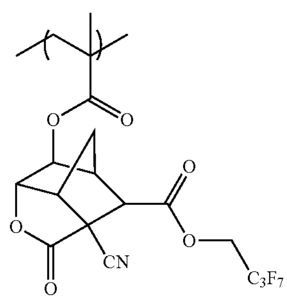
(C-183)
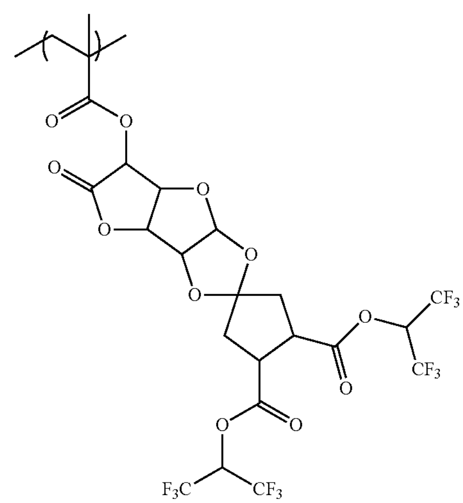

-continued
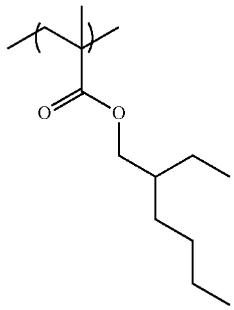
(C-184)
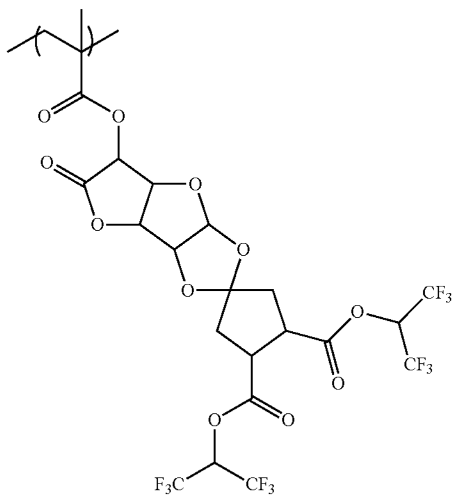
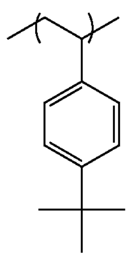
(C-185)
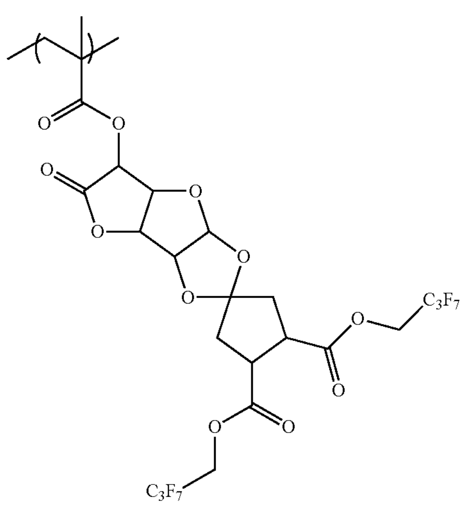
-continued
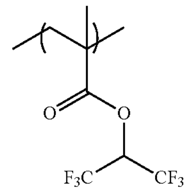
(C-186)
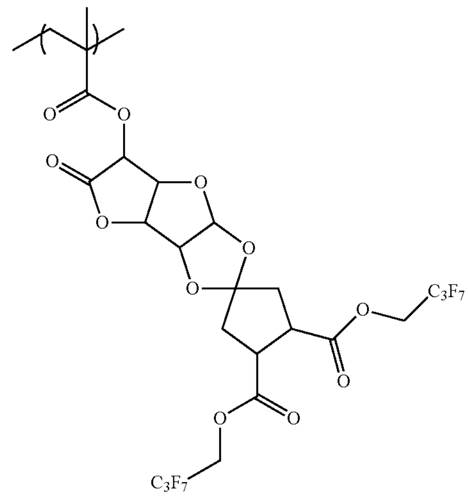
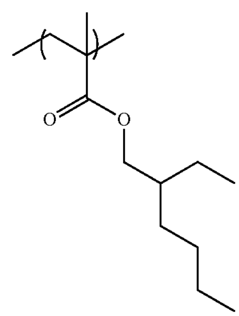
(C-187)
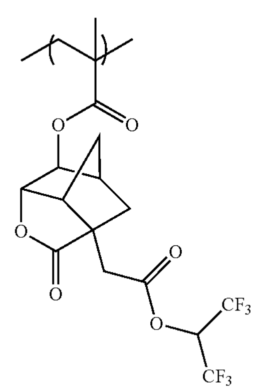

-continued
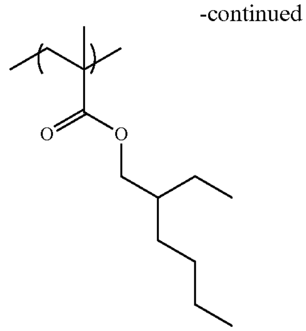
(C-188)
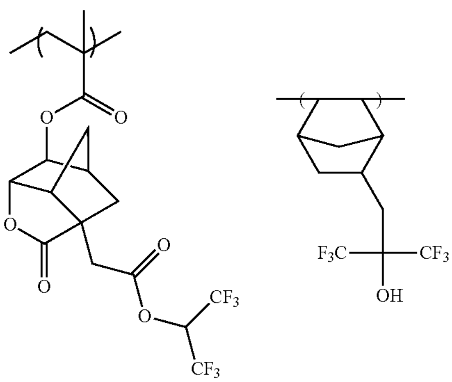
(C-189)
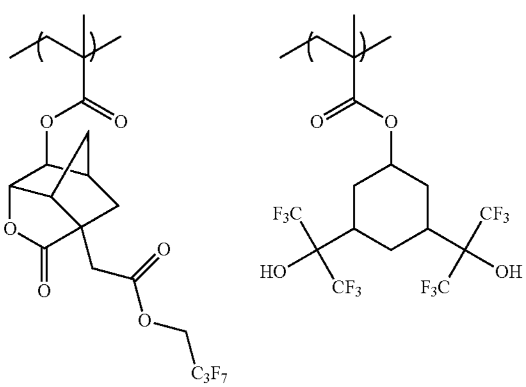
(C-190)
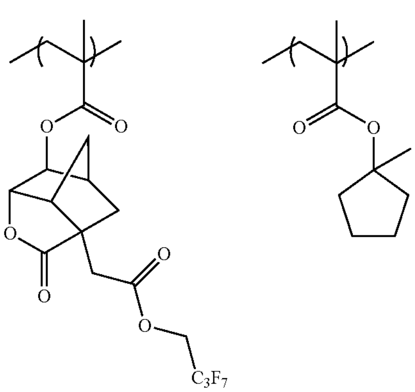
-continued
(C-191)
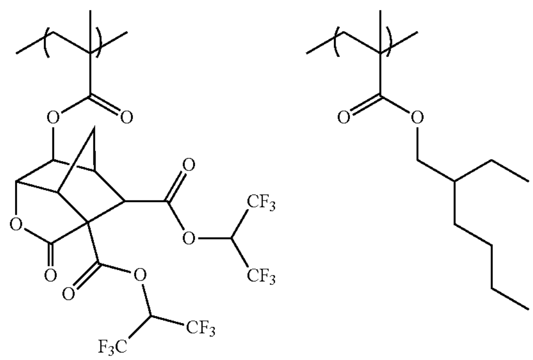
(C-192)
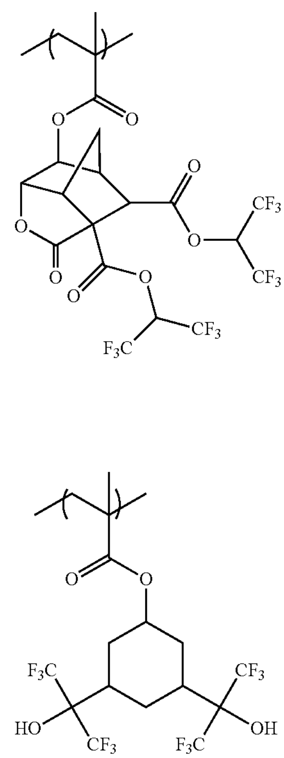
(C-193)
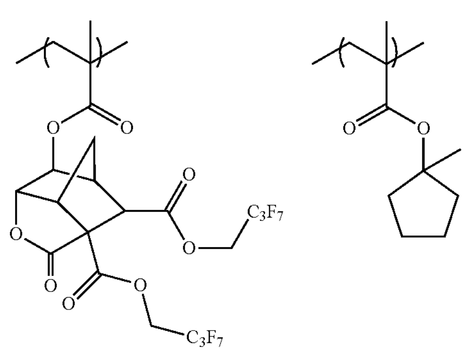

-continued
(C-194)
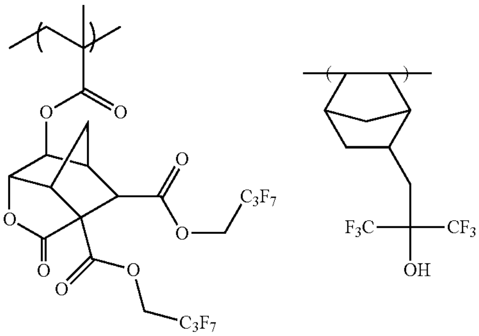
(C-195)
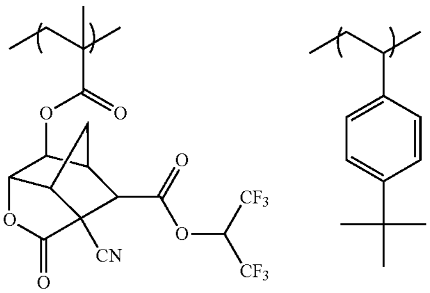
(C-196)
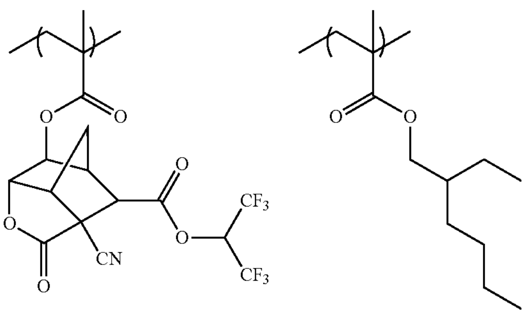
(C-197)
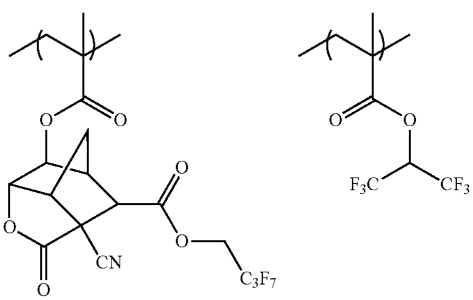
(C-198)
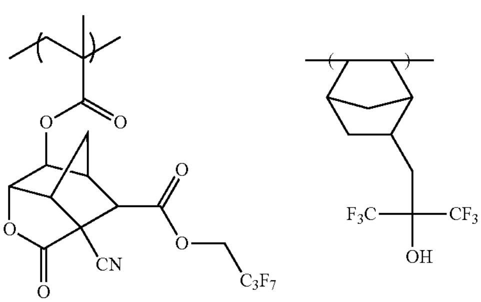
-continued
(C-199)
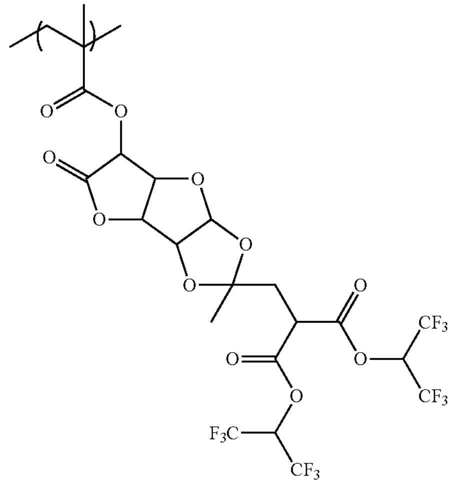
(C-200)
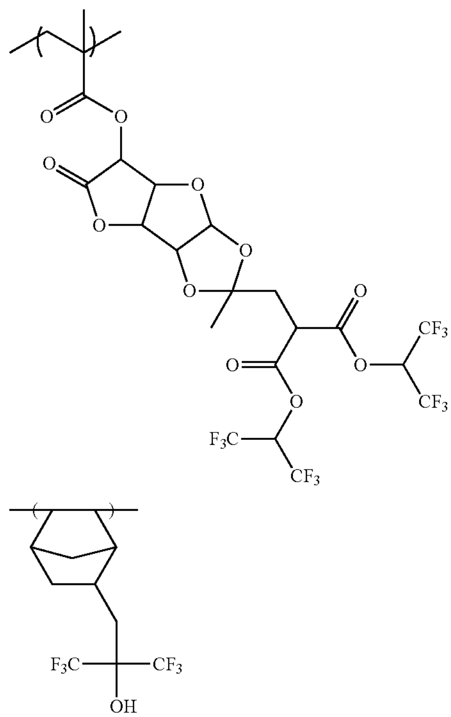
(C-201)
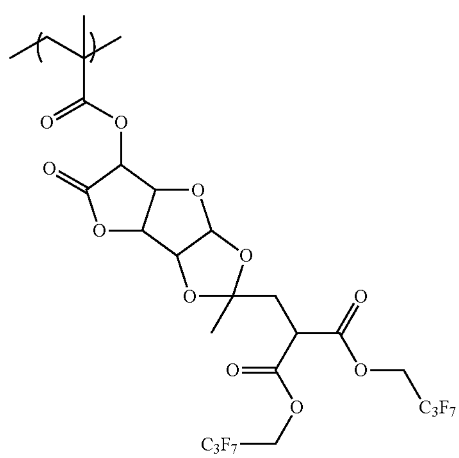

-continued
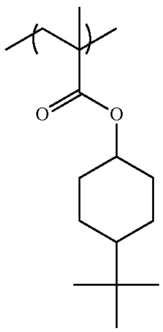
(C-202)
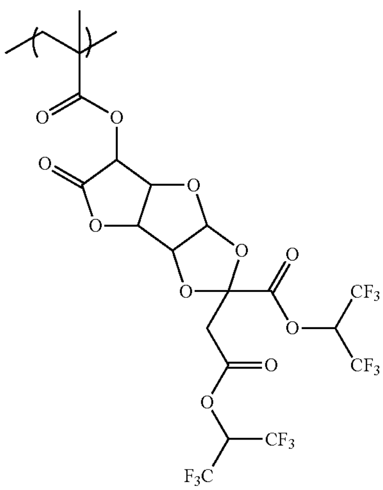
(C-203)
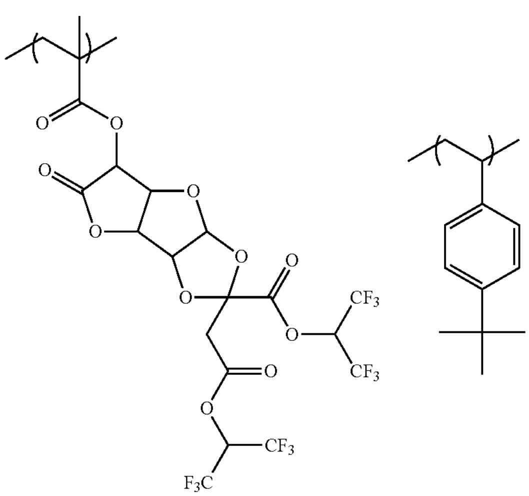
-continued
(C-204)
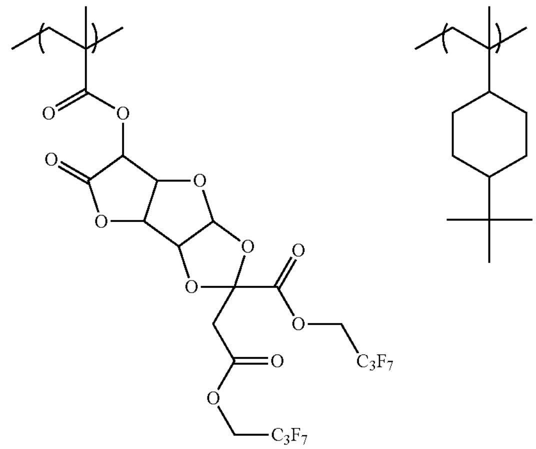
(C-205)
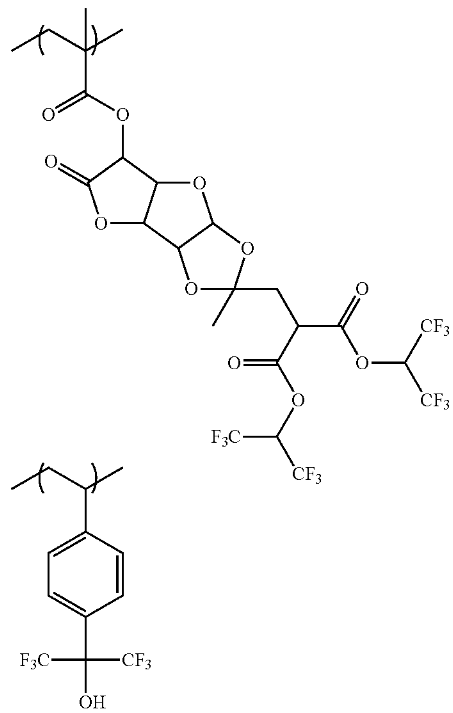
(C-206)
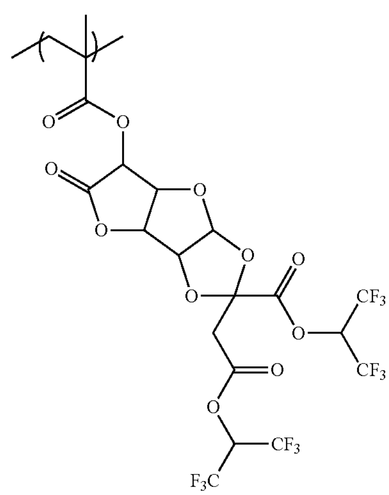

-continued
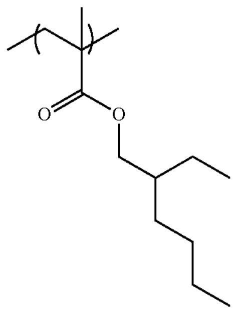
(C-207)
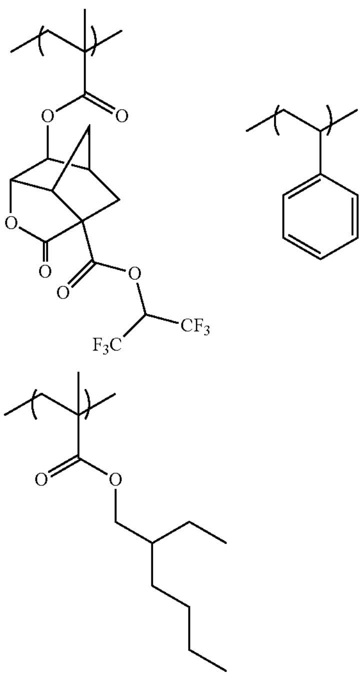
(C-208)
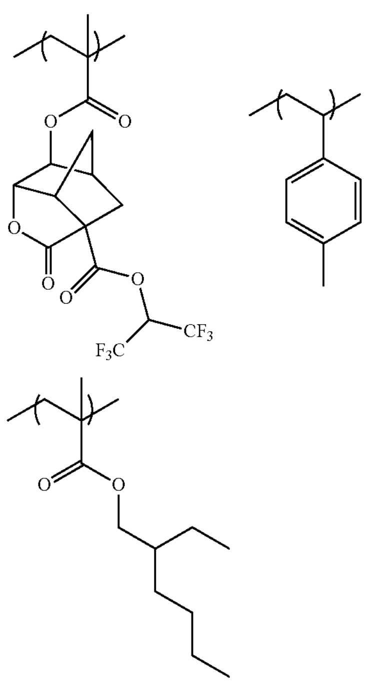
-continued
(C-209)
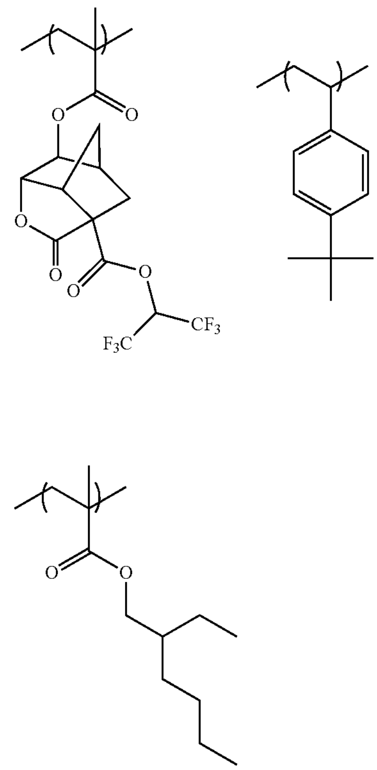
(C-210)
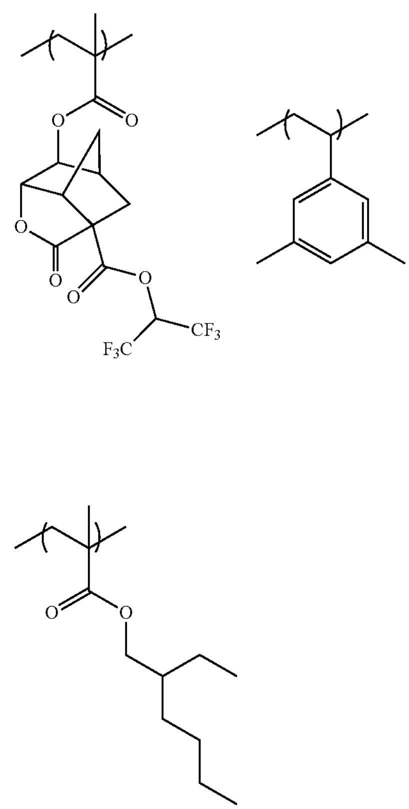

-continued
(C-211)
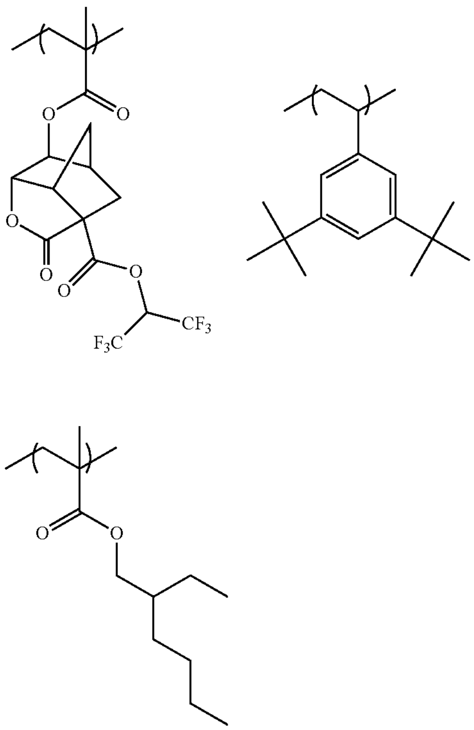
(C-212)
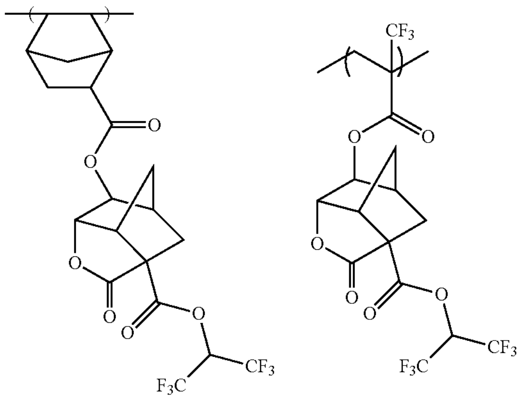
(C-213)
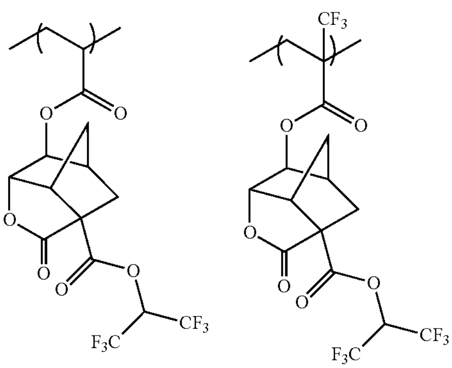
-continued
(C-214)
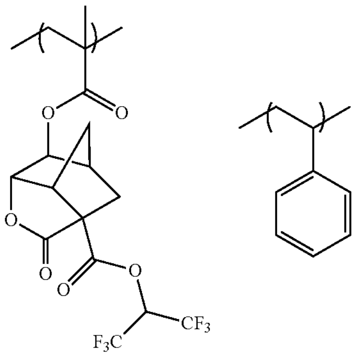
(C-215)
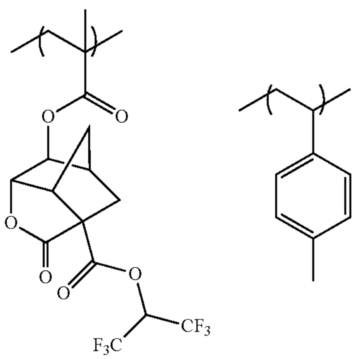
(C-216)
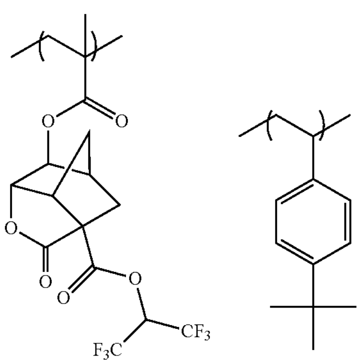
(C-217)
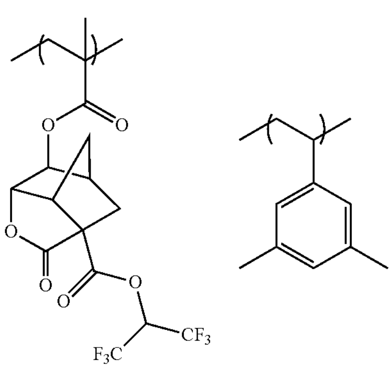

-continued
(C-218)
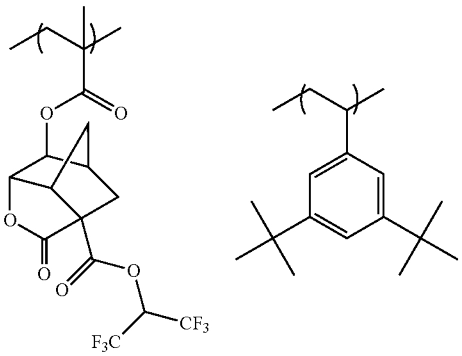
(C-219)
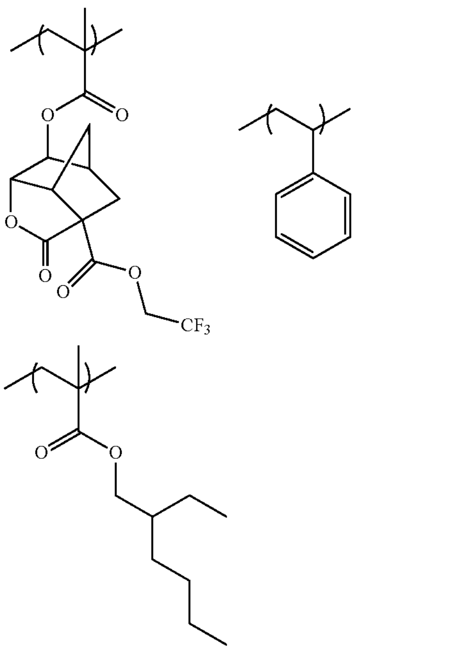
(C-220)
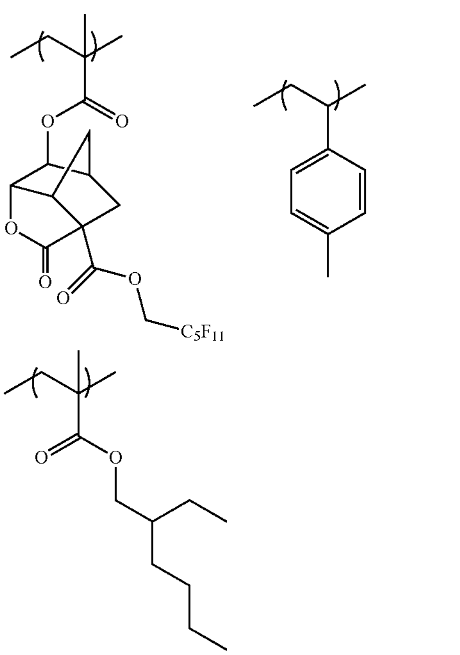
-continued
(C-221)
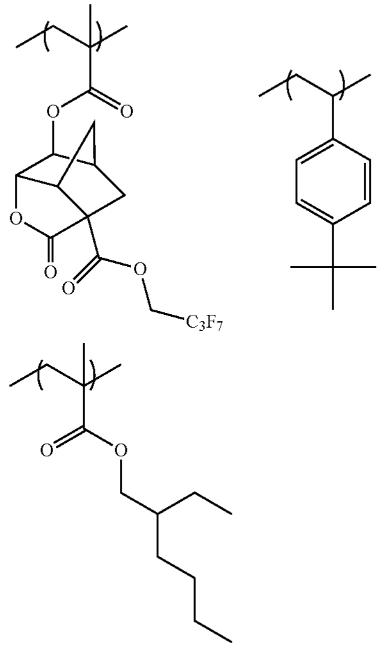
(C-222)
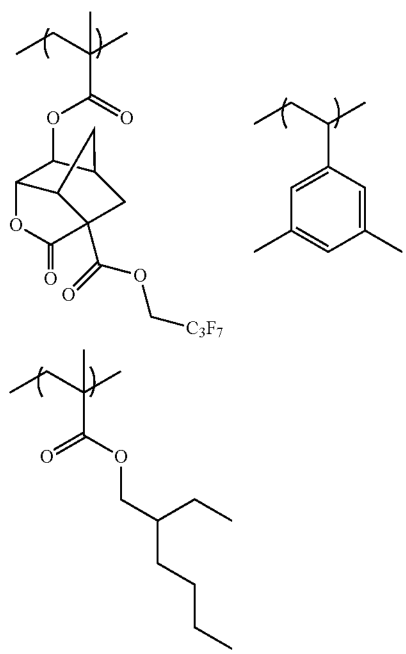
(C-223)
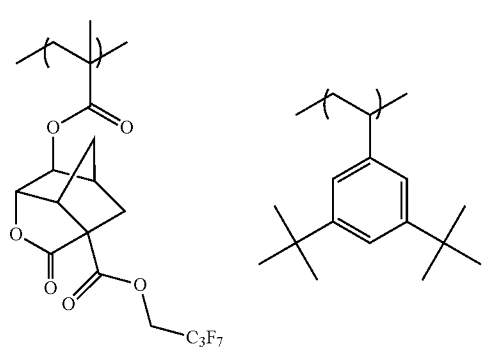

-continued
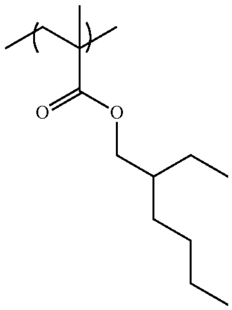
(C-224)
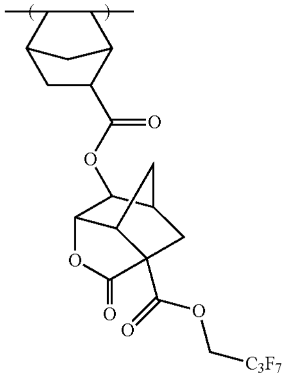
(C-225)
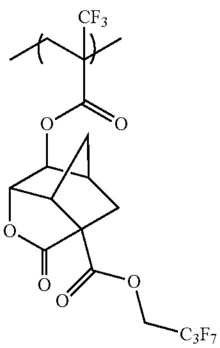
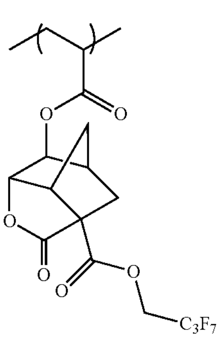
(C-226)
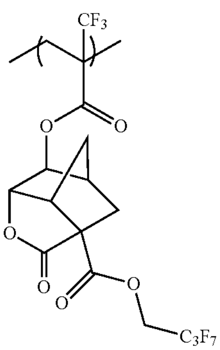
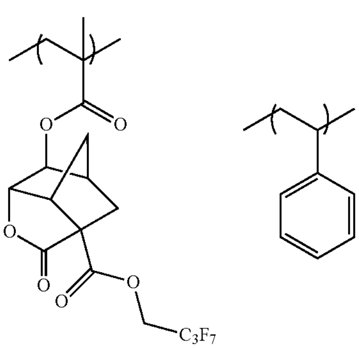
-continued
(C-227)
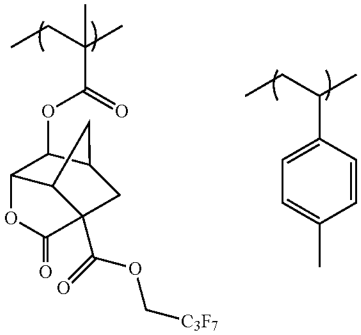
(C-228)
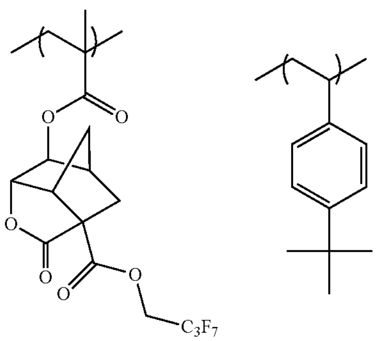
(C-229)
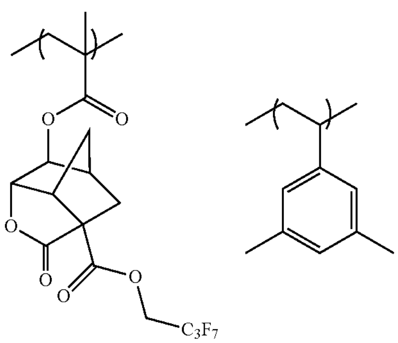
(C-230)
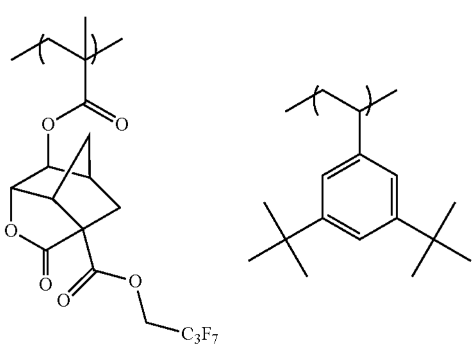

(C-231)
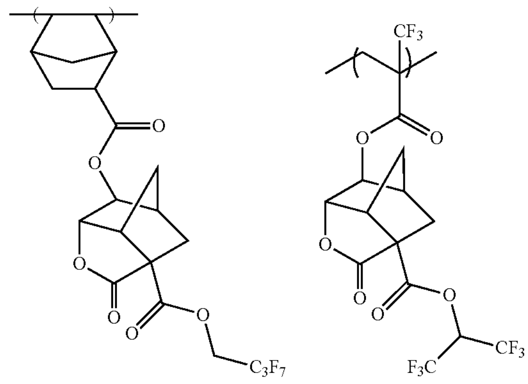
(C-232)
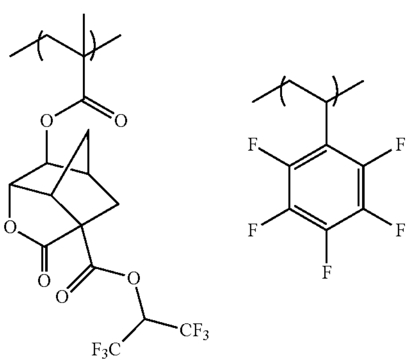
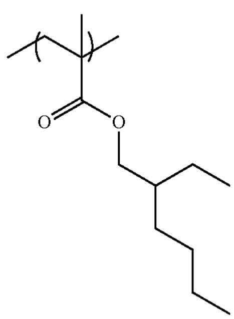
(C-233)
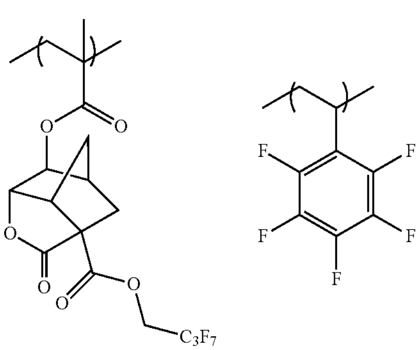
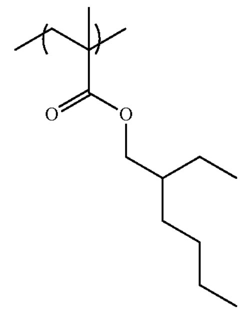
(C-234)
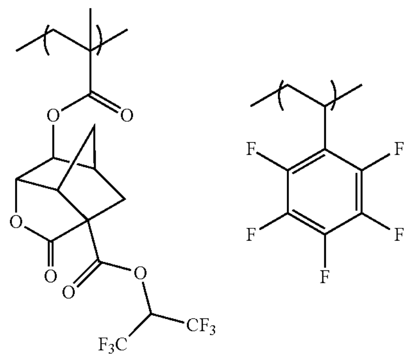
(C-235)
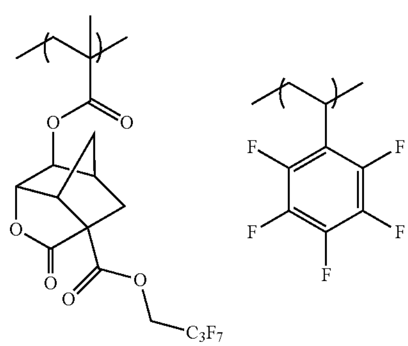
(C-236)
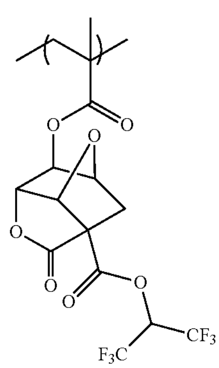

-continued
(C-237)
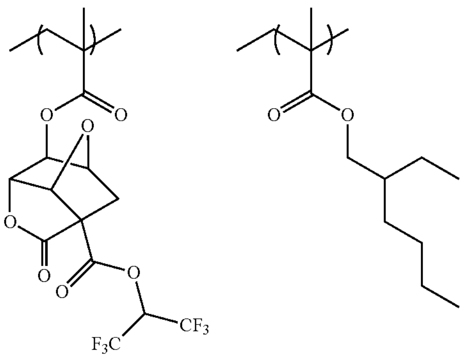
(C-238)
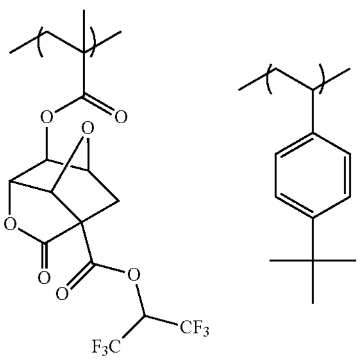
(C-239)
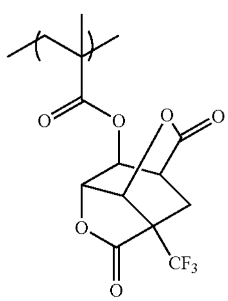
(C-240)
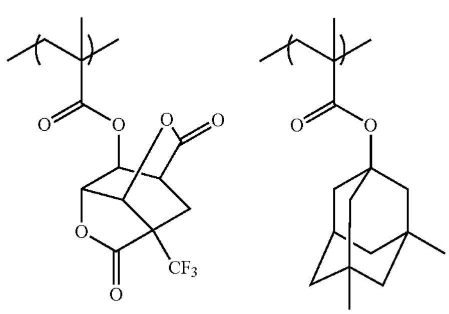
(C-241)
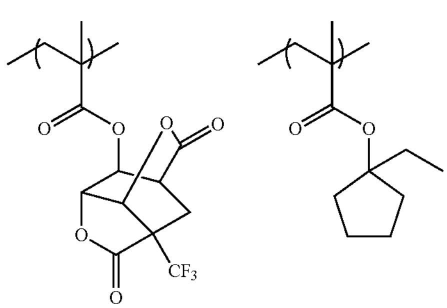
-continued
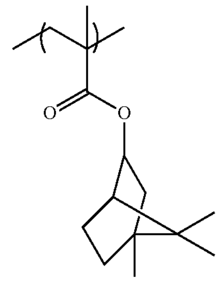
(C-242)
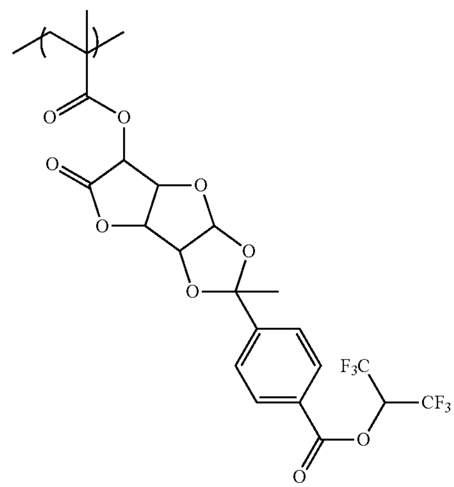
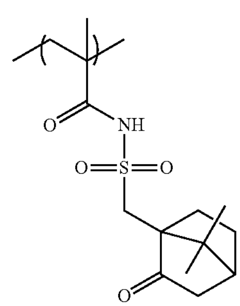
(C-243)
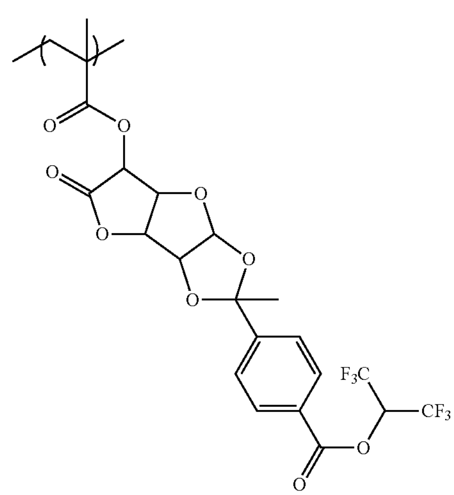

-continued
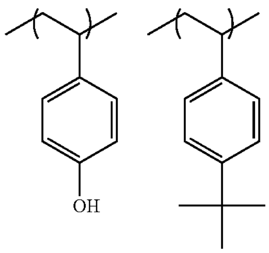
(C-244)
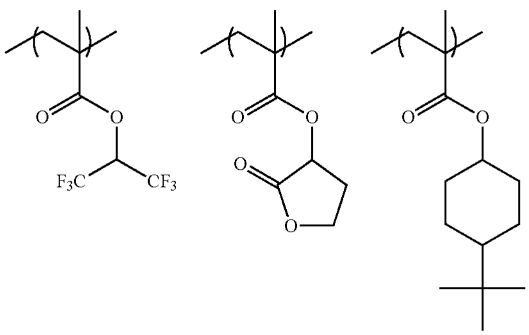
(C-245)
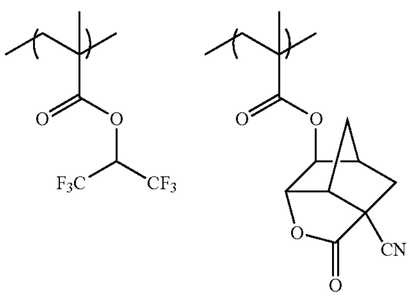
(C-246)
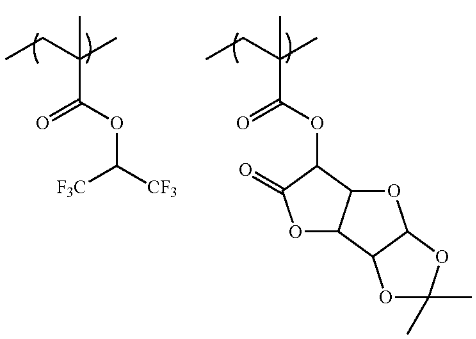
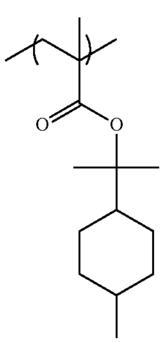
-continued
(C-247)
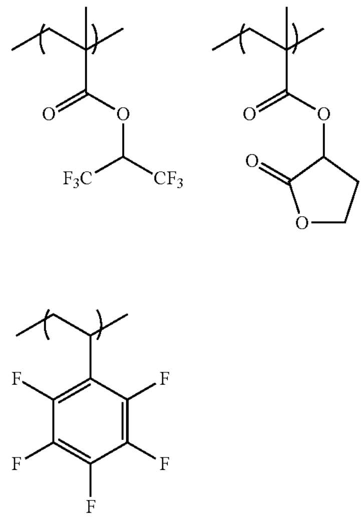
(C-248)
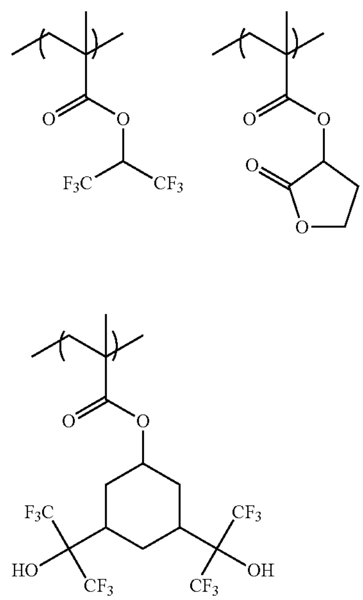
(C-249)
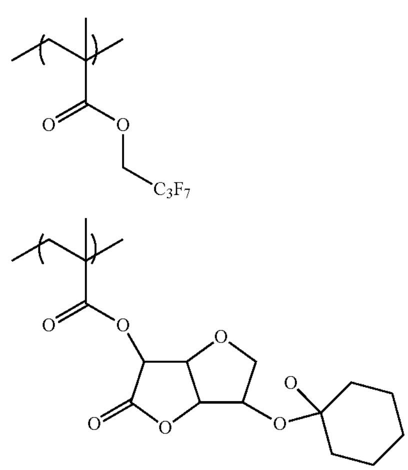

-continued
(C-250)
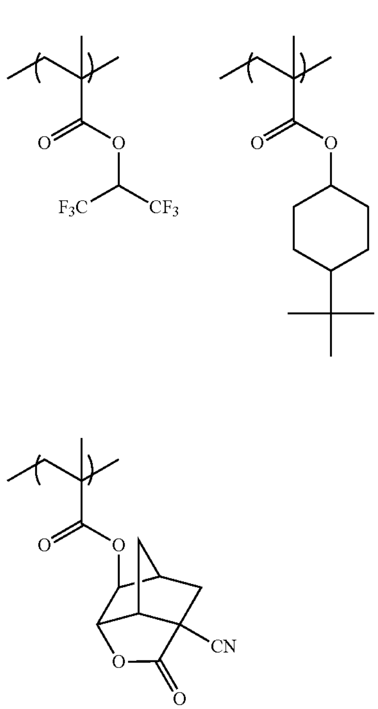
(C-251)
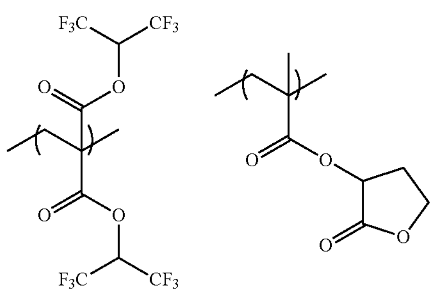
(C-252)
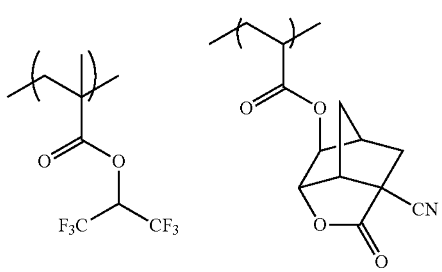
(C-253)
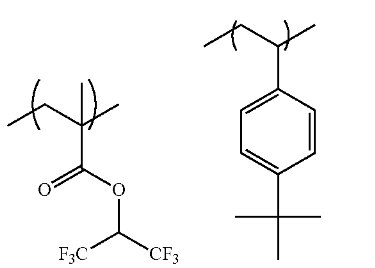
-continued
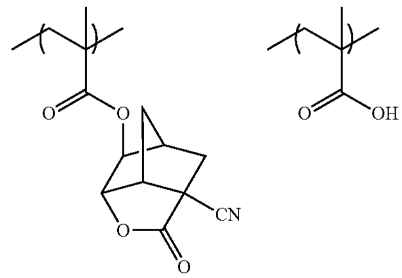
(C-254)
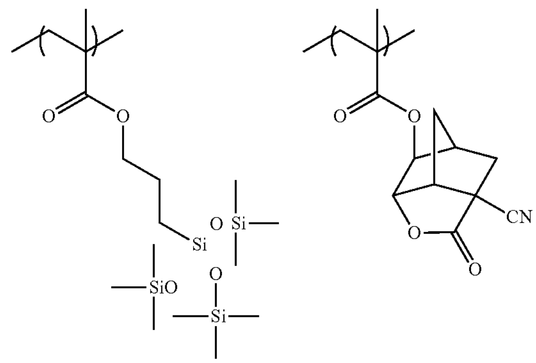
(C-255)
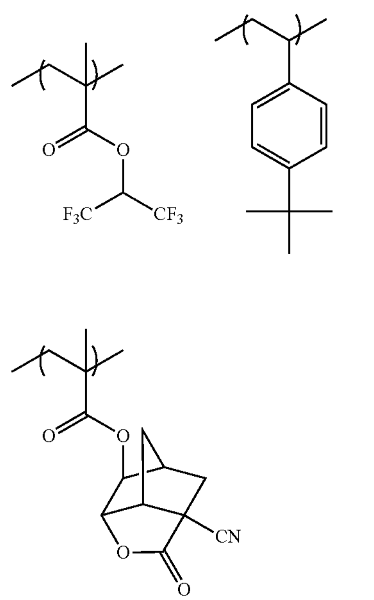
(C-256)
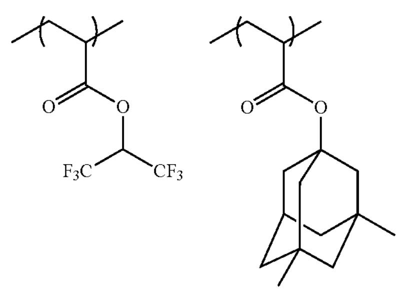

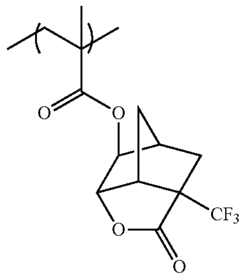
(C-257)
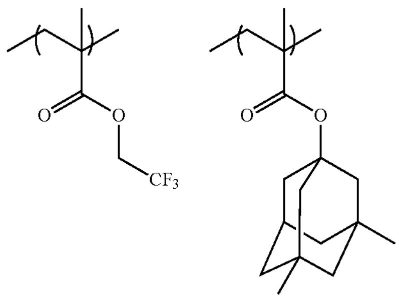
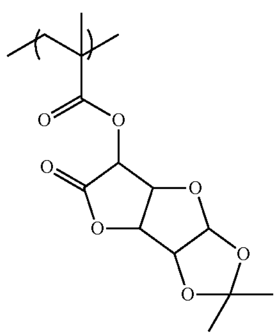
(C-258)
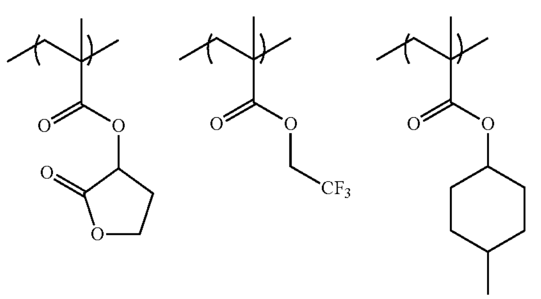
(C-259)
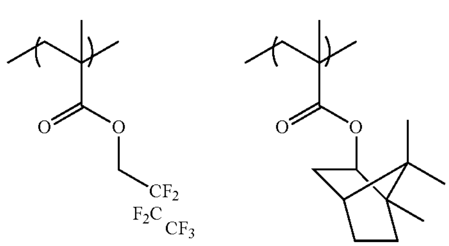
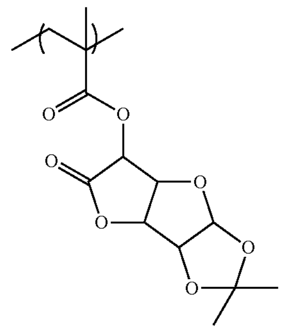
(C-260)
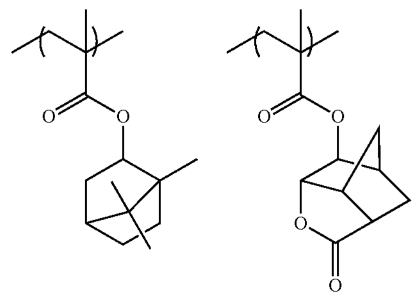
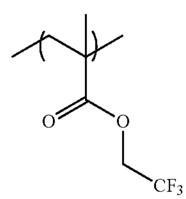
(C-261)
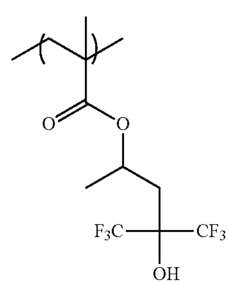
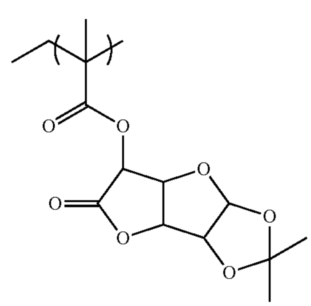

-continued
(C-262)
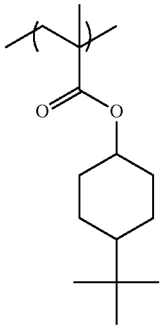
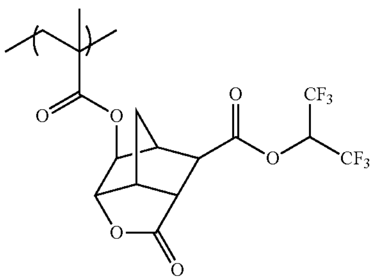
(C-263)
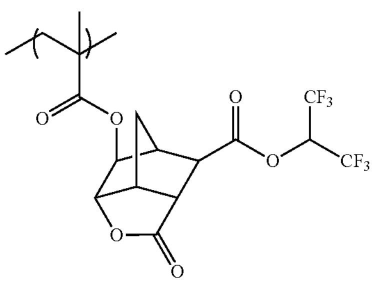
(C-264)
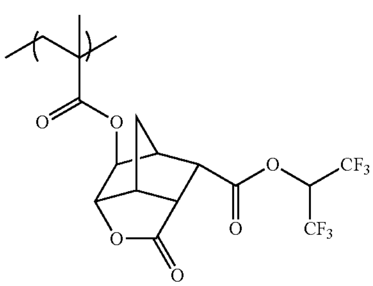
(C-265)
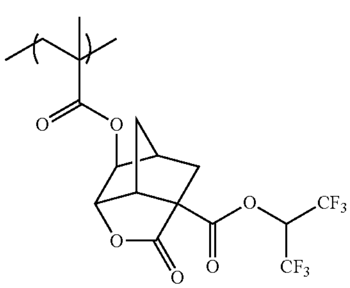
-continued
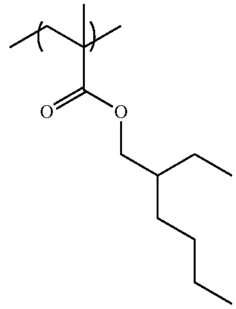
(C-266)
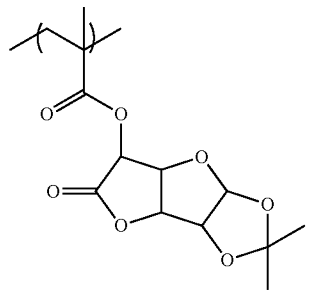
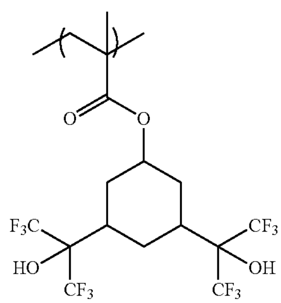
(C-267)
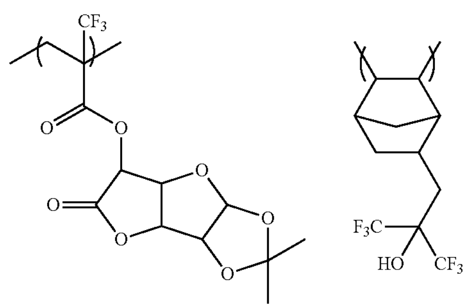
(C-268)
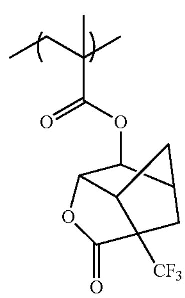

-continued (C-269)

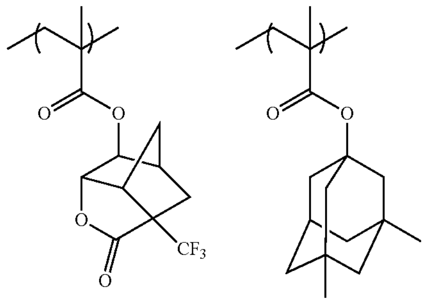

TABLE 2

| Resin | Composition | Mw | Mw/Mn |
|---|---|---|---|
| C-1 | 100 | 6000 | 1.5 |
| C-2 | 100 | 7500 | 1.4 |
| C-3 | 100 | 6000 | 1.4 |
| C-4 | 100 | 9000 | 1.5 |
| C-5 | 100 | 6000 | 1.4 |
| C-6 | 50/50 | 6500 | 1.4 |
| C-7 | 90/10 | 8000 | 1.4 |
| C-8 | 60/40 | 8000 | 1.3 |
| C-9 | 30/30/30/10 | 9500 | 1.4 |
| C-10 | 70/30 | 7000 | 1.4 |
| C-11 | 50/10/40 | 9000 | 1.6 |
| C-12 | 80/20 | 6000 | 1.4 |
| C-13 | 40/30/30 | 9500 | 1.4 |
| C-14 | 50/50 | 8000 | 1.4 |
| C-15 | 70/30 | 7000 | 1.4 |
| C-16 | 100 | 6000 | 1.4 |
| C-17 | 100 | 8000 | 1.4 |
| C-18 | 40/20/40 | 6000 | 1.4 |
| C-19 | 40/60 | 5000 | 1.5 |
| C-20 | 30/40/30 | 7000 | 1.4 |
| C-21 | 40/40/10/10 | 6000 | 1.4 |
| C-22 | 100 | 5500 | 1.4 |
| C-23 | 100 | 9500 | 1.5 |
| C-24 | 70/30 | 8500 | 1.4 |
| C-25 | 50/30/20 | 5000 | 1.4 |
| C-26 | 50/20/30 | 5500 | 1.4 |
| C-27 | 50/50 | 9000 | 1.5 |
| C-28 | 50/40/10 | 9000 | 1.4 |
| C-29 | 60/20/20 | 6500 | 1.4 |
| C-30 | 70/30 | 6500 | 1.4 |
| C-31 | 70/30 | 9000 | 1.5 |
| C-32 | 90/10 | 9000 | 1.5 |
| C-33 | 70/20/10 | 7000 | 1.4 |
| C-34 | 80/10/10 | 8500 | 1.5 |
| C-35 | 60/30/10 | 7500 | 1.4 |
| C-36 | 50/50 | 5000 | 1.5 |
| C-37 | 30/30/30/5/5 | 6000 | 1.5 |
| C-38 | 50/50 | 4500 | 1.4 |
| C-39 | 80/20 | 5000 | 1.4 |
| C-40 | 100 | 5000 | 1.4 |
| C-41 | 100 | 9000 | 1.5 |
| C-42 | 100 | 10000 | 1.5 |
| C-43 | 90/10 | 8500 | 1.4 |
| C-44 | 30/30/30/10 | 5500 | 1.4 |
| C-45 | 60/30/10 | 6500 | 1.4 |
| C-46 | 70/30 | 6500 | 1.4 |
| C-47 | 30/20/50 | 7000 | 1.4 |
| C-48 | 80/20 | 8000 | 1.5 |
| C-49 | 60/30/10 | 6000 | 1.4 |
| C-50 | 60/40 | 8000 | 1.5 |
| C-51 | 50/50 | 9500 | 1.4 |
| C-52 | 90/10 | 8000 | 1.5 |
| C-53 | 100 | 7000 | 1.5 |
| C-54 | 70/10/10/10 | 5500 | 1.4 |
| C-55 | 80/20 | 6500 | 1.4 |
| C-56 | 30/30/40 | 6000 | 1.4 |
| C-57 | 100 | 6000 | 1.4 |
| C-58 | 90/10 | 8000 | 1.4 |

TABLE 2-continued

| Resin | Composition | Mw | Mw/Mn |
|---|---|---|---|
| C-59 | 80/20 | 7000 | 1.5 |
| C-60 | 50/20/30 | 6000 | 1.4 |
| C-61 | 60/40 | 4500 | 1.5 |
| C-62 | 100 | 6500 | 1.4 |
| C-63 | 80/10/10 | 7000 | 1.5 |
| C-64 | 90/10 | 9000 | 1.5 |
| C-65 | 70/30 | 8000 | 1.4 |
| C-66 | 35/30/10/5/20 | 7000 | 1.4 |
| C-67 | 100 | 6500 | 1.4 |
| C-68 | 80/20 | 6500 | 1.4 |
| C-69 | 70/20/10 | 7000 | 1.4 |
| C-70 | 60/30/10 | 9000 | 1.5 |
| C-71 | 60/20/20 | 8000 | 1.4 |
| C-72 | 100 | 9500 | 1.5 |
| C-73 | 40/60 | 8000 | 1.4 |
| C-74 | 60/10/30 | 7000 | 1.5 |
| C-75 | 100 | 5500 | 1.5 |
| C-76 | 90/10 | 6500 | 1.4 |
| C-77 | 90/10 | 7500 | 1.3 |
| C-78 | 50/10/20/20 | 6000 | 1.5 |
| C-79 | 70/30 | 5000 | 1.3 |
| C-80 | 70/10/20 | 8500 | 1.5 |
| C-81 | 80/20 | 5500 | 1.3 |
| C-82 | 100 | 8000 | 1.3 |
| C-83 | 85/5/10 | 6500 | 1.4 |
| C-84 | 80/20 | 8000 | 1.5 |
| C-85 | 60/30/10 | 10000 | 1.5 |
| C-86 | 100 | 8000 | 1.5 |
| C-87 | 55/30/5/10 | 8000 | 1.3 |
| C-88 | 40/30/30 | 6000 | 1.3 |
| C-89 | 70/30 | 6500 | 1.3 |
| C-90 | 90/10 | 8000 | 1.5 |
| C-91 | 70/20/10 | 6500 | 1.5 |
| C-92 | 100 | 7000 | 1.4 |
| C-93 | 100 | 6000 | 1.5 |
| C-94 | 100 | 13000 | 1.4 |
| C-95 | 100 | 4000 | 1.4 |
| C-96 | 100 | 6000 | 1.5 |
| C-97 | 100 | 10000 | 1.4 |
| C-98 | 100 | 7500 | 1.5 |
| C-99 | 50/50 | 6500 | 1.4 |
| C-100 | 50/50 | 8500 | 1.4 |
| C-101 | 80/20 | 7000 | 1.3 |
| C-102 | 50/20/30 | 4500 | 1.3 |
| C-103 | 90/10 | 5500 | 1.3 |
| C-104 | 60/30/10 | 6000 | 1.5 |
| C-105 | 80/20 | 8000 | 1.3 |
| C-106 | 50/45/5 | 7500 | 1.4 |
| C-107 | 80/20 | 7000 | 1.5 |
| C-108 | 30/30/30/10 | 9000 | 1.6 |
| C-109 | 70/30 | 8000 | 1.3 |
| C-110 | 50/30/20 | 9000 | 1.4 |
| C-111 | 60/10/30 | 6000 | 1.5 |
| C-112 | 60/5/35 | 8000 | 1.5 |
| C-113 | 50/40/10 | 9500 | 1.5 |
| C-114 | 80/20 | 7000 | 1.5 |
| C-115 | 90/10 | 6000 | 1.2 |
| C-116 | 40/20/30/10 | 8000 | 1.3 |
| C-117 | 50/50 | 6000 | 1.5 |
| C-118 | 100 | 9500 | 1.4 |
| C-119 | 50/20/20/10 | 8000 | 1.5 |
| C-120 | 75/10/10/5 | 7000 | 1.3 |
| C-121 | 30/30/10/30 | 5500 | 1.3 |
| C-122 | 100 | 8000 | 1.3 |
| C-123 | 100 | 9500 | 1.5 |
| C-124 | 100 | 9000 | 1.6 |
| C-125 | 90/10 | 9500 | 1.3 |
| C-126 | 70/30 | 7500 | 1.5 |
| C-127 | 70/30 | 8000 | 1.3 |
| C-128 | 85/15 | 6000 | 1.5 |
| C-129 | 90/10 | 7000 | 1.6 |
| C-130 | 50/20/30 | 5000 | 1.3 |
| C-131 | 60/20/20 | 4000 | 1.4 |
| C-132 | 50/30/20 | 6500 | 1.4 |
| C-133 | 70/10/20 | 7000 | 1.4 |
| C-134 | 80/10/10 | 9000 | 1.4 |
| C-135 | 60/40 | 8000 | 1.5 |
| C-136 | 30/70 | 9000 | 1.4 |

TABLE 2-continued

| Resin | Composition | Mw | Mw/Mn |
|---|---|---|---|
| C-137 | 70/15/15 | 7500 | 1.5 |
| C-138 | 70/30 | 8000 | 1.4 |
| C-139 | 75/5/10/10 | 6000 | 1.5 |
| C-140 | 70/30 | 5500 | 1.5 |
| C-141 | 50/25/25 | 6500 | 1.4 |
| C-142 | 100 | 9000 | 1.6 |
| C-143 | 50/40/10 | 7000 | 1.4 |
| C-144 | 50/50 | 9000 | 1.4 |
| C-145 | 50/30/20 | 8000 | 1.4 |
| C-146 | 50/50 | 9000 | 1.5 |
| C-147 | 48/50/2 | 6000 | 1.4 |
| C-148 | 50/50 | 9000 | 1.5 |
| C-149 | 50/25/25 | 6000 | 1.4 |
| C-150 | 50/50 | 9500 | 1.5 |
| C-151 | 50/50 | 8000 | 1.5 |
| C-152 | 50/50 | 7000 | 1.4 |
| C-153 | 95/5 | 3000 | 1.4 |
| C-154 | 100 | 5000 | 1.4 |
| C-155 | 50/50 | 6000 | 1.5 |
| C-156 | 50/50 | 4000 | 1.5 |
| C-157 | 100 | 8000 | 1.4 |
| C-158 | 80/20 | 4500 | 1.4 |
| C-159 | 80/20 | 3500 | 1.4 |
| C-160 | 70/30 | 7000 | 1.4 |
| C-161 | 50/50 | 10000 | 1.3 |
| C-162 | 95/5 | 4500 | 1.4 |
| C-163 | 90/10 | 8500 | 1.4 |
| C-164 | 25/50/25 | 6000 | 1.5 |
| C-165 | 40/40/10/10 | 6500 | 1.4 |
| C-166 | 100 | 8000 | 1.4 |
| C-167 | 100 | 6500 | 1.4 |
| C-168 | 80/20 | 5000 | 1.3 |
| C-169 | 40/30/30 | 4500 | 1.5 |
| C-170 | 90/10 | 3000 | 1.4 |
| C-171 | 100 | 4500 | 1.4 |
| C-172 | 100 | 3500 | 1.4 |
| C-173 | 60/40 | 5000 | 1.4 |
| C-174 | 90/10 | 6000 | 1.4 |
| C-175 | 100 | 4000 | 1.5 |
| C-176 | 100 | 8000 | 1.4 |
| C-177 | 100 | 5000 | 1.4 |
| C-178 | 100 | 10000 | 1.5 |
| C-179 | 100 | 6000 | 1.4 |
| C-180 | 100 | 7000 | 1.3 |
| C-181 | 100 | 5500 | 1.4 |
| C-182 | 100 | 8000 | 1.3 |
| C-183 | 90/10 | 4500 | 1.4 |
| C-184 | 80/20 | 6000 | 1.4 |
| C-185 | 70/30 | 5500 | 1.6 |
| C-186 | 85/15 | 8500 | 1.4 |
| C-187 | 90/10 | 3000 | 1.3 |
| C-188 | 70/30 | 4500 | 1.4 |
| C-189 | 75/25 | 6500 | 1.4 |
| C-190 | 55/45 | 8500 | 1.3 |
| C-191 | 90/10 | 5500 | 1.4 |
| C-192 | 75/25 | 9000 | 1.4 |
| C-193 | 70/30 | 10000 | 1.5 |
| C-194 | 70/30 | 5000 | 1.4 |
| C-195 | 80/20 | 7000 | 1.4 |
| C-196 | 85/15 | 4500 | 1.4 |
| C-197 | 80/20 | 3500 | 1.5 |
| C-198 | 75/25 | 6000 | 1.4 |
| C-199 | 100 | 5000 | 1.4 |
| C-200 | 80/20 | 6000 | 1.4 |
| C-201 | 80/20 | 8000 | 1.5 |
| C-202 | 100 | 4500 | 1.5 |
| C-203 | 70/30 | 3500 | 1.4 |
| C-204 | 80/20 | 10000 | 1.4 |
| C-205 | 80/20 | 7000 | 1.4 |
| C-206 | 90/10 | 4000 | 1.4 |
| C-207 | 80/15/5 | 10000 | 1.4 |
| C-208 | 85/10/5 | 5000 | 1.5 |
| C-209 | 90/8/2 | 13000 | 1.5 |
| C-210 | 85/10/5 | 6000 | 1.5 |
| C-211 | 90/8/2 | 8000 | 1.4 |
| C-212 | 50/50 | 12000 | 1.5 |
| C-213 | 50/50 | 8000 | 1.3 |
| C-214 | 85/15 | 6500 | 1.5 |

TABLE 2-continued

| Resin | Composition | Mw | Mw/Mn |
|---|---|---|---|
| C-215 | 85/15 | 4000 | 1.5 |
| C-216 | 90/10 | 7500 | 1.6 |
| C-217 | 90/10 | 3500 | 1.5 |
| C-218 | 95/5 | 5500 | 1.4 |
| C-219 | 85/10/5 | 5000 | 1.5 |
| C-220 | 88/10/2 | 13000 | 1.4 |
| C-221 | 90/8/2 | 12000 | 1.5 |
| C-222 | 90/8/2 | 11000 | 1.4 |
| C-223 | 90/8/2 | 9000 | 1.5 |
| C-224 | 50/50 | 6000 | 1.5 |
| C-225 | 50/50 | 8000 | 1.5 |
| C-226 | 80/20 | 4500 | 1.3 |
| C-227 | 85/15 | 8500 | 1.6 |
| C-228 | 90/10 | 10000 | 1.4 |
| C-229 | 90/10 | 3500 | 1.5 |
| C-230 | 95/5 | 4500 | 1.5 |
| C-231 | 50/50 | 4000 | 1.5 |
| C-232 | 80/18/2 | 6000 | 1.5 |
| C-233 | 90/8/2 | 9500 | 1.5 |
| C-234 | 80/20 | 6500 | 1.4 |
| C-235 | 90/10 | 8000 | 1.5 |
| C-236 | 100 | 8000 | 1.5 |
| C-237 | 95/5 | 4500 | 1.5 |
| C-238 | 90/10 | 10000 | 1.5 |
| C-239 | 100 | 6500 | 1.4 |
| C-240 | 80/20 | 6500 | 1.4 |
| C-241 | 70/20/10 | 7000 | 1.4 |
| C-242 | 90/10 | 7000 | 1.6 |
| C-243 | 50/20/30 | 5000 | 1.3 |
| C-244 | 40/30/30 | 5000 | 1.4 |
| C-245 | 60/40 | 6000 | 1.4 |
| C-246 | 40/20/40 | 7000 | 1.4 |
| C-247 | 40/30/30 | 8000 | 1.5 |
| C-248 | 40/30/30 | 9500 | 1.5 |
| C-249 | 60/40 | 9500 | 1.5 |
| C-250 | 40/40/20 | 7500 | 1.4 |
| C-251 | 80/20 | 9000 | 1.5 |
| C-252 | 80/20 | 9000 | 1.5 |
| C-253 | 40/30/15/15 | 7000 | 1.4 |
| C-254 | 60/40 | 8500 | 1.4 |
| C-255 | 50/30/20 | 8000 | 1.4 |
| C-256 | 30/30/40 | 9500 | 1.5 |
| C-257 | 30/50/20 | 8000 | 1.3 |
| C-258 | 30/50/20 | 8000 | 1.3 |
| C-259 | 40/40/20 | 6500 | 1.4 |
| C-260 | 50/30/20 | 6000 | 1.4 |
| C-261 | 80/20 | 8500 | 1.5 |
| C-262 | 20/80 | 10000 | 1.5 |
| C-263 | 100 | 8500 | 1.5 |
| C-264 | 100 | 6000 | 1.4 |
| C-265 | 90/10 | 8000 | 1.4 |
| C-266 | 30/70 | 9000 | 1.6 |
| C-267 | 50/50 | 4000 | 1.3 |
| C-268 | 100 | 6500 | 1.4 |
| C-269 | 80/20 | 6500 | 1.4 |

It is both appropriate to use a single type of hydrophobic resin alone and use two or more types of hydrophobic resins in combination. For example, the hydrophobic resin containing a polarity conversion group is preferably used in combination with a hydrophobic resin (CP) different from the mentioned resin which contains at least either a fluorine atom or a silicon atom.

When the resin containing a polarity conversion group and the resin (CP) are contained in the composition, uneven localization of the resin containing a polarity conversion group and the resin (CP) occurs. When water is used as a liquid immersion medium, upon film formation, there can be increased the receding contact angle of the surface of the resist film with reference to water. Accordingly, the immersion water tracking property of the film can be enhanced. The content of the resin (CP) can be appropriately regulated so that the receding contact angle of the film after bake but before exposure falls within the range of preferably 60 to 90°. Based on the total solids of the actinic-ray- or radiation-sensitive resin composition, the content is preferably in the range of 0.01 to 10 mass %, more preferably 0.01 to 5 mass %, further more preferably 0.01 to 4 mass % and most preferably 0.01 to 3 mass %.

As mentioned above, the resin (CP) is unevenly localized in a surface. However, as different from surfactants, it is not always necessary for the resin to have a hydrophilic group in its molecule. The resin is not needed to contribute to the uniform mixing of polar and nonpolar substances.

In the resin (CP) having at least either a fluorine atom or a silicon atom, the fluorine atom and silicon atom may be introduced in the principal chain of the resin or may be introduced in a side chain of the resin by substitution.

It is preferred for the resin (CP) to be a resin containing, as a partial structure having a fluorine atom, an alkyl group having a fluorine atom, a cycloalkyl group having a fluorine atom or an aryl group having a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a cycloalkyl group of a single ring or multiple rings having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing fluorine atoms, cycloalkyl groups containing fluorine atoms and aryl groups containing fluorine atoms, there can be mentioned the groups of general formulae (F2) to (F4) given above with respect to the resin (C). These groups in no way limit the scope of the present invention.

In the present invention, it is preferred for the groups of general formulae (F2) to (F4) to be contained in (meth)acrylate repeating units.

It is preferred for the resin (CP) to be a resin containing, as a partial structure having a silicon atom, an alkylsilyl structure (especially a trialkylsilyl group) or a cyclosiloxane structure.

As the alkylsilyl structure and cyclosiloxane structure, there can be mentioned, for example, any of the groups of general formulae (CS-1) to (CS-3) mentioned above with respect to the hydrophobic resin (CP) or the like.

Moreover, the resin (CP) may have at least one group selected from among the following groups (x) and (z):

(x) an alkali soluble group, and (z) a group that is decomposed by the action of an acid.

As these groups, there can be mentioned, for example, those mentioned above with respect to the hydrophobic resin (C).

As specific examples of resin (CP), there can be mentioned, for example, (HR-1) to (HR-65) given above.

At the time of irradiation with actinic rays or radiation, exposure (liquid immersion exposure) may be carried out after filling the interstice between resist film and lens with a liquid (liquid immersion medium, liquid for liquid immersion) of refractive index higher than that of air. This would bring about an enhancement of resolving power. Any liquid with a refractive index higher than that of air can be employed as the liquid immersion medium. Preferably, pure water is employed.

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferred to use water from not only the above viewpoints but also the viewpoints of easy procurement and easy handling.

Further, from the viewpoint of refractive index increase, use can be made of a medium of 1.5 or higher refractive index. Such a medium may be an aqueous solution or an organic solvent.

In the use of water as a liquid for liquid immersion, a slight proportion of additive (liquid) that would not dissolve the resist film on a wafer and would be negligible with respect to its influence on an optical coat for an under surface of lens element may be added in order to not only decrease the surface tension of water but also increase a surface activating power. The additive is preferably an aliphatic alcohol with a refractive index approximately equal to that of water, for example, methyl alcohol, ethyl alcohol, isopropyl alcohol or the like. The addition of an alcohol with a refractive index approximately equal to that of water is advantageous in that even when the alcohol component is evaporated from water to thereby cause a change of content concentration, the change of refractive index of the liquid as a whole can be minimized. On the other hand, when a substance being opaque in 193 nm rays or an impurity whose refractive index is greatly different from that of water is mixed therein, the mixing would invite a distortion of optical image projected on the resist film. Accordingly, it is preferred to use distilled water as the liquid immersion water. Furthermore, use may be made of pure water having been filtered through an ion exchange filter or the like.

Desirably, the electrical resistance of the water is 18.3 MQcm or higher, and the TOC (organic matter concentration) thereof is 20 ppb or below. Prior deaeration of the water is desired.

Raising the refractive index of the liquid for liquid immersion would enable an enhancement of lithography performance. From this viewpoint, an additive suitable for refractive index increase may be added to the water, or heavy water ($D_2O$) may be used in place of water.

For the prevention of direct contact of a film with a liquid for liquid immersion, a film that is highly insoluble in the liquid for liquid immersion (hereinafter also referred to as a "top coat") may be provided between the film produced from the composition of the present invention and the liquid for liquid immersion. The functions to be fulfilled by the top coat are applicability to an upper layer portion of the resist, transparency in radiation of especially 193 nm and being highly insoluble in the liquid for liquid immersion. Preferably, the top coat does not mix with the resist and is uniformly applicable to an upper layer of the resist.

From the viewpoint of 193 nm transparency, the top coat preferably consists of a polymer not abundantly containing an aromatic moiety. As such, there can be mentioned, for example, a hydrocarbon polymer, an acrylic ester polymer, polymethacrylic acid, polyacrylic acid, polyvinyl ether, a siliconized polymer, a fluoropolymer or the like. The aforementioned hydrophobic resins (HR) (including resin (C) and resin (CP)) also find appropriate application in the top coat. From the viewpoint of contamination of an optical lens by leaching of impurities from the top coat into the liquid for liquid immersion, it is preferred to reduce the amount of residual monomer components of the polymer contained in the top coat.

At the detachment of the top coat, use may be made of a developer, or a separate peeling agent may be used. The peeling agent preferably consists of a solvent having a lower permeation into the film. Detachability by an alkali developer is preferred from the viewpoint of simultaneous attainment of the detachment step with the development processing step for the film. The top coat is preferred to be acidic from the viewpoint of detachment with the use of an alkali developer. However, from the viewpoint of non-intermixability with the film, the top coat may be neutral or alkaline.

The less the difference in refractive index between the top coat and the liquid for liquid immersion, the higher the resolving power. In an ArF excimer laser (wavelength: 193 nm), when water is used as the liquid for liquid immersion, the top coat for ArF liquid immersion exposure preferably has a refractive index close to that of the liquid for liquid immersion. From the viewpoint of approximation of the refractive index to that of the liquid for liquid immersion, it is preferred for the top coat to contain a fluorine atom. From the viewpoint of transparency and refractive index, it is preferred to reduce the thickness of the film.

Preferably, the top coat does not mix with the film and also does not mix with the liquid for liquid immersion. From this viewpoint, when the liquid for liquid immersion is water, it is preferred for the solvent used in the top coat to be highly insoluble in the solvent used in the positive resist composition and be a non-water-soluble medium. When the liquid for liquid immersion is an organic solvent, the top coat may be soluble or insoluble in water.

[3] Compound that when Exposed to Actinic Rays or Radiation, Generates an Acid

The actinic-ray- or radiation-sensitive resin composition of the present invention contains a compound that when exposed to actinic rays or radiation, generates an acid (hereinafter also referred to as an "acid generator").

Although the acid generator is not particularly limited, as preferred compounds, there can be mentioned those of the following general formulae (ZI), (ZII) and (ZIII).

ZI

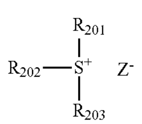

ZII

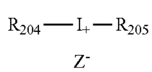

ZIII

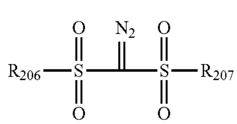

In general formula (ZI) above, each of $R_{201}$, $R_{202}$ and $R_{203}$ independently represents an organic group.

The number of carbon atoms of each of the organic groups represented by $R_{201}$, $R_{202}$ and $R_{203}$ is generally in the range of 1 to 30, preferably 1 to 20.

Two of $R_{201}$ to $R_{203}$ may be bonded to each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group).

$Z^-$ represents a normucleophilic anion. The normucleophilic anion means an anion whose capability of inducing a nucleophilic reaction is extremely low.

As the normucleophilic anion represented by $Z^-$, there can be mentioned, for example, a sulfonate anion (for example, an aliphatic sulfonate anion, an aromatic sulfonate anion, a camphor sulfonate anion or the like), a carboxylate anion(for example, an aliphatic carboxylate anion, an aromatic carboxylate anion, an aralkyl carboxylate anion or the like), a sulfonylimido anion, a bis(alkylsulfonyl)imido anion, a tris(alkylsulfonyl)methide anion or the like.

The aliphatic moiety of the aliphatic sulfonate anion and the aliphatic carboxylate anion may be an alkyl group or a cycloalkyl group, being preferably a linear or branched alkyl group having 1 to 30 carbon atoms or a cycloalkyl group having 3 to 30 carbon atoms.

As a preferred aromatic group of the aromatic sulfonate anion and the aromatic carboxylate anion, there can be mentioned an aryl group having 6 to 14 carbon atoms, for example, a phenyl group, a tolyl group, a naphthyl group or the like.

The alkyl group, cycloalkyl group and aryl group mentioned above may have a substituent. As the substituent, there can be mentioned, for example, a nitro group, a halogen atom (e.g., a fluorine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms) or the like. The aryl group or ring structure of these groups may further have an alkyl group (preferably having 1 to 15 carbon atoms) as its substituent.

As a preferred aralkyl group of the aralkyl carboxylate anion, there can be mentioned an aralkyl group having 6 to 12 carbon atoms, for example, a benzyl group, a phenethyl group, a naphthylmethyl group, a naphthylethyl group, a naphthylbutyl group or the like.

As the sulfonylimido anion, there can be mentioned, for example, a saccharin anion.

The alkyl group of the bis(alkylsulfonyl)imido anion and tris(alkylsulfonyl)methide anion is preferably an alkyl group having 1 to 5 carbon atoms. As a substituent of these alkyl groups, there can be mentioned a halogen atom, an alkyl group substituted with a halogen atom, an alkoxy group, an alkylthio group, an alkyloxysulfonyl group, an aryloxysulfonyl group, a cycloalkylaryloxysulfonyl group or the like. A fluorine atom or an alkyl group substituted with a fluorine atom is preferred.

As the other normucleophilic anions, there can be mentioned, for example, phosphorus fluoride, boron fluoride, antimony fluoride and the like.

The normucleophilic anion represented by $Z^-$ is preferably selected from among an aliphatic sulfonate anion substituted at its α-position of sulfonic acid with a fluorine atom, an aromatic sulfonate anion substituted with a fluorine atom or a group having a fluorine atom, a bis(alkylsulfonyl)imido anion whose alkyl group is substituted with a fluorine atom and a tris(alkylsulfonyl)methide anion whose alkyl group is substituted with a fluorine atom. More preferably, the normucleophilic anion is a perfluorinated aliphatic sulfonate anion (still more preferably having 4 to 8 carbon atoms) or a benzene sulfonate anion having a fluorine atom. Still more preferably, the normucleophilic anion is a nonafluorobutane sulfonate anion, a perfluorooctane sulfonate anion, a pentafluorobenzene sulfonate anion or a 3,5-bis(trifluoromethyl)benzene sulfonate anion.

From the viewpoint of acid strength, it is preferred for the pKa value of generated acid to be −1 or less so as to ensure a sensitivity enhancement.

As the organic groups represented by $R_{201}$, $R_{202}$ and $R_{203}$, there can be mentioned an aryl group (preferably having 6 to 15 carbon atoms), a linear or branched alkyl group (preferably having 1 to 10 carbon atoms), a cycloalkyl group (preferably having 3 to 15 carbon atoms) and the like.

Preferably, at least one of $R_{201}$, $R_{202}$ and $R_{203}$ is an aryl group. More preferably, these three are simultaneously aryl groups. The aryl groups include not only a phenyl group, a naphthyl group and the like but also heteroaryl groups, such as an indole residue and a pyrrole residue. Substituents may further be introduced in these aryl groups. As the substituents, there can be mentioned a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms) and the like. The appropriate substituents are not limited to these.

Two selected from among $R_{201}$, $R_{202}$ and $R_{203}$ may be bonded via a single bond or a connecting group to each other. The connecting group may be any of an alkylene group (preferably having 1 to 3 carbon atoms), —O—, —S—, —CO—, —$SO_2$— and the like. These in no way limit the scope of appropriate connecting groups.

As preferred structures in which at least one of $R_{201}$, $R_{202}$ and $R_{203}$ is not an aryl group, there can be mentioned the cation structures of the compounds set forth in Sections 0047 and 0048 of JP-A-2004-233661, compounds set forth in Sections 0040 to 0046 of JP-A-2003-35948, compounds of formulae (I-1) to (1-70) shown as examples in US 2003/0224288 A1, compounds of formulae (IA-1) to (IA-54) and (IB-1) to (IB-24) shown as examples in US 2003/0077540 A1 and the like.

In particular, when at least one of $R_{201}$, $R_{202}$ and $R_{203}$ is not an aryl group, the following instances (1) and (2) are preferred.

(1) At least one of $R_{201}$, $R_{202}$ and $R_{203}$ has any of the structures of the formula Ar—CO—X—, and the rest is a linear or branched alkyl group or a cycloalkyl group. In this instance, when the rest are two groups, the two linear or branched alkyl groups or cycloalkyl groups may be bonded to each other to thereby form a ring structure.

In the above formula, Ar represents an optionally substituted aryl group. In particular, the aryl group is the same as represented by $R_{201}$, $R_{202}$ and $R_{203}$. Ar is preferably an optionally substituted phenyl group.

X represents an optionally substituted alkylene group. For example, X is an alkylene group having 1 to 6 carbon atoms. Preferably, X is an alkylene group with a linear structure or branched structure which has 1 to 3 carbon atoms.

The rest linear or branched alkyl group or cycloalkyl group preferably has 1 to 6 carbon atoms. Substituents may further be introduced in these atomic groups. When the rest are two groups, they are preferably bonded to each other to thereby form a ring structure (preferably a 5- to 7-membered ring).

(2) One or two of $R_{201}$, $R_{202}$ and $R_{203}$ are optionally substituted aryl groups, and the rest is a linear or branched alkyl group or a cycloalkyl group.

In this instance, the aryl groups are, for example, the same as represented by $R_{201}$, $R_{202}$ and $R_{203}$. A phenyl group and a naphthyl group are preferred. Preferably, any of a hydroxyl group, an alkoxy group and an alkyl group is introduced as a substituent in the aryl groups. A preferred substituent is an alkoxy group having 1 to 12 carbon atoms. A more preferred substituent is an alkoxy group having 1 to 6 carbon atoms.

The rest linear or branched alkyl group or cycloalkyl group preferably has 1 to 6 carbon atoms. Substituents may further be introduced in these atomic groups. When the rest are two groups, they may be bonded to each other to thereby form a ring structure.

In general formulae (ZII) and (ZIII), each of $R_{204}$ to $R_{207}$ independently represents an aryl group, an alkyl group or a cycloalkyl group.

The examples of the aryl group, alkyl group and cycloalkyl group represented by $R_{204}$ to $R_{207}$ are the same as mentioned with respect to general formula (ZI) above.

The aryl group, alkyl group and cycloalkyl group represented by $R_{204}$ to $R_{207}$ may have a substituent. As a possible substituent on the aryl group, alkyl group and cycloalkyl group, there can also be mentioned the same as in general formula (ZI) above.

$Z^-$ represents a normucleophilic anion. As such, there can be mentioned the same normucleophilic anions as mentioned with respect to the $Z^-$ of general formula (ZI).

As the acid generators, there can be further mentioned the compounds of formulae (ZIV), (ZV) and (ZVI) below.

$$Ar_3—SO_2—SO_2—Ar_4 \quad \text{ZIV}$$

ZV

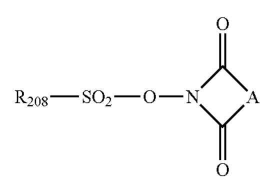

ZVI

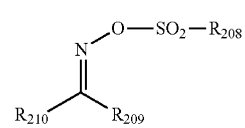

In general formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Especially preferred examples of the acid generators are as follows.

(z1)
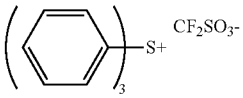
(z2)
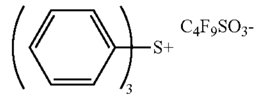
(z3)
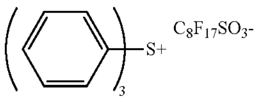
(z4)
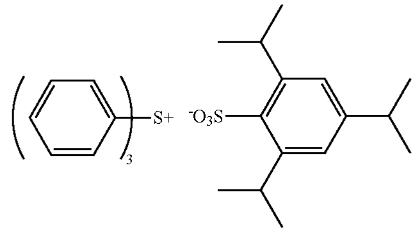
(z5)
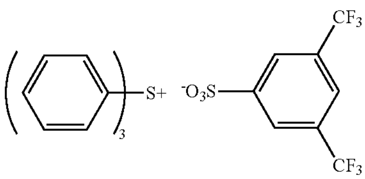
(z6)
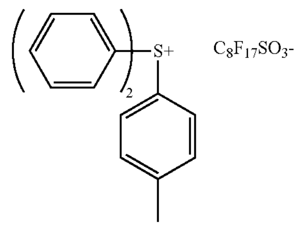
(z7)
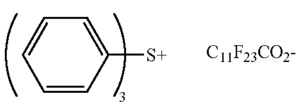
(z8)
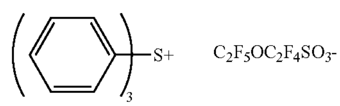
(z9)
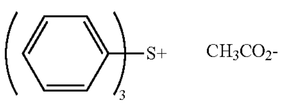
(z10)
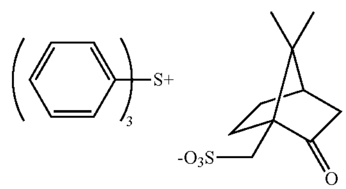
(z11)
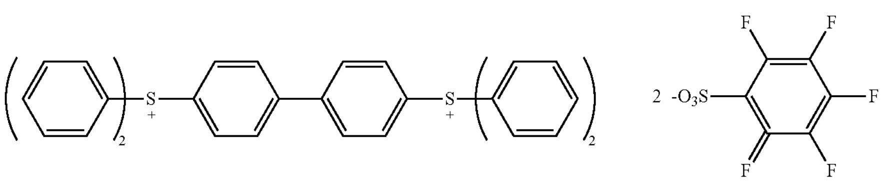
(z12)
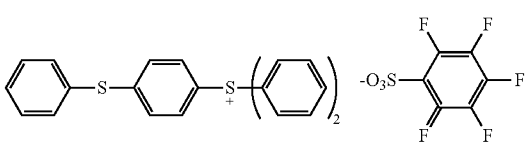
(z13)
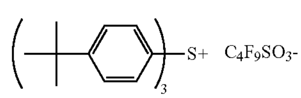
(z14)
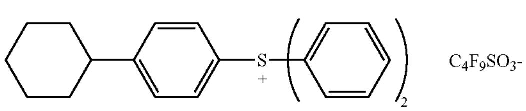
(z15)
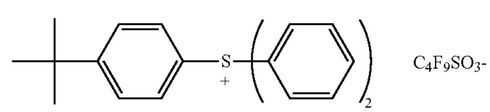
(z16)
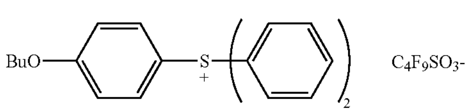
(z17)
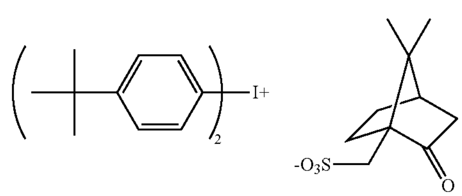

-continued
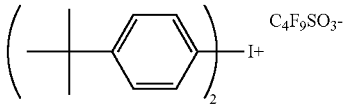
(z18)
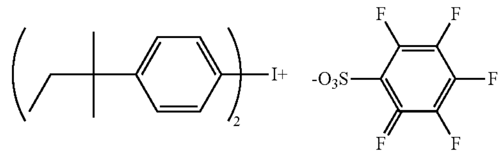
(z19)
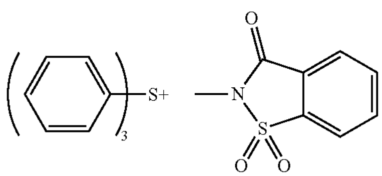
(z20)
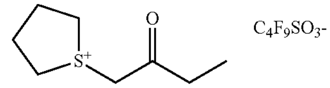
(z21)
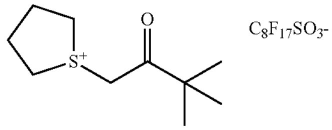
(z22)
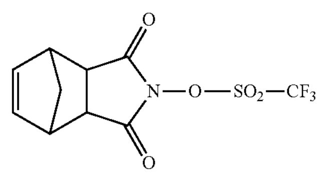
(z23)
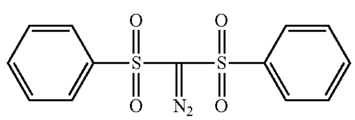
(z24)
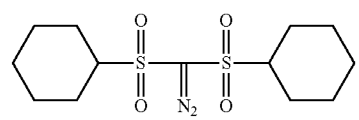
(z25)
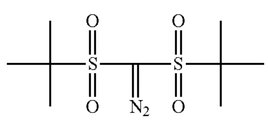
(z26)
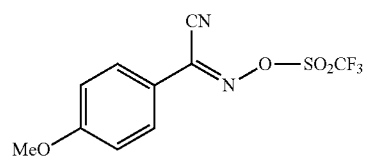
(z27)
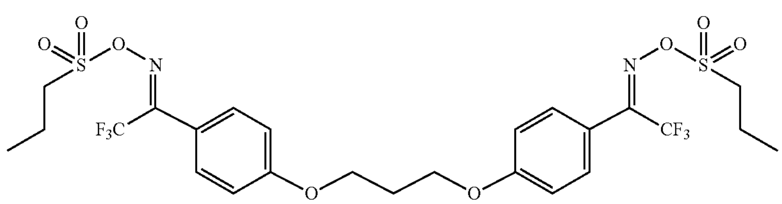
(z28)
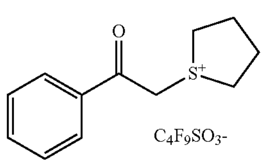
(z29)
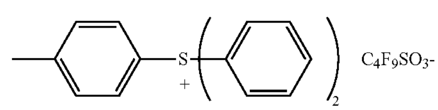
(z30)
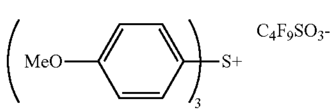
(z31)
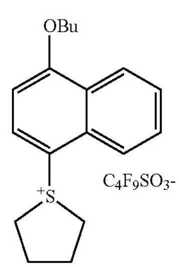
(z32)
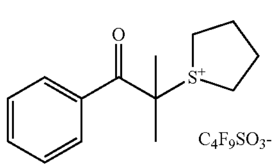
(z33)
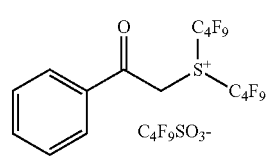
(z34)

-continued
(z35)
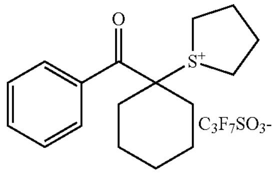
(z36)
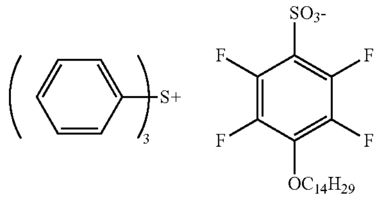
(z37)
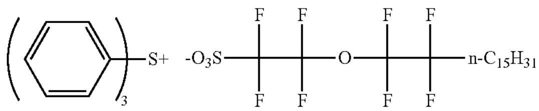
(z38)
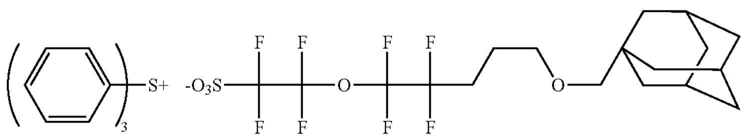
(z39)
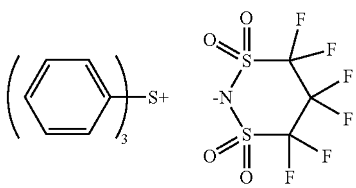
(z40)
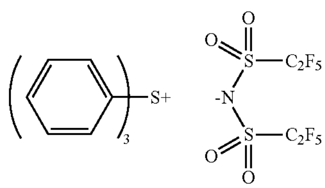
(z41)
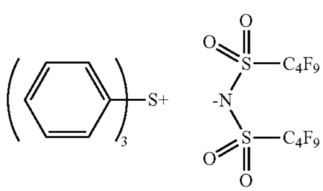
(z42)
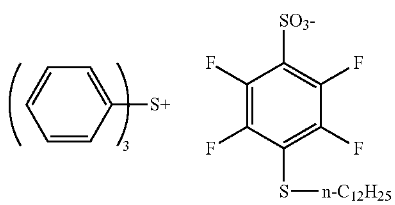
(z43)
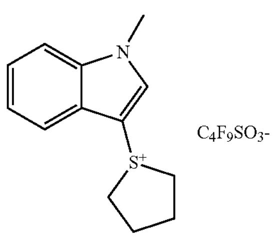
(z44)
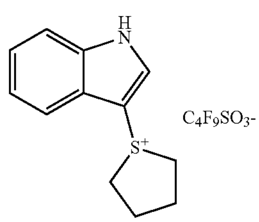
(z45)
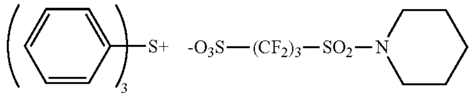
(z46)
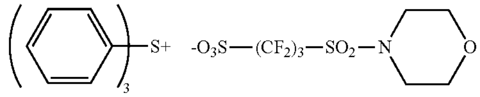
(z47)
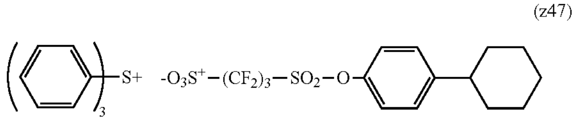
(z48)
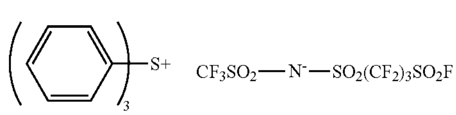
(z49)
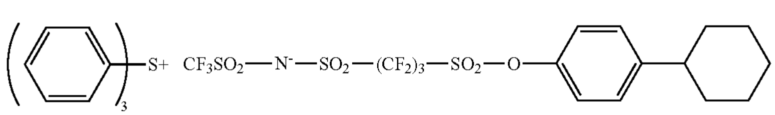

-continued
(z50)
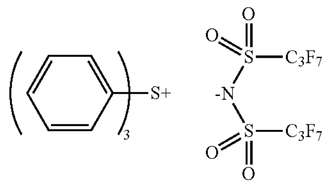
(z51)
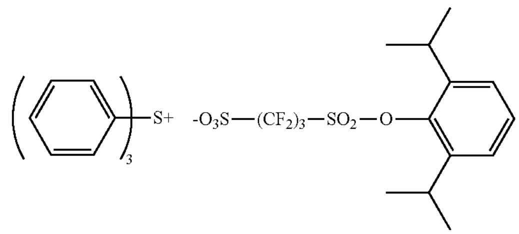
(z52)
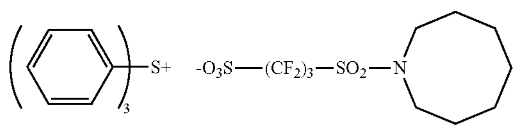
(z53)
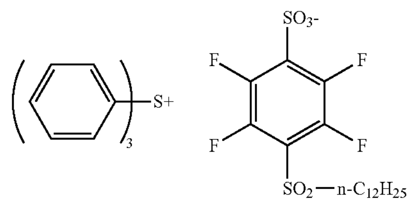
(z54)
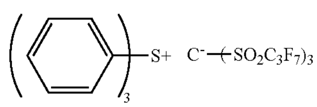
(z55)
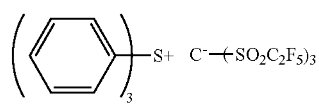
(z56)
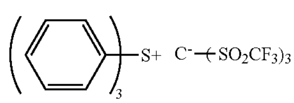
(z57)
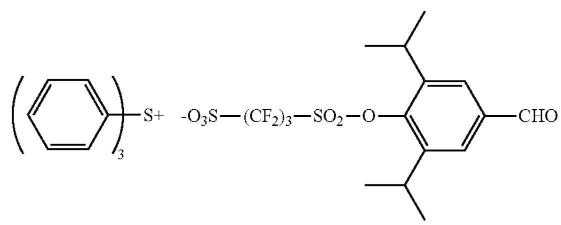
(z58)
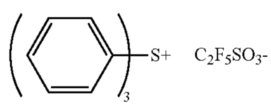
(z59)
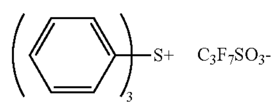
(z60)
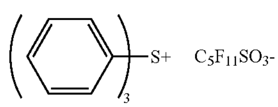
(z61)
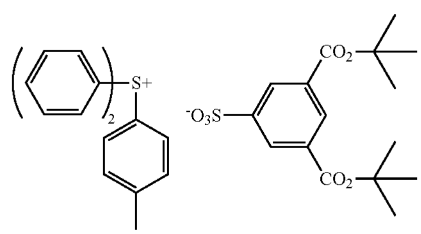
(z62)
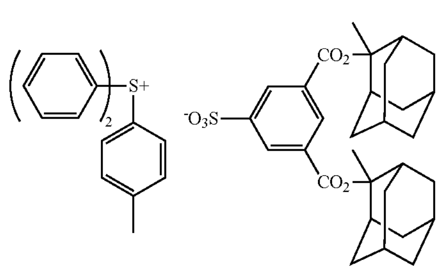
(z63)
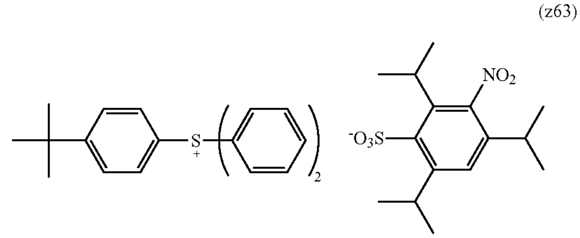

-continued (z64)

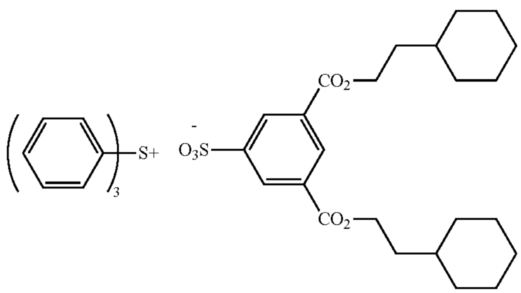

(z65)

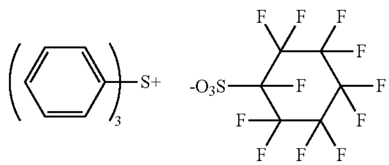

(z66)

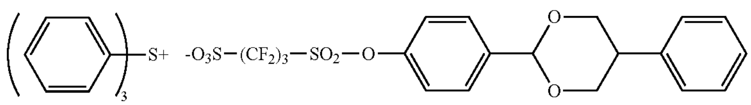

(z67)

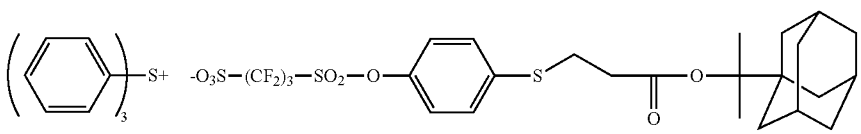

(z68)

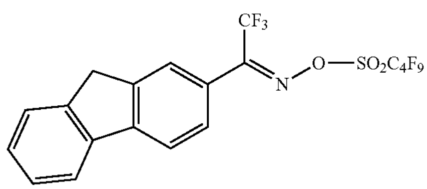

(z69)

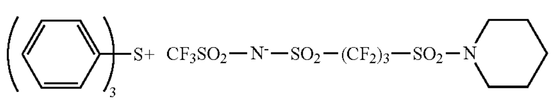

(z70)

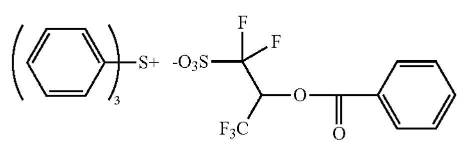

The acid generators can be used either individually or in combination.

The content ratio of the acid generators is preferably in the range of 0.1 to 20 mass %, more preferably 0.5 to 15 mass % and still more preferably 3 to 15 mass % based on the total solids of the composition of the present invention.

[4] Resin Whose Solubility in an Alkali Developer is Increased by the Action of an Acid The actinic-ray- or radiation-sensitive resin composition of the present invention may contain a resin (B) that when acted on by an acid is decomposed to thereby exhibit an increased solubility in an alkali developer.

The resin (B) (acid-decomposable resin) has a group that is decomposed by the action of an acid to thereby produce an alkali-soluble group (hereinafter also referred to as "acid-decomposable group") in the principal chain and/or side chain of the resin.

The resin (B) is preferably insoluble or poorly soluble in alkali developers.

It is preferred for the acid-decomposable group to have a structure in which the alkali soluble group is protected by a group that when acted on by an acid is decomposed and eliminated.

As the alkali soluble group, there can be mentioned a phenolic hydroxyl group, a carboxyl group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali soluble groups, there can be mentioned a carboxyl group, a fluoroalcohol group (preferably hexafluoroisopropanol) and a sulfonate group.

The acid-decomposable group is preferably a group as obtained by substituting the hydrogen atom of any of these alkali soluble groups with an acid eliminable group.

As the acid eliminable group, there can be mentioned, for example, —C($R_{36}$)($R_{37}$)($R_{38}$), —C($R_{36}$)($R_{37}$)($OR_{39}$), —C($R_{01}$)($R_{02}$)($OR_{39}$) or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded with each other to thereby form a ring structure.

Each of $R_{01}$ to $R_{02}$ independently represents a hydrogen atom, an alkyl group, a cycloalkyl group, an aryl group, an aralkyl group or an alkenyl group.

Preferably, the acid-decomposable group is a cumyl ester group, an enol ester group, an acetal ester group, a tertiary alkyl ester group or the like. A tertiary alkyl ester group is more preferred.

The repeating unit with an acid-decomposable group that may be contained in the resin (B) is preferably any of those of the following general formula (AI).

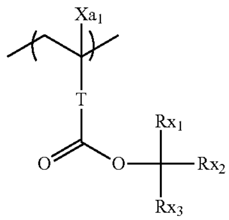
(AI)

In general formula (AI), $Xa_1$ represents a hydrogen atom, an optionally substituted methyl group or any of the groups of the formula —$CH_2$—$R_9$. $R_9$ represents a hydroxyl group or a monovalent organic group. The monovalent organic group is, for example, an alkyl group having 5 or less carbon atoms or an acyl group. Preferably, the monovalent organic group is an alkyl group having 3 or less carbon atoms, more preferably a methyl group. $Xa_1$ preferably represents a hydrogen atom, a methyl group, a trifluoromethyl group or a hydroxymethyl group.

T represents a single bond or a bivalent connecting group.

Each of $Rx_1$ to $Rx_3$ independently represents an alkyl group (linear or branched) or a cycloalkyl group (monocyclic or polycyclic).

At least two of $Rx_1$ to $Rx_3$ may be bonded with each other to thereby form a cycloalkyl group (monocyclic or polycyclic).

As the bivalent connecting group represented by T, there can be mentioned an alkylene group, a group of the formula —COO-Rt-, a group of the formula —O-Rt- or the like. In the formulae, Rt represents an alkylene group or a cycloalkylene group.

T is preferably a single bond or a group of the formula —COO-Rt-. Rt is preferably an alkylene group having 1 to 5 carbon atoms, more preferably a —$CH_2$- group or —$(CH_2)_3$-group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

The cycloalkyl group formed by bonding of at least two of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group. A monocyclic alkyl group having 5 to 6 carbon atoms is especially preferred.

In a preferred embodiment, $Rx_1$ is a methyl group or an ethyl group, and $Rx_2$ and $Rx_3$ are bonded with each other to thereby form any of the above-mentioned cycloalkyl groups.

Each of these groups may have a substituent. As the substituent, there can be mentioned, for example, an alkyl group (1 to 4 carbon atoms), a halogen atom, a hydroxyl group, an alkoxy group (1 to 4 carbon atoms), a carboxyl group, an alkoxycarbonyl group (2 to 6 carbon atoms) or the like. The number of carbon atoms of the substituent is preferably 8 or less.

The content ratio of the sum of repeating units having an acid-decomposable group is preferably in the range of 20 to 70 mol %, more preferably 30 to 50 mol %, based on all the repeating units of the resin (B).

Specific examples of the preferred repeating units with acid-decomposable groups will be shown below, which however in no way limit the scope of the present invention.

In the following formulae, each of Rx and $Xa_1$ represents a hydrogen atom, $CH_3$, $CF_3$ or $CH_2OH$. Each of Rxa and Rxb represents an alkyl group having 1 to 4 carbon atoms. Z, each independently in the presence of two or more groups, represents a substituent containing a polar group. p represents 0 or a positive integer.

1

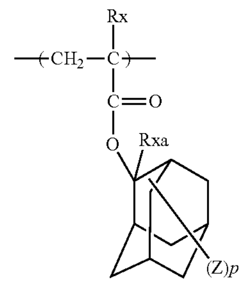

2

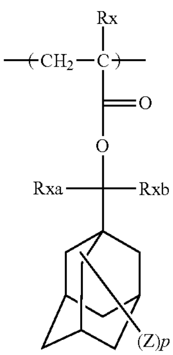

3

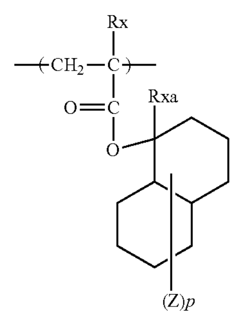

4

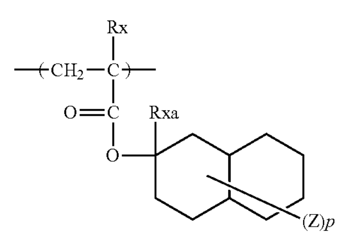

-continued
5
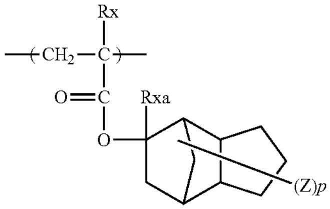
6
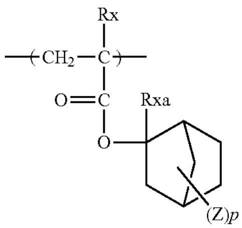
7
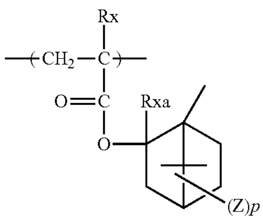
8
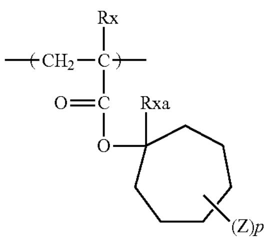
9
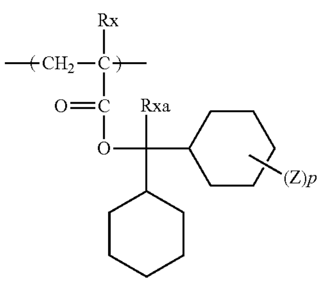
10
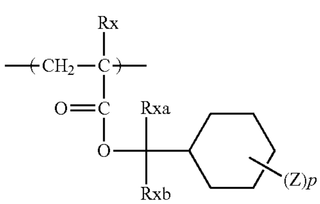
11
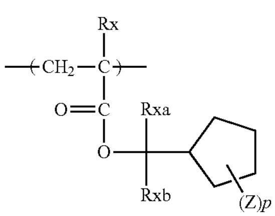
-continued
12
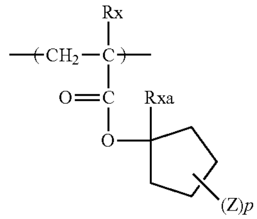
13
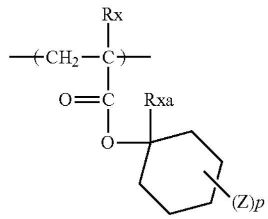
14
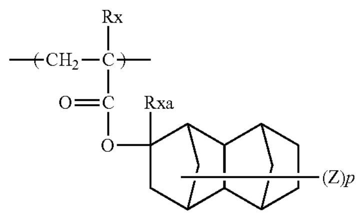
15
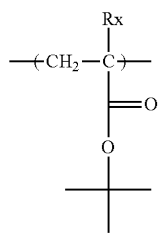
16
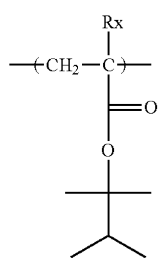
17
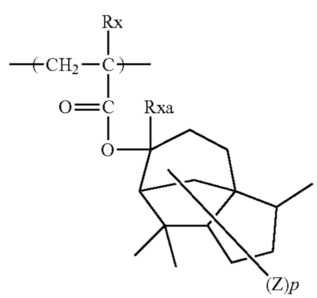

-continued
18
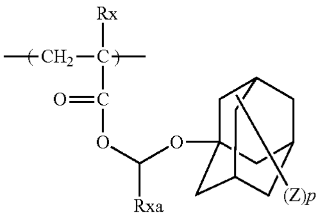
19
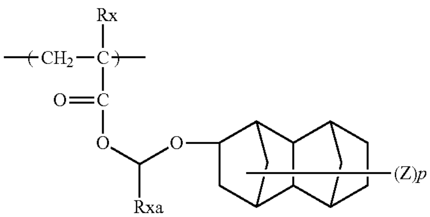
20
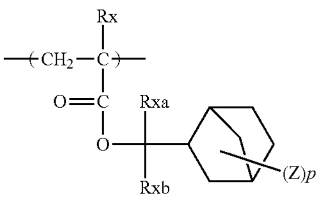
21
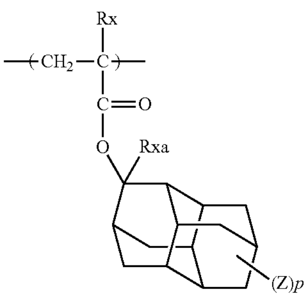
22
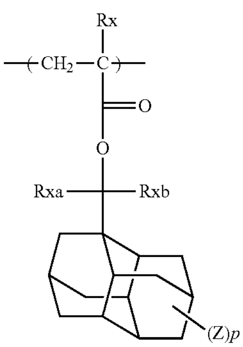
23
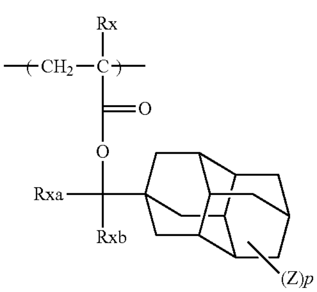
-continued
24
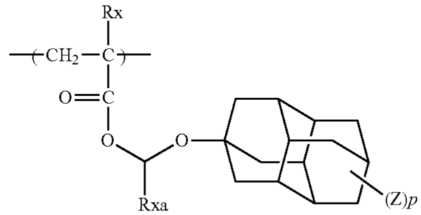
25
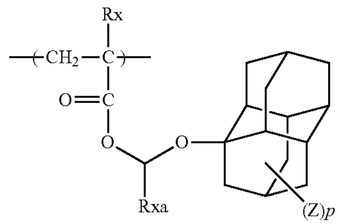
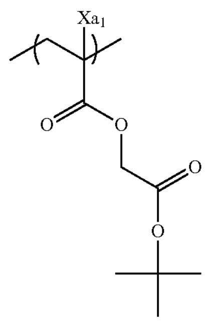
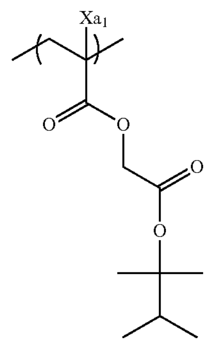
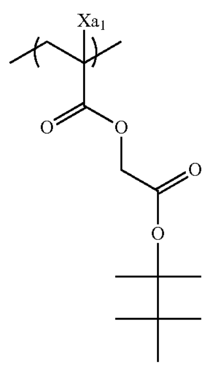
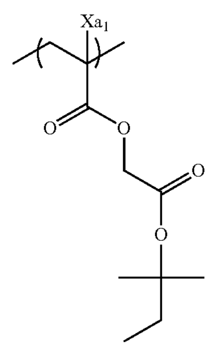
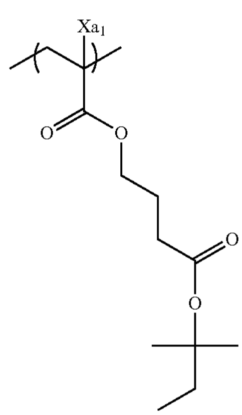
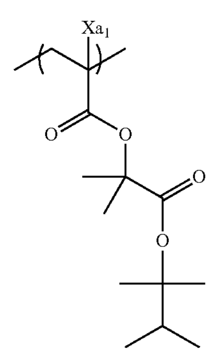

-continued
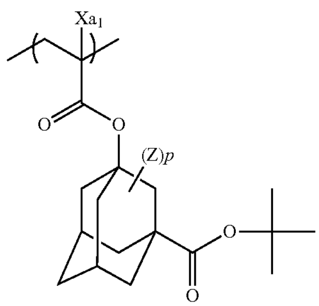
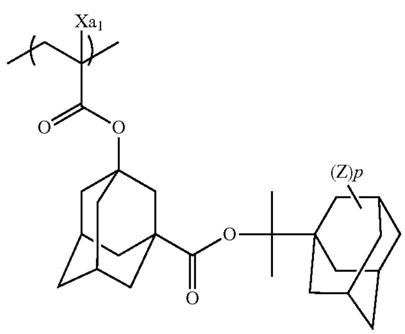
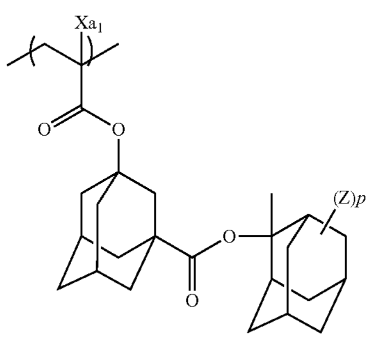
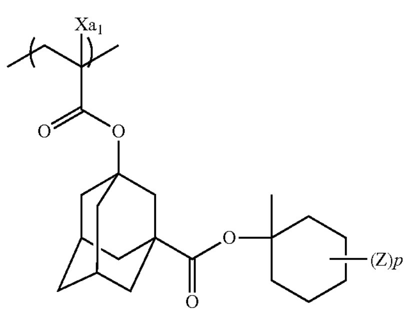
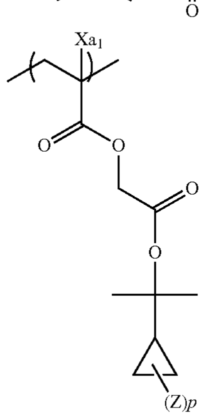
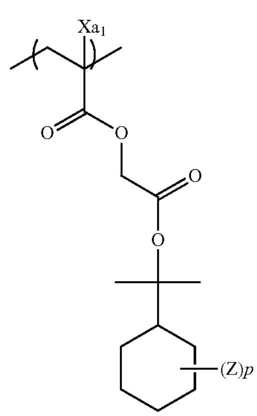
-continued
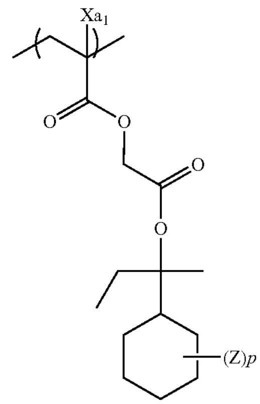
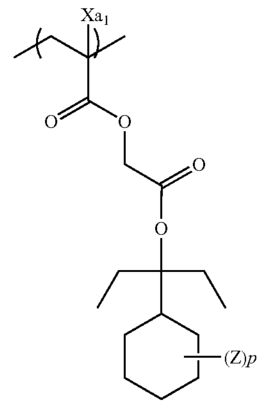
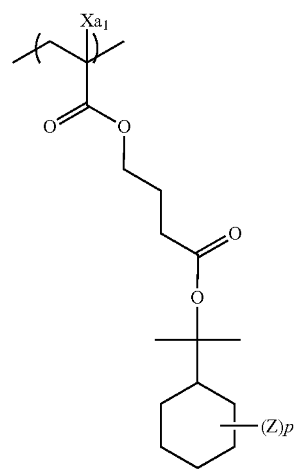
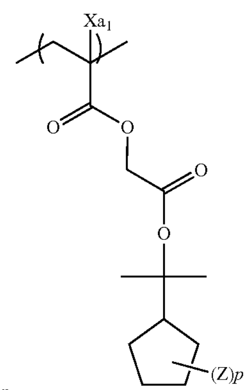
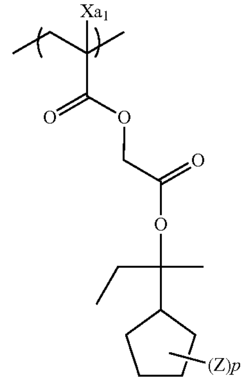
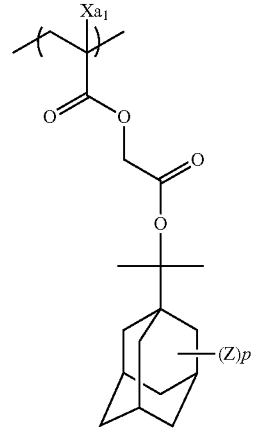

-continued
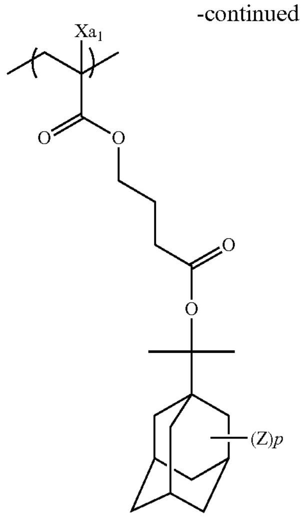
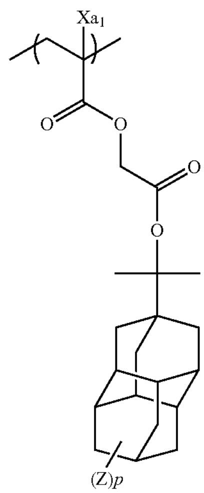
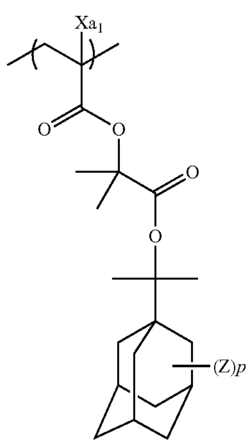
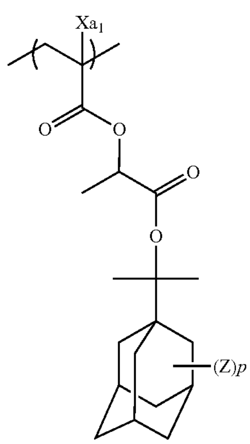
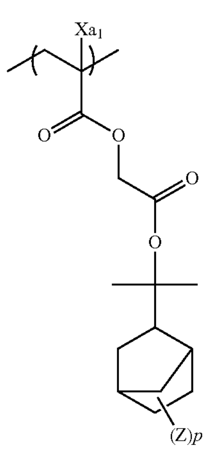
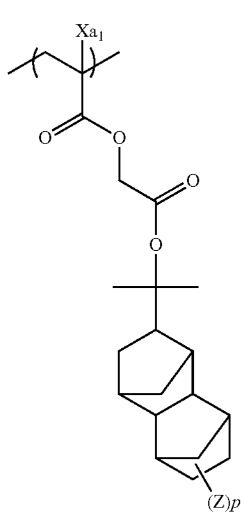
-continued
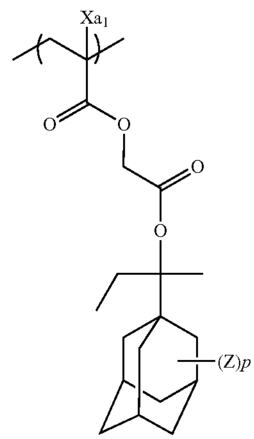
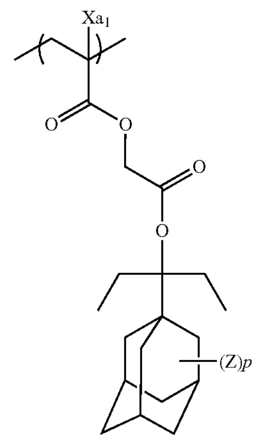
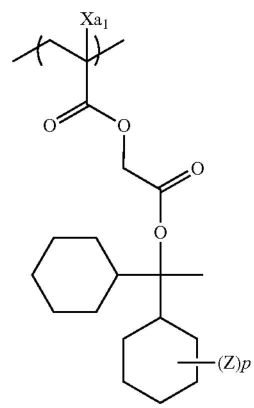
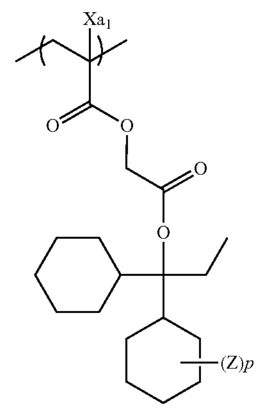
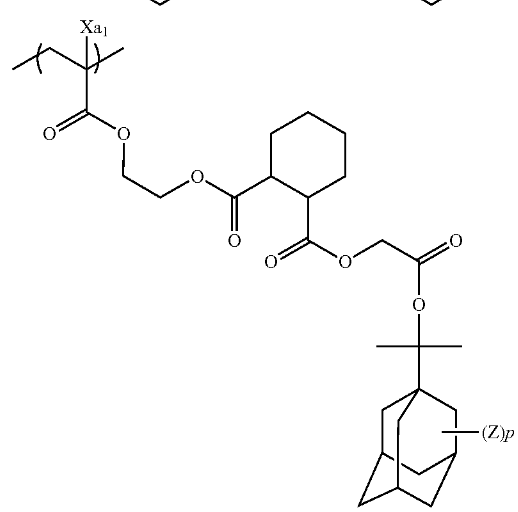
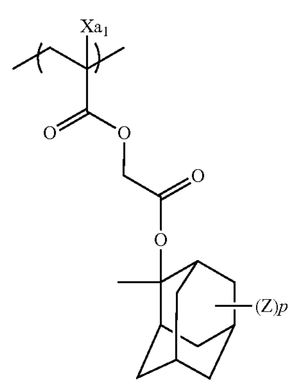

-continued
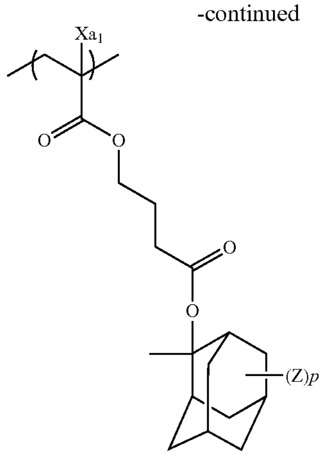
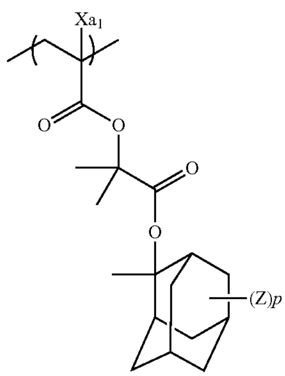
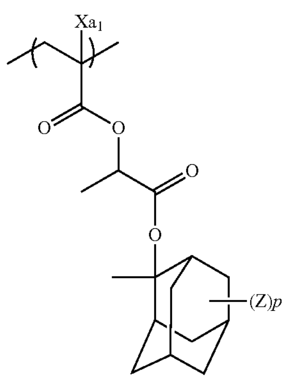
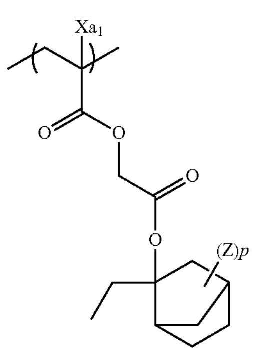
-continued
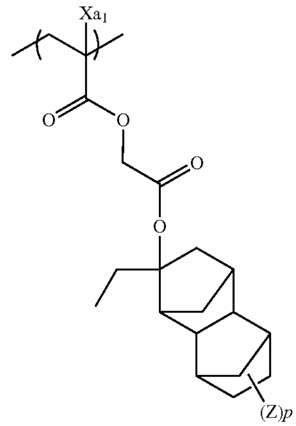
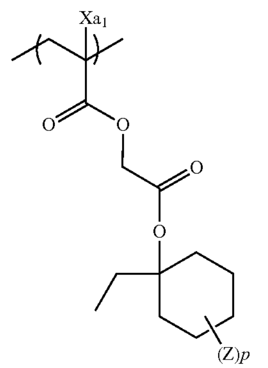
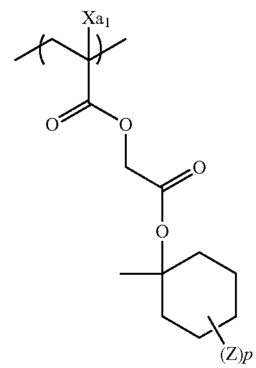
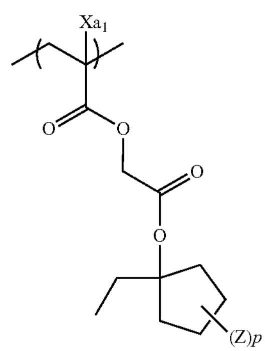
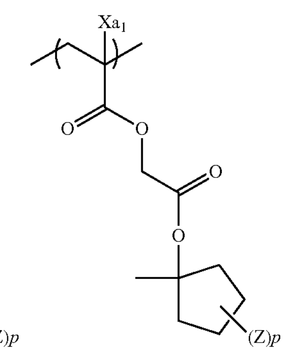
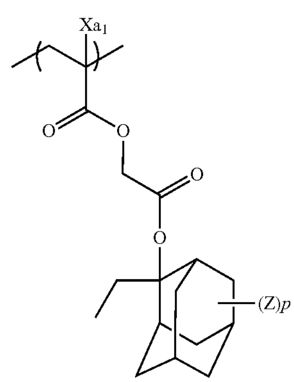

-continued

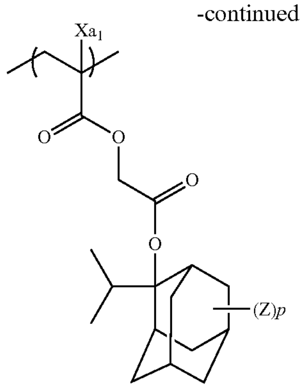

It is more preferred for the resin (B) to be a resin having, as the repeating units of general formula (AI), at least either any of the repeating units of general formula (AI-1) below or any of the repeating units of general formula (AI-2) below.

(AI-1)

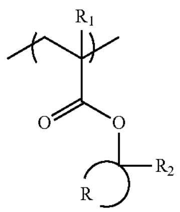

(AI-2)

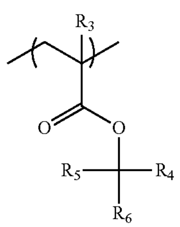

In general formulae (AI-1) and (AI-2), each of $R_1$ and $R_3$ independently represents a hydrogen atom, an optionally substituted methyl group or any of the groups of the formula —$CH_2$—$R_9$. $R_9$ represents a monovalent organic group.

Each of $R_2$, $R_4$, $R_5$ and $R_6$ independently represents an alkyl group or a cycloalkyl group.

R represents an atomic group required for forming an alicyclic structure in cooperation with a carbon atom.

$R_1$ preferably represents a hydrogen atom, a methyl group, a trifluoromethyl group or a hydroxymethyl group.

The alkyl group represented by $R_2$ may be linear or branched, and may have a substituent.

The cycloalkyl group represented by $R_2$ may be monocyclic or polycyclic, and may have a substituent.

$R_2$ preferably represents an alkyl group, more preferably an alkyl group having 1 to 10 carbon atoms, especially 1 to 5 carbon atoms. As examples thereof, there can be mentioned a methyl group and an ethyl group.

R represents an atomic group required for forming an alicyclic structure in cooperation with a carbon atom. The thus formed alicyclic structure is preferably an alicyclic structure of a single ring, and preferably has 3 to 7 carbon atoms, more preferably 5 or 6 carbon atoms.

$R_3$ preferably represents a hydrogen atom or a methyl group, more preferably a methyl group.

Each of the alkyl groups represented by $R_4$, $R_5$ and $R_6$ may be linear or branched, and may have a substituent. The alkyl groups preferably are those each having 1 to 4 carbon atoms, such as a methyl group, an ethyl group, an n-propyl group, an isopropyl group, an n-butyl group, an isobutyl group and a t-butyl group.

Each of the cycloalkyl groups represented by $R_4$, $R_5$ and $R_6$ may be monocyclic or polycyclic, and may have a substituent. The cycloalkyl groups are preferably a cycloalkyl group with a single ring, such as a cyclopentyl group or a cyclohexyl group, and a cycloalkyl group with multiple rings, such as a norbornyl group, a tetracyclodecanyl group, a tetracyclododecanyl group or an adamantyl group.

In one embodiment, the repeating units of general formula (AI-1) are those of general formula (1-a) below.

(1-a)

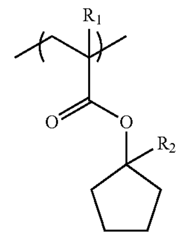

In the formula, $R_1$ to $R_2$ have the same meaning as those of general formulae (AI-1).

The repeating units of general formula (AI-2) are preferably those of general formula (II-1) below.

(II-1)

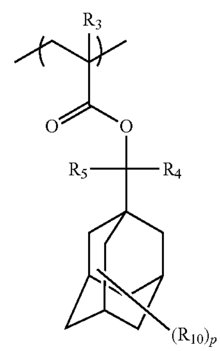

In general formula (II-1), $R_3$ to $R_5$ have the same meaning as in general formula (AI-2).

$R_{10}$ represents a substituent containing a polar group. When a plurality of $R_{10}$s exist, they may be identical to or different from each other. As the substituent containing a polar group, there can be mentioned, for example, a linear or branched alkyl group, or cycloalkyl group, having a hydroxyl group, a cyano group, an amino group, an alkylamido group or a sulfonamido group. An alkyl group having a hydroxyl group is preferred. As a branched alkyl group, an isopropyl group is especially preferred.

In the formula, p is an integer of 0 to 15, preferably in the range of 0 to 2, and more preferably 0 or 1.

As mentioned above, it is preferred for the acid-decomposable resin to be a resin containing, as the repeating units of general formula (AI), at least either any of the repeating units of general formula (AI-1) or any of the repeating units of general formula (AI-2). In another form, it is preferred for the acid-decomposable resin to be a resin containing, as the repeating units of general formula (AI), at least two of the repeating units of general formula (AI-1), or both any of the repeating units of general formula (AI-1) and any of the repeating units of general formula (AI-2).

When a plurality of acid-decomposable repeating units are simultaneously used in the resin (B), preferred combinations thereof are shown below. In the formulae, Each of Rs independently represents a hydrogen atom or a methyl group.

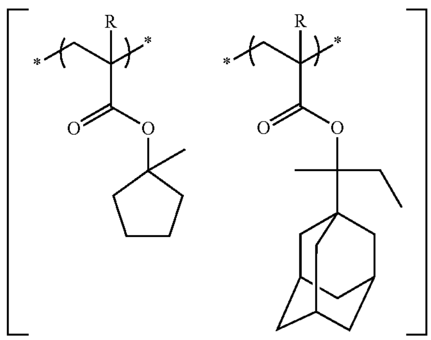

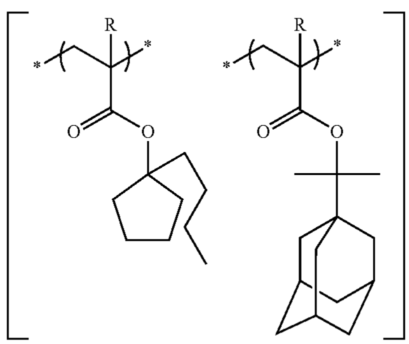

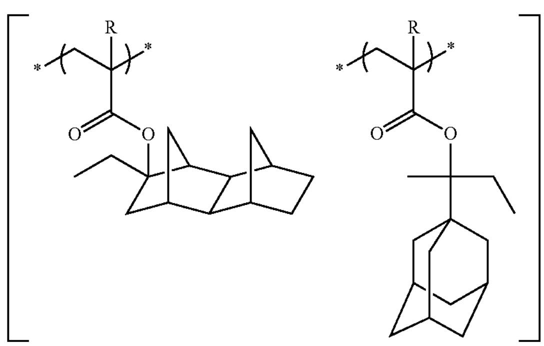

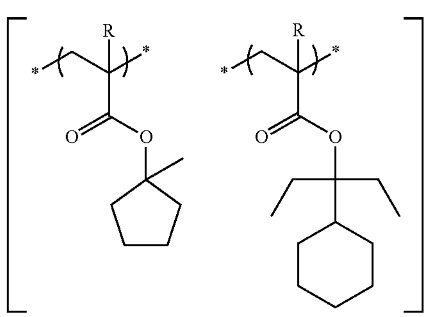

-continued

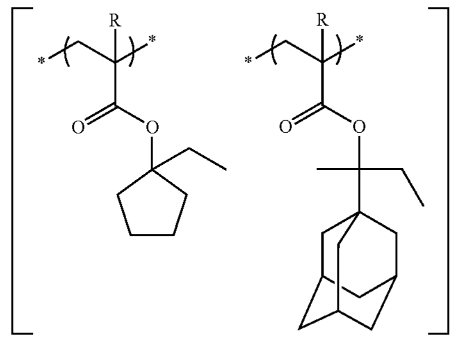

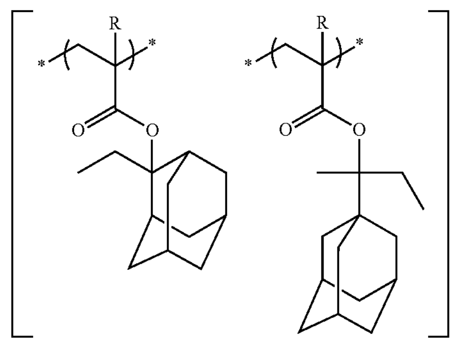

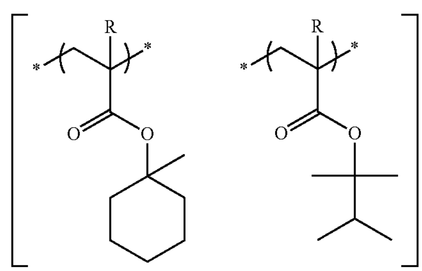

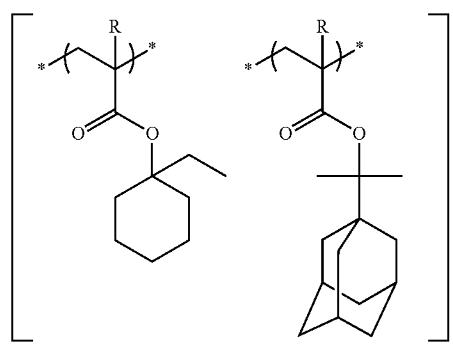

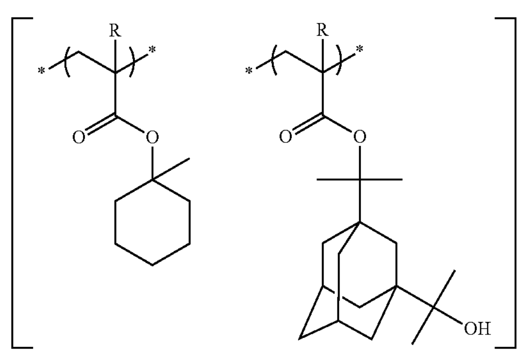

-continued
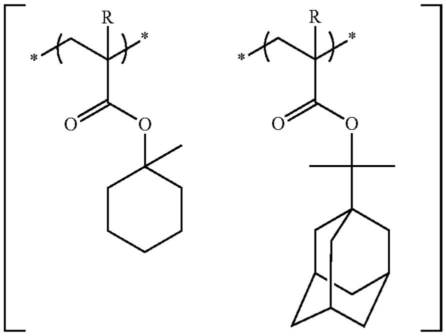
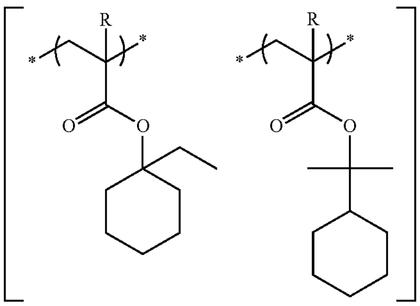
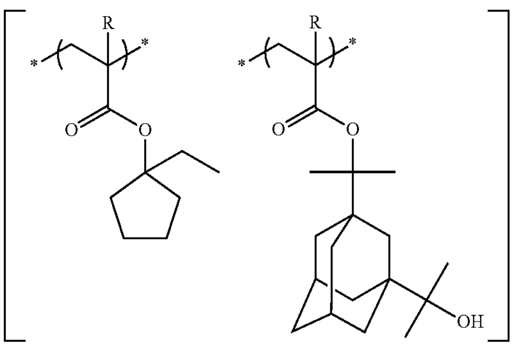
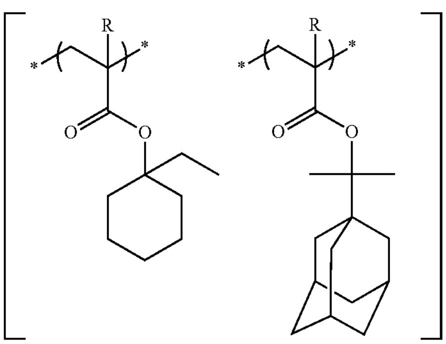
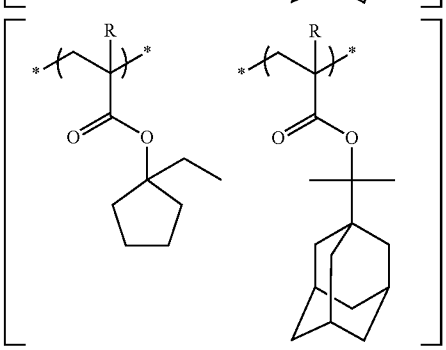
-continued
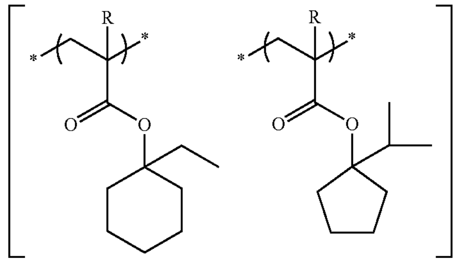
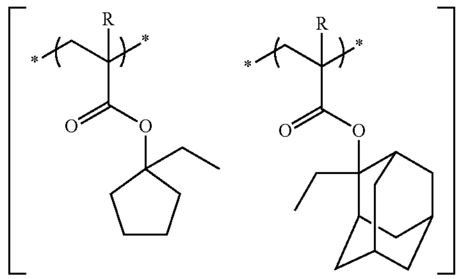
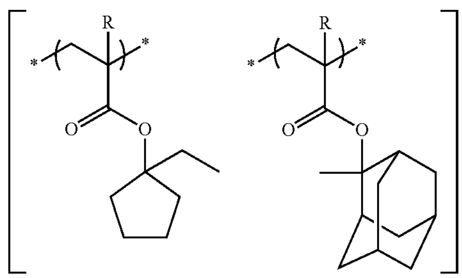
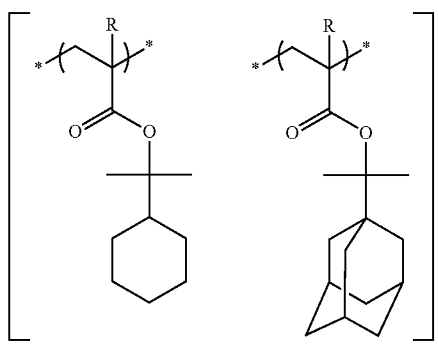
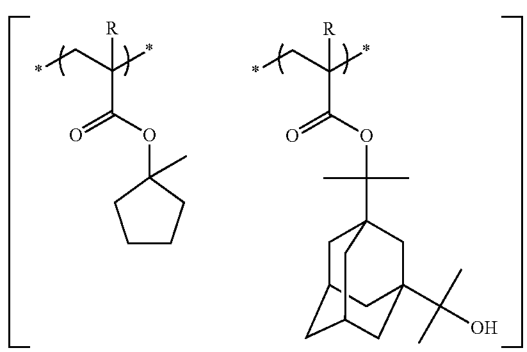

-continued

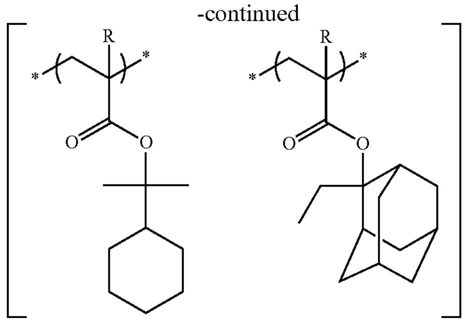

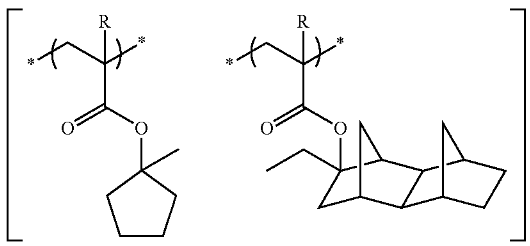

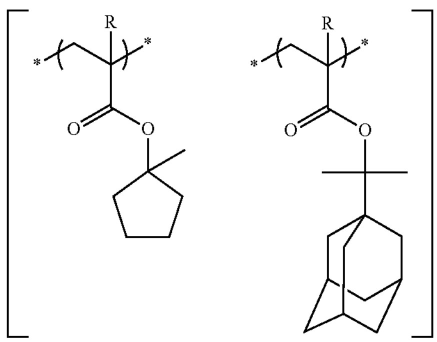

It is preferred for resin (B) to contain any of the repeating units having a lactone group represented by the following general formula (VII).

(VII)

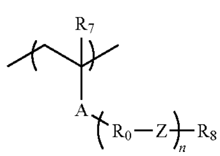

In formula (VII),

A represents an ester bond (—COO—) or an amido bond (—CONH—).

Ro, each independently in the presence of two or more groups, represents an alkylene group, a cycloalkylene group or a combination thereof.

Z, each independently in the presence of two or more groups, represents an ether bond, an ester bond, an amido bond, a urethane bond (a group represented by

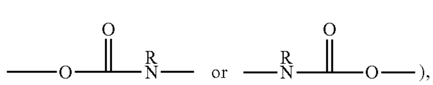

or a urea bond (a group represented by

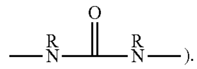

Each of Rs independently represents a hydrogen atom, an alkyl group, cycloalkyl group or an aryl group.

$R_8$ represents a monovalent organic group with a lactone structure.

n represents the number of repetitions of the structure of the formula —$R_0$—Z— and is an integer of 1 to 5.

$R_7$ represents a hydrogen atom, a halogen atom or an optionally substituted alkyl group.

Each of the alkylene group and cycloalkylene group represented by $R_0$ may have a substituent.

Z preferably represents an ether bond or an ester bond, most preferably an ester bond.

The alkyl group represented by $R_7$ is preferably an alkyl group having 1 to 4 carbon atoms, more preferably a methyl group or an ethyl group and most preferably a methyl group. The alkyl group represented by $R_7$ may be substituted. As substituents on $R_7$, there can be mentioned, for example, a halogen atom such as a fluorine atom, a chlorine atom or a bromine atom, a mercapto group, a hydroxyl group, an alkoxy group such as a methoxy group, an ethoxy group, an isopropoxy group, a t-butoxy group or a benzyloxy group, an acyl group such as an acetyl group or a propionyl group, an acetoxy group and the like. $R_7$ preferably represents a hydrogen atom, a methyl group, a trifluoromethyl group or a hydroxymethyl group.

The alkylene group represented by $R_0$ is preferably a chain alkylene group having 1 to 10 carbon atoms, more preferably 1 to 5 carbon atoms, for example, a methylene group, an ethylene group, a propylene group or the like. The cycloalkylene group is preferably a cycloalkylene group having 3 to 20 carbon atoms. As such, there can be mentioned, for example, cyclohexylene, cyclopentylene, norbornylene, adamantylene or the like. The chain alkylene groups are preferred from the viewpoint of the exertion of the effect of the present invention. A methylene group is most preferred.

The substituent with a lactone structure represented by $R_8$ is not limited as long as the lactone structure is contained. As particular examples thereof, there can be mentioned the lactone structures of the above general formulae (LC1-1) to (LC1-17). Of these, the structures of general formula (LC1-4) are most preferred. In general formulae (LC1-1) to (LC1-17), $n_2$ is more preferably 2 or less.

$R_8$ preferably represents a monovalent organic group with an unsubstituted lactone structure or a monovalent organic group with a lactone structure substituted with a methyl group, a cyano group or an alkoxycarbonyl group. More preferably, $R_8$ represents a monovalent organic group with a lactone structure substituted with a cyano group (cyanolactone).

Specific examples of the repeating units having groups with a lactone structure of general formula (VII) will be shown below, which however in no way limit the scope of the present invention.

In the following specific examples, R represents a hydrogen atom, an optionally substituted alkyl group or a halogen atom. Preferably, R represents a hydrogen atom, a methyl group, a hydroxymethyl group or an acetoxymethyl group.

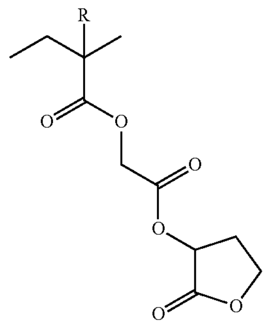

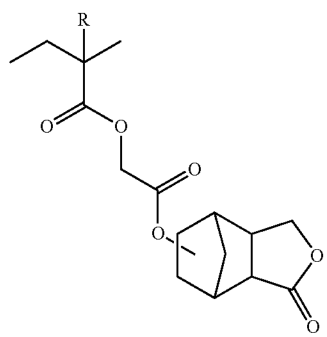

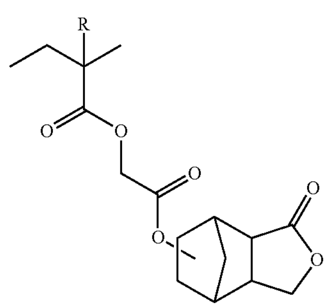

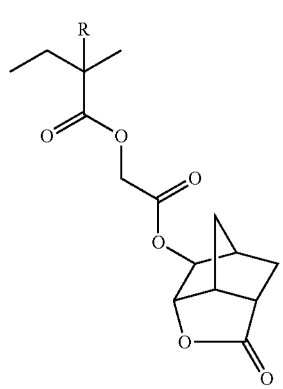

As more preferred repeating units with a lactone structure, there can be mentioned the repeating units of general formula (VII-1), below.

(VII-1)

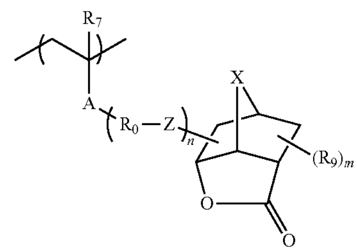

In general formula (VII-1), $R_7$, A, $R_0$, Z and n are as defined above with respect to general formula (VII).

$R_9$, each independently in the presence of two or more groups, represents an alkyl group, a cycloalkyl group, an alkoxycarbonyl group, a cyano group, a hydroxyl group or an alkoxy group. In the presence of two or more groups, two $R_9$s may be bonded to each other to thereby form a ring.

X represents an alkylene group, an oxygen atom or a sulfur atom, and m is the number of substituents and is an integer of 0 to 5. Preferably, m is 0 or 1.

The alkyl group represented by $R_9$ is preferably an alkyl group having 1 to 4 carbon atoms, more preferably a methyl group or an ethyl group and most preferably a methyl group. As the cycloalkyl group, there can be mentioned a cyclopropyl group, a cyclobutyl group, a cyclopentyl group or a cyclohexyl group. As the alkoxycarbonyl group, there can be mentioned a methoxycarbonyl group, an ethoxycarbonyl group, an n-butoxycarbonyl group, a t-butoxycarbonyl group or the like. As the substituent therefor, there can be mentioned a hydroxyl group, an alkoxy group such as a methoxy group or an ethoxy group, a cyano group, or a halogen atom such as a fluorine atom. More preferably, $R_9$ represents a methyl group, a cyano group or an alkoxycarbonyl group, still more preferably a cyano group.

As the alkylene group represented by X, there can be mentioned a methylene group, an ethylene group or the like. Preferably, X represents an oxygen atom or a methylene group, more preferably a methylene group.

When m is 1 or greater, the substitution site of at least one $R_9$ is preferably the α-position or β-position of the carbonyl group of the lactone. The substitution at the α-position is especially preferred.

Specific examples of the repeating units having groups with a lactone structure expressed by general formula (VII-1) will be shown below, which however in no way limit the scope of the present invention. In the following specific examples, R represents a hydrogen atom, an optionally substituted alkyl group or a halogen atom. Preferably, R represents a hydrogen atom, a methyl group, a hydroxymethyl group or an acetoxymethyl group.

-continued
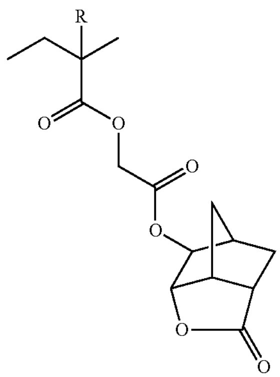
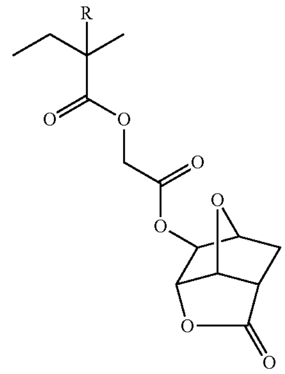
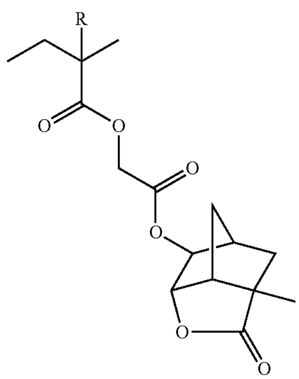
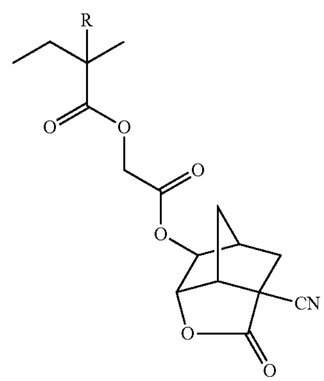
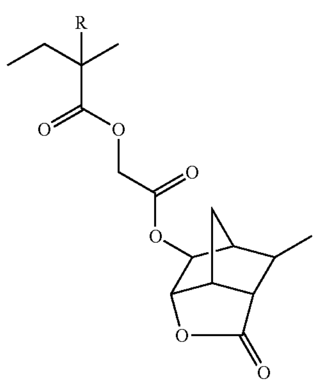
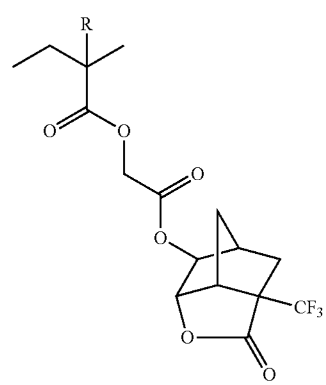
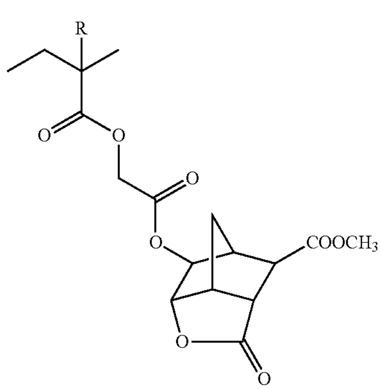
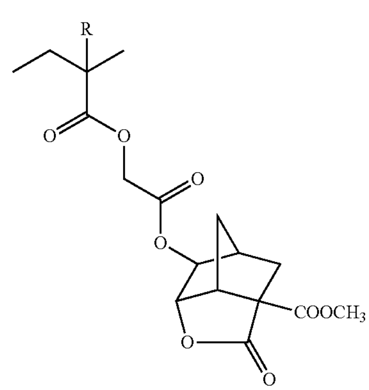

-continued
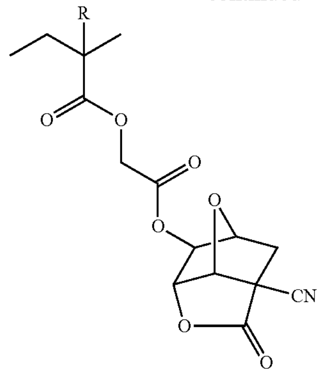
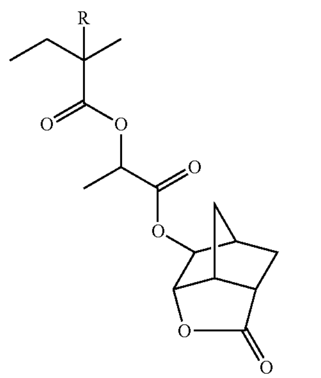
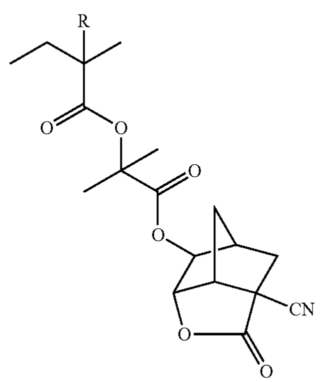
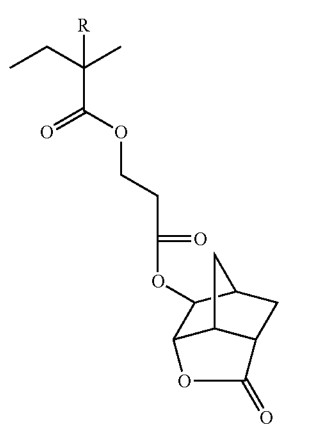
-continued
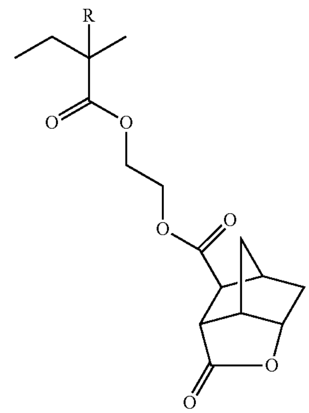
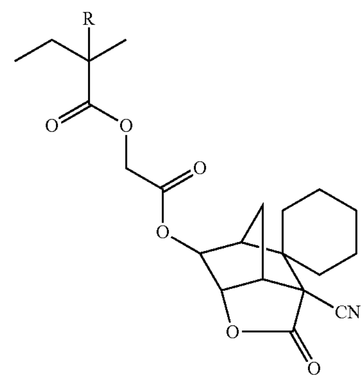
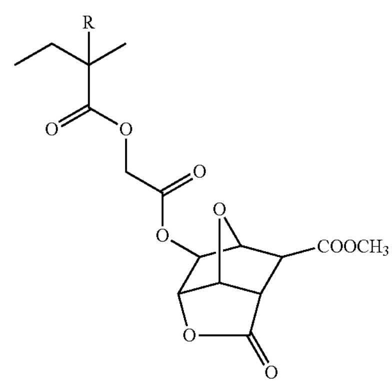
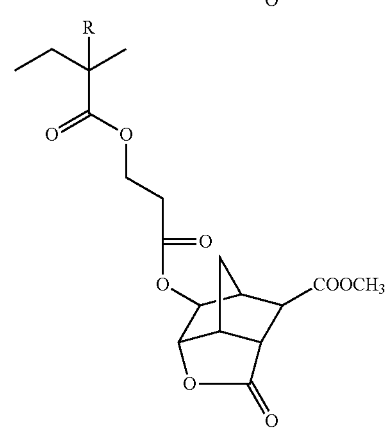

-continued
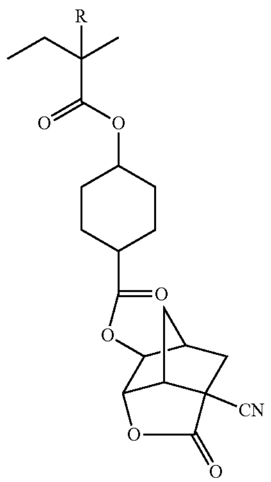
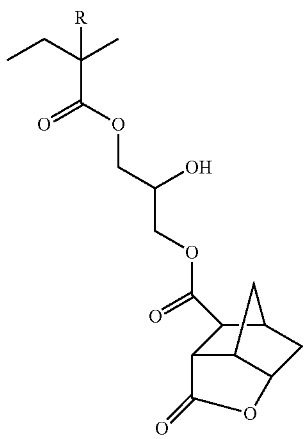
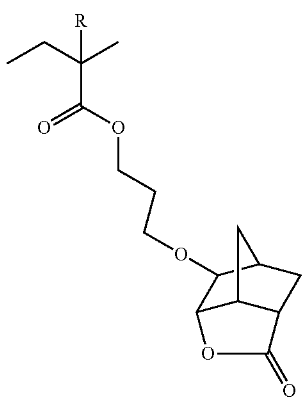
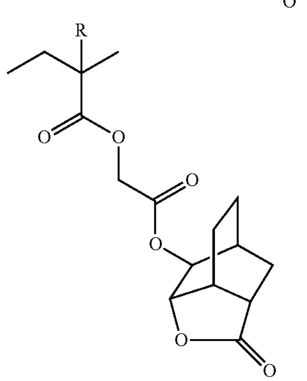
-continued
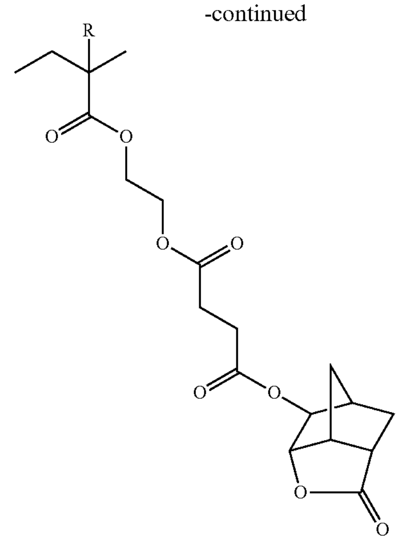
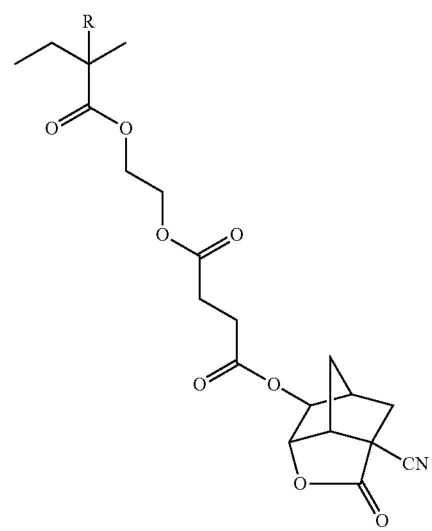
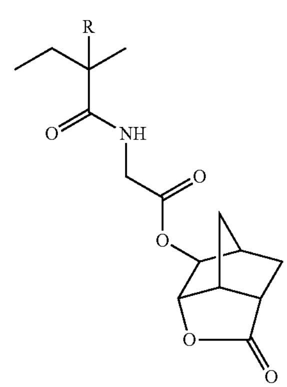

-continued

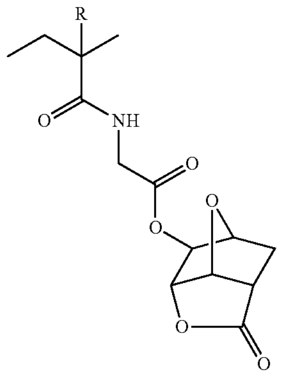

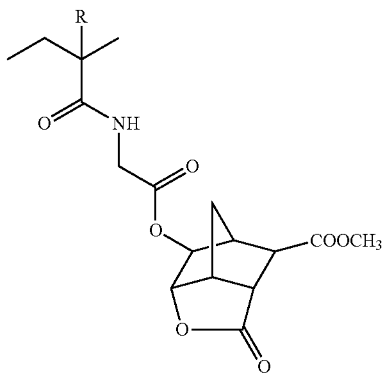

The content ratio of any of the repeating units, in the instance of two or more the sum thereof, of general formula (VII) in the resin based on all the repeating units of the resin is preferably in the range of 15 to 60 mol %, more preferably 20 to 60 mol % and further more preferably 30 to 50 mol %.

The resin (B) may contain a repeating unit having a lactone group other than the units of general formula (VII).

Any lactone groups can be employed as long as a lactone structure is possessed therein. However, lactone structures of a 5 to 7-membered ring are preferred, and in particular, those resulting from condensation of lactone structures of a 5 to 7-membered ring with other cyclic structures effected in a fashion to form a bicyclo structure or spiro structure are preferred. The possession of repeating units having a lactone structure represented by any of the following general formulae (LC1-1) to (LC1-17) is more preferred. The lactone structures may be directly bonded to the principal chain of the resin. Preferred lactone structures are those of formulae (LC1-1), (LC1-4), (LC1-5), (LC1-6), (LC1-13), (LC1-14) and (LC1-17). The use of these specified lactone structures would ensure improvement in the LWR and development defect.

LC1-1

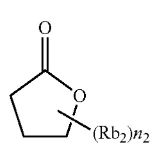

-continued

LC1-2

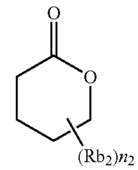

LC1-3

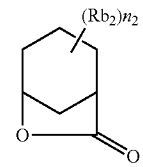

LC1-4

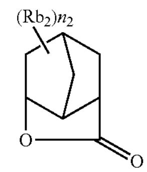

LC1-5

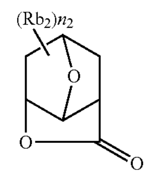

LC1-6

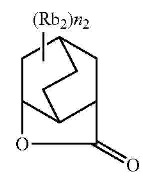

LC1-7

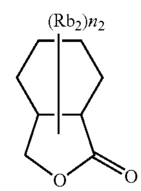

LC1-8

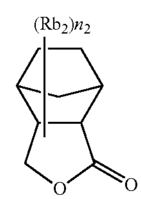

LC1-9

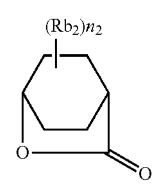

LC1-10

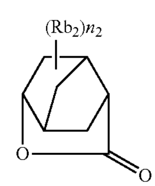

-continued

LC1-11

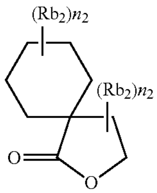

LC1-12

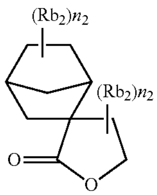

LC1-13

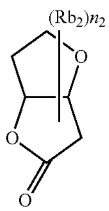

LC1-14

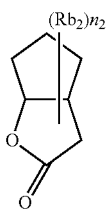

LC1-15

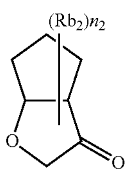

LC1-16

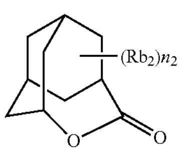

LC1-17

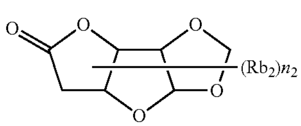

The presence of a substituent ($Rb_2$) on the portion of the lactone structure is optional. As a preferred substituent ($Rb_2$), there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group or the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded to each other to thereby form a ring.

The repeating units of general formula (AII'), below, can preferably be employed as the repeating units with a lactone structure other than the units of general formula (VII).

(AII')

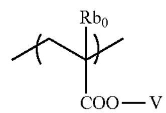

In general formula (AII'), $Ab_0$ represents a hydrogen atom, a halogen atom or an optionally substituted alkyl group having 1 to 4 carbon atoms. As a preferred substituent optionally contained in the alkyl group represented by $Ab_0$, there can be mentioned a hydroxyl group or a halogen atom. As the halogen atom represented by $Ab_0$, there can be mentioned a fluorine atom, a chlorine atom, a bromine atom or an iodine atom. The $Ab_0$ is preferably a hydrogen atom, a methyl group, a hydroxymethyl group or a trifluoromethyl group. A hydrogen atom and a methyl group are especially preferred.

V represents a group with a structure represented by any of general formulae (LC1-1) to (LC1-17).

Specific examples of the repeating units having a lactone group other than the units of general formula (VII) will be shown below, which however in no way limit the scope of the present invention.

In the following formulae, Rx represents H, $CH_3$, $CH_2OH$ or $CF_3$.

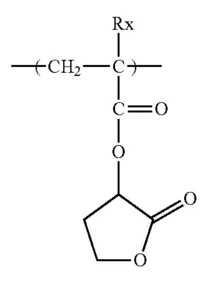

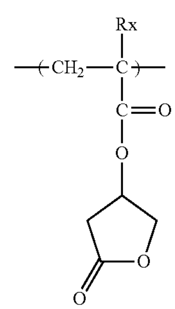

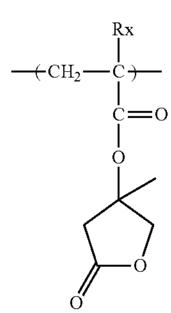

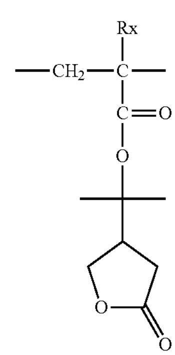

-continued
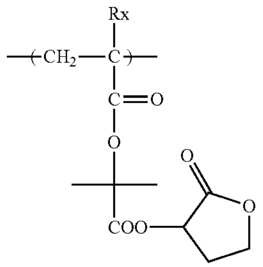
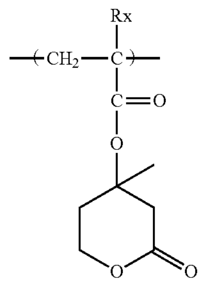
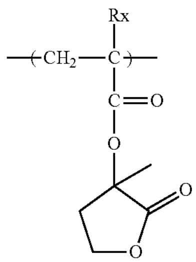
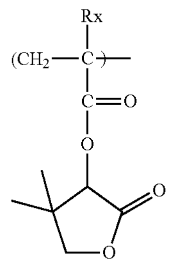
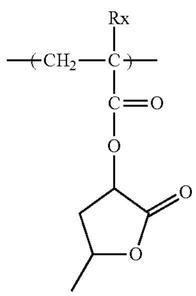
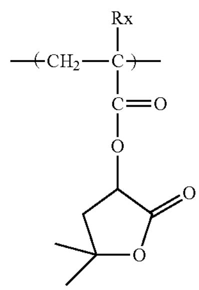
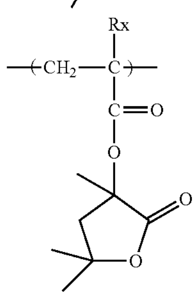
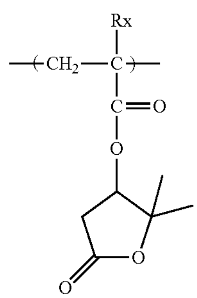
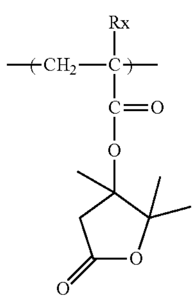
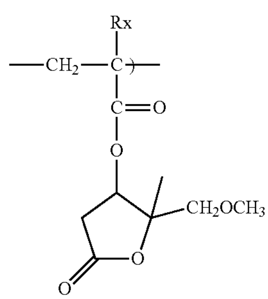
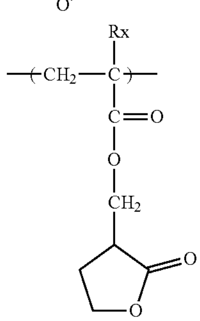
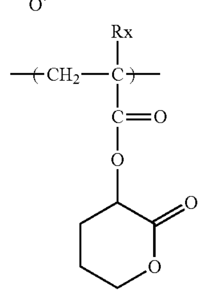
-continued
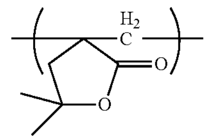
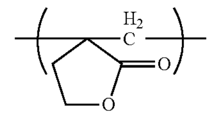
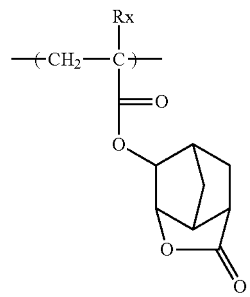
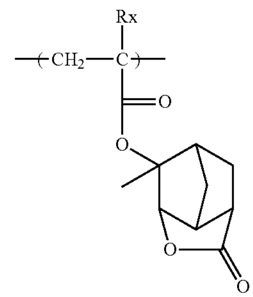
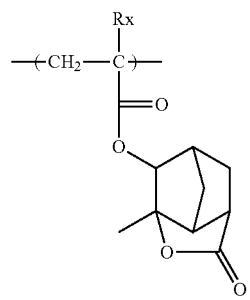
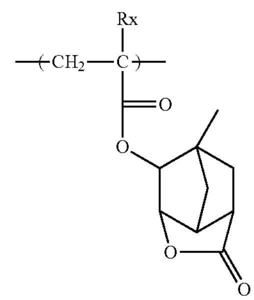
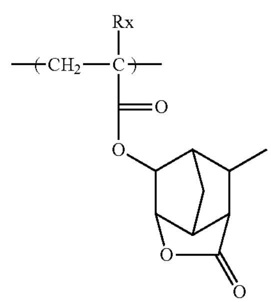
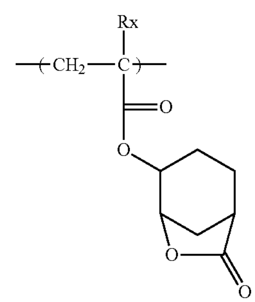
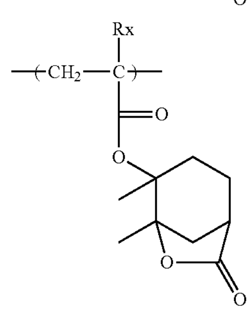
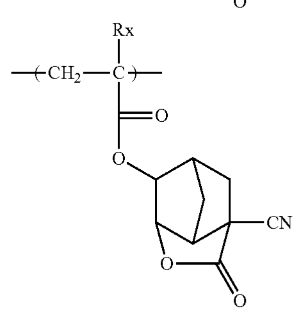

-continued
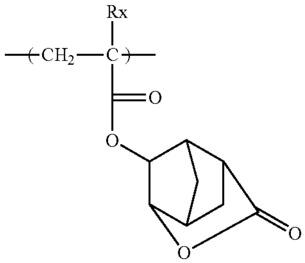
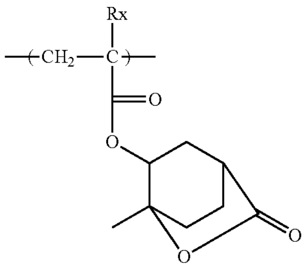
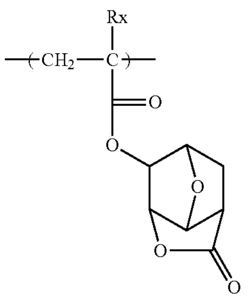
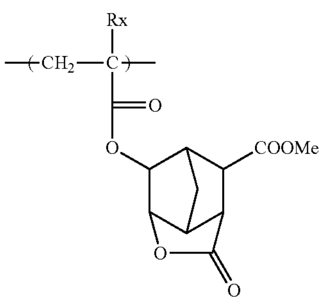
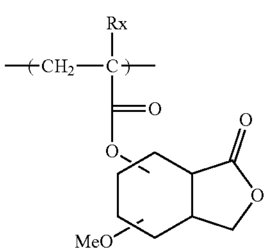
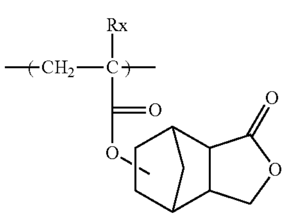
-continued
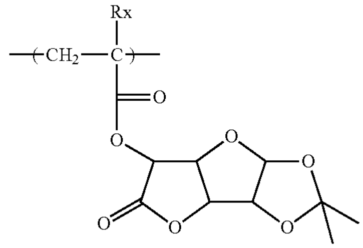
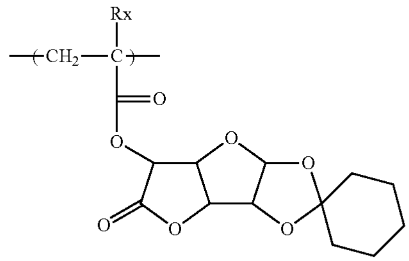
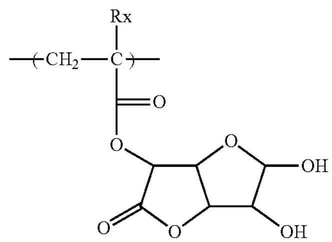
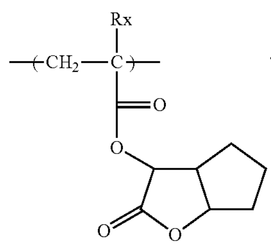
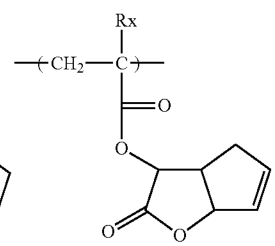
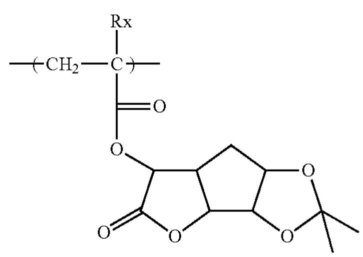
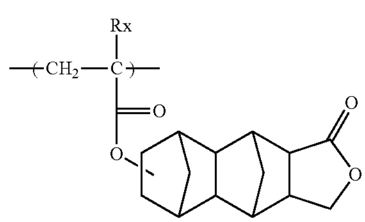

-continued
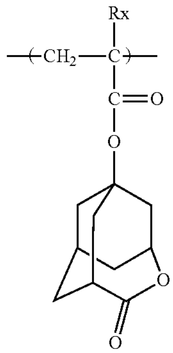
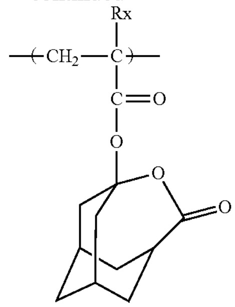
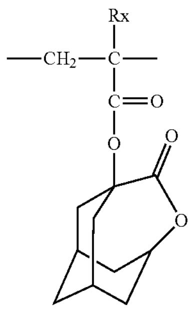
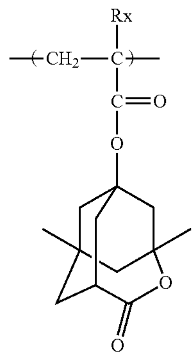
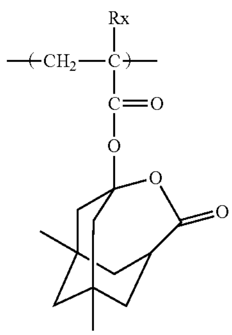
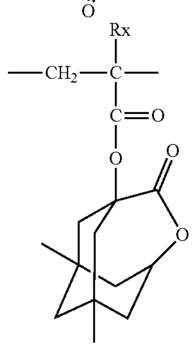
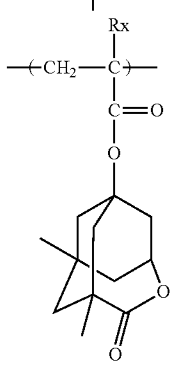
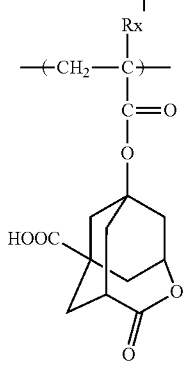
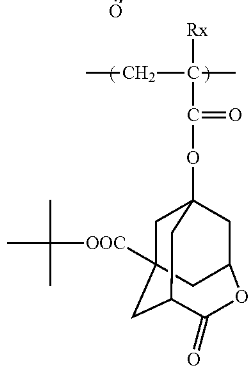
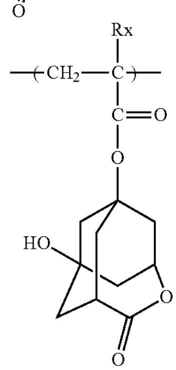
-continued
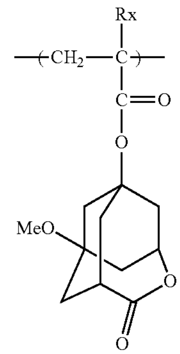
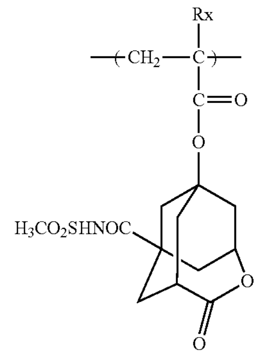
The repeating units other than the repeating units of general formula (VII), having an especially preferred lactone group will be shown below. An improvement in pattern profile and iso-dense bias can be attained by selection of the most appropriate lactone group.
In the following formulae, Rx represents H, $CH_3$, $CH_2OH$ or $CF_3$.
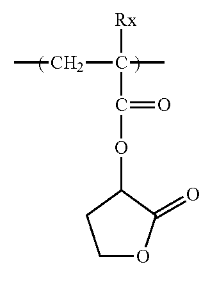
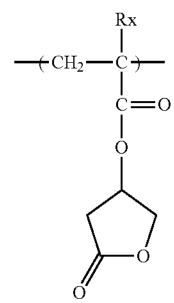
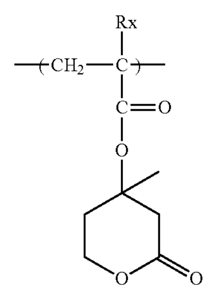
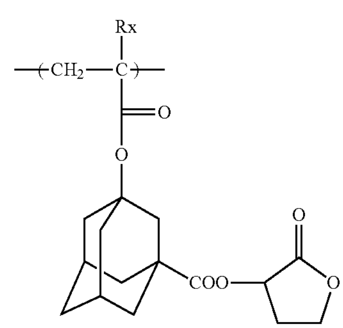

-continued

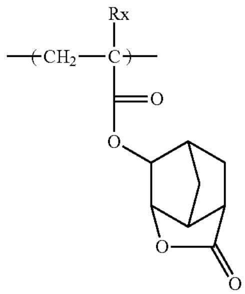

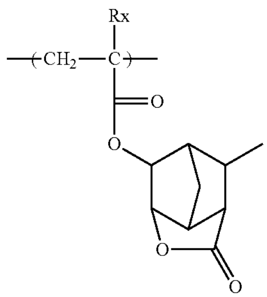

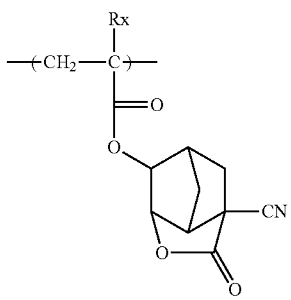

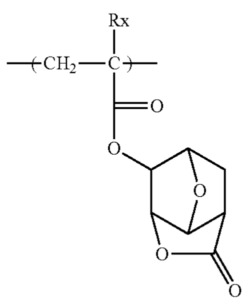

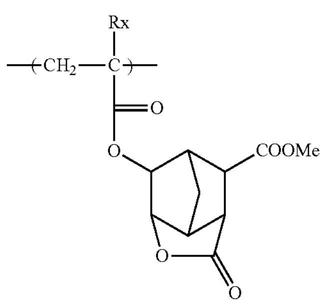

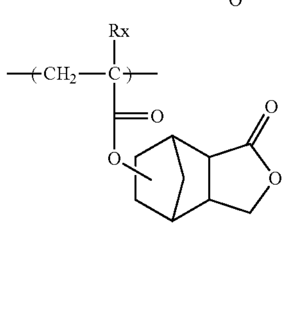

-continued

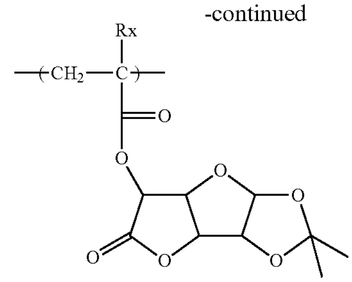

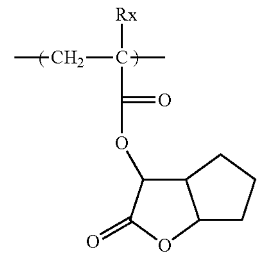

The repeating unit having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity (ee) thereof is preferably 90 or higher, more preferably 95 or higher.

The content ratio of the repeating units other than the repeating units of general formula (VII), having a lactone group, the sum thereof when a plurality of repeating units are contained, is preferably in the range of 15 to 60 mol %, more preferably 20 to 50 mol % and still more preferably 30 to 50 mol %, based on all the repeating units contained in the resin (B).

Two or more types of lactone repeating units selected from among those of general formula (VII) can be simultaneously employed in order to enhance the effects of the present invention. In the simultaneous employment, it is preferred to select the two or more types from the lactone repeating units of the general formula (VII) in which n is 1.

It is preferred for the resin (B) to have a repeating unit other than the repeating units of general formulae (AI) and (VII), having a hydroxyl group or a cyano group. The containment of this repeating unit would realize enhancements of adhesion to substrate and developer affinity.

The repeating unit having a hydroxyl group or a cyano group is preferably a repeating unit with a structure of alicyclic hydrocarbon substituted with a hydroxyl group or a cyano group, and preferably has no acid-decomposable group. In the alicyclic hydrocarbon structure substituted with a hydroxyl group or a cyano group, the alicyclic hydrocarbon structure preferably consists of an adamantyl group, a diamantyl group or a norbornane group. As preferred alicyclic hydrocarbon structures substituted with a hydroxyl group or a cyano group, there can be mentioned the partial structures of general formulae (VIIa) to (VIId), below.

(VIIa)

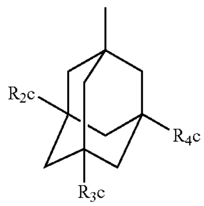

(VIIb)

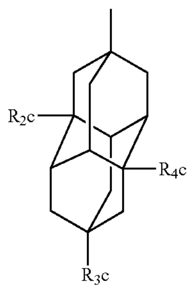

(VIIc)

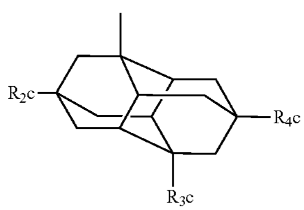

(VIId)

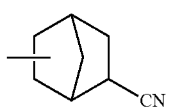

In general formulae (VIIa) to (VIIc), each of $R_2c$ to $R_4c$ independently represents a hydrogen atom, a hydroxyl group or a cyano group, providing that at least one of the $R_2c$ to $R_4c$ represents a hydroxyl group or a cyano group. Preferably, one or two of the $R_2c$ to $R_4c$ are hydroxyl groups and the remainder is a hydrogen atom. In the general formula (VIIa), more preferably, two of the $R_2c$ to $R_4c$ are hydroxyl groups and the remainder is a hydrogen atom.

As the repeating units having any of the partial structures of general formulae (VIIa) to (VIId), there can be mentioned those of general formulae (AIIa) to (AIId) below.

(AIIa)

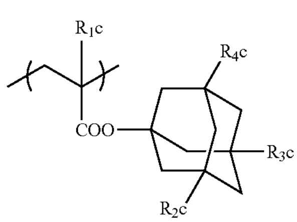

-continued (AIIb)

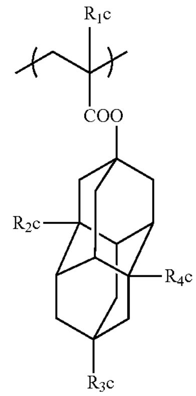

(AIIc)

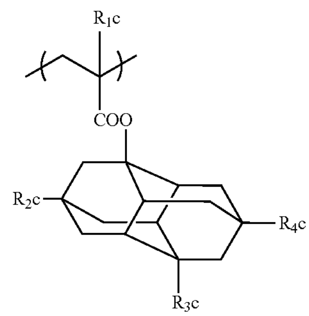

(AIId)

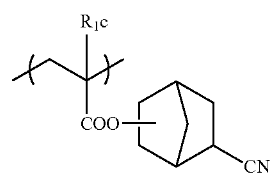

In the general formulae (AIIa) to (AIId), $R_1c$ represents a hydrogen atom, a methyl group, a trifluoromethyl group or a hydroxymethyl group.

$R_2c$ to $R_4c$ have the same meaning as those of general formulae (VIIa) to (VIIc).

The content ratio of the repeating unit having a hydroxyl group or a cyano group, based on all the repeating units of the resin (B), is preferably in the range of 5 to 40 mol %, more preferably 5 to 30 mol % and still more preferably 10 to 25 mol %.

Specific examples of the repeating units having a hydroxyl group or a cyano group will be shown below, which however in no way limit the scope of the present invention.

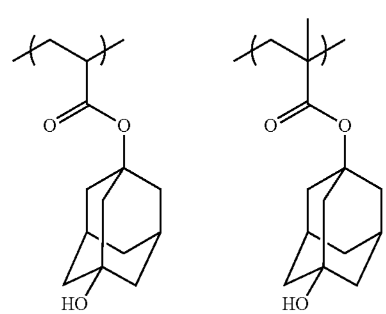

-continued

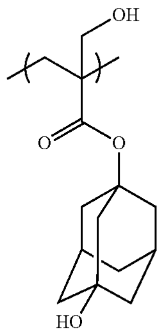

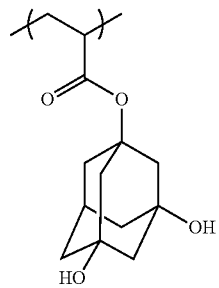

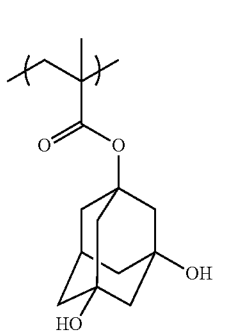

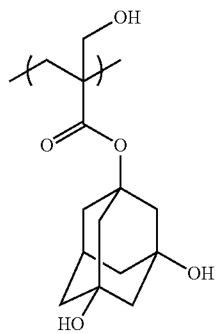

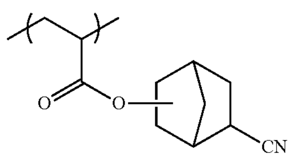

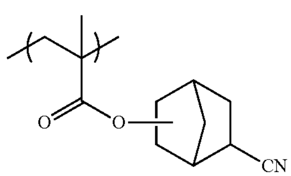

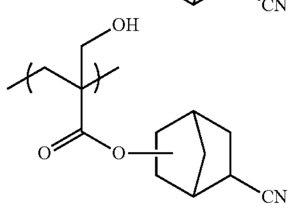

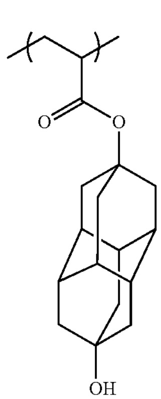

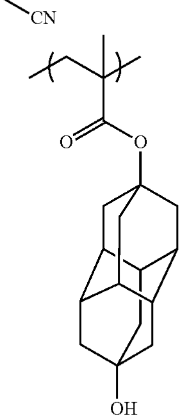

-continued

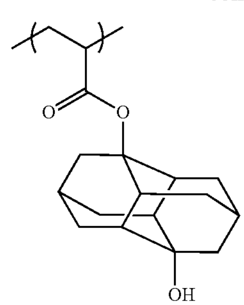

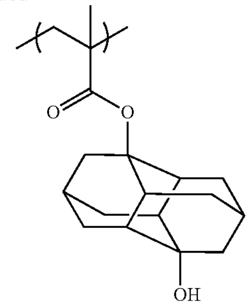

It is preferred for the resin (B) to contain a repeating unit having an alkali-soluble group. As the alkali-soluble group, there can be mentioned a carboxyl group, a sulfonamido group, a sulfonylimido group, a bisulfonylimido group or an aliphatic alcohol substituted at its α-position with an electron-withdrawing group (for example, a hexafluoroisopropanol group). The possession of a repeating unit having a carboxyl group is more preferred. The incorporation of the repeating unit having an alkali-soluble group would increase the resolving power in contact hole usage. The repeating unit having an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a cyclohydrocarbon structure of a single ring or multiple rings. The repeating unit of acrylic acid or methacrylic acid is especially preferred.

The content ratio of the repeating unit having an alkali-soluble group based on all the repeating units of the resin (B) is preferably in the range of 0 to 20 mol %, more preferably 3 to 15 mol % and still more preferably 5 to 10 mol %.

Specific examples of the repeating units having an alkali-soluble group will be shown below, which however in no way limit the scope of the present invention.

In the formulae, Rx represents H, $CH_3$, $CH_2OH$ or $CF_3$.

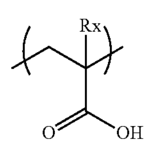

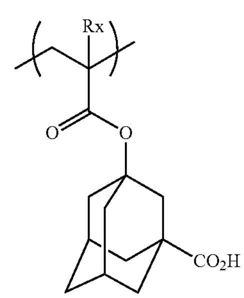

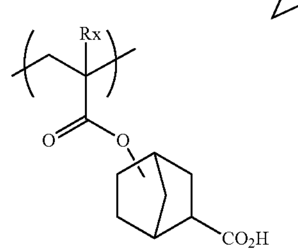

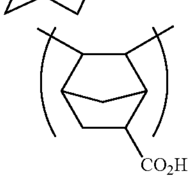

-continued

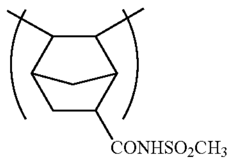

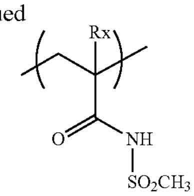

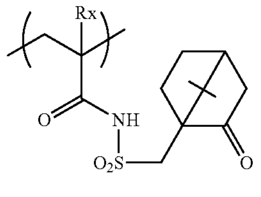

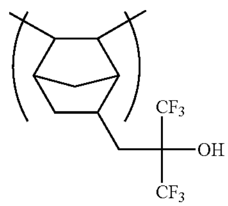

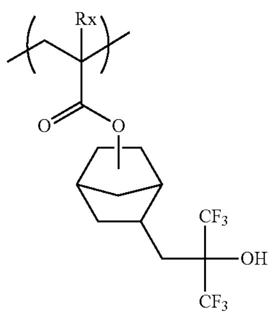

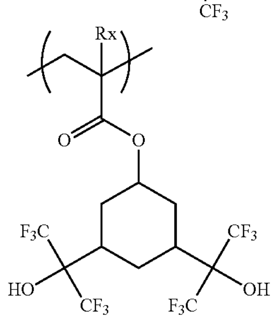

Resin (B) according to the present invention can further contain a repeating unit that has a structure of alicyclic hydrocarbon having no polar group, exhibiting no acid decomposability. As such a repeating unit, there can be mentioned any of the repeating units of general formula (VIII) below.

(VIII)

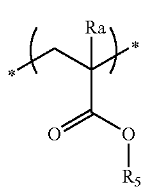

In general formula (VIII), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. Ra preferably represents a hydrogen atom, a methyl group, a trifluoromethyl group, a hydroxymethyl group or the like, more preferably a hydrogen atom and a methyl group.

The cyclic structures contained in $R_5$ include a monocyclic hydrocarbon group and a polycyclic hydrocarbon group. As the monocyclic hydrocarbon group, there can be mentioned, for example, a cycloalkyl group having 3 to 12 carbon atoms, such as a cyclopentyl group, a cyclohexyl group, a cycloheptyl group or a cyclooctyl group, or a cycloalkenyl group having 3 to 12 carbon atoms, such as a cyclohexenyl group. Preferably, the monocyclic hydrocarbon group is a monocyclic hydrocarbon group having 3 to 7 carbon atoms. A cyclopentyl group and a cyclohexyl group are more preferred.

The polycyclic hydrocarbon groups include ring-assembly hydrocarbon groups and crosslinked-ring hydrocarbon groups. Examples of the ring-assembly hydrocarbon groups include a bicyclohexyl group, a perhydronaphthalene group and the like. As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo [3.2.1]octane ring); tricyclic hydrocarbon rings, such as homobledane, adamantane, tricyclo[5.2.1.$0^{2,6}$]decane and tricyclo[4.3.1.$1^{2,5}$]undecane rings; and tetracyclic hydrocarbon rings, such as tetracyclo[4.4.0.$1^{2,5}$. $1^{7,10}$]dodecane and perhydro-1,4-methano-5,8-methanonaphthalene rings. Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenarene rings.

As preferred crosslinked-ring hydrocarbon rings, there can be mentioned, for example, a norbornyl group, an adamantyl group, a bicyclooctanyl group and a tricyclo[5,2,1,$0^{2,6}$]decanyl group. As more preferred crosslinked-ring hydrocarbon rings, there can be mentioned a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

The content ratio of any of the repeating units that have a structure of alicyclic hydrocarbon having no polar group, exhibiting no acid decomposability, based on all the repeating units of resin (B), is preferably in the range of 0 to 40 mol %, more preferably 0 to 20 mol %.

Specific examples of the repeating units that have a structure of alicyclic hydrocarbon having no polar group, exhibiting no acid decomposability will be shown below, which however in no way limit the scope of the present invention. In the formulae, Ra represents H, $CH_3$, $CH_2OH$ or $CF_3$.

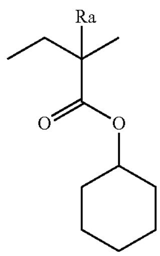
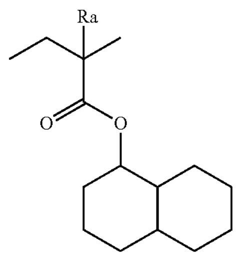
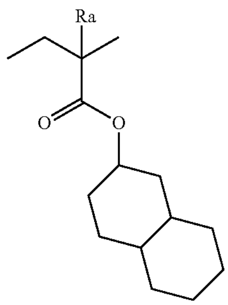
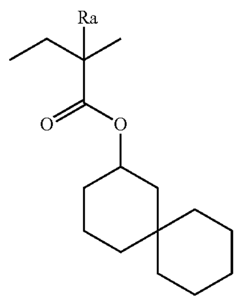
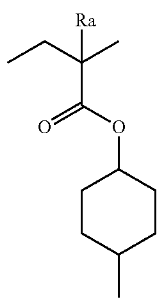
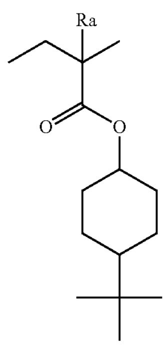
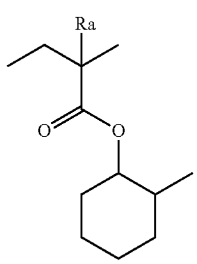
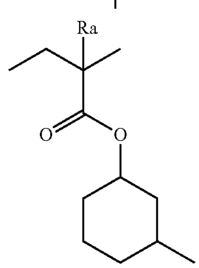
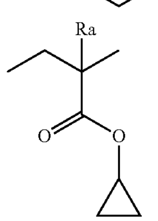
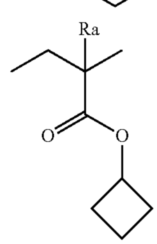
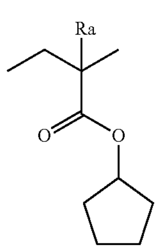
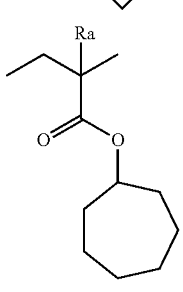

-continued

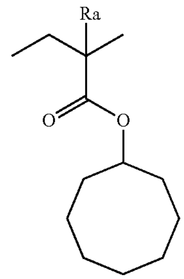
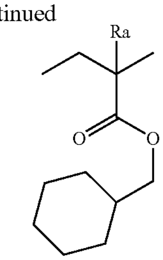
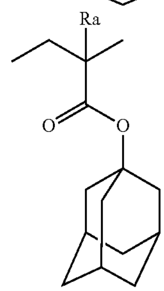
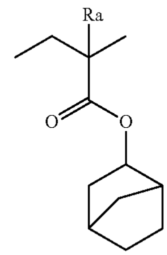
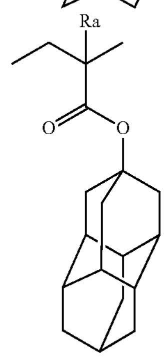
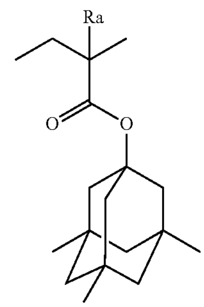
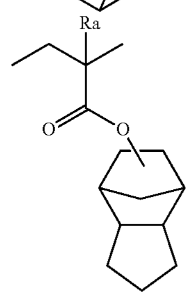

Resin (B) may have, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

As such repeating structural units, there can be mentioned those corresponding to the following monomers, which however are nonlimiting.

The use of such repeating structural units would enable fine regulation of the required properties of resin (A), especially:

(1) solubility in applied solvents, (2) film forming easiness (glass transition point), (3) alkali developability, (4) film thinning (selections of hydrophilicity/hydrophobicity and alkali-soluble group), (5) adhesion of unexposed area to substrate, (6) dry etching resistance, etc.

As appropriate monomers, there can be mentioned, for example, a compound having an unsaturated bond capable of addition polymerization, selected from among acrylic esters, methacrylic esters, acrylamides, methacrylamides, allyl compounds, vinyl ethers, vinyl esters and the like.

In addition, any unsaturated compound capable of addition polymerization that is copolymerizable with monomers corresponding to the above various repeating structural units may be copolymerized therewith.

The molar ratios of individual repeating structural units contained in resin (B) are appropriately determined from the viewpoint of regulation of not only the dry etching resistance of the resist but also the standard developer adaptability, substrate adhesion, resist profile and generally required properties of the resist such as the resolving power, heat resistance and sensitivity.

When the composition of the present invention is one for ArF exposure, it is preferred for resin (B) to have no aromatic group and to have an alicyclic hydrocarbon structure of a single ring or multiple rings from the viewpoint of transparency to ArF beams.

From the viewpoint of the compatibility with hydrophobic resin (HR) to be described hereinafter, it is preferred for resin (B) to contain neither a fluorine atom nor a silicon atom.

In resin (B), preferably, all the repeating units consist of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units. It is more preferred to employ a copolymer containing 20 to 50 mol % of (meth)acrylate repeating units having an acid-decomposable group, 20 to 50 mol % of (meth)acrylate repeating units having a lactone group, 5 to 30 mol % of (meth)acrylate repeating units having an alicyclic hydrocarbon structure substituted with a hydroxyl group or a cyano group and 0 to 20 mol % of other (meth)acrylate repeating units.

In the event of exposing the actinic-ray- or radiation-sensitive resin composition of the present invention to KrF excimer laser beams, electron beams, X-rays or high-energy light rays of wavelength 50 nm or less (EUV, etc.), it is preferred for resin (B) to further have hydroxystyrene repeating units. More preferably, resin (B) has hydroxystyrene repeating units, hydroxystyrene repeating units protected by an acid-decomposable group and acid-decomposable repeating units of a (meth)acrylic acid tertiary alkyl ester, etc.

As preferred hydroxystyrene repeating units having an acid-decomposable group, there can be mentioned, for example, repeating units derived from t-butoxycarbonyloxystyrene, a 1-alkoxyethoxystyrene and a (meth)acrylic acid tertiary alkyl ester. Repeating units derived from a 2-alkyl-2-adamantyl(meth)acrylate and a dialkyl(1-adamantyl)methyl (meth)acrylate are more preferred.

Resin (B) of the present invention can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or the solvent capable of dissolving the composition of the present invention, such as propylene glycol monomethyl ether acetate, propylene glycol monomethyl ether or cyclohexanone, to be described hereinafter. It is preferred to perform the polymerization with the use of the same solvent as employed in the actinic-ray- or radiation-sensitive resin composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° to 150° C., preferably 30° to 120° C. and more preferably 60° to 100° C.

The weight average molecular weight of resin (B) in terms of polystyrene molecular weight as measured by GPC is preferably in the range of 1000 to 200,000, more preferably 2000 to 20,000, still more preferably 3000 to 15,000 and further preferably 5000 to 13,000. The regulation of the weight average molecular weight to 1000 to 200,000 would prevent deteriorations of heat resistance and dry etching resistance and also prevent deterioration of developability and increase of viscosity leading to poor film forming property.

Use is made of the resin whose dispersity (molecular weight distribution) is generally in the range of 1 to 3, preferably 1 to 2.6, more preferably 1 to 2 and most preferably 1.4 to 2.0. The lower the molecular weight distribution, the more excellent the resolving power and resist profile and the smoother the side wall of the resist pattern to thereby attain an excellence in roughness.

In the present invention, the content ratio of resin (B) based on the total solid content of the whole composition is preferably in the range of 30 to 99 mass %, more preferably 60 to 95 mass %.

In the present invention, the resins (B) may be used either individually or in combination.

[5] Solvent

The photosensitive composition of the present invention may contain a solvent. The solvent is not limited as long as it can be used in the preparation of a positive resist composition through dissolution of the above-mentioned components. As the solvent, there can be mentioned, for example, an organic solvent, such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate or an alkyl pyruvate.

As preferred alkylene glycol monoalkyl ether carboxylates, there can be mentioned, for example, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

As preferred alkylene glycol monoalkyl ethers, there can be mentioned, for example, propylene glycol monomethyl ether, propylene glycol monoethyl ether, propylene glycol monopropyl ether, propylene glycol monobutyl ether, ethylene glycol monomethyl ether and ethylene glycol monoethyl ether.

As preferred alkyl lactates, there can be mentioned, for example, methyl lactate, ethyl lactate, propyl lactate and butyl lactate.

As preferred alkyl alkoxypropionates, there can be mentioned, for example, ethyl 3-ethoxypropionate, methyl 3-methoxypropionate, methyl 3-ethoxypropionate and ethyl 3-methoxypropionate.

As preferred cyclolactones, there can be mentioned, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

As preferred optionally cyclized monoketone compounds, there can be mentioned, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

As preferred alkylene carbonates, there can be mentioned, for example, propylene carbonate, vinylene carbonate, ethylene carbonate and butylene carbonate.

As preferred alkyl alkoxyacetates, there can be mentioned, for example, acetic acid 2-methoxyethyl ester, acetic acid 2-ethoxyethyl ester, acetic acid 2-(2-ethoxyethoxy)ethyl ester, acetic acid 3-methoxy-3-methylbutyl ester and acetic acid 1-methoxy-2-propyl ester.

As preferred alkyl pyruvates, there can be mentioned, for example, methyl pyruvate, ethyl pyruvate and propyl pyruvate.

As a preferably employable solvent, there can be mentioned a solvent having a boiling point of 130° C. or above measured at ordinary temperature under ordinary pressure. For example, there can be mentioned cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester or propylene carbonate.

In the present invention, these solvents may be used either individually or in combination.

In the present invention, a mixed solvent consisting of a mixture of a solvent having a hydroxyl group in its structure and a solvent having no hydroxyl group may be used as an organic solvent.

The solvent having a hydroxyl group and solvent having no hydroxyl group can appropriately be selected from among the compounds set forth above as examples. The solvent having a hydroxyl group is preferably an alkylene group monoalkyl ether, an alkyl lactate or the like, more preferably propylene glycol monomethyl ether or ethyl lactate. The solvent having no hydroxyl group is preferably an alkylene glycol monoalkyl ether acetate, an alkyl alkoxypropionate, an optionally cyclized monoketone compound, a cyclolactone, an alkyl acetate or the like. Of these, propylene glycol monomethyl ether acetate, ethyl ethoxypropionate, 2-heptanone, γ-butyrolactone, cyclohexanone and butyl acetate are especially preferred. Propylene glycol monomethyl ether acetate, ethyl ethoxypropionate and 2-heptanone are most preferred.

The mixing ratio (mass) of a solvent having a hydroxyl group and a solvent having no hydroxyl group is in the range of 1/99 to 99/1, preferably 10/90 to 90/10 and more preferably 20/80 to 60/40. Mixed solvents containing 50 mass % or more of a solvent having no hydroxyl group are especially preferred from the viewpoint of uniform applicability.

It is preferred for the solvent to be a mixed solvent of two or more types of solvents containing propylene glycol monomethyl ether acetate.

[6] Basic Compound

The composition of the present invention preferably contains, together with the compound (A) according to the present invention, another basic compound so as to suppress any performance alteration over time from exposure to bake.

As preferred other basic compounds, there can be mentioned the compounds having the structures of formulae (A) to (E) below.

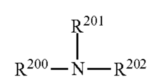

(A)

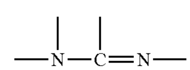

(B)

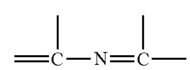

(C)

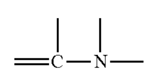

(D)

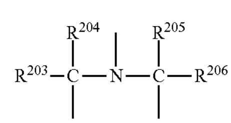

(E)

In the general formulae (A) and (E), $R^{200}$, $R^{201}$ and $R^{202}$ may be identical to or different from each other and each represent a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded with each other to thereby form a ring. $R^{203}$, $R^{204}$, $R^{205}$ and $R^{206}$ may be identical to or different from each other and each represent an alkyl group having 1 to 20 carbon atoms.

With respect to the above alkyl group, as a preferred substituted alkyl group, there can be mentioned an aminoalkyl group having 1 to 20 carbon atoms, a hydroxyalkyl group having 1 to 20 carbon atoms or a cyanoalkyl group having 1 to 20 carbon atoms.

More preferably, in these general formulae (A) and (E) the alkyl group is unsubstituted.

As preferred compounds, there can be mentioned guanidine, aminopyrrolidine, pyrazole, pyrazoline, piperazine, aminomorpholine, aminoalkylmorpholine, piperidine and the like. Further, as preferred compounds, there can be mentioned compounds with an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, aniline derivatives having a hydroxyl group and/or an ether bond and the like.

As the compounds with an imidazole structure, there can be mentioned imidazole, 2,4,5-triphenylimidazole, benzimidazole, 2-phenylbenzoimidazole and the like. As the compounds with a diazabicyclo structure, there can be mentioned 1,4-diazabicyclo[2,2,2]octane, 1,5-diazabicyclo[4,3,0]non-5-ene, 1,8-diazabicyclo[5,4,0]undec-7-ene and the like. As the compounds with an onium hydroxide structure, there can be mentioned tetrabutylammonium hydroxide, triarylsulfonium hydroxide, phenacylsulfonium hydroxide, and sulfonium hydroxides having a 2-oxoalkyl group such as triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide and the like. As the compounds with an onium carboxylate structure, there can be mentioned those having a carboxylate at the anion moiety of the compounds with an onium hydroxide structure, for example, acetate, adamantane-1-carboxylate, perfluoroalkyl carboxylate and the like. As the compounds with a trialkylamine structure, there can be mentioned tri(n-butyl)amine, tri(n-octyl)amine and the like. As the aniline compounds, there can be mentioned 2,6-diisopropylaniline, N,N-dimethylaniline, N,N-dibutylaniline, N,N-dihexylaniline and the like. As the alkylamine derivatives having a hydroxyl group and/or an ether bond, there can be mentioned ethanolamine, diethanolamine, triethanolamine, N-phenyldiethanolamine, tris(methoxyethoxyethyl) amine and the like. As the aniline derivatives having a hydroxyl group and/or an ether bond, there can be mentioned N,N-bis(hydroxyethyl)aniline and the like.

As preferred basic compounds, there can be further mentioned an amine compound having a phenoxy group, an ammonium salt compound having a phenoxy group, an amine compound having a sulfonic ester group and an ammonium salt compound having a sulfonic ester group.

Each of the above amine compound having a phenoxy group, ammonium salt compound having a phenoxy group, amine compound having a sulfonic ester group and ammonium salt compound having a sulfonic ester group preferably has at least one alkyl group bonded to the nitrogen atom thereof. Further preferably, the alkyl group in its chain contains an oxygen atom, thereby forming an oxyalkylene group. The number of oxyalkylene groups in each molecule is one or more, preferably 3 to 9 and more preferably 4 to 6. Oxyalkylene groups having the structure of $—CH_2CH_2O—$, $—CH(CH_3)CH_2O—$ or $—CH_2CH_2CH_2O—$ are preferred.

As specific examples of the above amine compound having a phenoxy group, ammonium salt compound having a phenoxy group, amine compound having a sulfonic ester group and ammonium salt compound having a sulfonic ester group, there can be mentioned the compounds (C1-1) to (C3-3) shown as examples in Section [0066] of US 2007/0224539 A, which are however nonlimiting.

These basic compounds can be used alone or in combination.

The amount of basic compound used is generally in the range of 0.001 to 10 mass %, preferably 0.01 to 5 mass % based on the solid contents of the composition of the invention.

With respect to the ratio of the acid generator to basic compound (excluding compound (A) of the present invention) in the composition, preferably, the acid generator/basic compound (molar ratio)=2.5 to 300. The reason for this is that the molar ratio is preferred to be 2.5 or higher from the viewpoint of sensitivity and resolving power. The molar ratio is preferred to be 300 or below from the viewpoint of the inhibition of any resolving power deterioration due to thickening of resist pattern over time from exposure to heating treatment. The acid generator/basic compound (molar ratio) is more preferably in the range of 10 to 200, still more preferably 15 to 150.

[7] Surfactant

The composition of the present invention preferably further contains a surfactant, and more preferably contains any one, or two or more members, of fluorinated and/or siliconized surfactants (fluorinated surfactant, siliconized surfactant and surfactant containing both fluorine and silicon atoms).

The composition of the present invention when containing the above surfactant would, in the use of an exposure light source of 250 nm or below, especially 220 nm or below, realize favorable sensitivity and resolving power and produce a resist pattern with less adhesion and development defects.

As the fluorinated and/or siliconized surfactants, there can be mentioned, for example, those described in Section [0276] of US Patent Application Publication No. 2008/0248425. As commercially available surfactants, there can be mentioned, for example, fluorinated surfactants/siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS). Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). The fluorinated aliphatic compound can be synthesized by the process described in JP-A-2002-90991.

The polymer having a fluorinated aliphatic group is preferably a copolymer from a monomer having a fluorinated aliphatic group and a poly(oxyalkylene) acrylate and/or poly (oxyalkylene) methacrylate, which copolymer may have an irregular distribution or may result from block copolymerization. As the poly(oxyalkylene) group, there can be mentioned a poly(oxyethylene) group, a poly(oxypropylene) group, a poly(oxybutylene) group or the like. Further, use can be made of a unit having alkylene groups of different chain lengths in a single chain, such as poly(oxyethylene-oxypropylene-oxyethylene block concatenation) or poly(oxyethylene-oxypropylene block concatenation). Moreover, the copolymer from a monomer having a fluorinated aliphatic group and a poly (oxyalkylene) acrylate (or methacrylate) is not limited to two-monomer copolymers and may be a three or more monomer copolymer obtained by simultaneous copolymerization of two or more different monomers having a fluorinated aliphatic group, two or more different poly(oxyalkylene) acrylates (or methacrylates), etc.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene) acrylate (or methacrylate), a copolymer from an acrylate (or methacrylate) having a $C_3F_7$ group, poly(oxyethylene) acrylate (or methacrylate) and poly(oxypropylene) acrylate (or methacrylate), or the like.

Also, in the present invention, use can be made of the surfactants other than fluorinated and/or siliconized surfactants described in Section [0280] of US Patent Application Publication No. 2008/0248425.

These surfactants may be used either individually or in combination.

The amount of each surfactant used is preferably in the range of 0 to 2 mass %, more preferably 0.0001 to 2 mass % and still more preferably 0.0005 to 1 mass % based on the total mass of the composition of the present invention (excluding the solvent).

[8] Carboxylic Acid Onium Salt

The composition of the present invention may contain a carboxylic acid onium salt. The preferred carboxylic acid onium salts are the iodonium salt and the sulfonium salt. The preferred anion moiety thereof is a linear, branched, monocyclic or polycyclic alkylcarboxylate anion having 1 to 30 carbon atoms. A more preferred anion moiety is an anion of carboxylic acid wherein the alkyl group is partially or wholly fluorinated. The alkyl chain may contain an oxygen atom. Accordingly, there would be achieved securement of the transparency in 220 nm or shorter light, enhancement of the sensitivity and resolving power and improvement of the iso-dense bias and exposure margin.

As the fluorinated carboxylic acid anion, there can be mentioned any of the anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid, or the like.

The content ratio of each carboxylic acid onium salt in the composition is generally in the range of 0.1 to 20 mass %, preferably 0.5 to 10 mass % and still more preferably 1 to 7 mass % based on the total solids of the composition.

[9] Dissolution Inhibiting Compound

The composition of the present invention may contain a dissolution inhibiting compound of 3000 or less molecular weight that is decomposed by the action of an acid to thereby increase the solubility in an alkali developer (hereinafter referred to as "dissolution inhibiting compound").

From the viewpoint of preventing any lowering of 220 nm or shorter transmission, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure are the same as described with respect to the resin as the component (B).

When the composition of the present invention is exposed to a KrF excimer laser or irradiated with electron beams, preferred use is made of one having a structure resulting from substitution of the phenolic hydroxyl group of a phenol compound with an acid-decomposable group. The phenol compound preferably contains 1 to 9 phenol skeletons, more preferably 2 to 6 phenol skeletons.

The amount of dissolution inhibiting compound added is preferably in the range of 3 to 50 mass %, more preferably 5 to 40 mass % based on the total solids of the composition of the present invention.

Specific examples of the dissolution inhibiting compounds will be shown below, which however in no way limit the scope of the present invention.

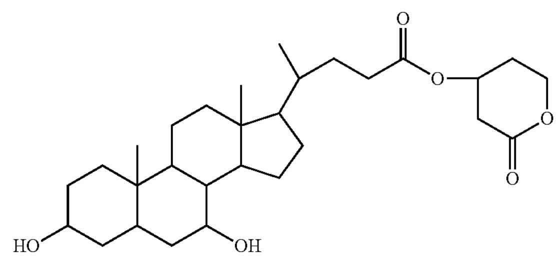

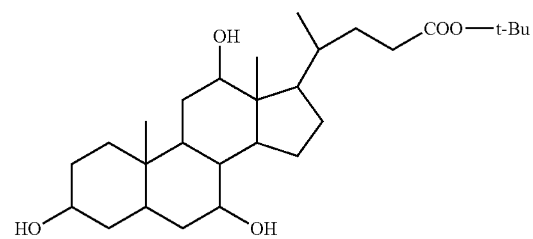

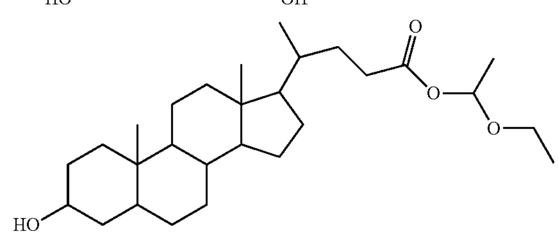

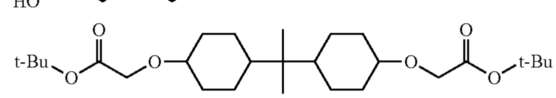

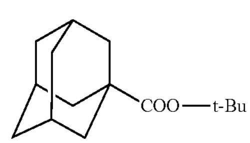

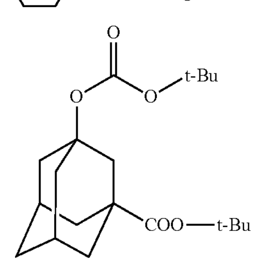

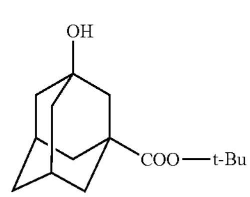

-continued

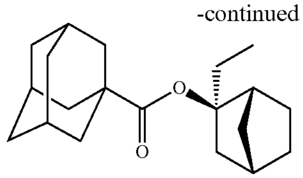

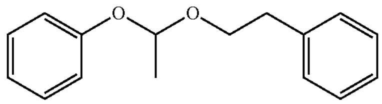

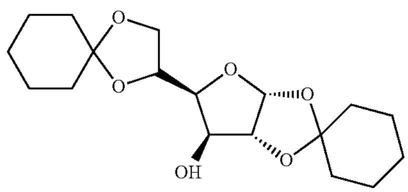 [SMILES: O[C@@H]1[C@H]2OC3(CCCCC3)O[C@H]2O[C@@H]1C1COC2(CCCCC2)O1]

[Other Additives]

The composition of the present invention may further according to necessity contain a dye, a plasticizer, a photosensitizer, a light absorber, a compound capable of increasing the solubility in a developer (for example, a phenolic compound of 1000 or less molecular weight or a carboxylated alicyclic or aliphatic compound), etc.

The above phenolic compound of 1000 or less molecular weight can be easily synthesized by persons of ordinary skill in the art to which the present invention pertains while consulting the processes described in, for example, JP-As 4-122938 and 2-28531, U.S. Pat. No. 4,916,210 and EP 219294.

As the carboxylated alicyclic or aliphatic compound, there can be mentioned, for example, a carboxylic acid derivative of steroid structure such as cholic acid, deoxycholic acid or lithocholic acid, an adamantanecarboxylic acid derivative, adamantanedicarboxylic acid, cyclohexanecarboxylic acid, cyclohexanedicarboxylic acid or the like. These are however nonlimiting.

Method of Forming Pattern

From the viewpoint of enhancement of resolving power, it is preferred for the composition of the present invention to be used with a coating thickness of 30 to 250 nm. More preferably, the composition is used with a coating thickness of 30 to 200 nm. This coating thickness can be attained by setting the solid content of the composition within an appropriate range so as to cause the composition to have an appropriate viscosity, thereby improving the applicability and film forming property.

The total solids content of the actinic-ray- or radiation-sensitive resin composition is generally in the range of 1 to 10 mass %, preferably 1 to 8 mass % and more preferably 1 to 6 mass %.

The composition of the present invention is used in such a manner that the above components are dissolved in a given organic solvent, preferably the above mixed solvent, and filtered and applied onto a given support in the following manner. The filter medium for the filtration preferably consists of a polytetrafluoroethylene, polyethylene or nylon having a pore size of 0.1 μm or less, especially 0.05 μm or less and more especially 0.03 μm or less.

For example, an actinic-ray- or radiation-sensitive resin composition is applied onto a substrate, such as one for use in the production of precision integrated circuit elements (e.g., silicon/silicon dioxide coating), by appropriate application means, such as a spinner or coater, and dried to thereby form a film.

The film is exposed through a given mask to actinic rays or radiation, preferably baked (heated), and developed and rinsed. Accordingly, a desirable pattern can be obtained.

As the actinic rays or radiation, there can be mentioned infrared rays, visible light, ultraviolet rays, far ultraviolet rays, extreme ultraviolet rays, X-rays, electron beams or the like. Among them, preferred use is made of far ultraviolet rays of especially 250 nm or less, more especially 220 nm or less and still more especially 1 to 200 nm wavelength, such as a KrF excimer laser (248 nm), an ArF excimer laser (193 nm) and an $F_2$ excimer laser (157 nm), as well as X-rays, electron beams and the like. More preferred use is made of an ArF excimer laser, an $F_2$ excimer laser, EUV (13 nm) and electron beams.

Prior to the formation of at film, the substrate may be coated with an antireflection film.

As the antireflection film, use can be made of not only an inorganic film of titanium, titanium oxide, titanium nitride, chromium oxide, carbon, amorphous silicon or the like but also an organic film composed of a light absorber and a polymer material. Also, as the organic antireflection film, use can be made of commercially available organic antireflection films, such as the DUV30 Series and DUV40 Series produced by Brewer Science Inc. and AR-2, AR-3 and AR-5 produced by Shipley Co., Ltd.

Generally, an aqueous solution of any of quaternary ammonium salts, a typical example thereof being tetramethylammonium hydroxide, is employed as the alkali developer for use in the development step. However, other aqueous alkali solutions of an inorganic alkali, a primary amine, a secondary amine, a tertiary amine, an alcoholamine, a cycloamine, etc. can also be employed.

Before the use of the above alkali developer, appropriate amounts of an alcohol and a surfactant may be added thereto.

The alkali concentration of the alkali developer is generally in the range of 0.1 to 20 mass %.

The pH value of the alkali developer is generally in the range of 10.0 to 15.0.

Before the use of the above alkaline aqueous solution, appropriate amounts of an alcohol and a surfactant may be added thereto.

Pure water can be used as the rinse liquid. Before the use, an appropriate amount of surfactant may be added thereto.

The development operation or rinse operation may be followed by the operation for removing any developer or rinse liquid adhering onto the pattern by the use of a supercritical fluid.

EXAMPLE

The present invention will be described in greater detail below by way of its examples. However, the gist of the present invention is in no way limited to these examples.

Synthetic Example for Compound (A)

Synthetic Example

Synthesis of Compound (A-1)

In a nitrogen stream, a mixture of 8.35 g (26.4 mmol) of 1,1,2,2,3,3-hexafluoropropane-1,3-disulfonyl fluoride and 15 ml of THF was cooled in an ice bath. A mixed solution of 4.94 g (27.7 mmol) of 1-phenylpiperazine and 30 ml of triethylamine was dropped thereinto over a period of 60 minutes. The mixture was agitated while cooling in the ice bath for an hour and warmed to room temperature at which the mixture was agitated for an hour. Trifluoromethanesulfonamide amounting to 3.94 g (26.4 mmol) was added to the mixture, and agitated at 80° C. for 12 hours. Thereafter, 100 ml of chloroform was added, and the resultant organic phase was washed with water and dried over sodium sulfate. After the drying, 20 ml of methanol and 50 ml of 1.5 N aqueous hydrochloric acid were added, and the thus precipitated white solid was collected by filtration. Thus, 16.5 g of the following compound was obtained.

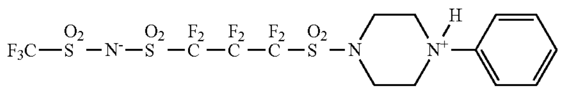 [SMILES: O=S(=O)([N-]S(=O)(=O)C(F)(F)C(F)(F)C(F)(F)S(=O)(=O)N1CC[NH+](c2ccccc2)CC1)C(F)(F)F]

The above compound amounting to 6.86 g was dissolved in a mixed solution of 200 ml of methanol and 25 ml of 1M aqueous sodium hydroxide solution, and 4.15 g (12 mmol) of triphenylsulfonium bromide was added thereto and agitated at room temperature for 3 hours. Thereafter, 60 ml of chloroform was added, and the resultant organic phase was washed with water. The solvent was evaporated off, and the product was purified through a column chromatography ($SiO_2$, chloroform/methanol=10/1 vol %). Thus, desired compound (A-1) (9.35 g) was obtained as a white solid.

Other compounds (A-2) to (A-23) were synthesized in the same manner as above.

[Method of Calculating pKa]

With respect to each of the compounds (A-1) to (A-23), the acid dissociation constant (pKa) of the conjugate acid ($R_NH^+$) of the basic moiety ($R_N$) thereof was calculated in the following manner.

The equilibrium constant of the following structure obtained by substituting the $A^-$ of general formula (I) with a hydrogen atom was calculated, and the pKa of the conjugate acid thereof was determined. ($pKa=-\log_{10}(Ka)$)

$$H—\overset{+}{R_N}—H \underset{}{\overset{Ka}{\rightleftharpoons}} R_N—H + H^+$$

With respect to the pKa of the conjugate acid of the basic moiety ($R_N$), in particular, when $R_N$ was expressed by general formula (II), the following equilibrium constant was calculated.

$$L—\underset{H}{\overset{R_{21}}{N^+}}—R_{22}—H \overset{Ka}{\rightleftharpoons} L—\overset{R_{21}}{N}—R_{22}—H + H^+$$

In particular, when $R_N$ was expressed by general formula (IV), the following equilibrium constant was calculated.

$$L—\underset{H}{\overset{R_{21}}{N^+}}—R_{42}—H \overset{Ka}{\rightleftharpoons} L—\overset{R_{21}}{N}—R_{42}—H + H^+$$

In that instance, when $R_{21}$ and Rx formed a ring, there was calculated the following equilibrium constant substituting N with a methylene group so as to render the number of ring members unchanged.

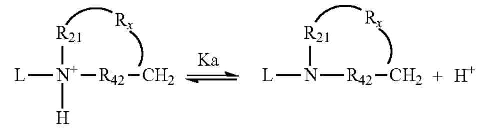

Synthetic Example for Resin (B)

Synthesis of Resin (RA-1)

The monomers corresponding to the repeating units shown below were charged in a molar ratio of 40/15/30/15 in order from the left and dissolved in PGMEA, thereby obtaining 450 g of a solution of 15 mass % solid content. Thereafter, 0.9 mol % of polymerization initiator V-60 produced by Wako Pure Chemical Industries, Ltd. was added to the solution. The resultant mixture was dropped into 50 g of PGMEA heated at 100° C. in a nitrogen atmosphere over a period of 6 hours. After the completion of the dropping, the reaction liquid was agitated for two hours. After the completion of the reaction, the reaction liquid was cooled to room temperature and crystallized in 5 liters of methanol. The thus precipitated white powder was collected by filtration. Thus, desired resin (RA-1) was recovered.

(RA-1)

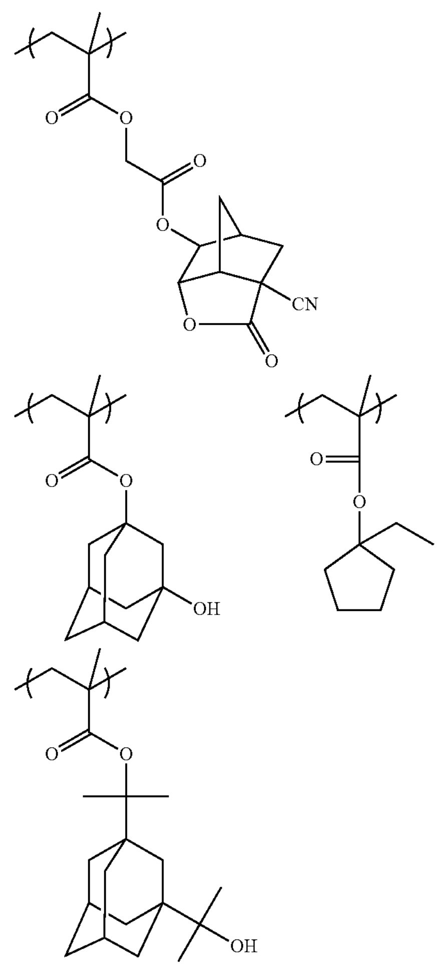

Other resins (RA-2) to (RA-5) were synthesized in the same manner as above.
The structure, molecular weight and dispersity of each of the resins (RA-1) to (RA-5) used in Examples are as follows.
(RA-1)
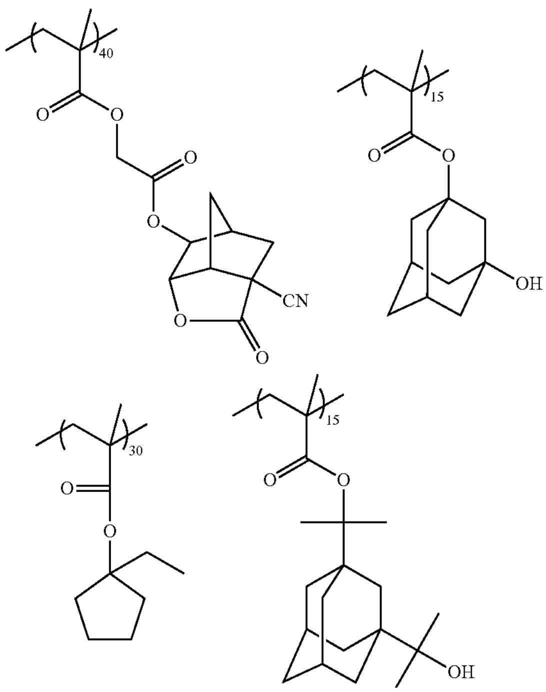
Mw = 9300
Mw/Mn = 1.83
(RA-2)
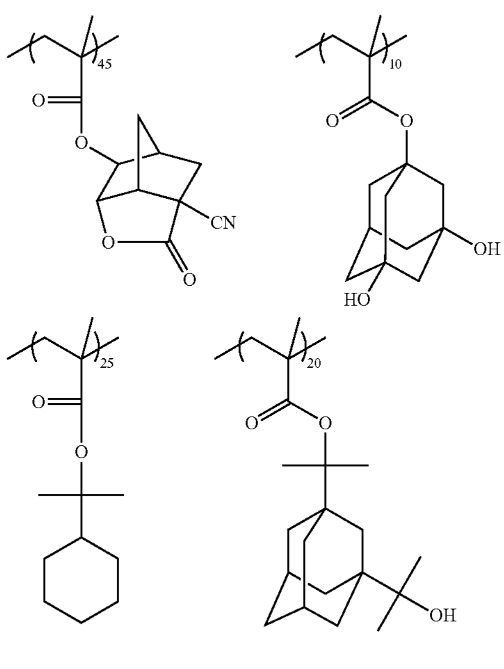
Mw = 13200
Mw/Mn = 1.52
-continued
(RA-3)
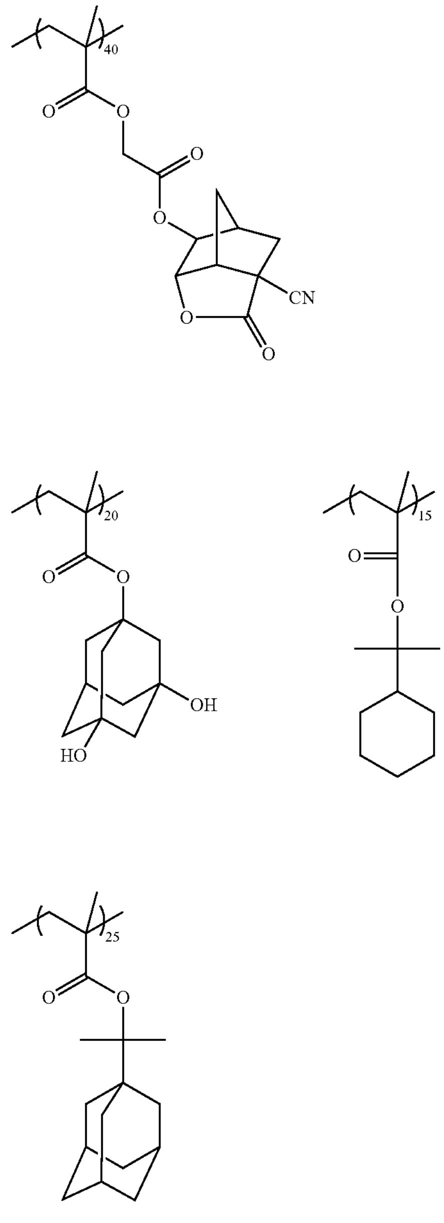
Mw = 10300
Mw/Mn = 2.11
(RA-4)
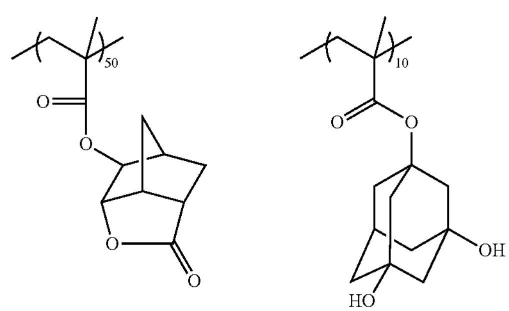

-continued

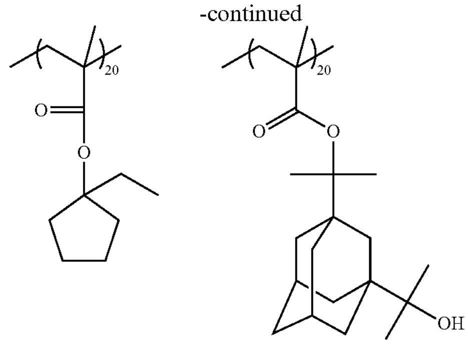

Mw = 8200
Mw/Mn = 1.98

(RA-5)

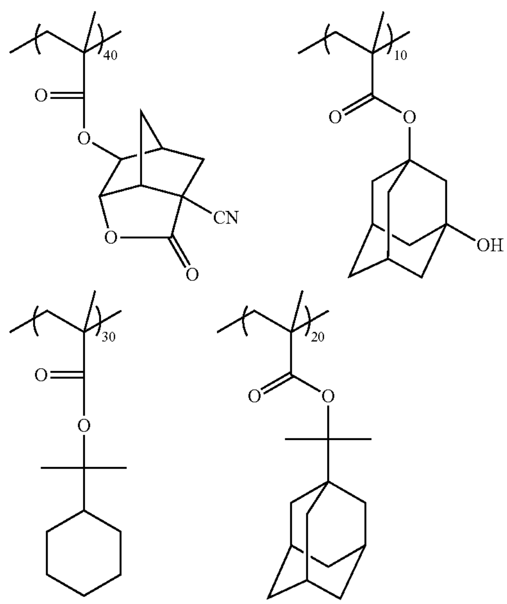

Mw = 7200
Mw/Mn = 1.73

Synthesis of Hydrophobic Resin (HR)

Synthetic Example 1

Synthesis of Monomer (Compound (4))

[Compound (1)]

Compound (1) shown below was synthesized by the process described in International Publication Ser. No. 07/037,213 (pamphlet).

[Compound (2)]

Water amounting to 150.00 g was added to 35.00 g of compound (1), and 27.30 g of NaOH was further added to the mixture. The resultant mixture was agitated while heating under reflux for 9 hours. Subsequently, hydrochloric acid was added, thereby acidifying the mixture. Thereafter, extraction with ethyl acetate was performed. The organic phase was collected, and concentrated, thereby obtaining 36.90 g of compound (2) (yield 93%).

$^1$H-NMR (400 MHz in $(CD_3)_2C0$): σ(ppm)=1.56-1.59 (1H), 1.68-1.72 (1H), 2.13-2.15 (1H), 2.13-2.47 (2H), 3.49-3.51 (1H), 3.68 (1H), 4.45-4.46 (1H)

[Compound (3)]

$CHCl_3$ amounting to 200 ml was added to 20.00 g of compound (2), and 50.90 g of 1,1,1,3,3,3-hexafluoroisopropyl alcohol and 30.00 g of 4-dimethylaminopyridine were further added to the mixture and agitated. Thereafter, 22.00 g of 1-ethyl-3-(3-dimethylaminopropyl)carbodiimide hydrochloride was added to the obtained solution, and agitated for three hours. The thus obtained reaction solution was poured into 500 ml of 1N HCl, thereby terminating the reaction. The thus obtained organic phase was washed with 1N HCl and then water, and concentrated, thereby obtaining 30.00 g of compound (3) (yield 85%).

$^1$H-NMR (400 MHz in $(CD_3)_2C0$): σ(ppm)=1.62 (1H), 1.91-1.95 (1H), 2.21-2.24 (1H), 2.45-2.53 (2H), 3.61-3.63 (1H), 3.76 (1H), 4.32-4.58 (1H), 6.46-6.53 (1H)

[Compound (4)]

Toluene amounting to 300.00 g was added to 15.00 g of compound (3), and 3.70 g of methacrylic acid and 4.20 g of p-toluenesulfonic acid monohydrate were further added to the mixture. The resultant mixture was refluxed for 15 hours while removing generated water by azeotropy. The thus obtained reaction liquid was concentrated, and the concentrate was purified through a column chromatography. Thus, 11.70 g of compound (4) was obtained (yield 65%).

$^1$H-NMR (400 MHz in $(CD_3)_2C0$): σ(ppm)=1.76-1.79 (1H), 1.93 (3H), 2.16-2.22 (2H), 2.57-2.61 (1H), 2.76-2.81 (1H), 3.73-3.74 (1H), 4.73 (1H), 4.84-4.86 (1H), 5.69-5.70 (1H), 6.12 (1H), 6.50-6.56 (1H)

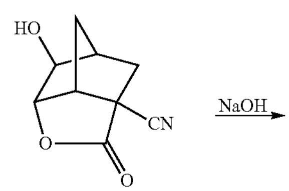

1

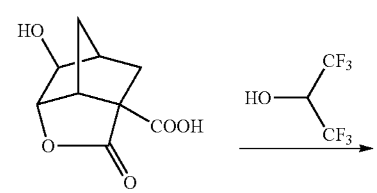

2

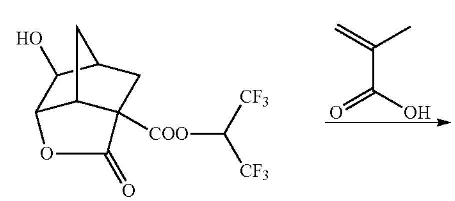

3

-continued

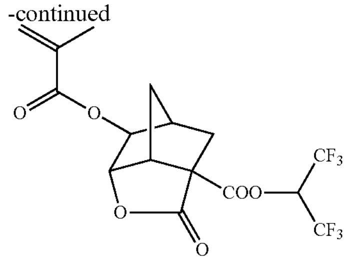

4

Synthetic Example 2

Synthesis of Hydrophobic Resin (C-7)

The monomers corresponding to the repeating units shown below were charged in a molar ratio of 90/10 and dissolved in PGMEA, thereby obtaining 450 g of a solution of 15 mass % solid content. Thereafter, 1 mol % of polymerization initiator V-60 produced by Wako Pure Chemical Industries, Ltd. was added to the solution. The resultant mixture was dropped into 50 g of PGMEA heated at 100° C. in a nitrogen atmosphere over a period of 6 hours. After the completion of the dropping, the reaction liquid was agitated for two hours. After the completion of the reaction, the reaction liquid was cooled to room temperature and crystallized in 5 liters of methanol. The thus precipitated white powder was collected by filtration. Thus, desired resin (C-7) was recovered.

The polymer component ratio determined by NMR was 90/10. The weight average molecular weight thereof in terms of standard polystyrene molecular weight determined by GPC measurement was 8000, and the molecular weight dispersity thereof was 1.40.

(C-7)

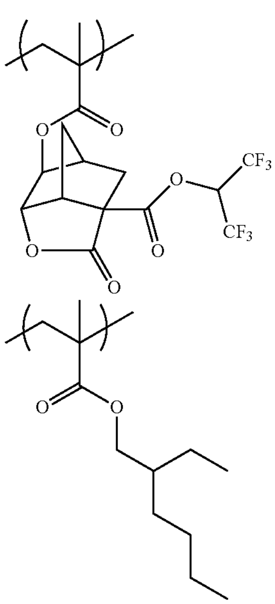

Other hydrophobic resins were synthesized in the same manner as above.

Examples 1 to 35 and Comparative Examples 1 and 2

Preparation of Resist

Dissolution of the components in the solvents as indicated in Table 3 below was carried out, thereby obtaining solutions of 5 mass % solid content. The solutions were passed through a polyethylene filter of 0.1 μm pore size, thereby obtaining positive resist compositions. The thus obtained positive resist compositions were evaluated by the following methods, and the evaluation results are given in Table 4.

<Evaluation of Resist>

An organic antireflection film ARC29A (produced by Nissan Chemical Industries, Ltd.) was applied onto a silicon wafer and baked at 205° C. for 60 seconds, thereby forming a 98 nm-thick antireflection film. Each of the prepared positive resist compositions was applied thereonto and baked at 130° C. for 60 seconds, thereby forming a 120 nm-thick resist film. The resultant wafer was exposed through a 6% half-tone mask of 65 nm 1:1 line and space pattern by means of an ArF excimer laser liquid-immersion scanner (manufactured by ASML, XT1700i, NA 1.20). Ultrapure water was used as the immersion liquid. Thereafter, the exposed wafer was baked at 130° C. for 60 seconds, developed with an aqueous solution of tetramethylammonium hydroxide (2.38 mass %) for 30 seconds, rinsed with pure water and spin dried, thereby obtaining a resist pattern.

Line Edge Roughness (LER):

In the measurement of line edge roughness (nm), a 42 nm line and space (L/S=1/1) pattern was observed by means of a critical dimension scanning electron microscope (SEM, model S-8840 manufactured by Hitachi, Ltd.). In a 5 μm region along the longitudinal direction of the line pattern, the distances of actual edges from a reference line on which edges were to be present were measured on 50 points. The standard deviation of measurements was determined, and 3σ was computed. The smaller the value thereof, the more favorable the performance exhibited.

Configuration of Profile:

An 85 nm isolated pattern was observed. The evaluation mark o was given when the configuration was rectangular. The evaluation mark Δ was given when the configuration was slightly tapering. The evaluation mark x was given when film thinning occurred.

Storage Stability:

Each of the resist solutions was stored by allowing the same to stand still at 60° C. for a week. The evaluation mark x was given when the storage caused the pattern line width to change as much as 5% or more. The evaluation mark o was given when the change was in the range of 3% to less than 5%. The evaluation mark o* was given when the change was less than 3%.

TABLE 3

| | Compound (A) [mass (g)] | Acid generator [mass (g)] | Resin (B) [10 g] | Hydrophobic Resin (HR) [mass (g)] | Basic compound [mass (g)] | Surfactant [mass (g)] | Solvent [mass ratio] |
|---|---|---|---|---|---|---|---|
| Ex. 1 | A-1 [0.5] | z-2 [0.7] | RA-3 | C-7 [0.4] | TMEA [0.03] | W-2 [0.05] | A1/B1 [60/40] |
| Ex. 2 | A-1 [0.4] | z-15 [0.8] | RA-2 | HR-44 [0.4] | HEP [0.04] | W-3 [0.05] | A1/B1 [60/40] |
| Ex. 3 | A-1 [0.5] | z-45 [0.8] | RA-1 | C-209 [0.5] | DIA [0.04] | W-1 [0.05] | A1/B1 [60/40] |
| Ex. 4 | A-2 [0.5] | z-32 [0.6] | RA-5 | C-12 [0.5] | TPI [0.05] | W-4 [0.05] | A1/A3 [80/20] |
| Ex. 5 | A-3 [0.6] | z-43 [0.7] | RA-4 | HR-57 [0.6] | HEP [0.04] | W-1 [0.05] | A1/A2 [70/30] |
| Ex. 6 | A-4 [0.3] | z-33 [0.6] | RA-2 | C-262 [0.6] | TMEA [0.05] | W-3 [0.05] | A1/B1 [70/30] |
| Ex. 7 | A-4 [0.4] | z-45 [0.8] | RA-5 | C-253 [0.4] | HEP [0.03] | W-2 [0.05] | A1/A3 [70/30] |
| Ex. 8 | A-5 [0.5] | z-32 [0.8] | RA-3 | HR-46 [0.4] | TPI [0.04] | W-3 [0.05] | A1/B2 [60/40] |
| Ex. 9 | A-5 [0.5] | z-33 [0.8] | RA-1 | C-161 [0.5] | DIA [0.06] | W-4 [0.05] | A1/B1 [60/40] |
| Ex. 10 | A-6 [0.5] | z-15 [0.7] | RA-2 | C-7 [0.5] | DIA [0.03] | W-1 [0.05] | A1/B1 [60/40] |
| Ex. 11 | A-7 [0.6] | z-2 [0.5] | RA-5 | C-209 [0.6] | HEP [0.04] | W-1 [0.05] | A1/B1 [70/30] |
| Ex. 12 | A-7 [0.4] | z-45 [0.7] | RA-4 | HR-44 [0.6] | TMEA [0.05] | W-2 [0.05] | A1/A4 [70/30] |
| Ex. 13 | A-8 [0.4] | z-32 [0.8] | RA-3 | C-12 [0.4] | HEP [0.04] | W-3 [0.05] | A1/A3 [70/30] |
| Ex. 14 | A-9 [0.5] | z-43 [0.7] | RA-5 | C-262 [0.4] | DIA [0.04] | W-4 [0.05] | A1/A2 [60/40] |
| Ex. 15 | A-10 [0.4] | z-33 [0.7] | RA-1 | HR-50 [0.5] | TPI [0.05] | W-2 [0.05] | A1/B1 [70/30] |
| Ex. 16 | A-11 [0.5] | z-45 [0.8] | RA-2 | C-253 [0.5] | HEP [0.04] | W-3 [0.05] | A1/A3 [70/30] |
| Ex. 17 | A-12 [0.6] | z-32 [0.8] | RA-3 | C-7 [0.6] | TMEA [0.05] | W-1 [0.05] | A1/S2 [70/30] |
| Ex. 18 | A-13 [0.5] | z-33 [0.6] | RA-2 | HR-44 [0.6] | HEP [0.04] | W-4 [0.05] | A1/B1 [60/40] |
| Ex. 19 | A-14 [0.4] | z-15 [0.7] | RA-1 | C-209 [0.4] | TPI [0.05] | W-1 [0.05] | A1/B1 [60/40] |
| Ex. 20 | A-15 [0.6] | z-2 [0.6] | RA-5 | C-12 [0.4] | DIA [0.03] | W-3 [0.05] | A1/B1 [60/40] |
| Ex. 21 | A-16 [0.7] | z-45 [0.8] | RA-4 | HR-57 [0.5] | DIA [0.04] | W-2 [0.05] | A1/A4 [70/30] |
| Ex. 22 | A-17 [0.4] | z-32 [0.8] | RA-2 | C-262 [0.5] | HEP [0.06] | W-3 [0.05] | A1/B1 [70/30] |
| Ex. 23 | A-18 [0.5] | z-43 [0.8] | RA-5 | C-253 [0.6] | TMEA [0.03] | W-4 [0.05] | A1/B1 [70/30] |
| Ex. 24 | A-19 [0.5] | z-33 [0.7] | RA-3 | HR-46 [0.6] | TMEA [0.04] | W-1 [0.05] | A1/B1 [60/40] |
| Ex. 25 | A-20 [0.4] | z-45 [0.5] | RA-1 | C-161 [0.4] | HEP [0.05] | W-1 [0.05] | A1/A3 [60/40] |
| Ex. 26 | A-1/A-10 [0.3/0.2] | z-2 [0.7] | RA-3 | C-209 [0.5] | TPI [0.05] | W-2 [0.05] | A1/B1 [60/40] |
| Ex. 27 | A-1 [0.5] | z-2/z-32 [0.2/0.5] | RA-1 | C-7 [0.4] | DIA [0.05] | W-1 [0.05] | A1/B1 [70/30] |
| Ex. 28 | A-1 [0.5] | z-15 [0.8] | RA-1/RA-3 [5/5] | C-12 [0.5] | HEP [0.04] | W-3 [0.05] | A1/B1 [60/40] |
| Ex. 29 | A-1 [0.5] | z-2 [0.7] | RA-1 | C-7/HR-24 [0.4/0.1] | TMEA [0.03] | W-1 [0.05] | A1/B1 [60/40] |
| Ex. 30 | A-1 [0.5] | z-45 [0.7] | RA-4 | C-262 [0.5] | DIA/TMEA [0.02/0.02] | W-1 [0.05] | A1/B2 [60/40] |
| Ex. 31 | A-1 [0.4] | z-45 [0.6] | RA-1 | C-161 [0.4] | HEP [0.05] | W-1/W-2 [0.02/0.03] | A1/A3 [60/40] |
| Ex. 32 | A-1 [0.5] | z-15 [0.7] | RA-1 | C-209 [0.4] | HEP [0.05] | — | A1/A3 [60/40] |
| Ex. 33 | A-21 [0.5] | z-45 [0.7] | RA-1 | C-209 [0.4] | DIA [0.04] | W-1 [0.05] | A1/B1 [60/40] |
| Ex. 34 | A-22 [0.5] | z-45 [0.8] | RA-3 | C-7 [0.4] | HEP [0.05] | W-2 [0.05] | A1/B1 [60/40] |
| Ex. 35 | A-23 [0.5] | z-15 [0.7] | RA-2 | C-12 [0.4] | HEP [0.05] | W-3 [0.05] | A1/B1 [60/40] |
| Comp. 1 | A-A' [0.5] | z-2 [0.7] | RA-3 | C-1 [0.4] | TMEA [0.03] | W-2 [0.05] | A1/B1 [60/40] |
| Comp. 2 | A-1 [0.5] | — | RA-3 | C-1 [0.4] | TMMA [0.03] | W-2 [0.05] | A1/B1 [60/40] |

TABLE 4

| | LER [nm] | Pattern profile | Storage stability | pKa | σp (L site) |
|---|---|---|---|---|---|
| Ex. 1 | 5.2 | ○ | ○* | 5.68 | −0.01 |
| Ex. 2 | 5.5 | Δ | ○* | 5.68 | −0.01 |
| Ex. 3 | 5.3 | ○ | ○* | 5.68 | −0.01 |
| Ex. 4 | 6.2 | ○ | ○* | −0.41 | 0.5 |
| Ex. 5 | 5.1 | Δ | ○* | −1.28 | 0.44 |
| Ex. 6 | 4.9 | Δ | ○* | 5.39 | 0.18 |
| Ex. 7 | 5.5 | ○ | ○* | 5.39 | 0.18 |
| Ex. 8 | 5.6 | Δ | ○* | 7.53 | 0.03 |
| Ex. 9 | 5.3 | Δ | ○* | 7.53 | 0.03 |
| Ex. 10 | 5.2 | ○ | ○* | 7.37 | 0.04 |
| Ex. 11 | 5.5 | ○ | ○* | 5.52 | 0.18 |
| Ex. 12 | 5.4 | ○ | ○* | 5.52 | 0.18 |
| Ex. 13 | 5.4 | Δ | ○* | 7.5 | 0.18 |
| Ex. 14 | 5.6 | Δ | ○* | 7.66 | 0.03 |
| Ex. 15 | 5.1 | Δ | ○* | 4.69 | 0.09 |
| Ex. 16 | 5.9 | ○ | ○* | 4.6 | 0.23 |
| Ex. 17 | 5.4 | Δ | ○ | 7.83 | 0 |
| Ex. 18 | 5.8 | ○ | ○* | −0.41 | 0.5 |
| Ex. 19 | 5.7 | ○ | ○* | 6.69 | −0.01 |
| Ex. 20 | 5.7 | Δ | ○* | 1.5 | 0.01 |
| Ex. 21 | 5.2 | ○ | ○* | 5.68 | 0.06 |
| Ex. 22 | 4.8 | Δ | ○* | 5.68 | −0.01 |
| Ex. 23 | 5 | Δ | ○* | 5.68 | −0.01 |
| Ex. 24 | 4.9 | ○ | ○* | 5.68 | −0.01 |
| Ex. 25 | 5.1 | ○ | ○* | 5.68 | −0.01 |
| Ex. 26 | 5.3 | ○ | ○* | 5.68 | −0.01 |
| Ex. 27 | 5.2 | ○ | ○* | 5.68 | −0.01 |
| Ex. 28 | 5.4 | ○ | ○* | 5.68 | −0.01 |
| Ex. 29 | 5.3 | ○ | ○* | 5.68 | −0.01 |
| Ex. 30 | 5.1 | ○ | ○* | 5.68 | −0.01 |
| Ex. 31 | 5.2 | ○ | ○* | 5.68 | −0.01 |
| Ex. 32 | 5.8 | ○ | ○* | 5.68 | −0.01 |
| Ex. 33 | 4.7 | ○ | ○* | 7.45 | 0.01 |
| Ex. 34 | 4.9 | ○ | ○* | 7.45 | 0.01 |
| Ex. 35 | 5.2 | ○ | ○* | 6.32 | 0.07 |
| Comp. 1 | 5.1 | ○ | x | 9.91 | −0.17 |
| Comp. 2 | *1 | *1 | *1 | 5.68 | −0.01 |

*1: Any image could not be formed because of poor resolution.

The meanings of the abbreviations appearing in Table 3 are summarized below.

[Compound (A)]

The abbreviations correspond to specific examples of the compounds (A) set forth hereinbefore.

[Acid Generator (B)]

The abbreviations correspond to specific examples of the acid generators (B) set forth hereinbefore.

[Hydrophobic Resin (HR)]

The abbreviations correspond to specific examples of the hydrophobic resins (HR) and hydrophobic resins (C) set forth hereinbefore.

[Basic Compound]

TMEA: tris(methoxyethoxyethyl)amine,

HEP: N-hydroxyethylpiperidine,

DIA: 2,6-diisopropylaniline and

TPI: 2,4,5-triphenylimidazole.

[Surfactant]

W-1: Megafac F176 (produced by Dainippon Ink & Chemicals, Inc.) (fluorinated),

W-2: Megafac R08 (produced by Dainippon Ink & Chemicals, Inc.) (fluorinated and siliconized), W-3: polysiloxane polymer KP-341 (produced by Shin-Etsu Chemical Co., Ltd.) (siliconized), and W-4: Troy Sol S-366 (produced by Troy Chemical Co., Ltd.).

[Solvent]

A1: propylene glycol monomethyl ether acetate,

A2: 2-heptanone,

A3: cyclohexanone,

A4: γ-butyrolactone,

B1: propylene glycol monomethyl ether and

B2: ethyl lactate.

As a comparative compound to the compounds (A), use was made of compound (A') (pKa 9.91) shown below.

(A')

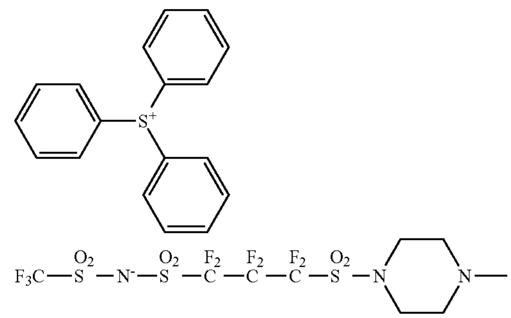

It is apparent from the results of Table 4 that the actinic-ray- or radiation-sensitive resin compositions of the present invention excel in not only line edge roughness and pattern profile but also storage stability.

The invention claimed is:

1. An actinic-ray- or radiation-sensitive resin composition comprising any of the compounds (A) of general formula (I) below, a compound that when exposed to actinic rays or radiation, generates an acid and a hydrophobic resin, $$R_N\text{-}A^-X^+ \qquad (I)$$

in general formula (I), $R_N$ is any of the groups of general formula (II) below, (II)

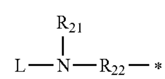

in general formula (II), $R_{21}$ represents a monovalent organic group, and $R_{22}$ represents a bivalent organic group, provided that $R_{21}$ and $R_{22}$ may be bonded to each other to thereby form a ring, L represents a functional group of −0.1 to 0.5 in the $\sigma_p$ value of Hammett's rule, excluding a hydrogen atom, wherein the functional group contains a lactone structure, and

* represents a site of bonding to $A^-$, $A^-$ represents —$X_1$—$N^-$—$X_2$—$R_1$ in which each of $X_1$ and $X_2$ independently represents —CO— or —$SO_2$— and $R_1$ represents a monovalent organic group, and $X^+$ represents a counter cation.

2. The actinic-ray- or radiation-sensitive resin composition according to claim 1, wherein the hydrophobic resin comprises a repeating unit containing a polarity conversion group and further comprises at least either a fluorine atom or a silicon atom.

3. The actinic-ray- or radiation-sensitive resin composition according to claim 1, wherein the hydrophobic resin comprises a repeating unit containing two or more polarity conversion groups.

4. The actinic-ray- or radiation-sensitive resin composition according to claim 1, wherein the content ratio of the hydrophobic resin is in the range of 0.01 to 20 mass % based on the total solids of the composition.

5. The actinic-ray- or radiation-sensitive resin composition according to claim 1, further comprising a resin that is decomposed by the action of an acid to thereby increase its solubility in an alkali developer.

6. The actinic-ray- or radiation-sensitive resin composition according to claim 5, wherein the resin that is decomposed by the action of an acid contains either any of repeating units of general formula (AI-1) below or any of repeating units of general formula (AI-2) below:

(AI-1)

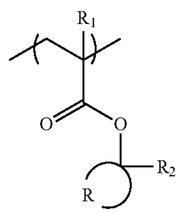

(AI-2)

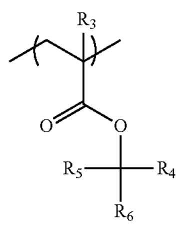

in general formulae (AI-1) and (AI-2), each of $R_1$ and $R_3$ independently represents a hydrogen atom, an optionally substituted methyl group or any of the groups of the formula —$CH_2$—$R_9$, $R_9$ represents a monovalent organic group, each of $R_2$, $R_4$, $R_5$ and $R_6$ independently represents an alkyl group or a cycloalkyl group, and R represents an atomic group required for forming an alicyclic structure in cooperation with a carbon atom.

7. The actinic-ray- or radiation-sensitive resin composition according to claim 5, wherein the resin that is decomposed by the action of an acid contains at least two of repeating units of general formula (AI-1) below, or both any of the repeating units of general formula (AI-1) below and any of repeating units of general formula (AI-2) below:

(AI-1)

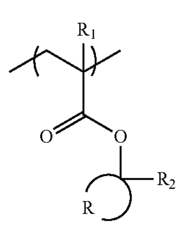

-continued (AI-2)

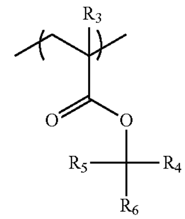

in general formulae (AI-1) and (AI-2), each of $R_1$ and $R_3$ independently represents a hydrogen atom, an optionally substituted methyl group or any of the groups of the formula —$CH_2$—$R_9$, $R_9$ represents a monovalent organic group, each of $R_2$, $R_4$, $R_5$ and $R_6$ independently represents an alkyl group or a cycloalkyl group, and R represents an atomic group required for forming an alicyclic structure in cooperation with a carbon atom.

8. The actinic-ray- or radiation-sensitive resin composition according to claim 1, wherein a conjugate acid of $R_N$, $R_NH^+$, has a value of pKa, as an acid dissociation constant, of −1.5 to 7.8.

9. The actinic-ray- or radiation-sensitive resin composition according to claim 1, wherein L is a functional group of −0.05 to 0.5 in the $\sigma_p$ value.

10. The actinic-ray- or radiation-sensitive resin composition according to claim 1, wherein L is a functional group of −0.03 to 0.5 in the $\sigma_p$ value.

11. The actinic-ray- or radiation-sensitive resin composition according to claim 1, wherein $R_N$ is expressed by general formula (IV) below:

(IV)

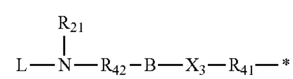

in general formula (IV), each of $R_{41}$ and $R_{42}$ independently represents a bivalent connecting group, B represents a single bond, an oxygen atom or —N(Rx)-, Rx represents a hydrogen atom or a monovalent organic group, provided that when B is —N(Rx)-, $R_{21}$ and Rx may be bonded to each other to thereby form a ring, $X_3$ represents —CO— or —$SO_2$—,

* represents a site of bonding to $A^-$, and $R_{21}$ and L have the same meaning as in general formula (II).

12. The actinic-ray- or radiation-sensitive resin composition according to claim 1, wherein $R_N$ is expressed by general formula (V) below:

(V)

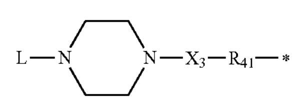

In general formula (V), $R_{41}$ represents a bivalent connecting group, $X_3$ represents —CO— or —$SO_2$—,

* represents a site of bonding to $A^-$, and

L has the same meaning as in general formula (II).

13. The actinic-ray- or radiation-sensitive resin composition according to claim 1, wherein a content of the compound (A) in the actinic-ray- or radiation-sensitive resin composition is in a range of 2 to 10 mass %, based on total solids of the composition.

14. An actinic-ray- or radiation-sensitive resin composition comprising any of the compounds (A) of general formula (I) below, a compound that when exposed to actinic rays or radiation, generates an acid and a hydrophobic resin, $$R_N\text{-}A^-X^+ \quad (I)$$

in general formula (I), $R_N$ is any of the groups of general formula (V) below, (V)

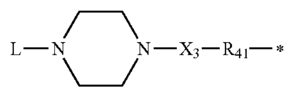

in general formula (V), $R_{41}$ represents a bivalent connecting group, $X_3$ represents —CO— or —$SO_2$—, L represents a functional group of −0.1 to 0.5 in the $\sigma_p$ value of Hammett's rule, excluding a hydrogen atom, and

* represents a site of bonding to $A^-$, $A^-$ represents —$X_1$—$N^-$—$X_2$—$R_1$ in which each of $X_1$ and $X_2$ independently represents —CO— or —$SO_2$— and $R_1$ represents a monovalent organic group, and $X^+$ represents a counter cation.

15. A method of forming a pattern, comprising the steps of forming the actinic-ray- or radiation-sensitive resin composition of claim 1 into a film, exposing the film and developing the exposed film.

16. The method of forming a pattern according to claim 15, wherein the exposure is carried out by a liquid immersion exposure.

* * * * *